US012648352B2

(12) United States Patent
Kim et al.

(10) Patent No.: US 12,648,352 B2
(45) Date of Patent: *Jun. 2, 2026

(54) PLURALITY OF HOST MATERIALS AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: Bitnari Kim, Gyeonggi-do (KR); Su-Hyun Lee, Gyeonggi-do (KR); So-Young Jung, Gyeonggi-do (KR); Ji-Won Um, Gyeonggi-do (KR); Jeong-Eun Yang, Gyeonggi-do (KR); Sang-Hee Cho, Gyeonggi-do (KR)

(73) Assignee: DuPont Specialty Materials Korea Ltd. (KR)

( * ) Notice: Subject to any disclaimer, the term of this patent is extended or adjusted under 35 U.S.C. 154(b) by 15 days.

This patent is subject to a terminal disclaimer.

(21) Appl. No.: 17/272,620

(22) PCT Filed: Aug. 28, 2019

(86) PCT No.: PCT/KR2019/010977

§ 371 (c)(1),
(2) Date: Mar. 1, 2021

(87) PCT Pub. No.: WO2020/045976

PCT Pub. Date: Mar. 5, 2020

(65) Prior Publication Data

US 2021/0359216 A1 Nov. 18, 2021

(30) Foreign Application Priority Data

Aug. 29, 2018 (KR) ........................ 10-2018-0101717
Aug. 23, 2019 (KR) ........................ 10-2019-0103829

(51) Int. Cl.

| | |
|---|---|
| ***H10K 85/60*** | (2023.01) |
| ***H10K 50/11*** | (2023.01) |
| ***H10K 101/00*** | (2023.01) |
| ***H10K 101/10*** | (2023.01) |

(52) U.S. Cl.

CPC ......... *H10K 85/654* (2023.02); *H10K 85/622* (2023.02); *H10K 85/624* (2023.02); *H10K 85/626* (2023.02); *H10K 85/633* (2023.02); *H10K 85/6572* (2023.02); *H10K 85/6574* (2023.02); *H10K 85/6576* (2023.02); *H10K 50/11* (2023.02); *H10K 2101/10* (2023.02); *H10K 2101/90* (2023.02)

(58) Field of Classification Search

CPC ........ H01L 2251/5384; H10K 2201/90; H10K 85/622; H10K 2101/90

See application file for complete search history.

(56) References Cited

U.S. PATENT DOCUMENTS

2009/0286772 A1 11/2009 Chau et al.
2014/0231769 A1* 8/2014 Nishimura .......... H01L 51/0056 257/40
2017/0104163 A1 4/2017 Lee et al.
2018/0033975 A1 2/2018 Kim et al.
2018/0208837 A1* 7/2018 Ahn .................... H01L 51/0074
2018/0323397 A1 11/2018 Ahn et al.
2019/0207125 A1 7/2019 Ahn et al.
2019/0221751 A1 7/2019 Cho et al.
2019/0393427 A1 12/2019 Moon et al.

FOREIGN PATENT DOCUMENTS

KR 2017022865 A * 3/2017 .......... C07D 251/12

OTHER PUBLICATIONS

Search Report from KIPO for Korean application No. 10-2019-0103829; Application Date: Aug. 23, 2019.
Search Report from KIPO for Korean application No. 20190103829; Application Date: Aug. 23, 2019.

* cited by examiner

*Primary Examiner* — Sean M DeGuire
(74) *Attorney, Agent, or Firm* — G. Creston Campbell

(57) ABSTRACT

The present disclosure relates to a plurality of host materials comprising a first host material comprising a compound represented by formula 1, and a second host material comprising a compound represented by formula 2, and an organic electroluminescent device comprising the same. By comprising a specific combination of compounds as a host material, it is possible to provide an organic electroluminescent device having higher luminous efficiency and/or improved lifespan characteristics compared to conventional organic electroluminescent devices.

6 Claims, No Drawings

PLURALITY OF HOST MATERIALS AND ORGANIC ELECTROLUMINESCENT DEVICE COMPRISING THE SAME

TECHNICAL FIELD

The present disclosure relates to a plurality of host materials and an organic electroluminescent device comprising the same.

BACKGROUND ART

In 1987, Tang et al. of Eastman Kodak first developed a small molecule green organic electroluminescent device (OLED) of TPD/Alq3 bilayer consisting of a light-emitting layer and a charge transport layer. Since then, the research on an OLED has been rapidly carried out, and it has been commercialized. At present, phosphorescent materials, which provide excellent luminous efficiency in realizing panels, are mainly used in organic electroluminescent devices. In applications such as TV, lighting, problems of insufficient lifespan of an OLED are confronted, and a high efficiency of an OLED is still required. Generally, the higher the luminance of an OLED is, the shorter the lifespan of an OLED is. Hence, OLEDs having high luminous efficiency and/or long lifespan are required for long periods of uses and high resolution of displays.

In order to enhance luminous efficiency, driving voltage and/or lifespan, various materials or concepts for an organic layer of an organic electroluminescent device have been proposed. However, they were not satisfactory to use practically.

Korean Patent Application Laying-Open No. 10-2017-0022865 discloses an organic electroluminescent device using phenanthro oxazole and phenanthro thiazole compounds as a host. However, said reference does not specifically disclose an organic electroluminescent device using the specific combination of the plurality of host materials of the present disclosure, and development of a host material for improving performances of an OLED is still required.

DISCLOSURE OF INVENTION

Technical Problem

The objective of the present disclosure is to provide an organic electroluminescent device having high luminous efficiency and/or improved lifespan characteristics by comprising a plurality of host materials comprising a specific combination of compounds.

Solution to Problem

By focusing on the tendency that a compound having a phenanthro oxazole or phenanthro thiazole core has unusually low LUMO (lowest unoccupied molecular orbital) energy level compared to general hole-type hosts, the present inventors studied hole-type hosts which can form a suitable energy gap with the compound. As a result, the present inventors found that when using a combination of a compound represented by the following formula 1 and a compound represented by the following formula 2 in a light-emitting layer, hole and electron characteristics are balanced due to suitable HOMO and LUMO energy levels, and therefore provide an OLED having higher luminous efficiency and/or longer lifespan characteristics compared to conventional OLEDs can be provided.

Specifically, the present inventors found that the objective above can be achieved by a plurality of host materials comprising a first host material comprising a compound represented by the following formula 1, and a second host material comprising a compound represented by the following formula 2:

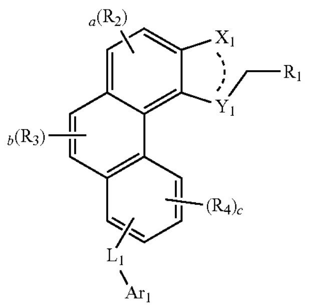

(1)

wherein $X_1$ and $Y_1$ each independently represent —N═, —$NR_5$—, —O— or —S—, with a proviso that one of $X_1$ and $Y_1$ is —N═, and the other is —$NR_5$—, —O— or —S—;

$L_1$ represents a single bond, or a substituted or unsubstituted (C6-C30)arylene;

$Ar_1$ represents a substituted or unsubstituted (C6-C60) aryl, a substituted or unsubstituted (3- to 30-membered) heteroaryl, a substituted or unsubstituted mono- or di-(C1-C30)alkylamino, a substituted or unsubstituted mono- or di-(C6-C30)arylamino, a substituted or unsubstituted (C6-C30)aryl(3- to 30-membered)heteroarylamino, or a substituted or unsubstituted (C1-C30)alkyl(C6-C30)arylamino;

$R_1$ represents a substituted or unsubstituted (C6-C30)aryl, or a substituted or unsubstituted (3- to 30-membered) heteroaryl;

$R_2$ to $R_5$ each independently represent hydrogen, deuterium, a halogen, a cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl (C6-C30)arylamino; or adjacent substituents may be linked to each other to form a ring(s);

a and b each independently represent 1 or 2, and c represents an integer of 1 to 3, where if a to c are an integer of 2 or more, each $R_2$ to each $R_4$ may be the same or different;

$$HAr—(L_2—Ar_2)_d \quad (2)$$

wherein

HAr represents a substituted or unsubstituted nitrogen-containing (3- to 20-membered)heteroaryl;

$L_2$ represents a single bond, or a substituted or unsubstituted (C6-C30)arylene;

$Ar_2$ represents a substituted or unsubstituted (C6-C30) aryl, or is represented by the following formula 3 or formula 4;

(3)

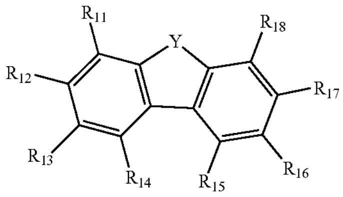

(4)

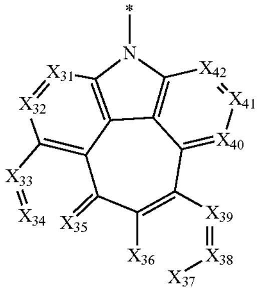

Y represents O, S, N—*, or $NR_{21}$;

$R_{21}$ represents a substituted or unsubstituted (C6-C30) aryl;

$R_{11}$ to $R_{18}$ each independently are a bonding site with $L_2$; or represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30) arylsilyl, a substituted or unsubstituted tri(C6-C30) arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or may be linked to an adjacent substituent to form a ring(s);

$X_{31}$ to $X_{42}$ each independently represent N or $CR_a$;

$R_a$ each independently represents hydrogen, deuterium, a halogen, a cyano, a substituted or unsubstituted (C1-C30)alkyl, a substituted or unsubstituted (C6-C30)aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di- (C1-C30)alkylamino, a substituted or unsubstituted mono- or di-(C6-C30)arylamino, or a substituted or unsubstituted (C1-C30)alkyl (C6-C30)arylamino; or may be linked to an adjacent substituent to form a ring(s);

d represents an integer of 1 to 3, where if d is an integer of 2 or more, each ($L_2$-$Ar_2$) may be the same or different; and

* represents a bonding site.

Advantageous Effects of Invention

By comprising the plurality of host materials of the present disclosure, an organic electroluminescent device having higher luminous efficiency and/or improved lifespan characteristics compared to conventional organic electroluminescent devices can be provided, and a display device or a lighting device using the organic electroluminescent device can be manufactured.

Mode for the Invention

Hereinafter, the present disclosure will be described in detail. However, the following description is intended to explain the disclosure, and is not meant in any way to restrict the scope of the disclosure.

The term “organic electroluminescent material” in the present disclosure means a material that may be used in an organic electroluminescent device, and may comprise at least one compound. The organic electroluminescent material may be comprised in any layer constituting an organic electroluminescent device, as necessary. For example, the organic electroluminescent material may be a hole injection material, a hole transport material, a hole auxiliary material, a light-emitting auxiliary material, an electron blocking material, a light-emitting material (comprising a host material and a dopant material), an electron buffer material, a hole blocking material, an electron transport material, an electron injection material, etc.

The term “a plurality of organic electroluminescent materials” in the present disclosure means an organic electroluminescent material comprising a combination of at least two compounds, which may be comprised in any layer constituting an organic electroluminescent device. It may mean both a material before being comprised in an organic electroluminescent device (for example, before vapor deposition) and a material after being comprised in an organic electroluminescent device (for example, after vapor deposition). For example, a plurality of organic electroluminescent materials may be a combination of at least two compounds, which may be comprised in at least one layer of a hole injection layer, a hole transport layer, a hole auxiliary layer, a light-emitting auxiliary layer, an electron blocking layer, a light-emitting layer, an electron buffer layer, a hole blocking layer, an electron transport layer, and an electron injection layer. Such at least two compounds may be comprised in the same layer or different layers by a used method in the field, and, for example, may be mixture-evaporated or co-evaporated, or may be individually evaporated.

The term “a plurality of host materials” in the present disclosure means a host material comprising a combination of at least two compounds, which may be comprised in any light-emitting layer constituting an organic electroluminescent device. It may mean both a material before being comprised in an organic electroluminescent device (for example, before vapor deposition) and a material after being comprised in an organic electroluminescent device (for example, after vapor deposition). For example, a plurality of host materials of the present disclosure may be a combination of at least two host materials, and selectively, conventional materials comprised in organic electroluminescent materials may be additionally comprised.

A plurality of host materials of the present disclosure may be comprised in any light-emitting layer constituting an organic electroluminescent device, and the at least two compounds comprised in the plurality of host materials of the present disclosure may be comprised together in one light-emitting layer, or may each be comprised in separate light-emitting layers by a method known in the field. For example, the at least two compounds may be mixture-evaporated or co-evaporated, or may be individually evaporated.

Herein, the term "(C1-C30)alkyl" is meant to be a linear or branched alkyl(ene) having 1 to 30 carbon atoms constituting the chain, in which the number of carbon atoms is preferably 1 to 20, and more preferably 1 to 10. The above alkyl may include methyl, ethyl, n-propyl, isopropyl, n-butyl, isobutyl, tert-butyl, etc. The term "(C2-C30)alkenyl" is meant to be a linear or branched alkenyl having 2 to 30 carbon atoms constituting the chain, in which the number of carbon atoms is preferably 2 to 20, and more preferably 2 to 10. The above alkenyl may include vinyl, 1-propenyl, 2-propenyl, 1-butenyl, 2-butenyl, 3-butenyl, 2-methylbut-2-enyl, etc. The term "(C2-C30)alkynyl" is meant to be a linear or branched alkynyl having 2 to 30 carbon atoms constituting the chain, in which the number of carbon atoms is preferably 2 to 20, and more preferably 2 to 10. The above alkynyl may include ethynyl, 1-propynyl, 2-propynyl, 1-butynyl, 2-butynyl, 3-butynyl, 1-methylpent-2-ynyl, etc. The term "(C3-C30)cycloalkyl" is meant to be a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, etc. The term "(3- to 7-membered) heterocycloalkyl" is meant to be a cycloalkyl having 3 to 7, preferably 5 to 7, ring backbone atoms, and including at least one heteroatom selected from the group consisting of B, N, O, S, Si, and P, and preferably the group consisting of O, S, and N. The above heterocycloalkyl may include tetrahydrofuran, pyrrolidine, thiolan, tetrahydropyran, etc. The term "(C6-C60)aryl(ene)" is meant to be a monocyclic or fused ring radical derived from an aromatic hydrocarbon having 6 to 60 ring backbone carbon atoms, in which the number of the ring backbone carbon atoms is preferably 6 to 30. The above aryl(ene) may be partially saturated, and may comprise a spiro structure. The above aryl may include phenyl, biphenyl, terphenyl, naphthyl, binaphthyl, phenylnaphthyl, naphthylphenyl, phenylterphenyl, fluorenyl, phenylfluorenyl, benzofluorenyl, dibenzofluorenyl, phenanthrenyl, phenylphenanthrenyl, anthracenyl, indenyl, triphenylenyl, pyrenyl, tetracenyl, perylenyl, chrysenyl, naphthacenyl, fluoranthenyl, spirobifluorenyl, etc. More specifically, the above aryl may include a phenyl group, a 1-naphthyl group, a 2-naphthyl group, a 1-anthryl group, a 2-anthryl group, a 9-anthryl group, a benzanthryl group, a 1-phenanthryl group, a 2-phenanthryl group, a 3-phenanthryl group, a 4-phenanthryl group, a 9-phenanthryl group, a naphthacenyl group, a pyrenyl group, a 1-chrysenyl group, a 2-chrysenyl group, a 3-chrysenyl group, a 4-chrysenyl group, a 5-chrysenyl group, a 6-chrysenyl group, a benzo[c]phenanthryl group, a benzo[g]chrysenyl group, a 1-triphenylenyl group, a 2-triphenylenyl group, a 3-triphenylenyl group, a 4-triphenylenyl group, a 1-fluorenyl group, a 2-fluorenyl group, a 3-fluorenyl group, a 4-fluorenyl group, a 9-fluorenyl group, a benzofluorenyl group, a dibenzofluorenyl group, a 2-biphenylyl group, a 3-biphenylyl group, a 4-biphenylyl group, an o-terphenyl group, an m-terphenyl-4-yl group, an m-terphenyl-3-yl group, an m-terphenyl-2-yl group, a p-terphenyl-4-yl group, a p-terphenyl-3-yl group, a p-terphenyl-2-yl group, an m-quaterphenyl group, a 3-fluoranthenyl group, a 4-fluoranthenyl group, an 8-fluoranthenyl group, a 9-fluoranthenyl group, a benzofluoranthenyl group, an o-tolyl group, an m-tolyl group, a p-tolyl group, a 2,3-xylyl group, a 3,4-xylyl group, a 2,5-xylyl group, a mesityl group, an o-cumenyl group, an m-cumenyl group, a p-cumenyl group, a p-t-butylphenyl group, a p-(2-phenylpropyl)phenyl group, a 4'-methylbiphenylyl group, a 4"-t-butyl-p-terphenyl-4-yl group, a 9,9-dimethyl-1-fluorenyl group, a 9,9-dimethyl-2-fluorenyl group, a 9,9-dimethyl-3-fluorenyl group, a 9,9-dimethyl-4-fluorenyl group, a 9,9-diphenyl-1-fluorenyl group, a 9,9-diphenyl-2-fluorenyl group, a 9,9-diphenyl-3-fluorenyl group, a 9,9-diphenyl-4-fluorenyl group, etc.

The term "(3- to 30-membered)heteroaryl(ene)" is meant to be an aryl having 3 to 30 ring backbone atoms, and including at least one, preferably 1 to 4 heteroatoms selected from the group consisting of B, N, O, S, Si, and P. The above heteroaryl(ene) may be a monocyclic ring, or a fused ring condensed with at least one benzene ring; may be partially saturated; may be one formed by linking at least one heteroaryl or aryl group to a heteroaryl group via a single bond(s); and may comprise a spiro structure. The above heteroaryl may include a monocyclic ring-type heteroaryl such as furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, and pyridazinyl, and a fused ring-type heteroaryl such as benzofuranyl, benzothiophenyl, isobenzofuranyl, dibenzofuranyl, dibenzothiophenyl, benzonaphthofuranyl, benzonaphthothiophenyl, diazadibenzofuranyl, benzimidazolyl, benzothiazolyl, benzoisothiazolyl, benzoisoxazolyl, benzoxazolyl, isoindolyl, indolyl, benzoindolyl, indazolyl, benzothiadiazolyl, quinolyl, benzoquinolyl, isoquinolyl, benzoisoquinolyl, cinnolinyl, quinazolinyl, benzoquinazolinyl, quinoxalinyl, benzoquinoxalinyl, naphthyridinyl, triazanaphthyl, benzothienopyrimidinyl, carbazolyl, benzocarbazolyl, dibenzocarbazolyl, phenoxazinyl, phenothiazinyl, phenanthridinyl, benzodioxolyl, dihydroacridinyl, etc. More specifically, the above heteroaryl may include a 1-pyrrolyl group, a 2-pyrrolyl group, a 3-pyrrolyl group, a pyrazinyl group, a 2-pyridinyl group, a 2-pyrimidinyl group, a 4-pyrimidinyl group, a 5-pyrimidinyl group, a 6-pyrimidinyl group, a 1,2,3-triazin-4-yl group, a 1,2,4-triazin-3-yl group, a 1,3,5-triazin-2-yl group, a 1-imidazolyl group, a 2-imidazolyl group, a 1-pyrazolyl group, a 1-indolidinyl group, a 2-indolidinyl group, a 3-indolidinyl group, a 5-indolidinyl group, a 6-indolidinyl group, a 7-indolidinyl group, an 8-indolidinyl group, a 2-imidazopyridinyl group, a 3-imidazopyridinyl group, a 5-imidazopyridinyl group, a 6-imidazopyridinyl group, a 7-imidazopyridinyl group, an 8-imidazopyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a 2-quinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, a 7-isoquinolyl group, an 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, an azacarbazolyl-1-yl group, an azacarbazolyl-2-yl group, an azacarbazolyl-3-yl group, an azacarbazolyl-4-yl group, an azacarbazolyl-5-yl group, an azacarbazolyl-6-yl group, an azacarbazolyl-7-yl group, an azacarbazolyl-8-yl group, an azacarbazolyl-9-yl group, a 1-phenanthridinyl group, a 2-phenanthridinyl group, a 3-phenanthridinyl group, a 4-phenanthridinyl group, a 6-phenanthridinyl group, a 7-phenanthridinyl group, an 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrol-1-yl group, a 2-methylpyrrol-3-yl group, a 2-methylpyrrol-4-yl group, a 2-methylpyrrol-5-yl group, a 3-methylpyrrol-1-yl group, a 3-methylpyrrol-2-yl group, a 3-methylpyrrol-4-yl group, a 3-methylpyrrol-5-yl group, a 2-t-butylpyrrol-4-yl group, a 3-(2-phenylpropyl)pyrrol-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, a 4-t-butyl-3-indolyl group, a 1-dibenzofuranyl group, a 2-dibenzofuranyl group, a 3-dibenzofuranyl group, a 4-dibenzofuranyl group, a 1-dibenzothiophenyl group, a 2-dibenzothiophenyl group, a 3-dibenzothiophenyl group, a 4-dibenzothiophenyl group, a 1-silafluorenyl group, a 2-silafluorenyl group, a 3-silafluorenyl group, a 4-silafluorenyl group, a 1-germafluorenyl group, a 2-germafluorenyl group, a 3-germafluorenyl group, and a 4-germafluorenyl group. Furthermore, "halogen" includes F, Cl, Br, and I.

Herein, "substituted" in the expression "substituted or unsubstituted" means that a hydrogen atom in a certain functional group is replaced with another atom or functional group, i.e., a substituent. The substituents of the substituted alkyl, the substituted aryl, the substituted arylene, the substituted heteroaryl, the substituted nitrogen-containing heteroaryl, the substituted cycloalkyl, the substituted alkoxy, the substituted trialkylsilyl, the substituted dialkylarylsilyl, the substituted alkyldiarylsilyl, the substituted triarylsilyl, the substituted mono- or di-alkylamino, the substituted mono- or di-arylamino, the substituted arylheteroarylamino, and the substituted alkylarylamino in the formulas of the present disclosure each independently are at least one selected from the group consisting of deuterium; a halogen; a cyano; a carboxyl; a nitro; a hydroxyl; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (3- to 30-membered)heteroaryl unsubstituted or substituted with a (C6-C30)aryl(s); a (C6-C30)aryl unsubstituted or substituted with at least one of a (C1-C30)alkyl(s) and a (3- to 30-membered)heteroaryl(s); a tri(C1-C30)alkylsilyl; a tri(C6-C30)arylsilyl; a di(C1-C30)alkyl(C6-C30)arylsilyl; a (C1-C30)alkyldi(C6-C30)arylsilyl; an amino; a mono- or di-(C1-C30)alkylamino; a mono- or di-(C6-C30)arylamino; a (C1-C30)alkyl(C6-C30)arylamino; a (C1-C30)alkylcarbonyl; a (C1-C30)alkoxycarbonyl; a (C6-C30)arylcarbonyl; a di(C6-C30)arylboronyl; a di(C1-C30)alkylboronyl; a (C1-C30)alkyl(C6-C30)arylboronyl; a (C6-C30)aryl(C1-C30)alkyl; and a (C1-C30)alkyl(C6-C30)aryl. Preferably, the substituents each independently are at least one selected from the group consisting of a (C1-C10)alkyl; a (C6-C20)aryl; a (3- to 20-membered)heteroaryl unsubstituted or substituted with a (C6-C20)aryl(s); and a di(C6-C20)arylamino. More preferably, the substituents each independently are at least one selected from the group consisting of a (C1-C6)alkyl; a (C6-C12)aryl; a (5- to 15-membered)heteroaryl unsubstituted or substituted with a (C6-C12)aryl(s); and a di(C6-C12)arylamino. For example, the substituents may be at least one of a methyl, a phenyl, a naphthyl, a carbazolyl, a phenylquinoxalinyl, and a diphenylamino.

In the formulas of the present disclosure, if adjacent substituents are linked to each other to form a ring, the ring may be a substituted or unsubstituted, mono- or polycyclic, (3- to 30-membered) alicyclic or aromatic ring, or the combination thereof which is formed by the linkage of two or more adjacent substituents, in which the formed ring may contain at least one heteroatom selected from B, N, O, S, Si, and P, preferably N. O, and S. According to one embodiment of the present disclosure, the number of the ring backbone atoms is 5 to 20, and according to another embodiment of the present disclosure, the number of the ring backbone atoms is 5 to 15. For example, the fused ring may be a substituted or unsubstituted dibenzothiophene ring, a substituted or unsubstituted dibenzofuran ring, a substituted or unsubstituted naphthalene ring, a substituted or unsubstituted phenanthrene ring, a substituted or unsubstituted fluorene ring, a substituted or unsubstituted benzothiophene ring, a substituted or unsubstituted benzofuran ring, a substituted or unsubstituted indole ring, a substituted or unsubstituted indene ring, a substituted or unsubstituted benzene ring, or a substituted or unsubstituted carbazole ring.

In the formulas of the present disclosure, the heteroaryl or heteroarylene may each independently contain at least one heteroatom selected from B, N, O, S, Si, and P. In addition, the heteroatom may be bonded to at least one selected from the group consisting of hydrogen, deuterium, a halogen, a cyano, a substituted or unsubstituted (C1-C30)alkyl, a substituted or unsubstituted (C6-C30)aryl, a substituted or unsubstituted (5- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, and a substituted or unsubstituted (C1-C30)alkyl(C6-C30)arylamino.

Hereinafter, the compounds represented by formulas 1 and 2 will be described in detail.

In formula 1, $X_1$ and $Y_1$ each independently represent —N═, —$NR_5$—, —O— or —S—, with a proviso that one of $X_1$ and $Y_1$ is —N═, and the other is —$NR_5$—, —O— or —S—. According to one embodiment of the present disclosure, one of $X_1$ and $Y_1$ is —N═, and the other is —O— or —S—.

In formula 1, $L_1$ represents a single bond, or a substituted or unsubstituted (C6-C30)arylene. According to one embodiment of the present disclosure, $L_1$ represents a single bond, or a substituted or unsubstituted (C6-C15)arylene. According to another embodiment of the present disclosure, $L_1$ represents a single bond or an unsubstituted (C6-C15)

arylene. Specifically, $L_1$ may represent a single bond, a phenylene, a naphthylene, a biphenylene, etc.

In formula 1, $Ar_1$ represents a substituted or unsubstituted (C6-C60)aryl, a substituted or unsubstituted (3- to 30-membered)heteroaryl, a substituted or unsubstituted mono- or di-(C1-C30)alkylamino, a substituted or unsubstituted mono- or di-(C6-C30)arylamino, a substituted or unsubstituted (C6-C30)aryl(3- to 30-membered)heteroarylamino, or a substituted or unsubstituted (C1-C30)alkyl(C6-C30)arylamino. According to one embodiment of the present disclosure, $Ar_1$ represents a substituted or unsubstituted (C6-C30)aryl, a substituted or unsubstituted (10- to 30-membered)heteroaryl, a substituted or unsubstituted di(C6-C25)arylamino, or a substituted or unsubstituted (C6-C18)aryl(5- to 15-membered)heteroarylamino. According to another embodiment of the present disclosure, $Ar_1$ represents a (C6-C30)aryl unsubstituted or substituted with a (C1-C6)alkyl(s), an unsubstituted (10- to 30-membered) heteroaryl, a di(C6-C25)arylamino unsubstituted or substituted with a (C1-C6)alkyl(s) and/or a (C6-C12)aryl(s), or a (C6-C18)aryl(5- to 15-membered)heteroarylamino unsubstituted or substituted with a (C6-C12)aryl(s). Specifically, $Ar_1$ may represent a substituted or unsubstituted phenyl, a substituted or unsubstituted naphthyl, a substituted or unsubstituted biphenyl, a substituted or unsubstituted naphthylphenyl, a substituted or unsubstituted phenylnaphthyl, a substituted or unsubstituted terphenyl, a substituted or unsubstituted phenanthrenyl, a substituted or unsubstituted benzophenanthrenyl, a substituted or unsubstituted chrysenyl, a substituted or unsubstituted fluoranthenyl, a substituted or unsubstituted fluorenyl, a substituted or unsubstituted benzofluorenyl, a substituted or unsubstituted triphenylenyl, a substituted or unsubstituted spirobifluorenyl, a substituted or unsubstituted spiro[cyclopentane-fluorene]yl, a substituted or unsubstituted spiro[indane-fluorene]yl, a substituted or unsubstituted spiro[fluorene-benzofluorene]yl, a substituted or unsubstituted nitrogen-containing 23-membered heteroaryl, a substituted or unsubstituted diphenylamino, a substituted or unsubstituted phenylbiphenylamino, a substituted or unsubstituted phenylnaphthylamino, a substituted or unsubstituted phenytterphenylamino, a substituted or unsubstituted phenylfluorenylamino, a substituted or unsubstituted naphthylbiphenylamino, a substituted or unsubstituted naphthylterphenylamino, a substituted or unsubstituted naphthylphenanthrenylamino, a substituted or unsubstituted dinaphthylamino, a substituted or unsubstituted dibiphenylamino, a substituted or unsubstituted biphenylfluorenylamino, a substituted or unsubstituted difluorenylamino, a substituted or unsubstituted phenylcarbazolylamino, a substituted or unsubstituted phenyldibenzofuranylamino, a substituted or unsubstituted biphenyldibenzofuranylamino, or a substituted or unsubstituted biphenyldibenzothiophenylamino, etc.

In formula 1, $R_1$ represents a substituted or unsubstituted (C6-C30)aryl, or a substituted or unsubstituted (3- to 30-membered)heteroaryl. According to one embodiment of the present disclosure. $R_1$ represents a substituted or unsubstituted (C6-C15)aryl, or a substituted or unsubstituted (5- to 15-membered)heteroaryl. According to another embodiment of the present disclosure, $R_1$ represents an unsubstituted (C6-C15)aryl, or an unsubstituted (5- to 15-membered) heteroaryl. Specifically, $R_1$ may represent a phenyl, a biphenyl, a pyridyl, a quinolyl, an isoquinolyl, etc.

In formula 1, $R_2$ to $R_5$ each independently represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30) cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30) arylamino, or a substituted or unsubstituted (C1-C30)alkyl (C6-C30)arylamino; or adjacent substituents may be linked to each other to form a ring(s). For example, two $R_2$'s, two $R_3$'s, two $R_4$'s, $R_2$ and $R_3$, $R_3$ and $R_4$, $R_5$ and $R_2$, and/or $R_5$ and $R_4$ may be linked to each other to form a ring(s). According to one embodiment of the present disclosure, $R_2$ to $R_5$ may each independently represent hydrogen.

In formula 1, a and b each independently represent 1 or 2, and c represents an integer of 1 to 3, where if a to c are an integer of 2 or more, each $R_2$ to each $R_4$ may be the same or different.

According to one embodiment of the present disclosure, formula 1 may be represented by at least one of the following formulas 1-1 and 1-2.

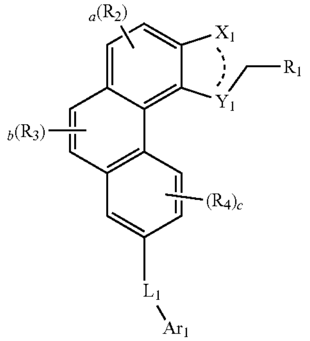

(1-1)

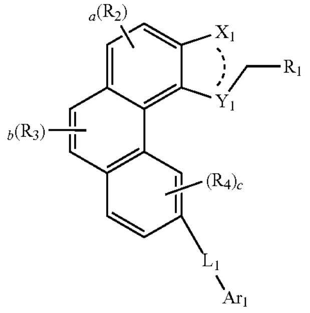

(1-2)

wherein $X_1$, $Y_1$, $L_1$, $Ar_1$, $R_1$ to $R_4$, and a to c are as defined in formula 1.

In formula 2, HAr represents a substituted or unsubstituted nitrogen-containing (3- to 20-membered)heteroaryl. According to one embodiment of the present disclosure, HAr represents a substituted or unsubstituted nitrogen-containing (3- to 15-membered)heteroaryl. Specifically, HAr may represent a pyridyl, a pyrimidinyl, a triazinyl, a quinolyl, a quinazolinyl, a quinoxalinyl, a naphthyridinyl, a pyridopyrazinyl, a benzoquinazolinyl, a benzoquinoxalinyl, a benzofuropyrimidinyl, etc.

In formula 2, $L_2$ represents a single bond, or a substituted or unsubstituted (C6-C30)arylene. According to one embodiment of the present disclosure, $L_2$ represents a single bond, or a substituted or unsubstituted (C6-C20)arylene. According to another embodiment of the present disclosure, $L_2$ represents a single bond or an unsubstituted (C6-C20) arylene. Specifically, $L_2$ may represent a single bond, a phenylene, a naphthylene, a biphenylene, a phenylnaphthylene, a naphthylphenylene, etc.

In formula 2, $Ar_2$ represents a substituted or unsubstituted (C6-C30)aryl, or is represented by formula 3 or 4. According to one embodiment of the present disclosure, $Ar_2$ represents a (C6-C30)aryl substituted with a (C1-C6)alkyl(s); a (C6-C30)aryl substituted with a (5- to 15-membered)heteroaryl substituted with a (C6-C12)aryl(s); a (C6-C30)aryl substituted with a di(C6-C12)arylamino(s); an unsubstituted (C6-C30)aryl; or is represented by formula 3 or 4. Specifically, $Ar_2$ may represent a phenyl, a naphthyl, a biphenyl, a terphenyl, a phenanthrenyl, a triphenylenyl, a dimethylfluorenyl, a diphenylfluorenyl, a dimethylbenzofluorenyl, a diphenylbenzofluorenyl, a phenyl substituted with a phenylquinoxalinyl, a phenyl substituted with a diphenylamino, or formula 3 or 4, etc.

In formula 3, Y represents O, S, N—*, or $NR_{21}$.

In formula 3, $R_{21}$ represents a substituted or unsubstituted (C6-C30)aryl. According to one embodiment of the present disclosure, $R_{21}$ represents a substituted or unsubstituted (C6-C12)aryl. According to another embodiment of the present disclosure, $R_{21}$ represents an unsubstituted (C6-C12) aryl. Specifically, $R_{21}$ may represent a phenyl, etc.

In formula 3, $R_{11}$ to $R_{18}$ each independently are a bonding site with $L_2$; or represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri (C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or may be linked to an adjacent substituent to form a ring(s). According to one embodiment of the present disclosure, $R_{11}$ to $R_{18}$ each independently are a bonding site with $L_2$, or represent hydrogen.

In formula 4, $X_{31}$ to $X_{42}$ each independently represent N or $CR_a$.

$R_a$ each independently represents hydrogen, deuterium, a halogen, a cyano, a substituted or unsubstituted (C1-C30) alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or may be linked to an adjacent substituent to form a ring(s). According to one embodiment of the present disclosure, $R_a$ each independently represents hydrogen, or a substituted or unsubstituted (C6-C12)aryl; or may be linked to an adjacent substituent to form a ring(s). According to another embodiment of the present disclosure, $R_a$ each independently represents hydrogen, or an unsubstituted (C6-C12)aryl; or may be linked to an adjacent substituent to form a ring(s). Specifically, $R_a$ may each independently represent hydrogen, a phenyl, etc., or may be linked to an adjacent substituent to form a benzene ring, etc.

In formula 2, d represents an integer of 1 to 3, where if d is an integer of 2 or more, each ($L_2$-$Ar_2$) may be the same or different.

According to one embodiment of the present disclosure, formula 2 may be represented by at least one of the following formulas 2-1 and 2-2.

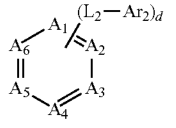

(2-1)

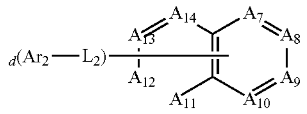

(2-2)

wherein $A_1$ to $A_{14}$ each independently represent $CR_{10}$ or N, with a proviso that at least one of $A_1$ to $A_6$ is N, and at least one of $A_7$ to $A_{14}$ is N;

$R_{10}$ each independently represents hydrogen or -$L_2$-$Ar_2$; or adjacent two $R_{10}$'s may be linked to each other to form a ring(s), and where if a plurality of $R_{10}$ is present, each $R_{10}$ may be the same or different; and $L_2$, $Ar_2$, and d are as defined in formula 2.

The compound represented by formula 1 includes the following compounds, but is not limited thereto.

H-1

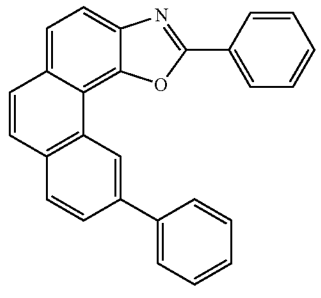

H-2

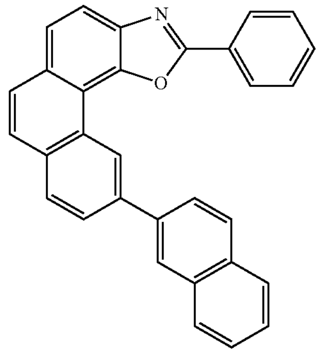

-continued
H-3
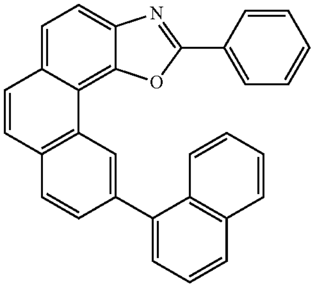
H-4
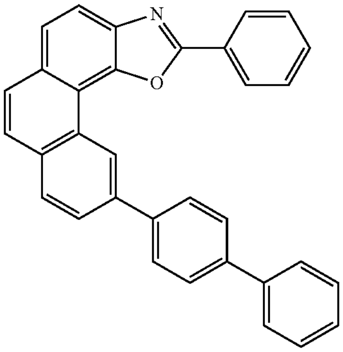
H-5
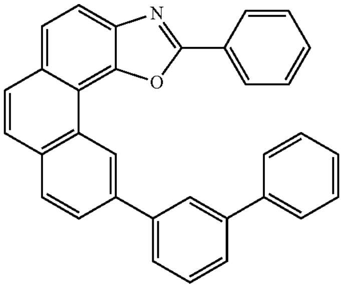
H-6
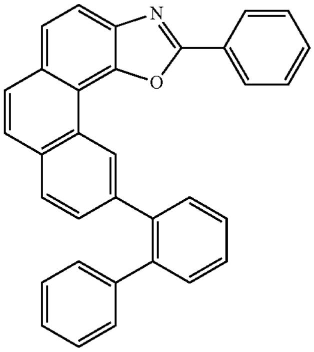
-continued
H-7
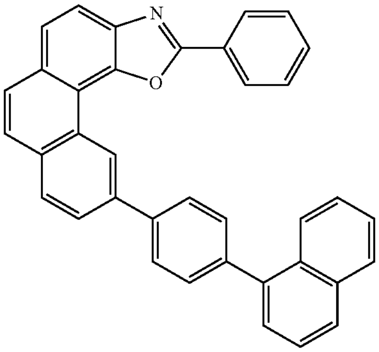
H-8
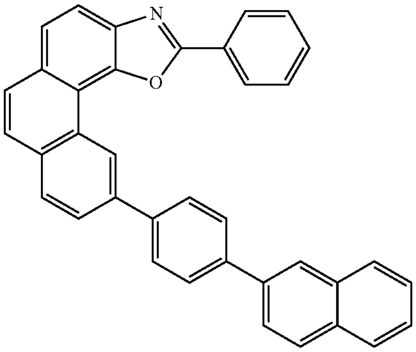
H-9
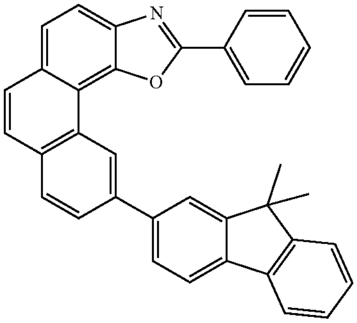
H-10
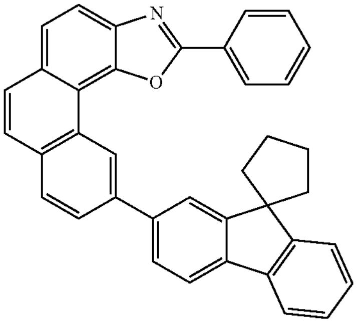

-continued
H-11
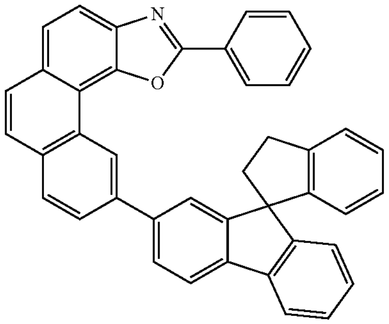
H-12
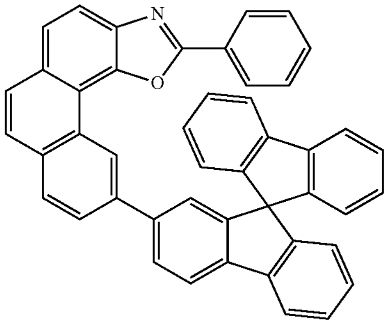
H-13
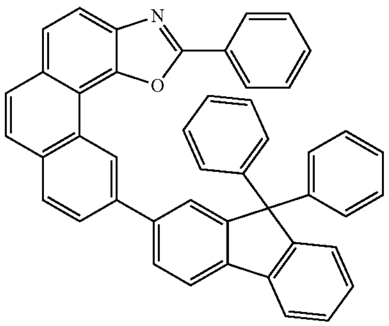
H-14
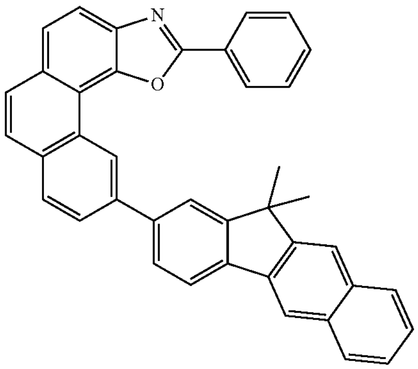
-continued
H-15
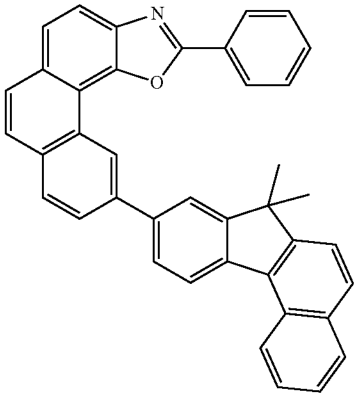
H-16
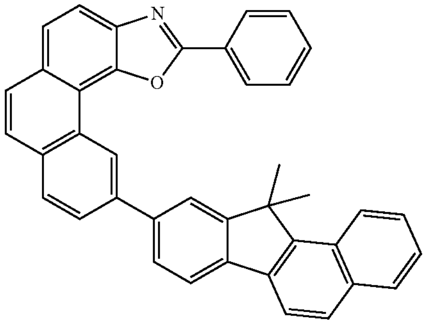
H-17
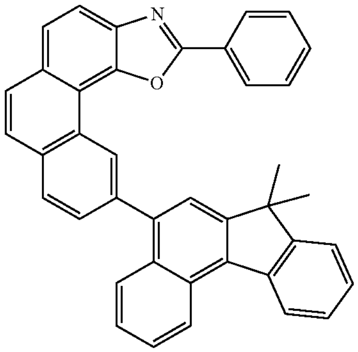
H-18
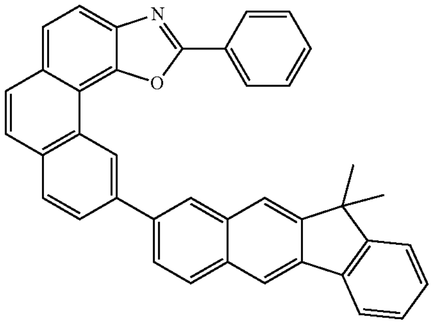

-continued
H-19
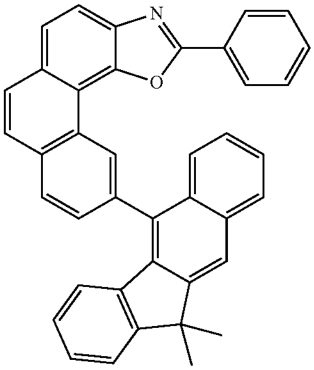
H-20
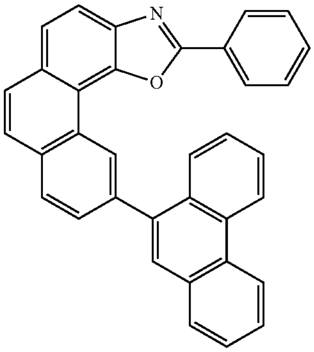
H-21
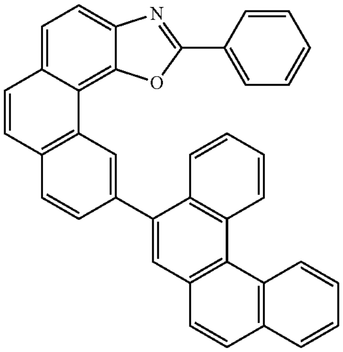
H-22
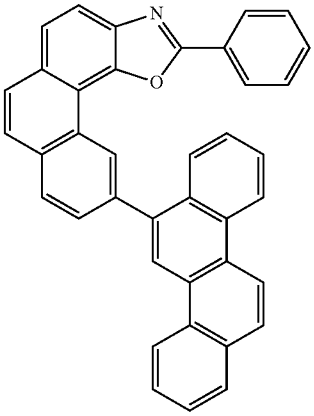
-continued
H-23
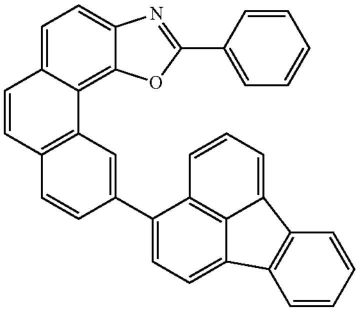
H-24
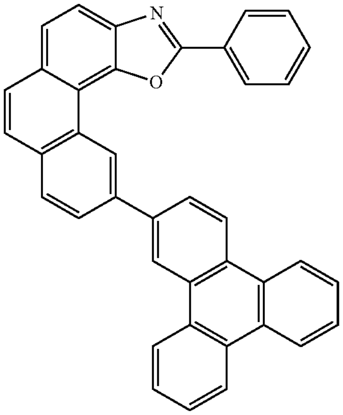
H-25
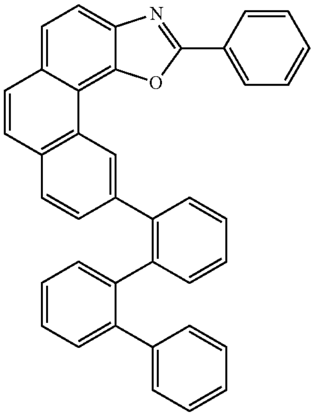
H-26
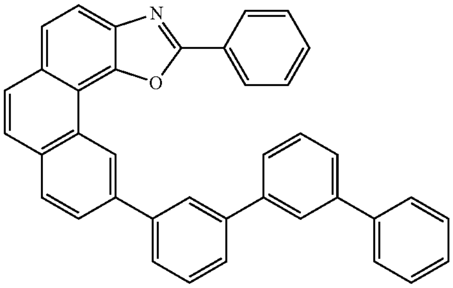

-continued
H-27
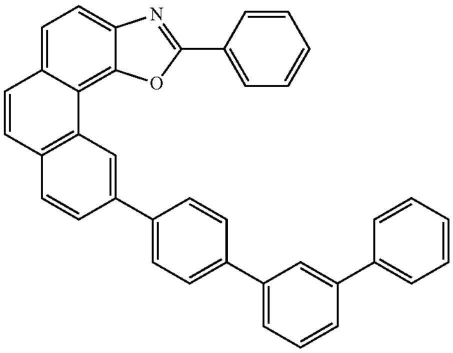
H-28
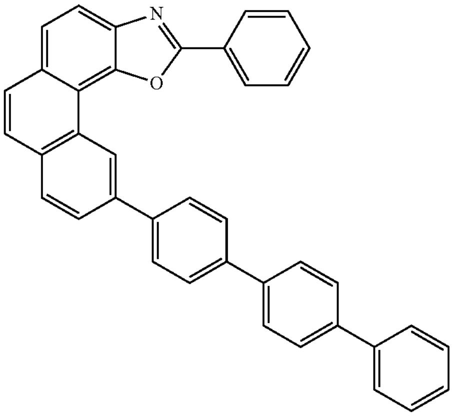
H-29
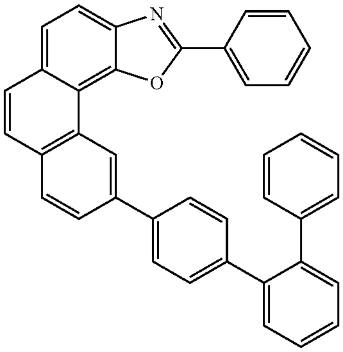
H-30
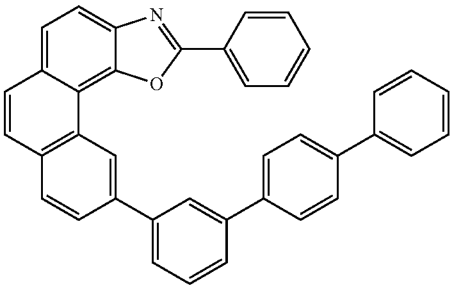
-continued
H-31
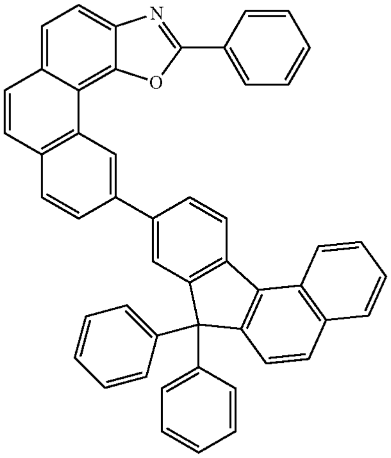
H-32
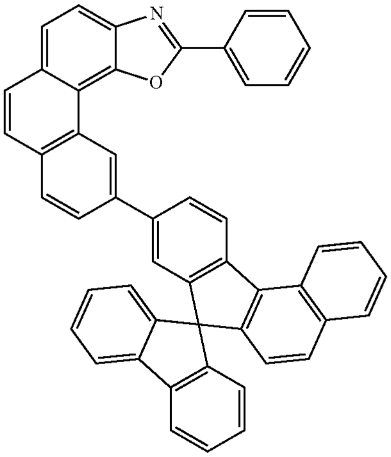
H-33
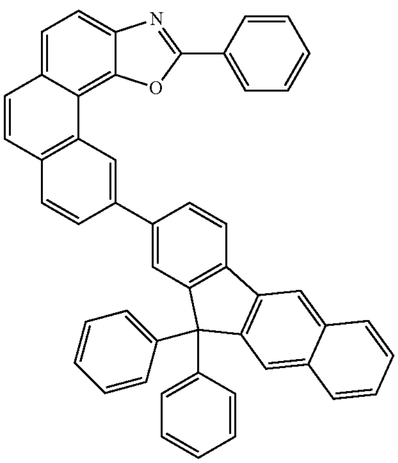

H-34
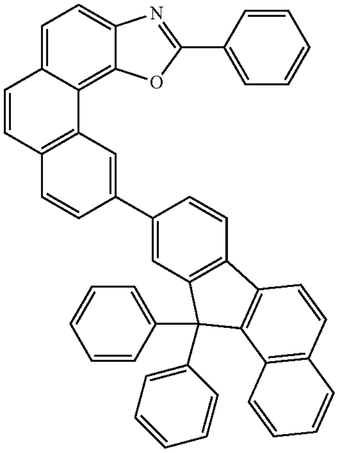
H-35
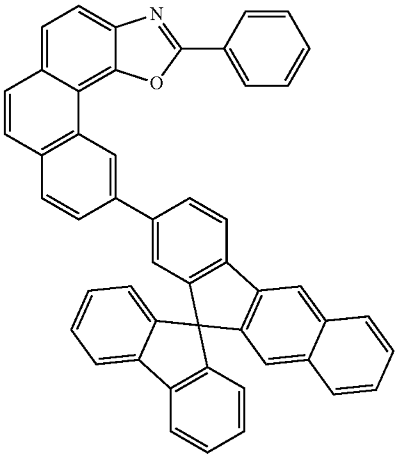
H-36
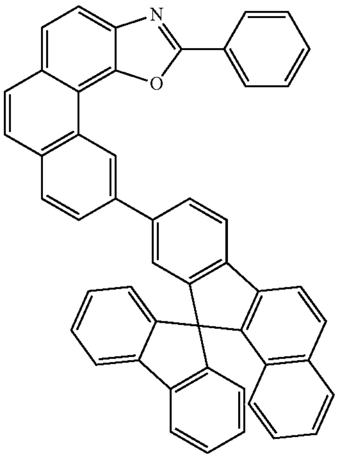
H-37
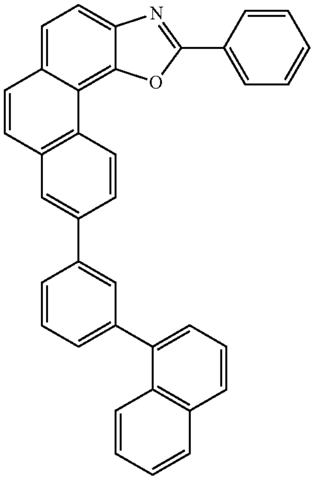
H-38
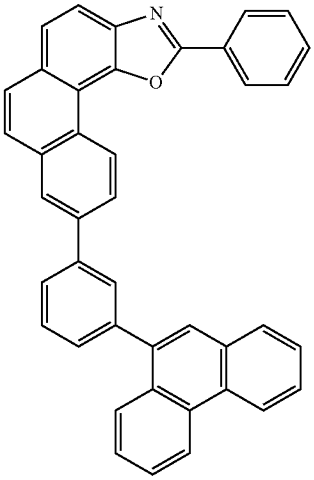
H-39
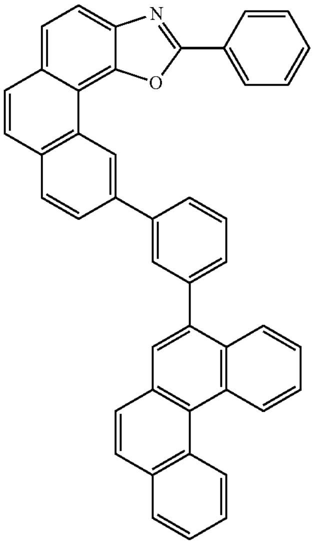

-continued
H-40
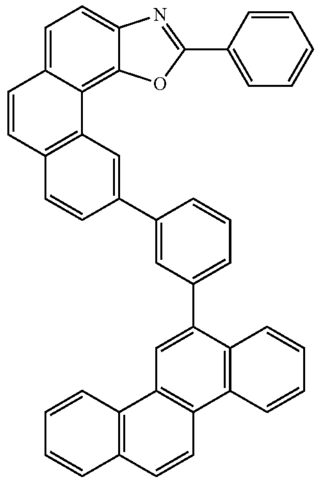
H-41
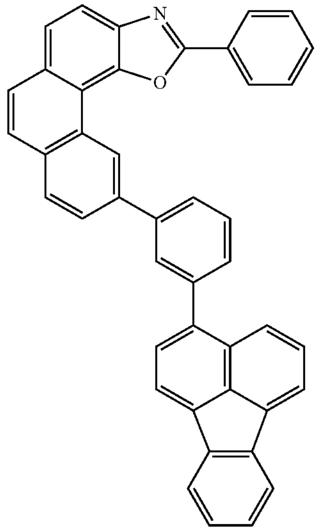
H-42
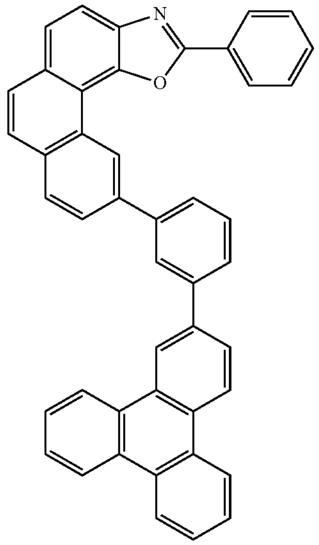
-continued
H-43
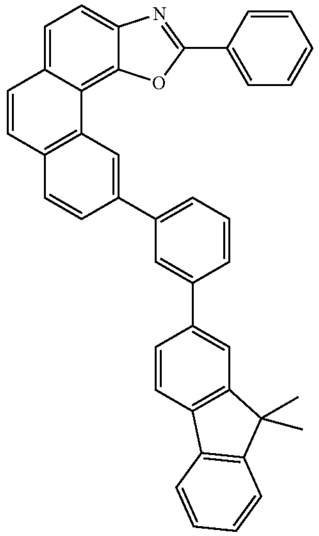
H-44
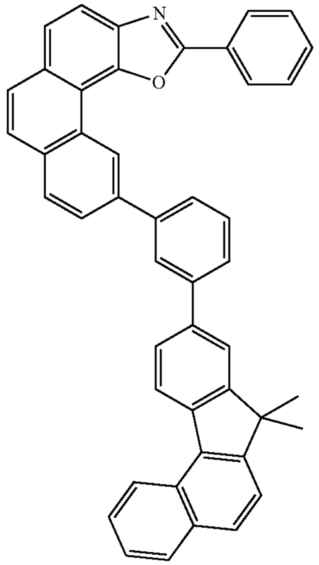

-continued
H-45
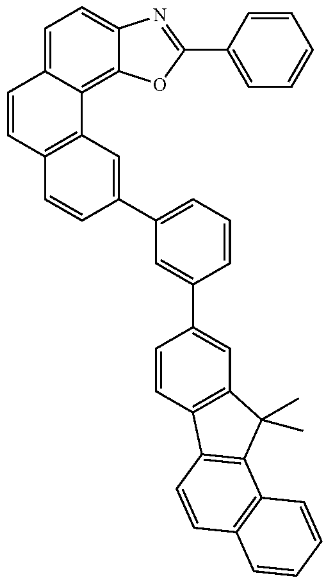
H-46
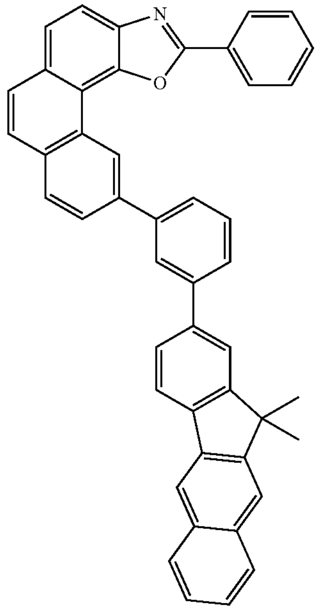
-continued
H-47
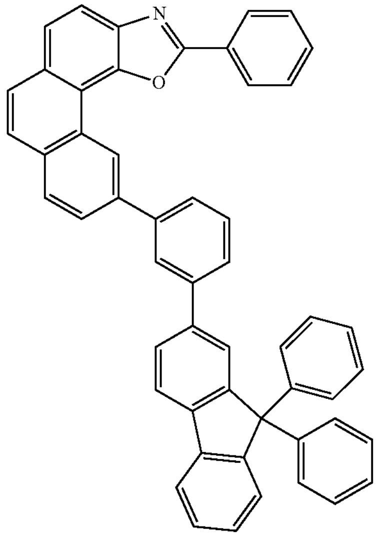
H-48
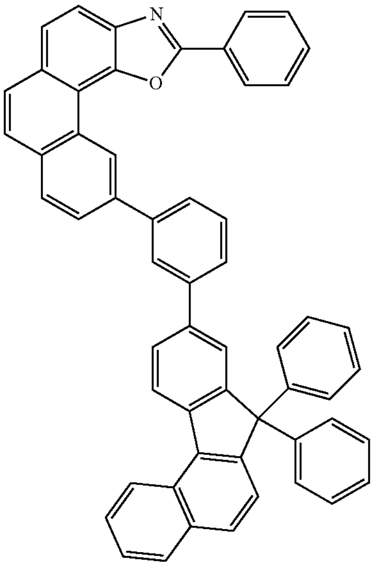

-continued
H-49
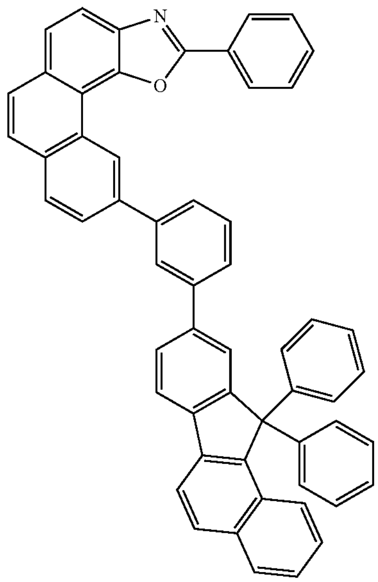
H-50
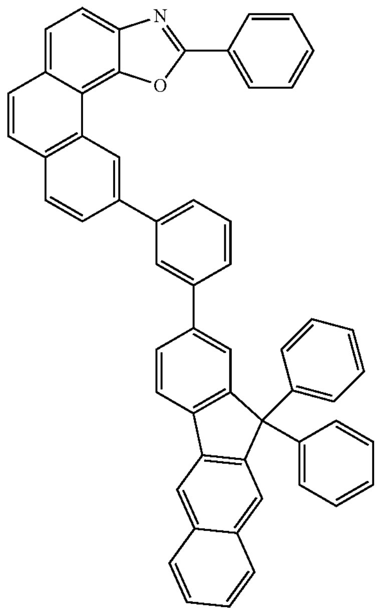
-continued
H-51
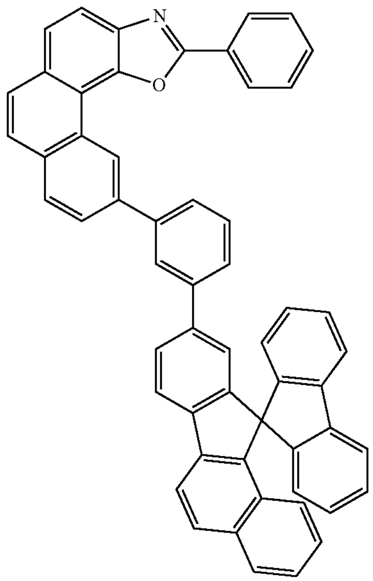
H-52
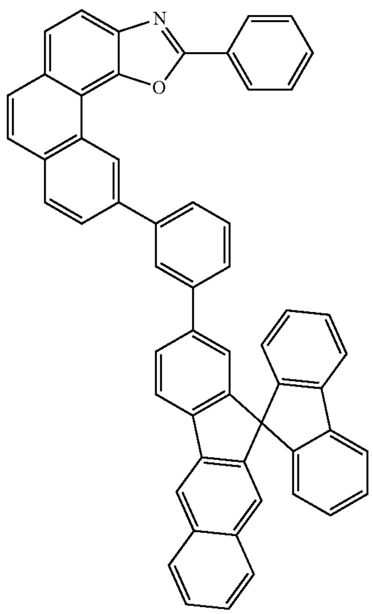

-continued
H-53
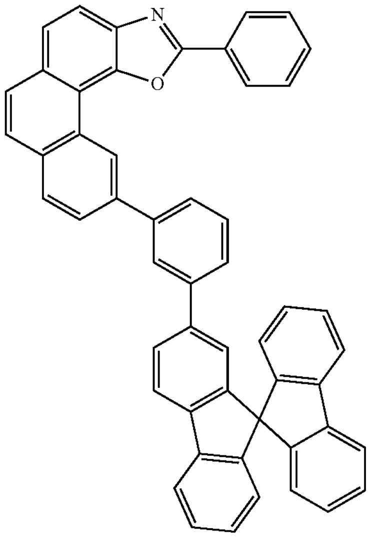
H-54
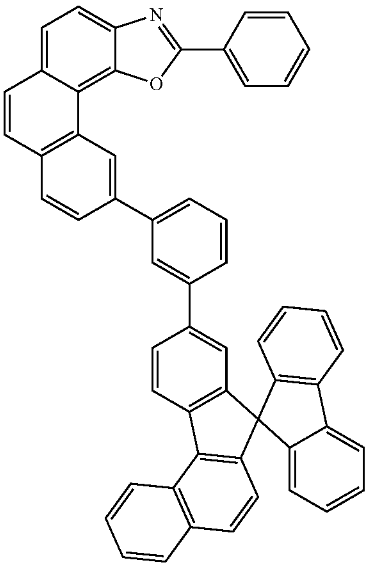
H-55
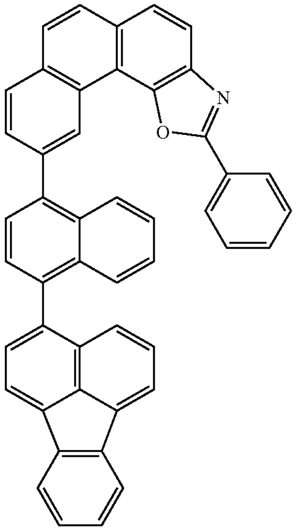
-continued
H-56
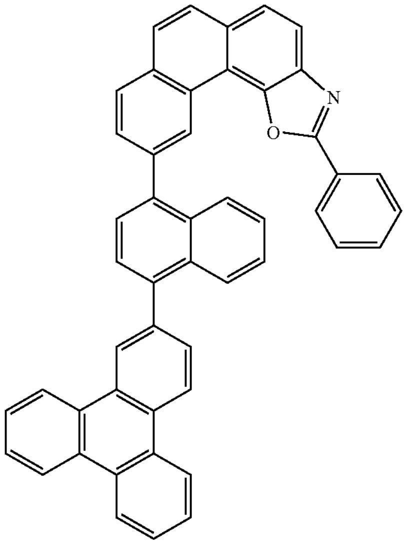
H-57
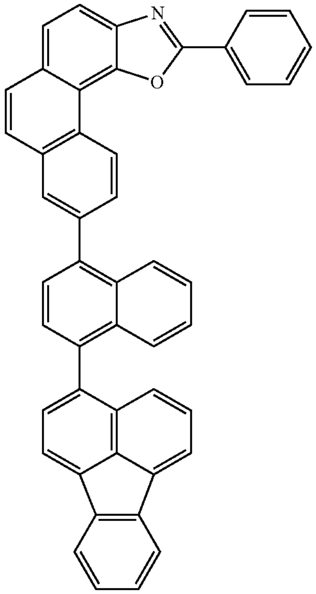

-continued
H-58
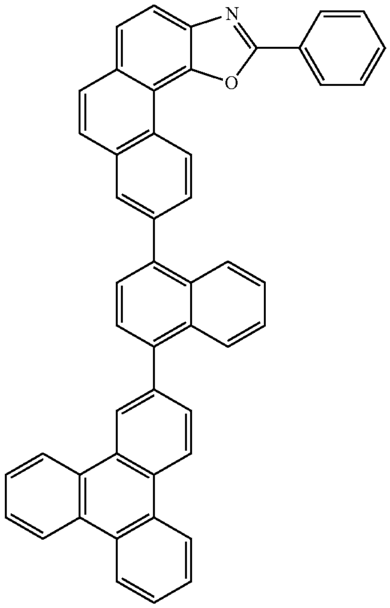
H-59
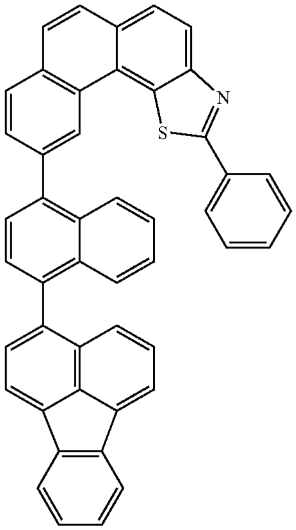
-continued
H-60
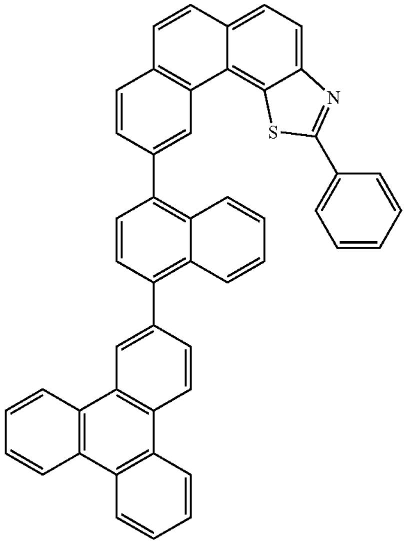
H-61
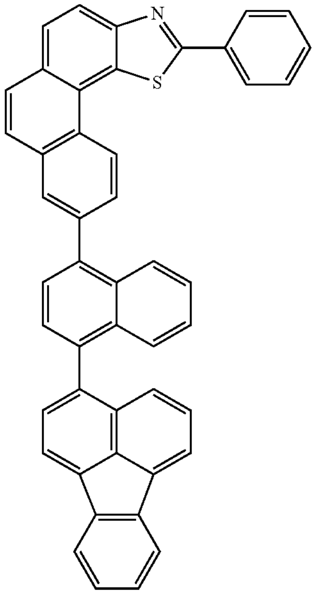

-continued
H-62
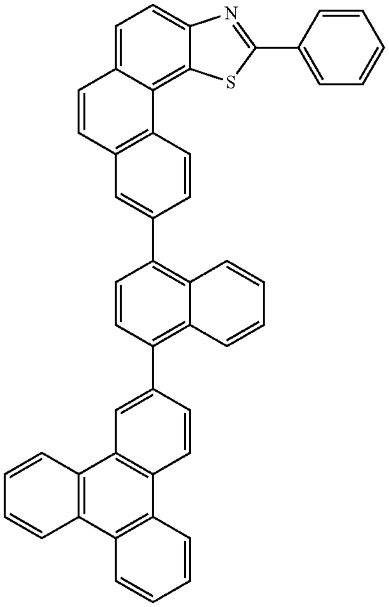
H-63
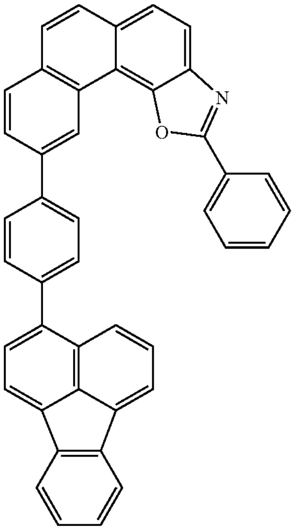
-continued
H-64
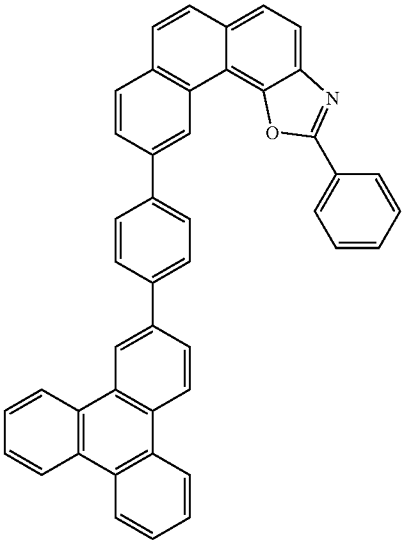
H-65
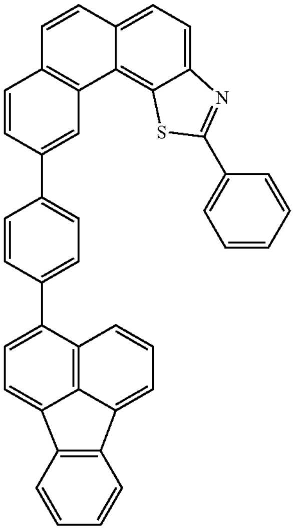
H-66
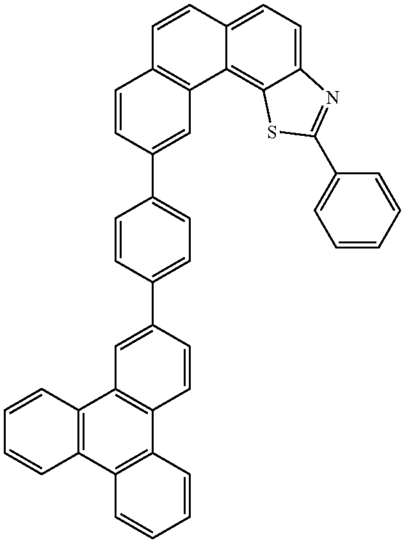

-continued
H-67
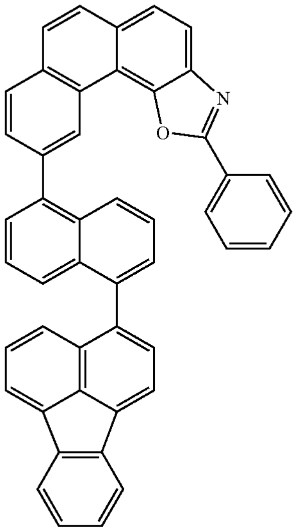
H-68
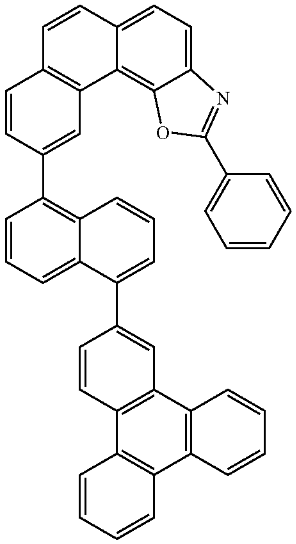
H-69
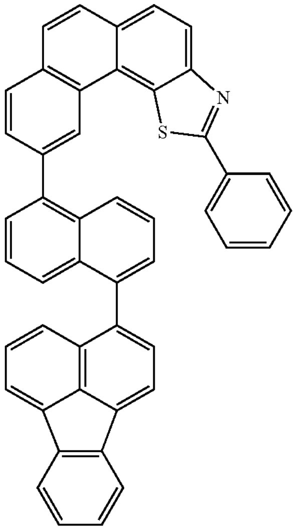
-continued
H-70
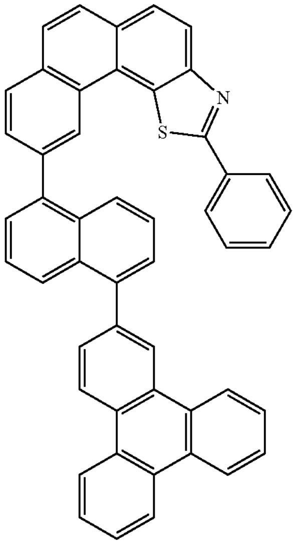
H-71
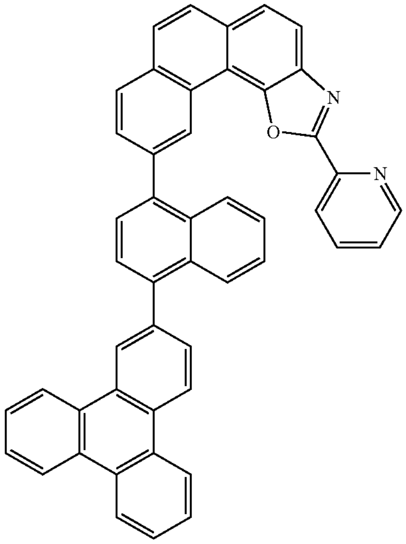
H-72
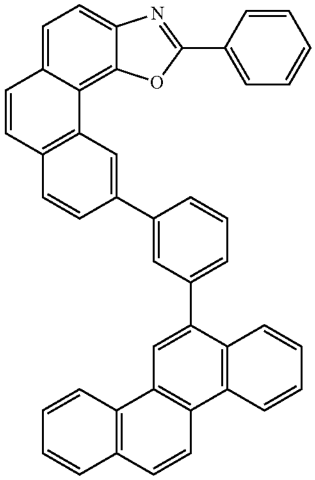

-continued
H-73
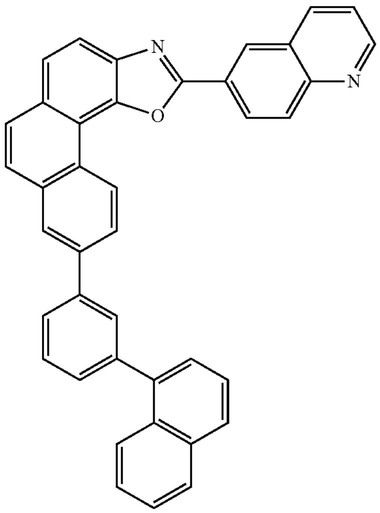
H-74
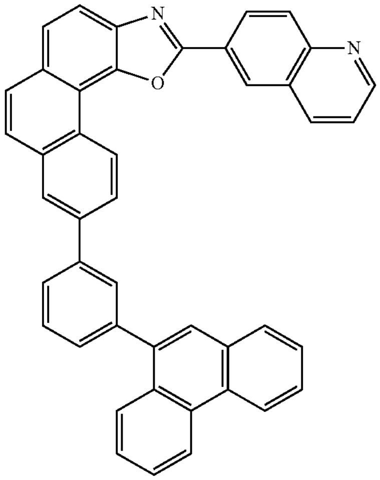
H-75
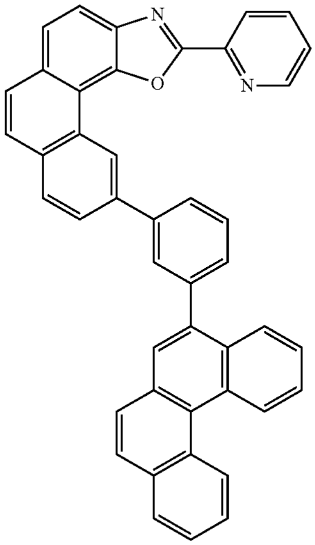
-continued
H-76
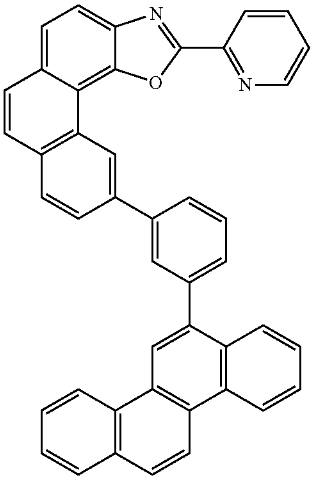
H-77
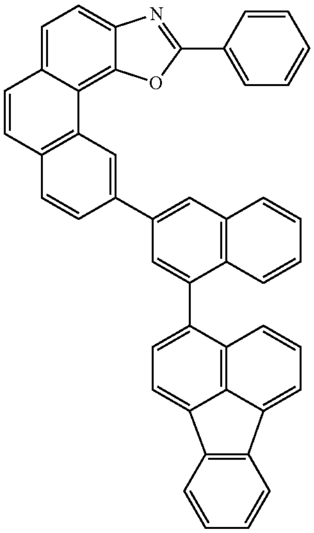
H-78
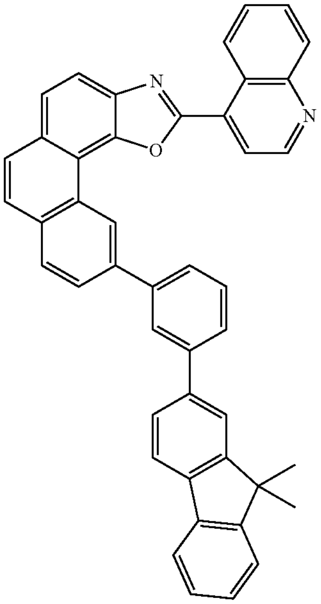

-continued
H-79
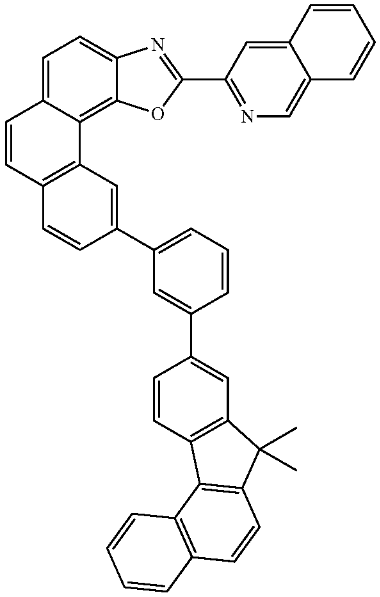
H-80
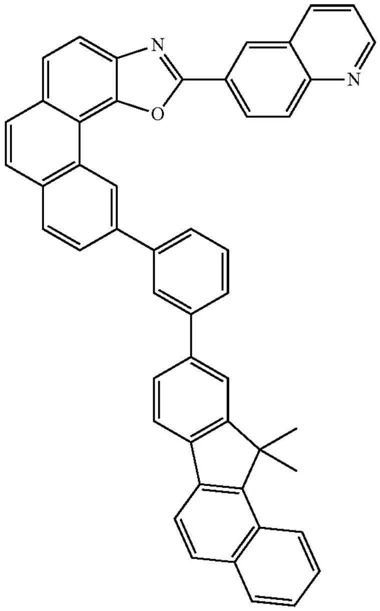
-continued
H-81
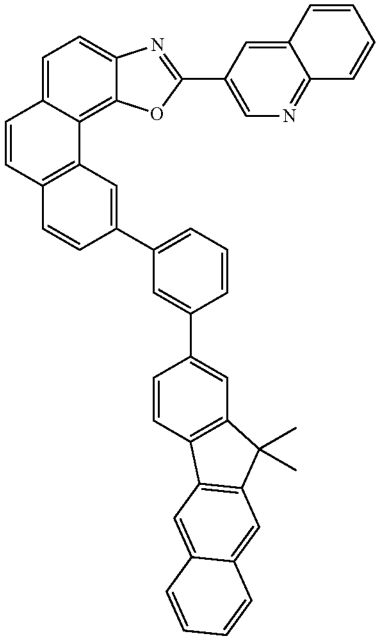
H-82
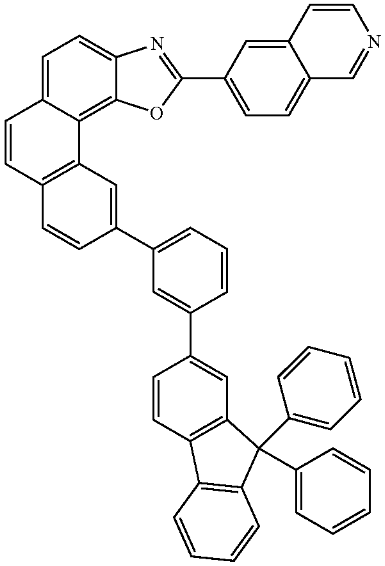

-continued
H-83
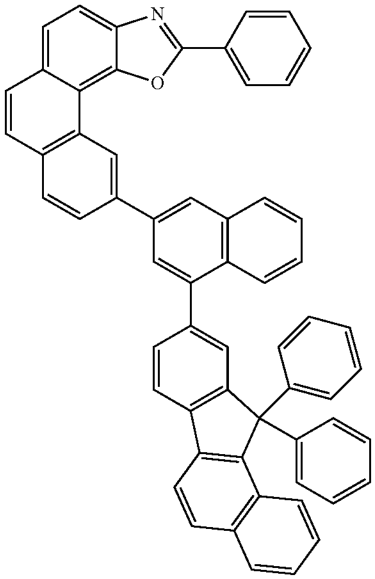
H-84
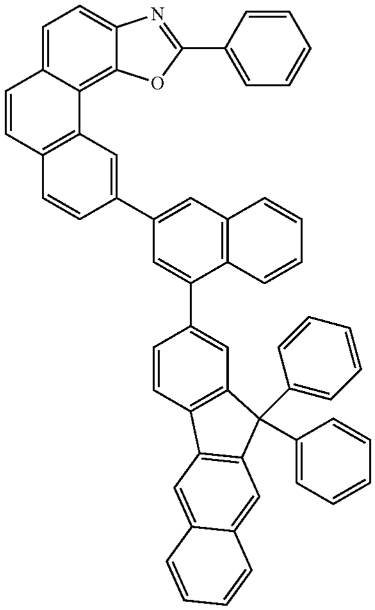
-continued
H-85
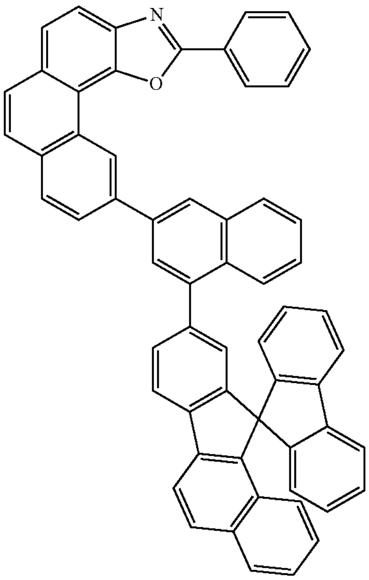
H-86
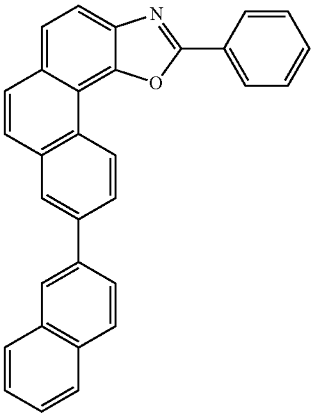
H-87
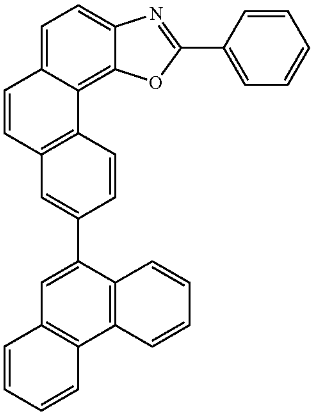

-continued
H-88
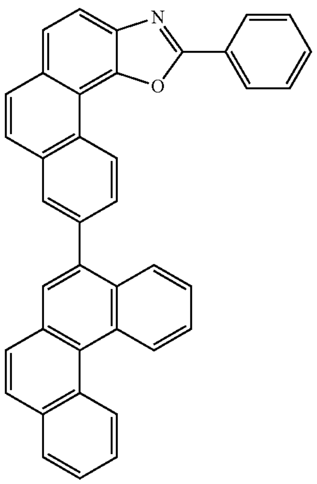
H-89
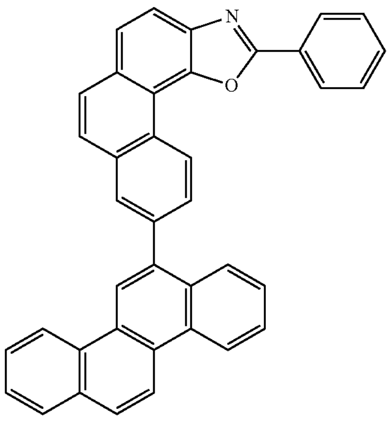
H-90
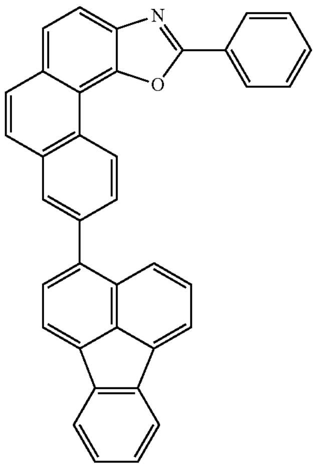
-continued
H-91
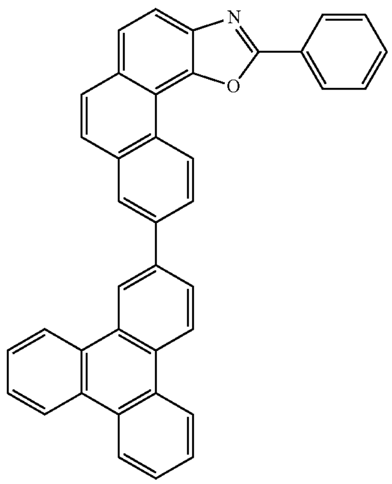
H-92
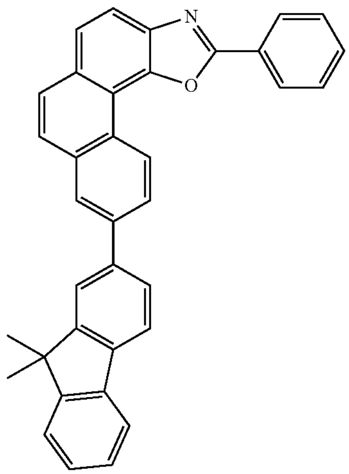
H-93
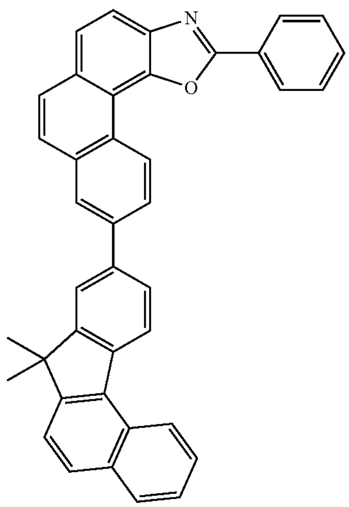

-continued
H-94
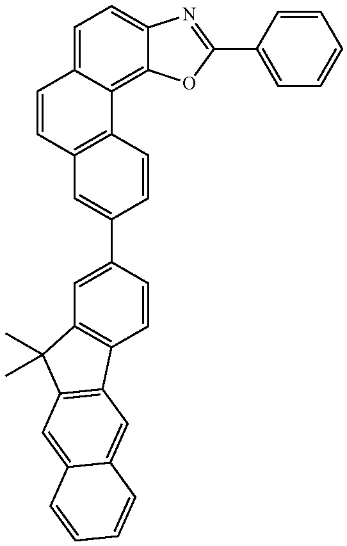
H-95
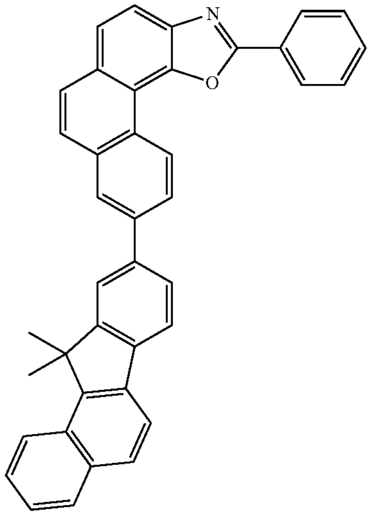
H-96
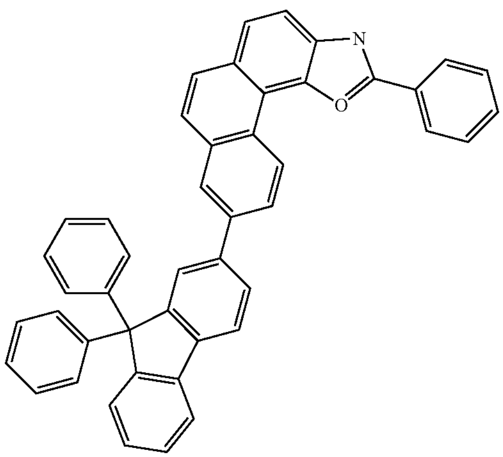
-continued
H-97
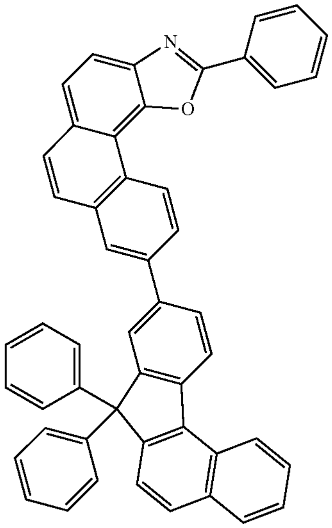
H-98
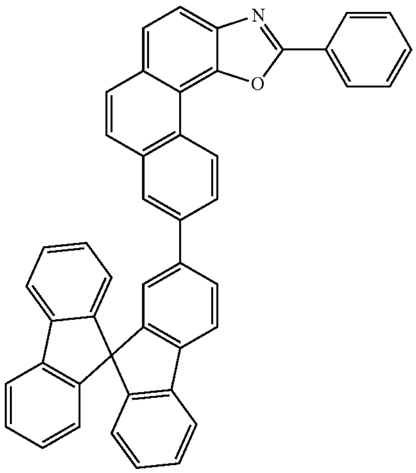
H-99
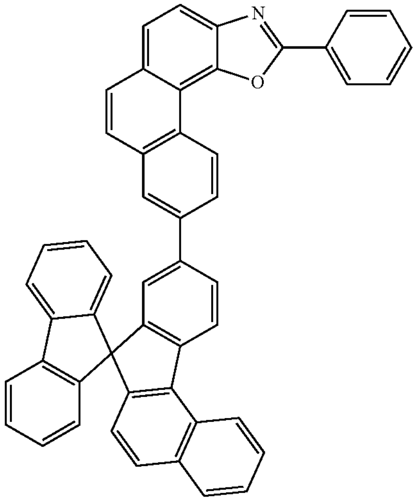

-continued
H-100
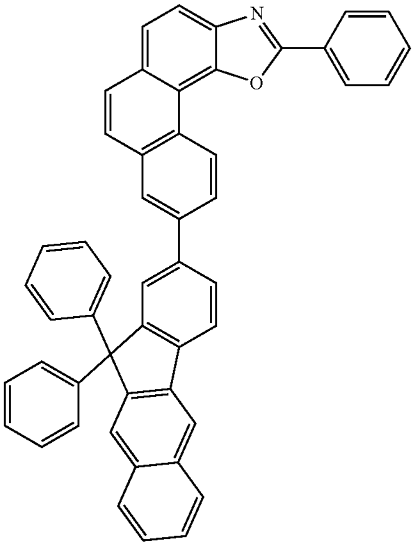
H-101
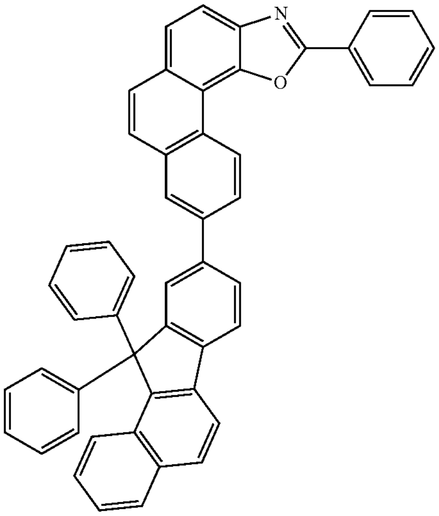
H-102
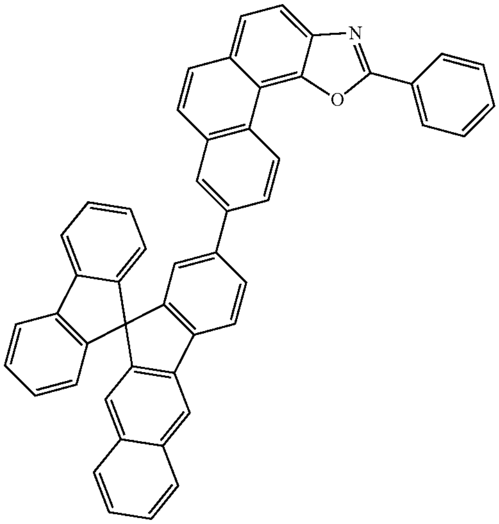
-continued
H-103
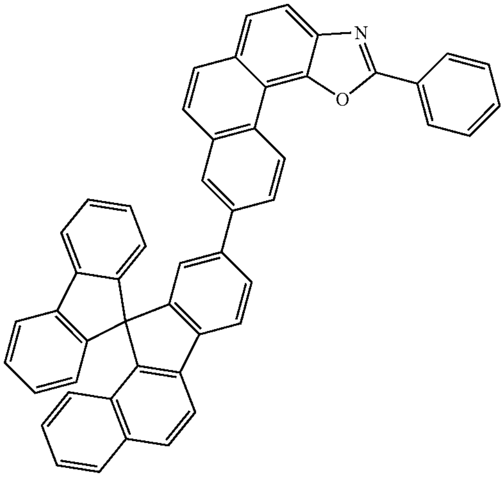
H-104
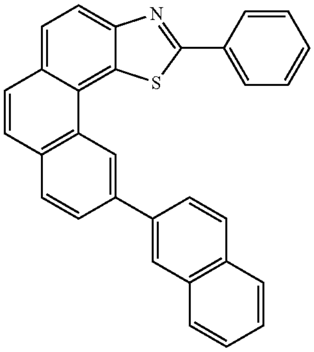
H-105
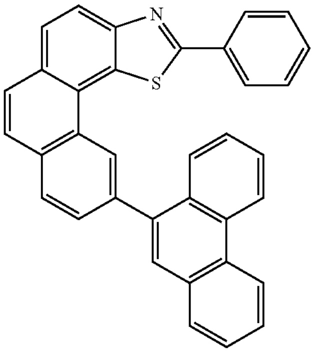
H-106
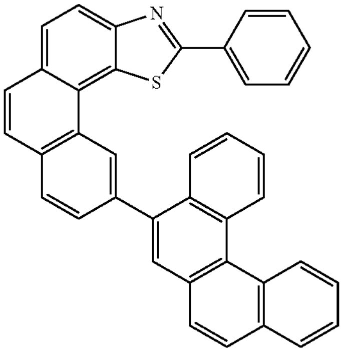

-continued
H-107
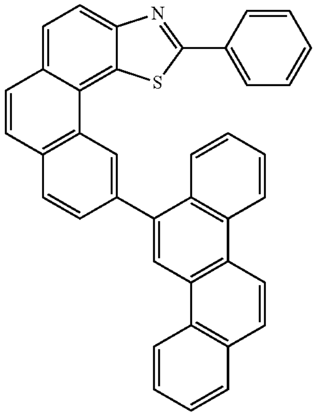
H-108
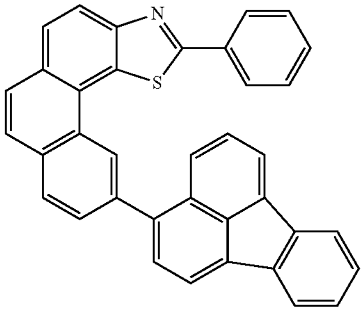
H-109
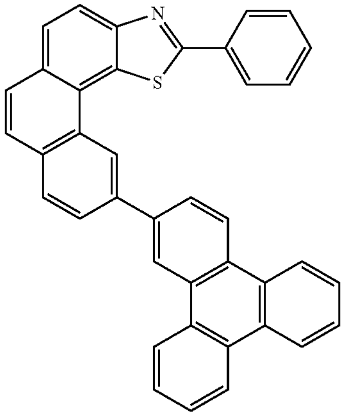
H-110
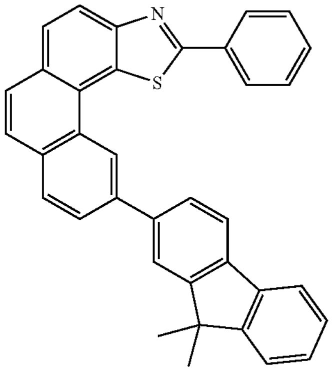
-continued
H-111
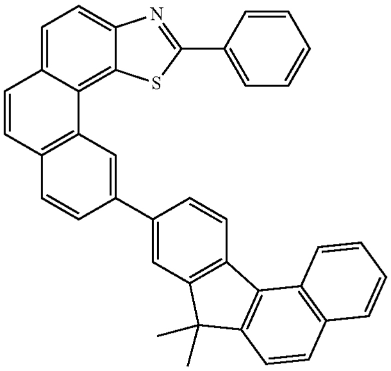
H-112
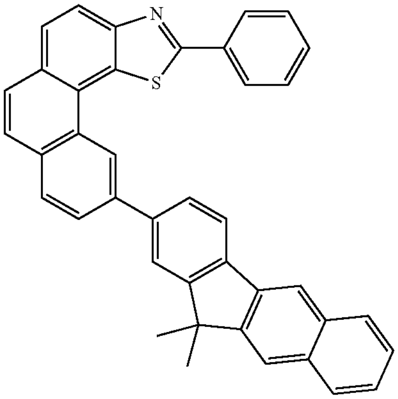
H-113
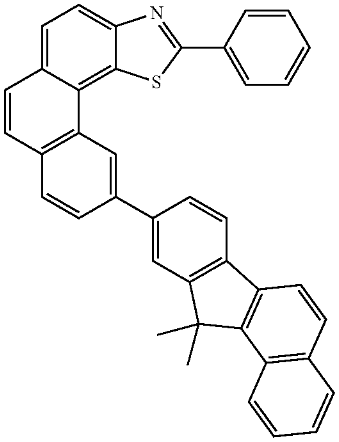

-continued
H-114
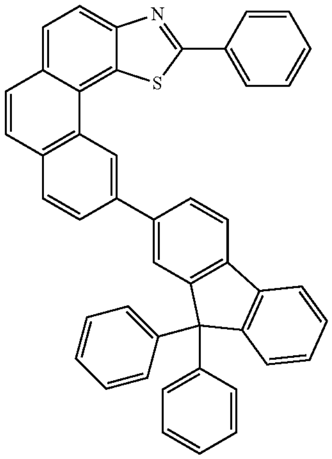
H-115
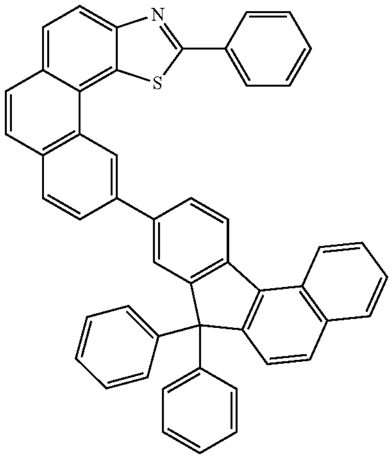
H-116
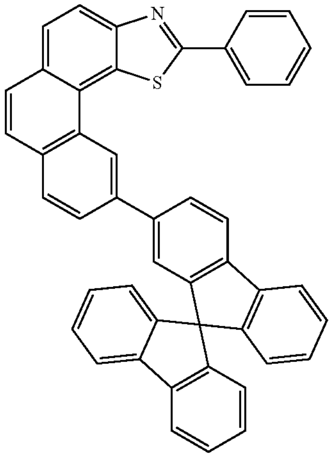
-continued
H-117
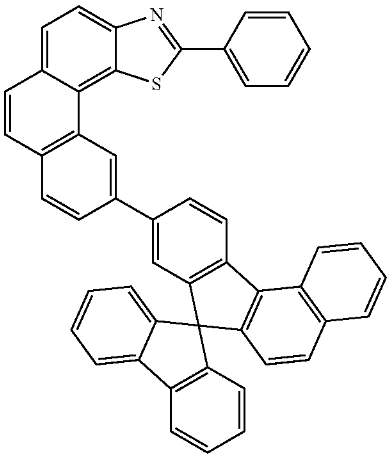
H-118
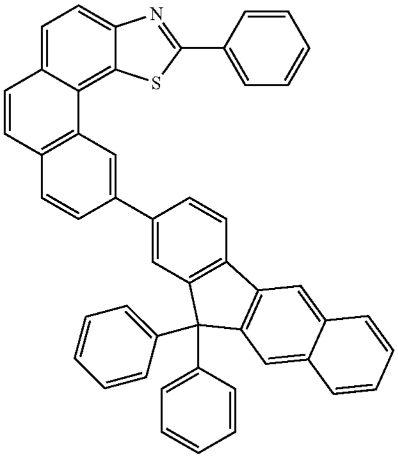
H-119
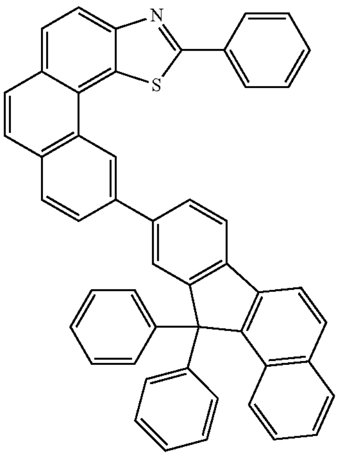

-continued
H-120
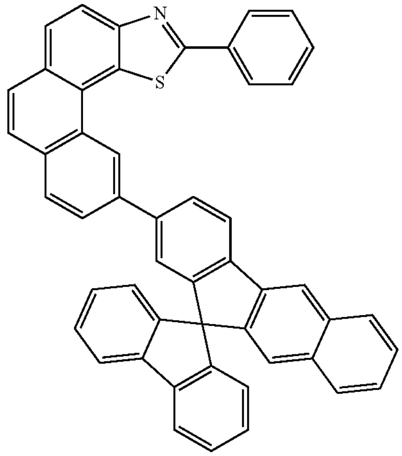
H-121
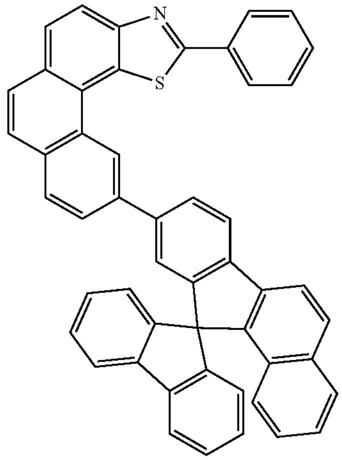
H-122
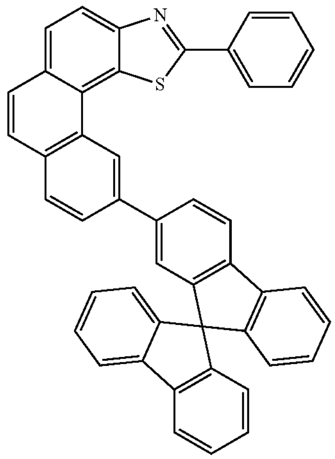
-continued
H-123
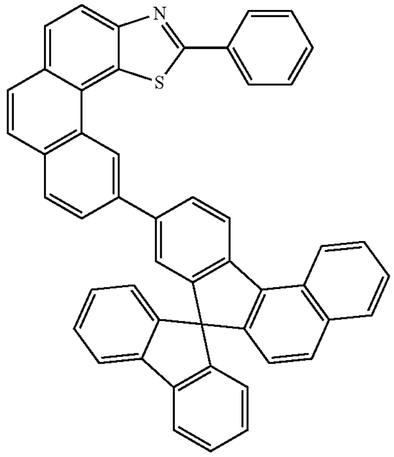
H-124
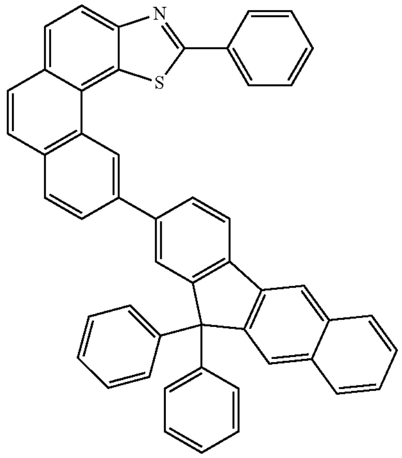
H-125
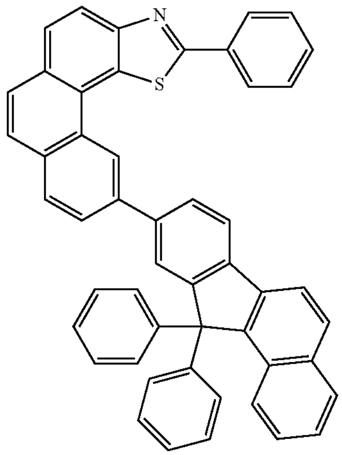

-continued
H-126
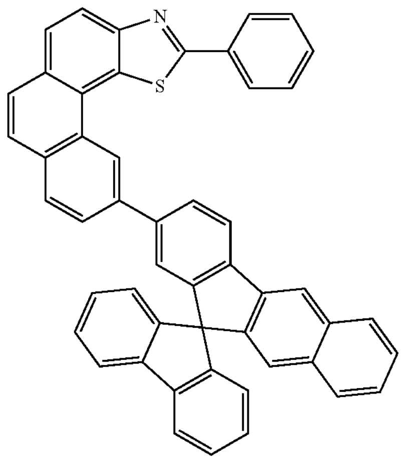
H-127
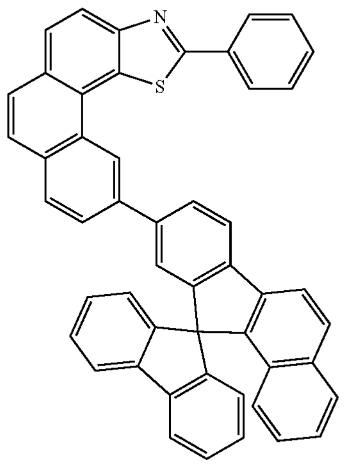
H-128
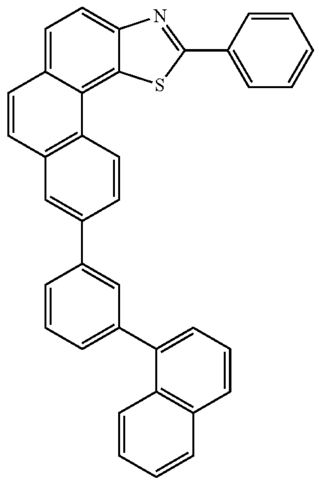
-continued
H-129
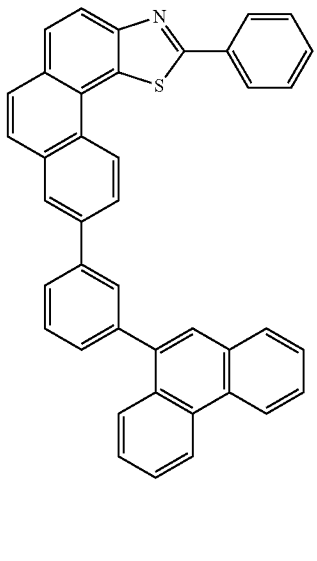
H-130
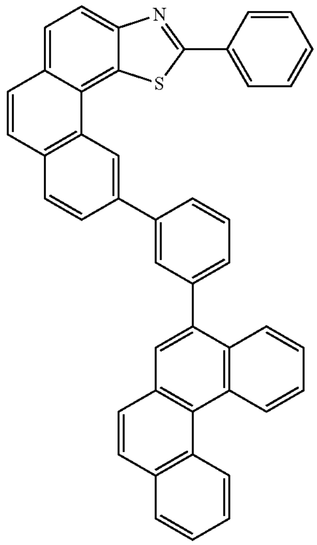
H-131
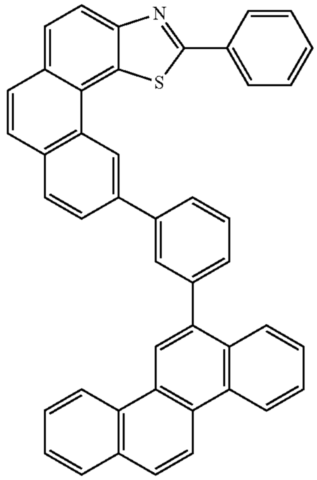

-continued
H-132
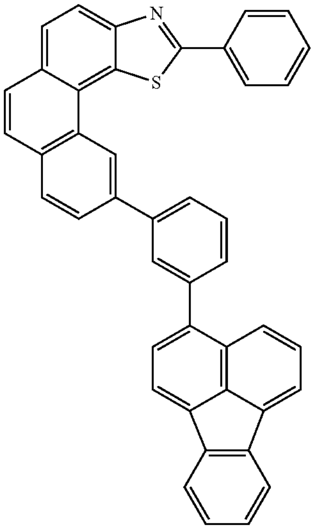
H-133
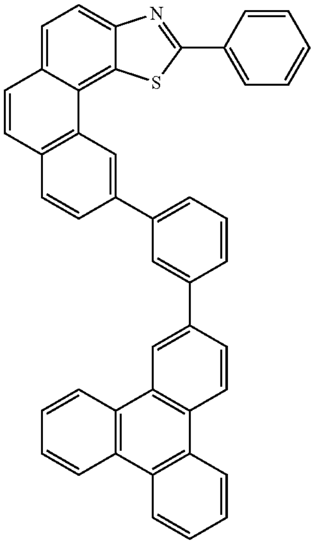
H-134
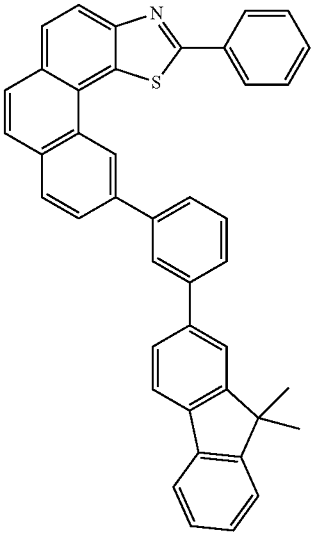
-continued
H-135
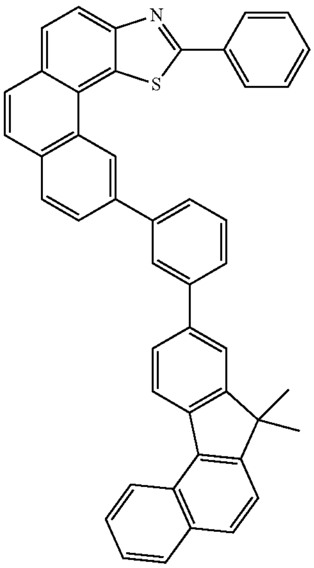
H-136
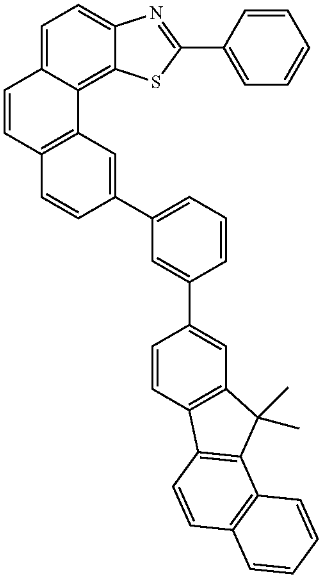

-continued
H-137
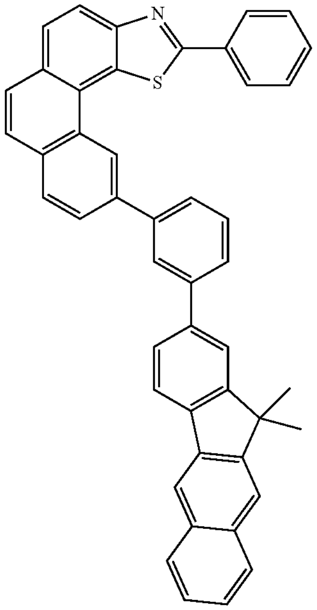
H-138
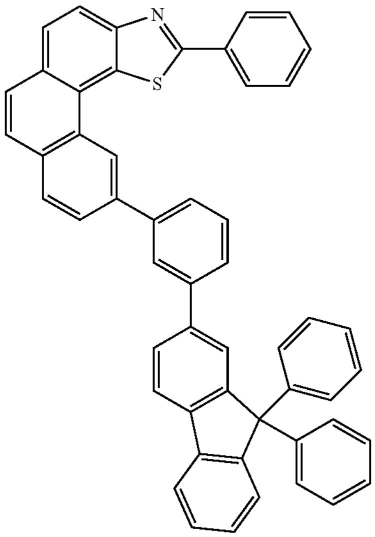
-continued
H-139
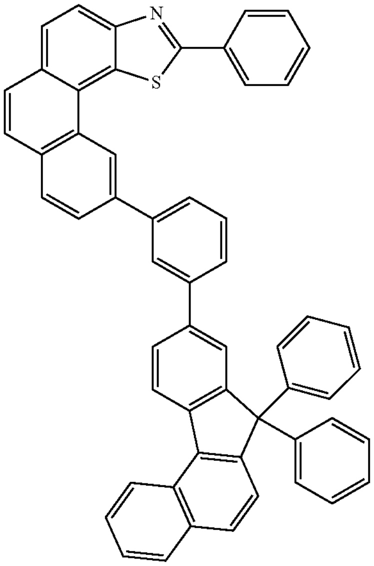
H-140
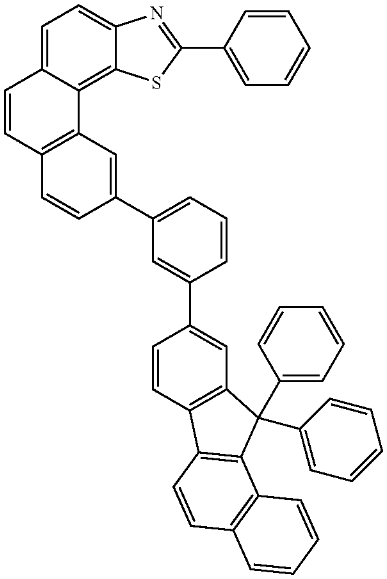

-continued
H-141
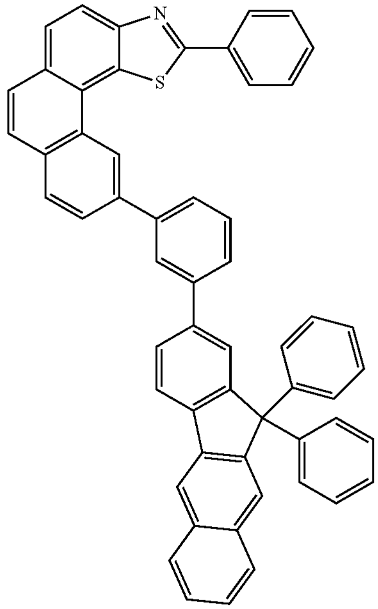
H-142
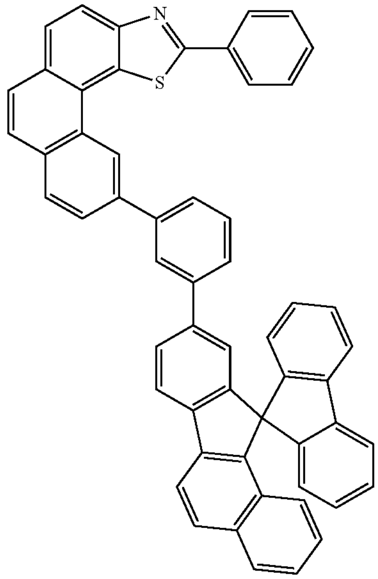
-continued
H-143
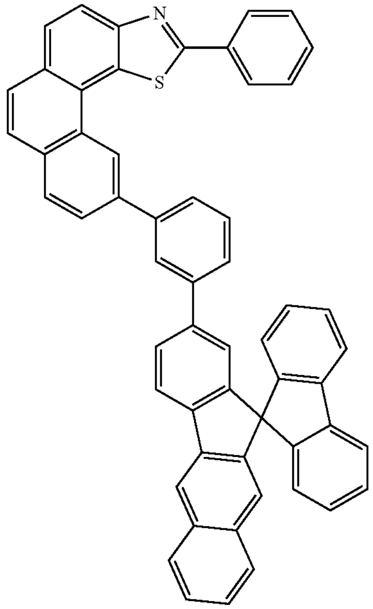
H-144
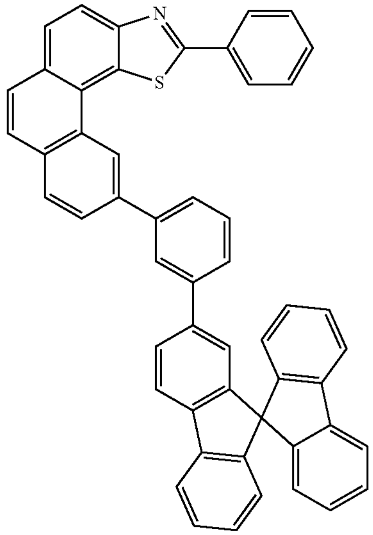

-continued
H-145
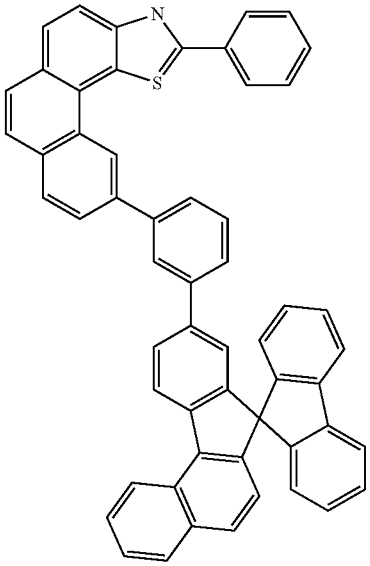
H-146
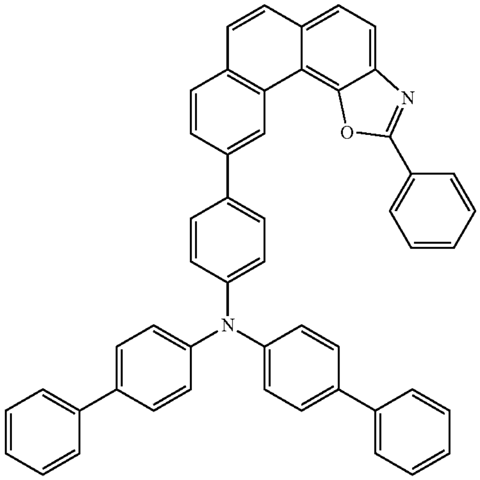
H-147
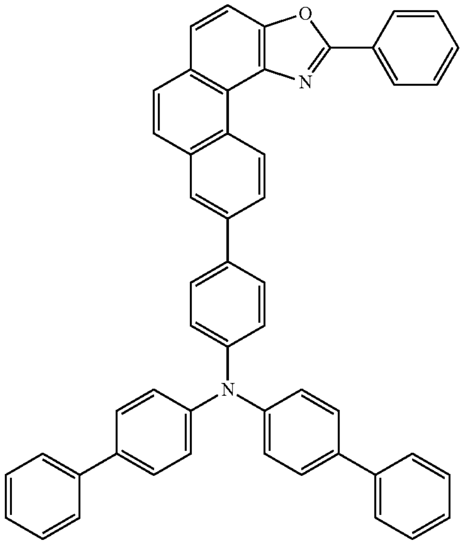
-continued
H-148
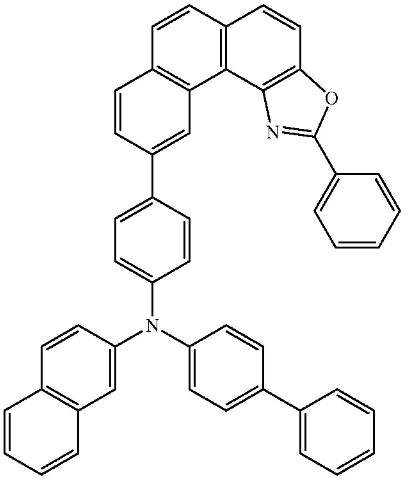
H-149
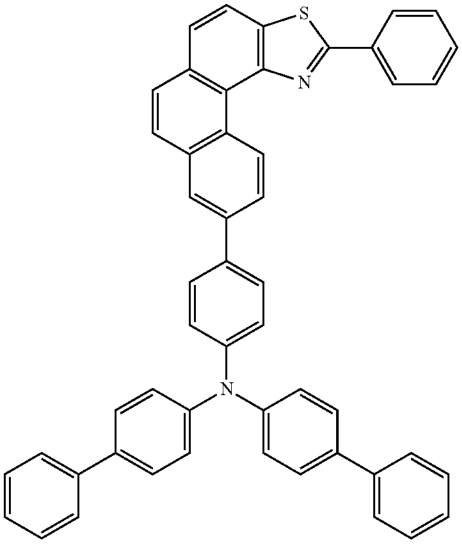
H-150
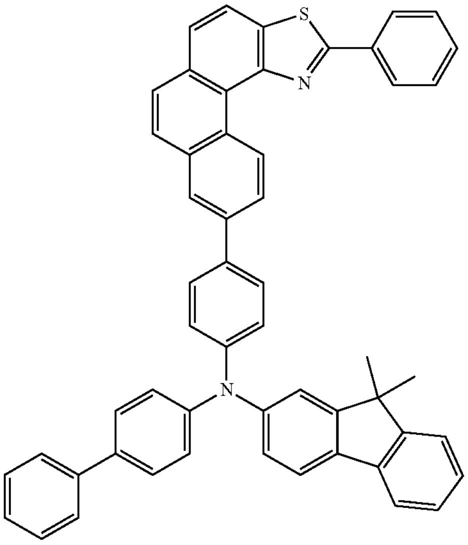

-continued
H-151
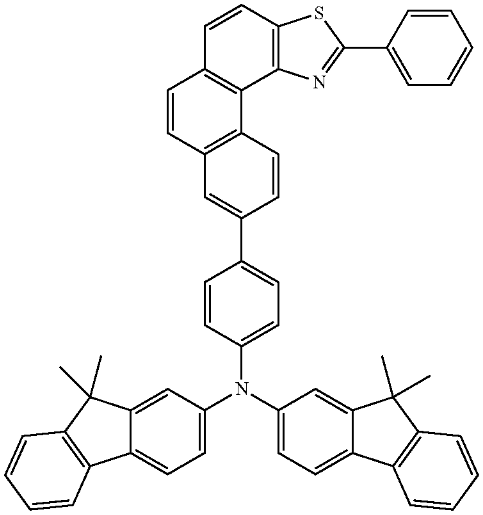
H-152
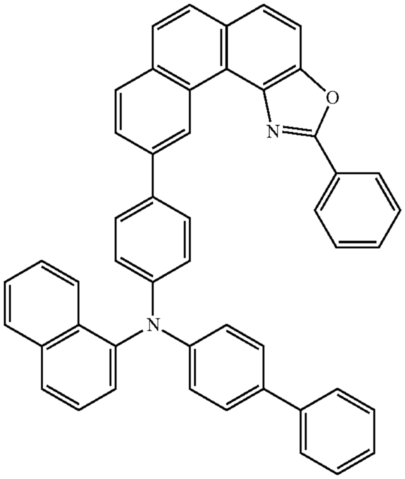
H-153
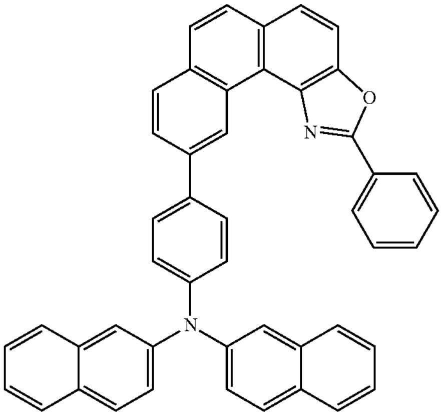
-continued
H-154
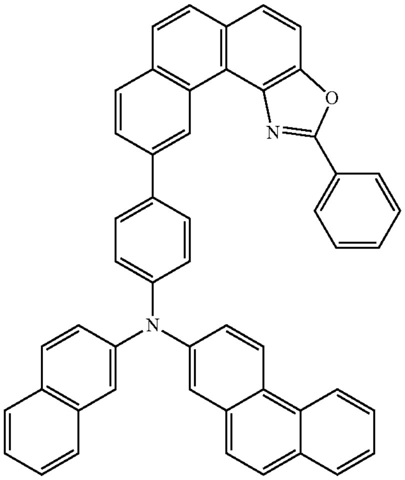
H-155
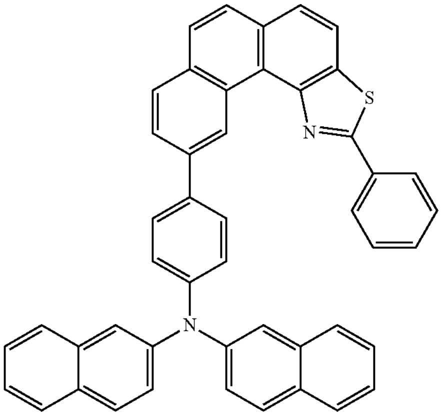
H-156
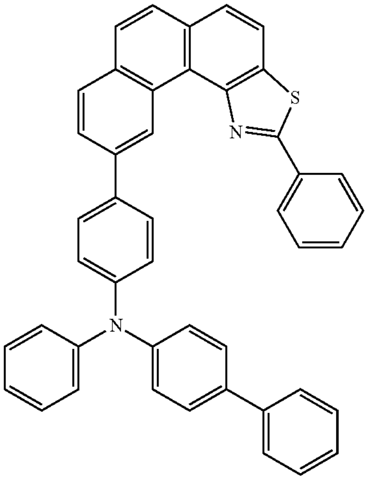

-continued
H-157
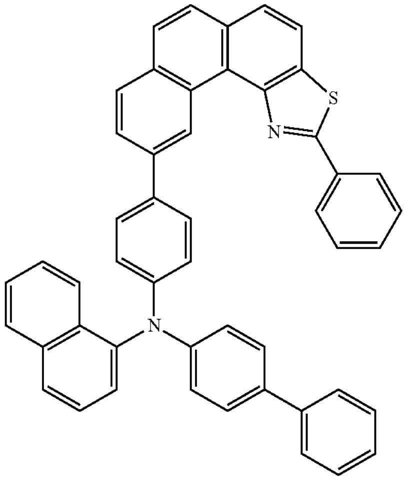
H-158
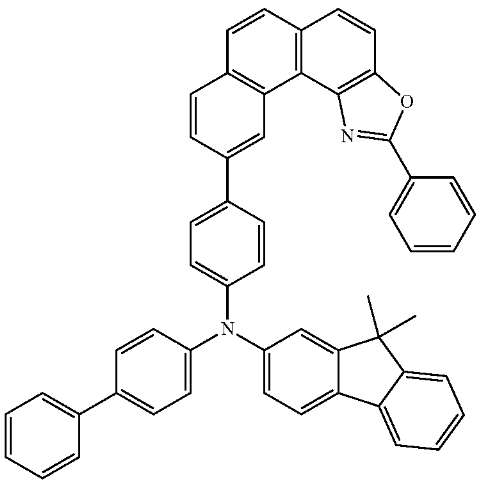
H-159
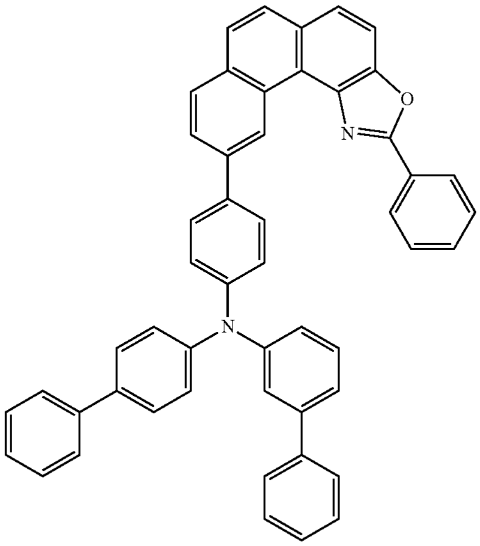
-continued
H-160
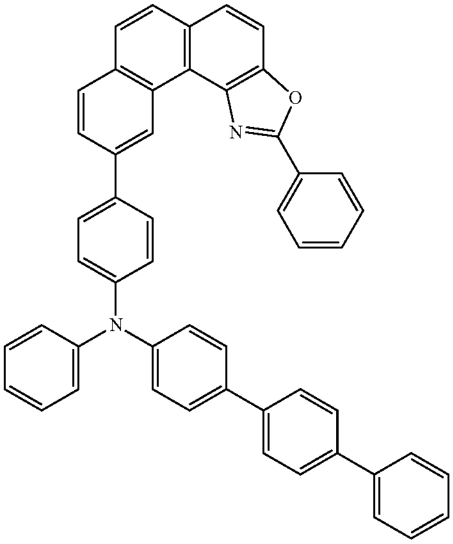
H-161
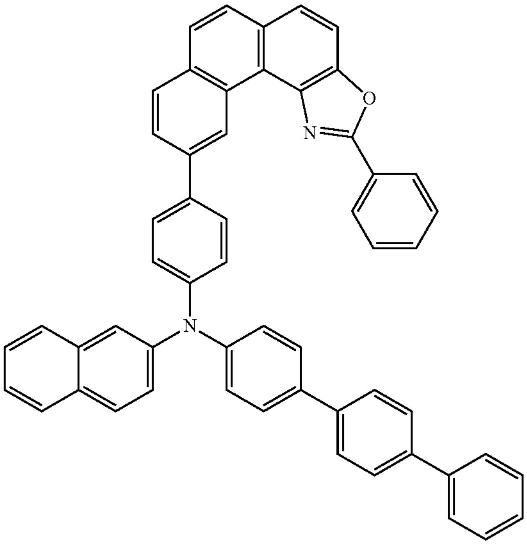
H-162
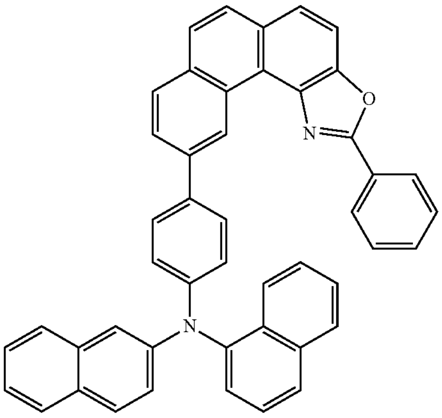

-continued
H-163
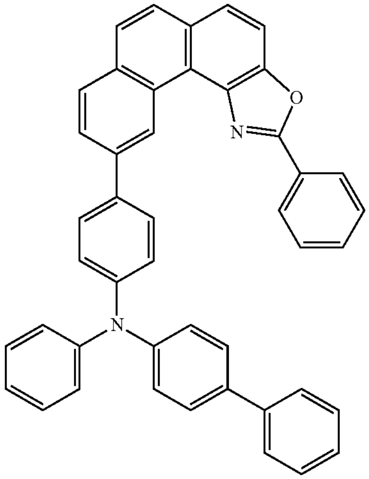
H-164
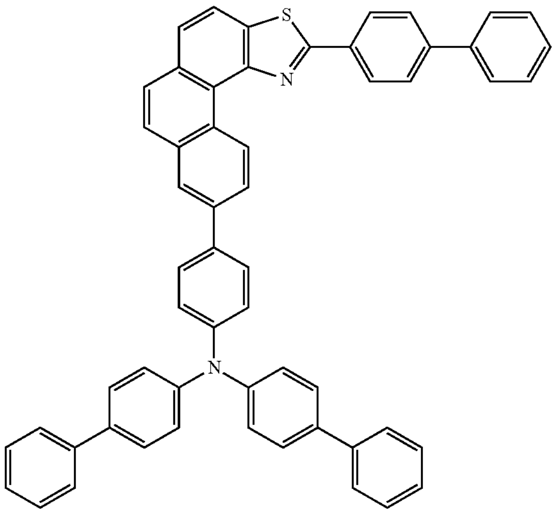
H-165
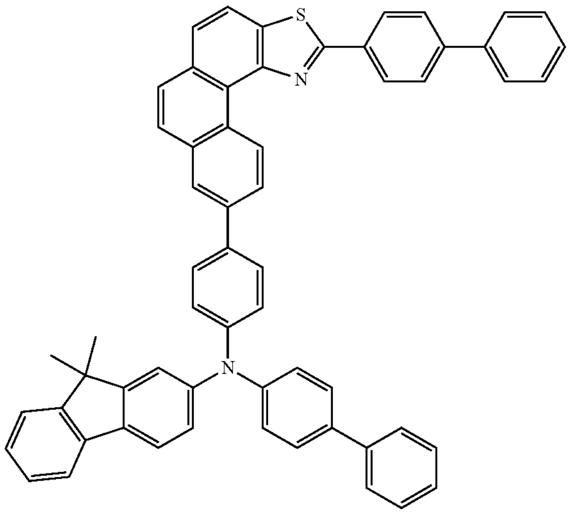
-continued
H-166
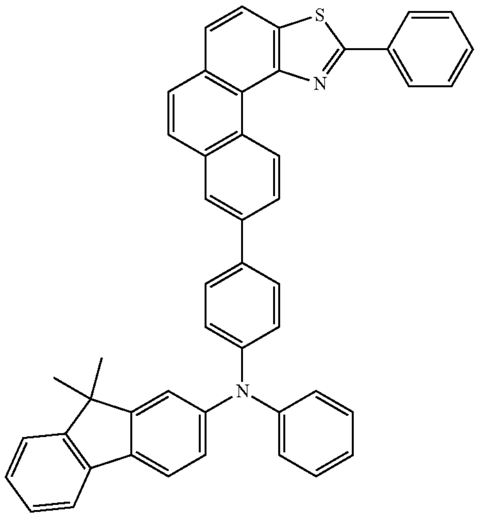
H-167
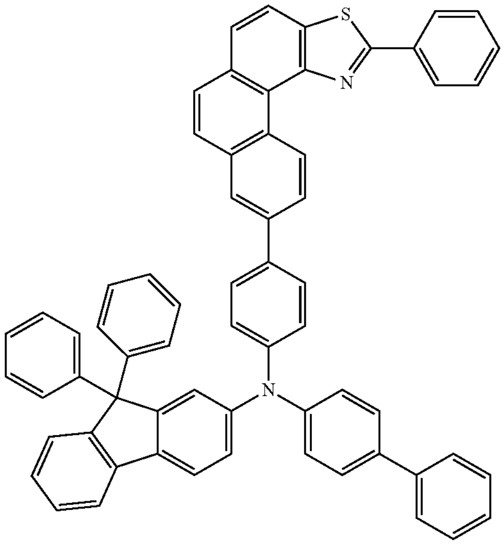
H-168
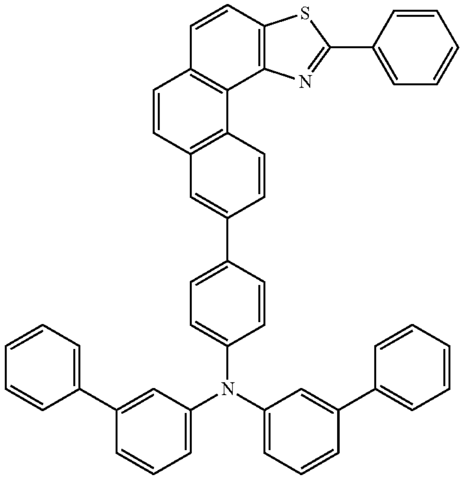

-continued
H-169
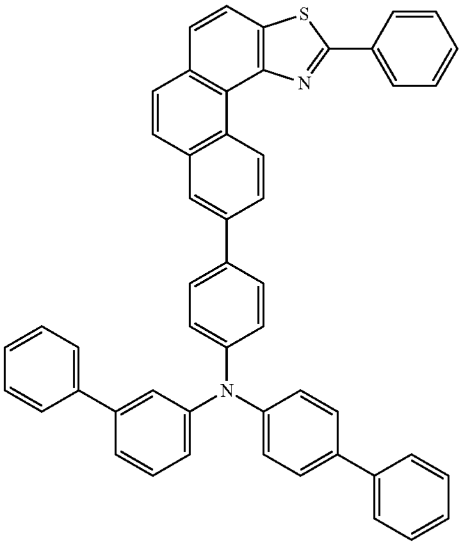
H-170
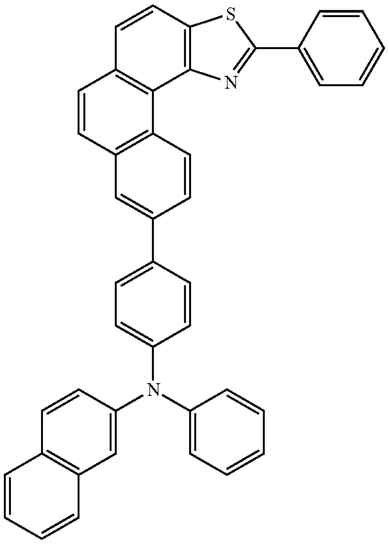
H-171
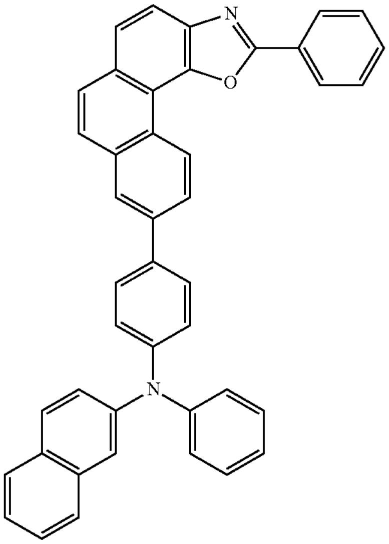
-continued
H-172
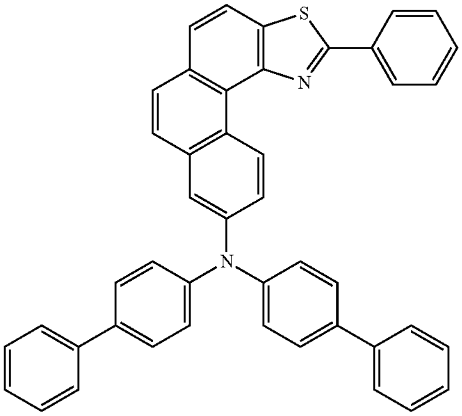
H-173
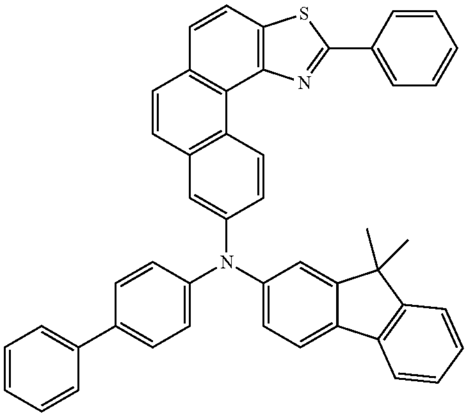
H-174
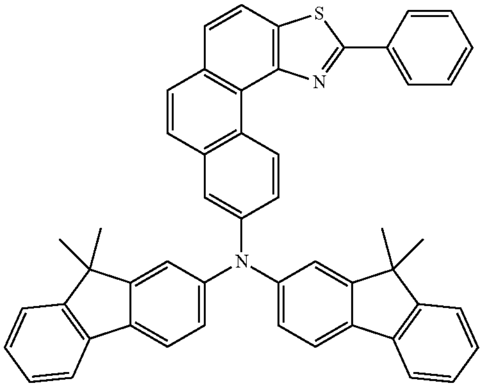

-continued
H-175
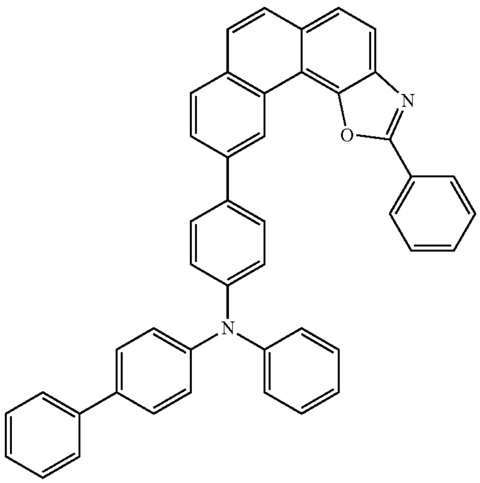
H-176
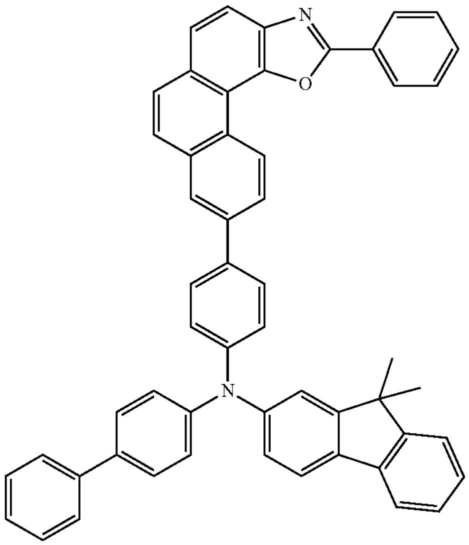
H-177
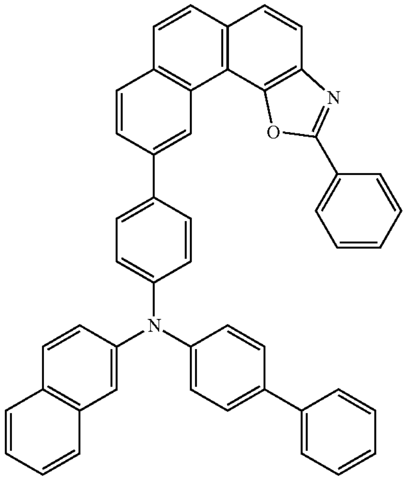
-continued
H-178
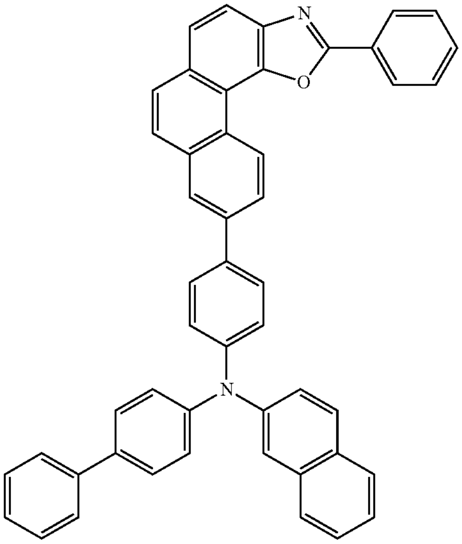
H-179
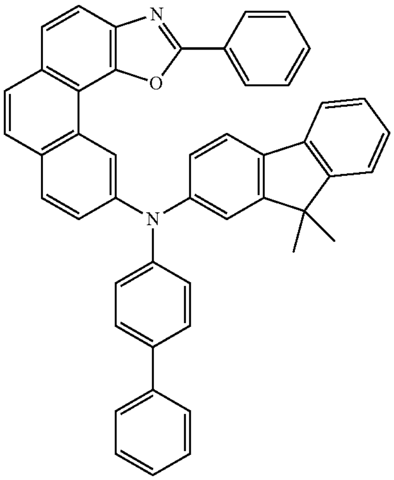
H-180
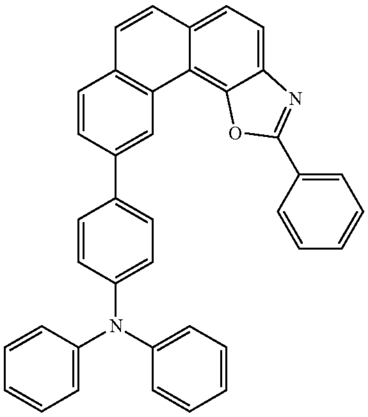

-continued
H-181
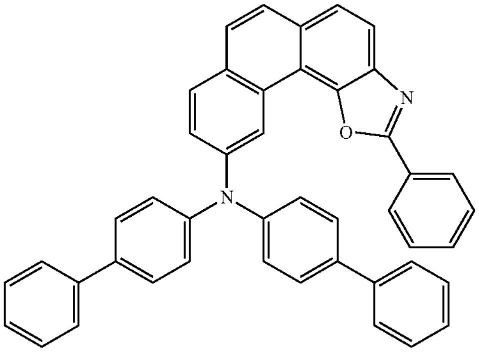
H-182
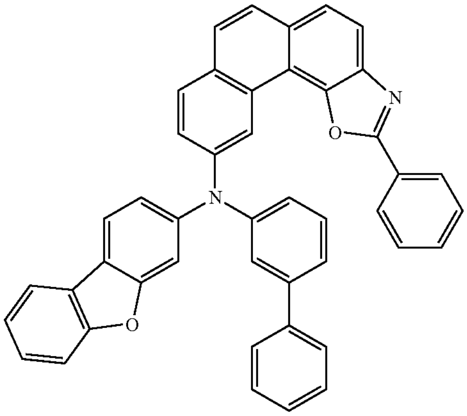
H-183
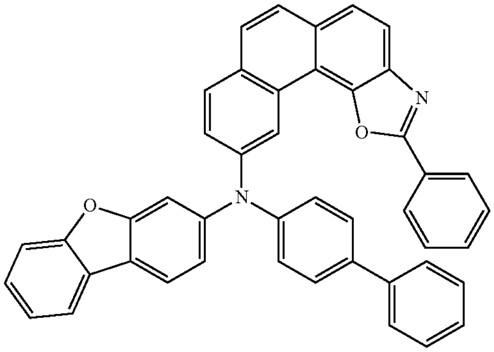
H-184
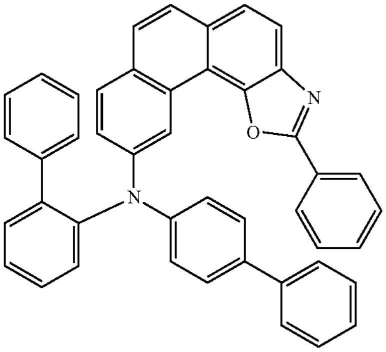
-continued
H-185
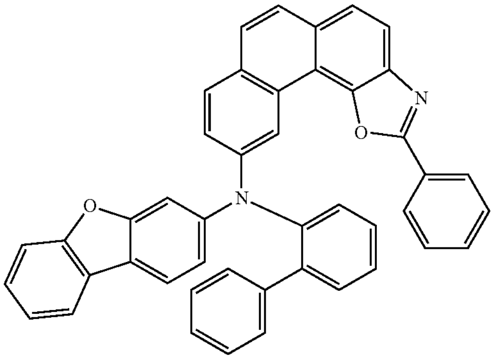
H-186
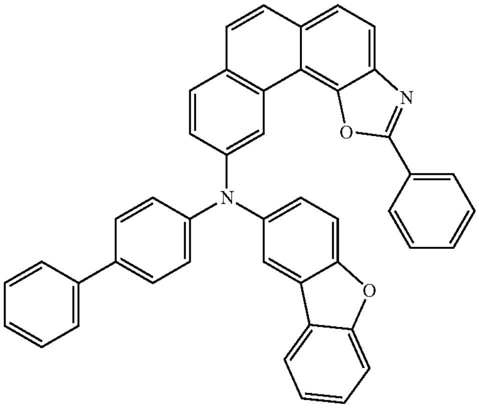
H-187
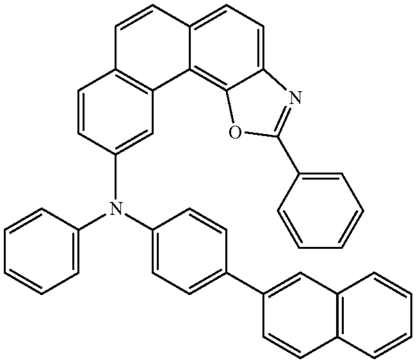
H-188
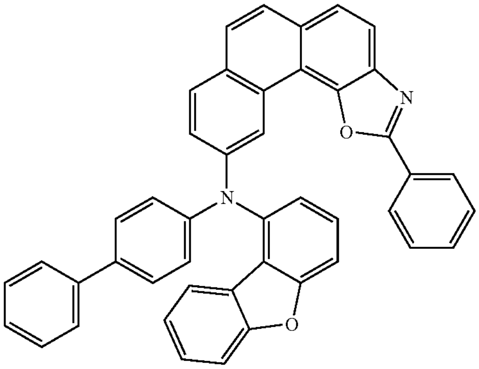

-continued
H-189
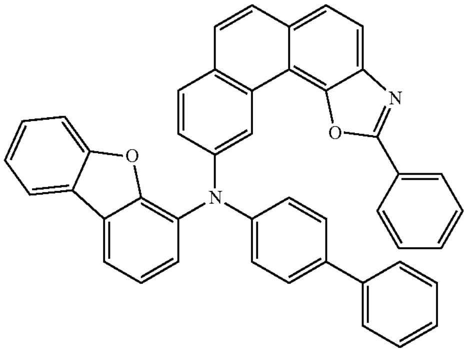
H-190
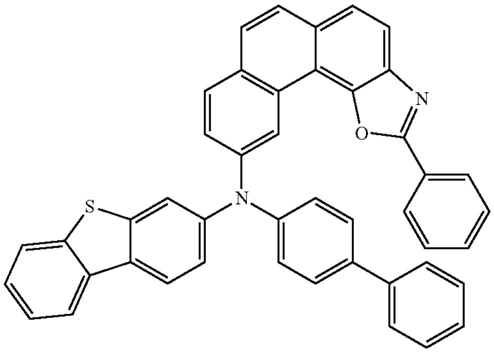
H-191
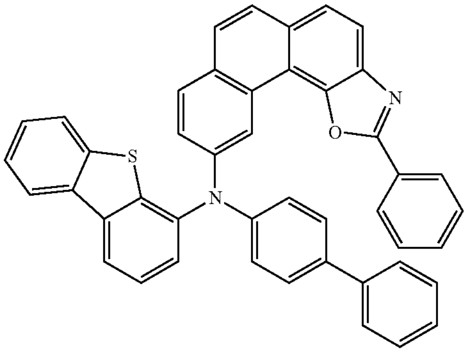
H-192
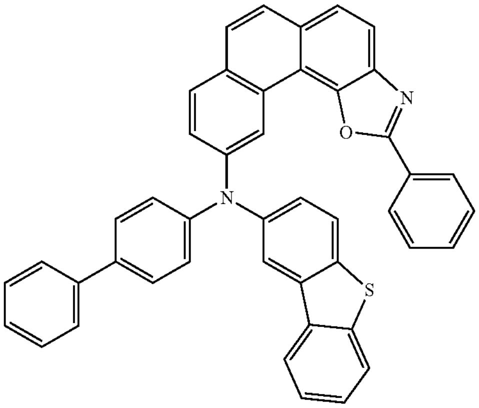
-continued
H-193
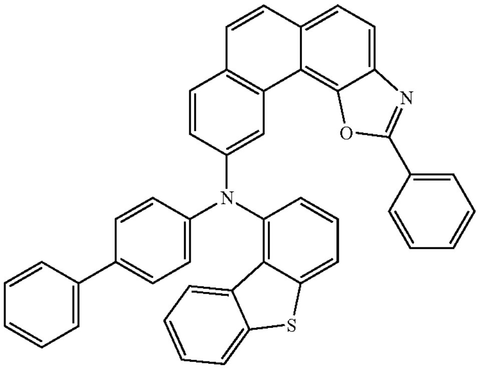
H-194
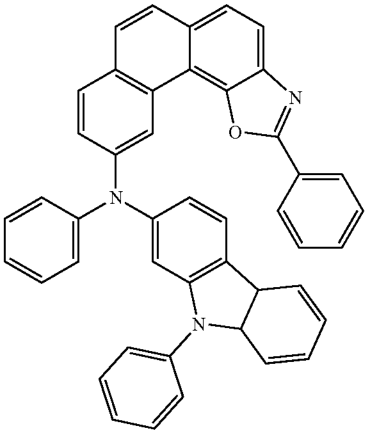
H-195
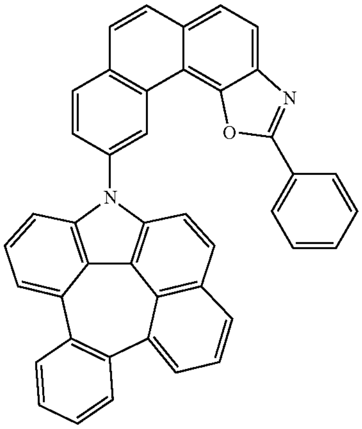
H-196
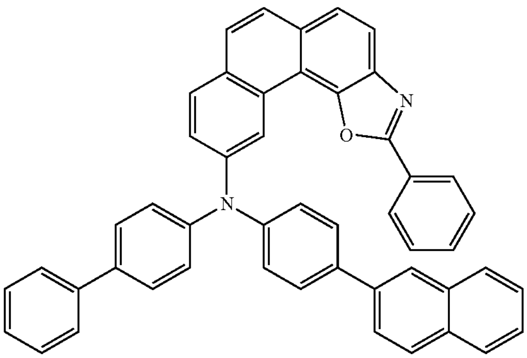

-continued
H-197
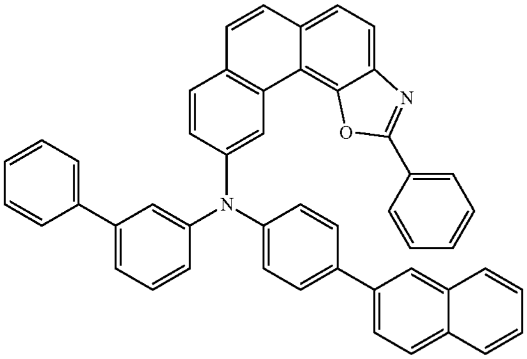
H-198
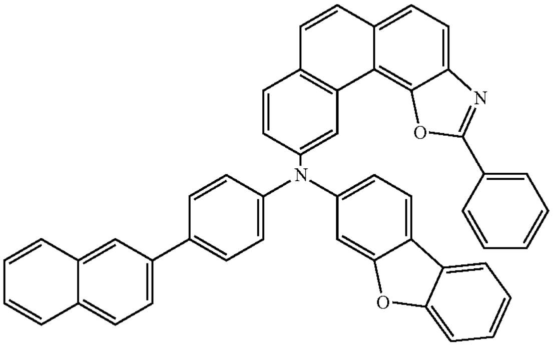
H-199
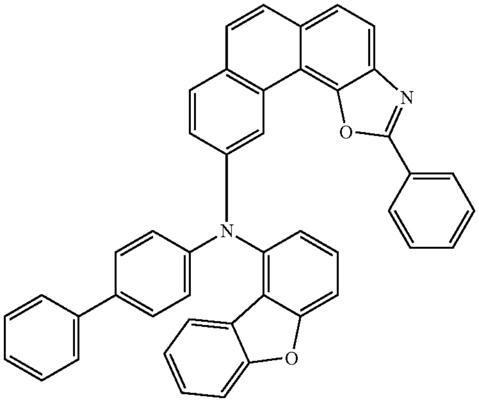
The compound represented by formula 2 includes the following compounds, but is not limited thereto.
C-1
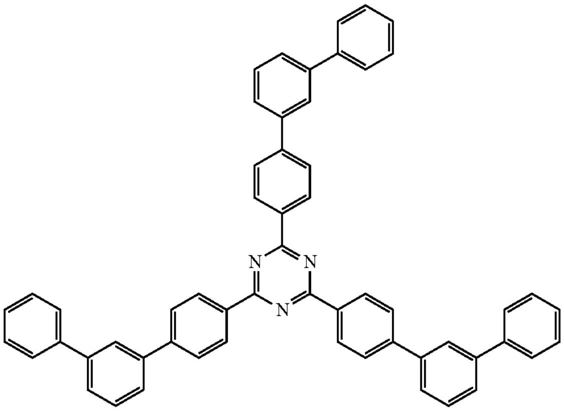
C-2
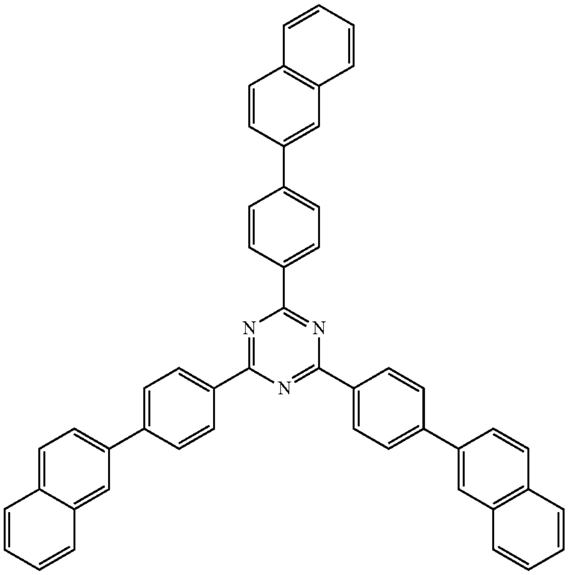
C-3
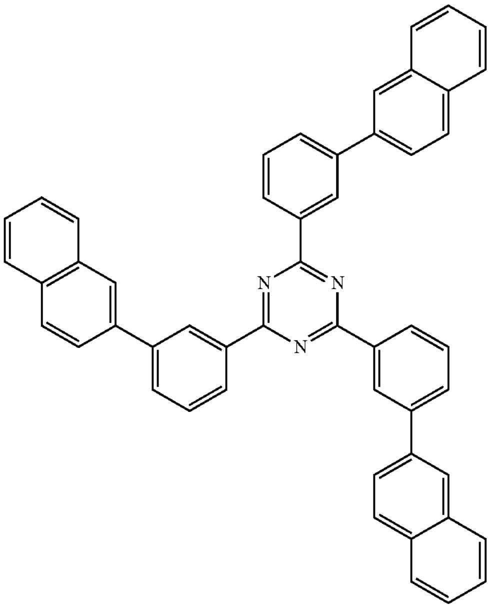

-continued
C-4
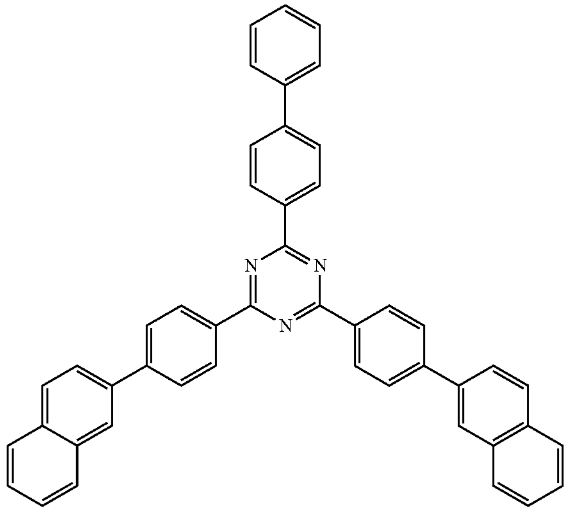
C-5
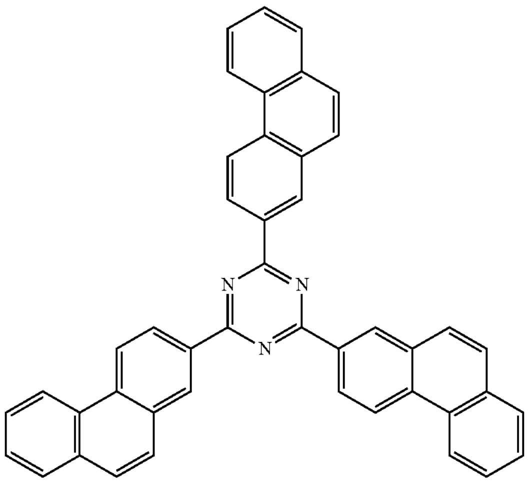
C-6
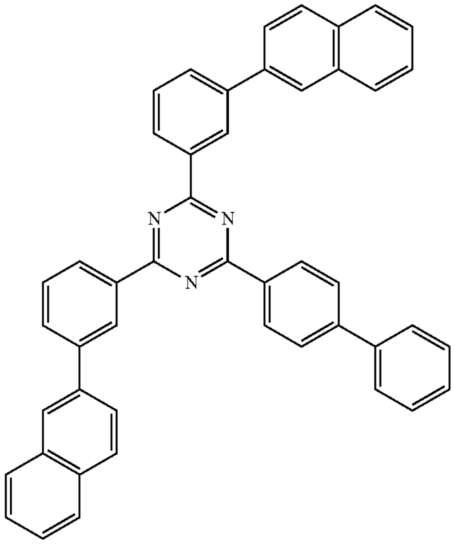
-continued
C-7
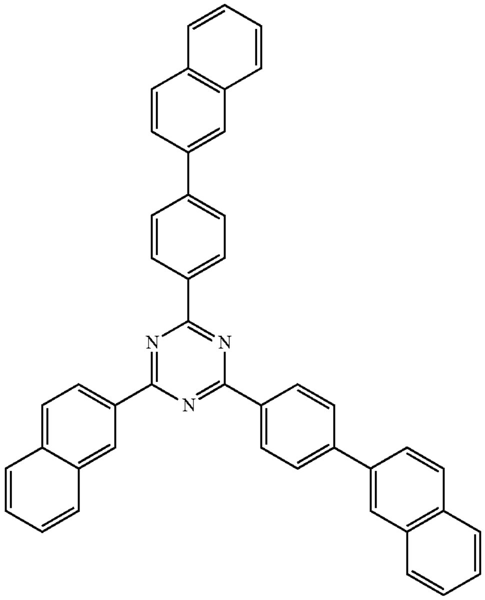
C-8
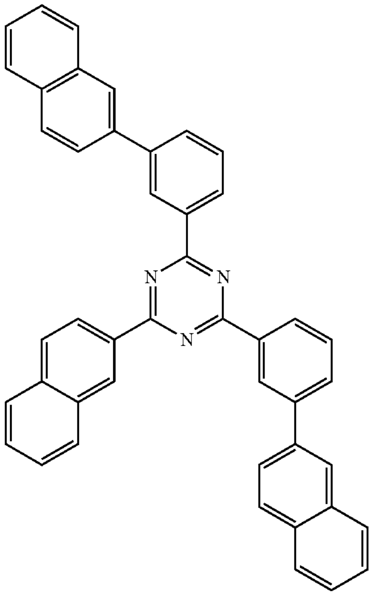

-continued
C-9
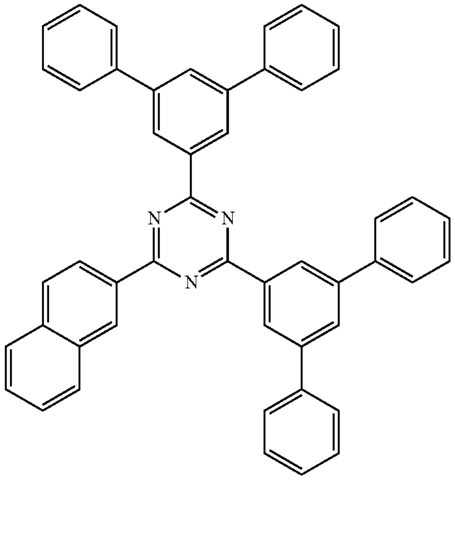
C-10
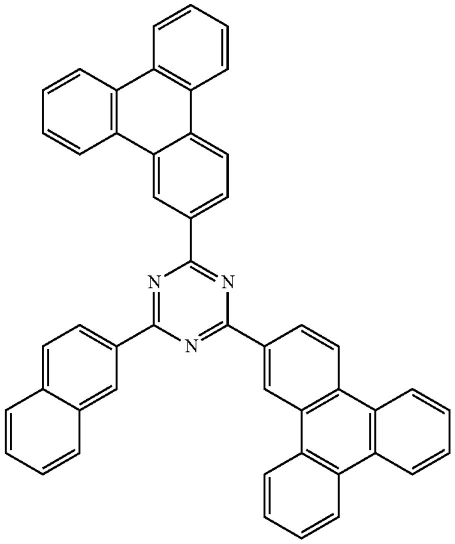
C-11
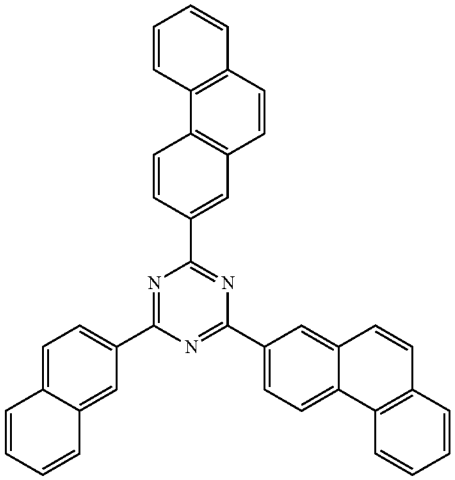
-continued
C-12
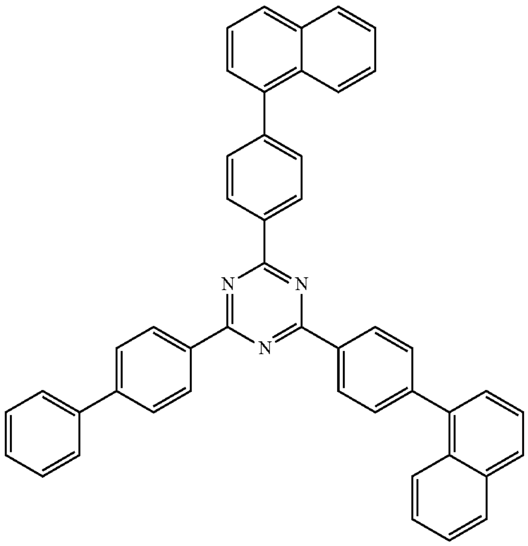
C-13
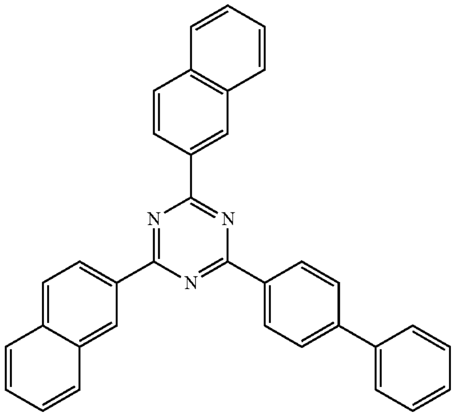
C-14
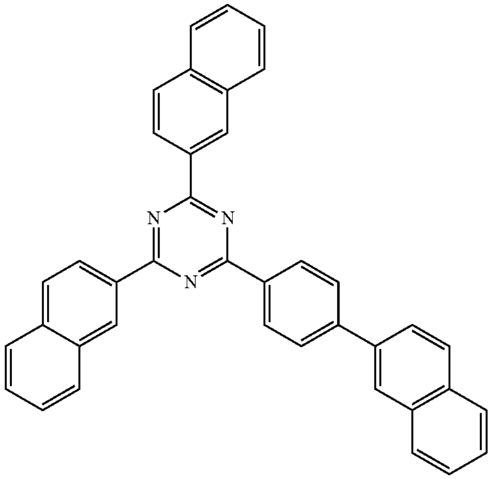

-continued
C-15
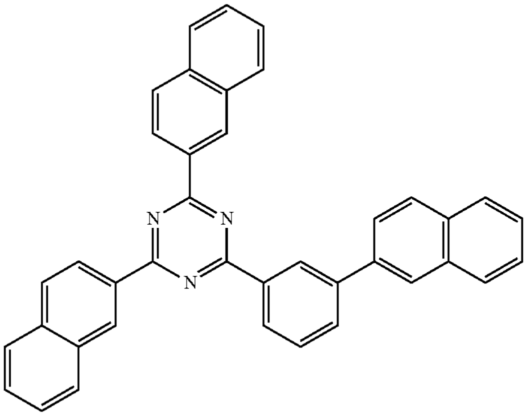
C-16
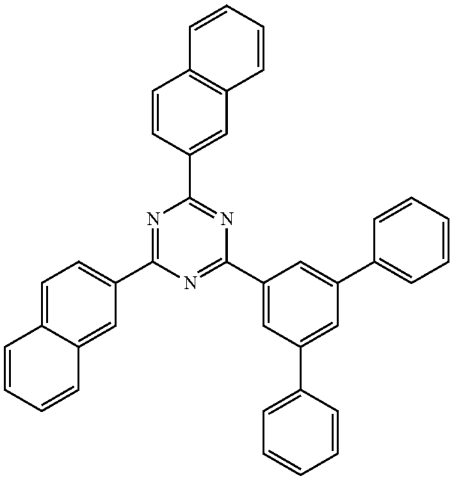
C-17
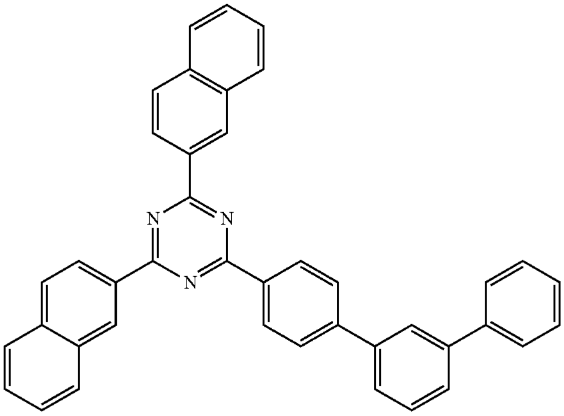
-continued
C-18
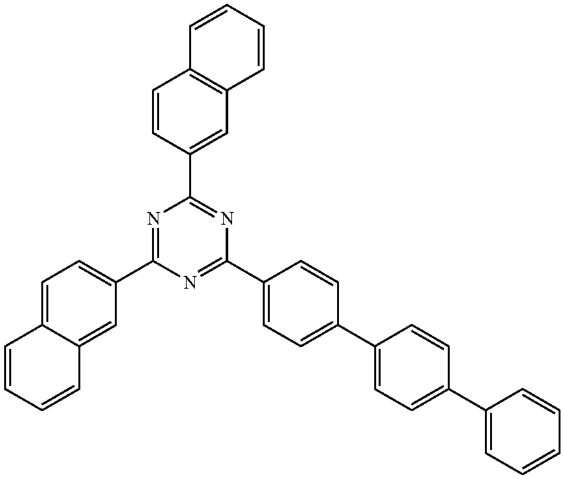
C-19
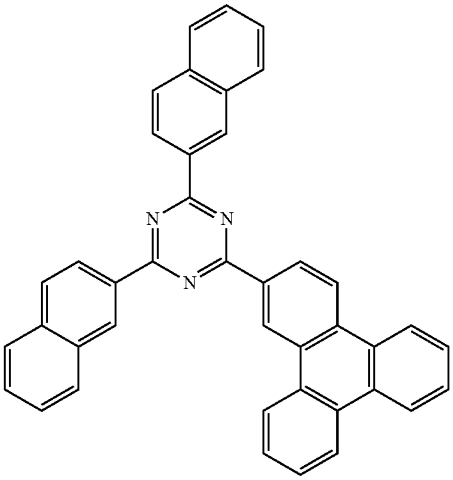
C-20
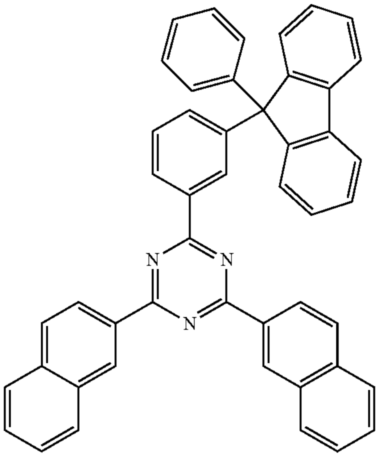

-continued
C-21
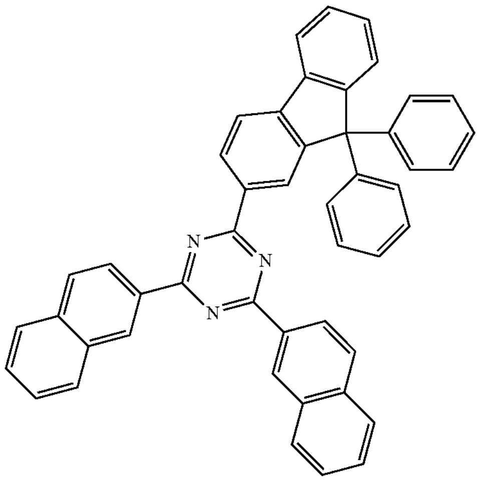
C-22
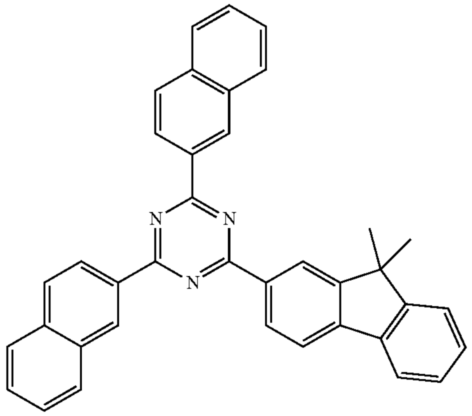
C-23
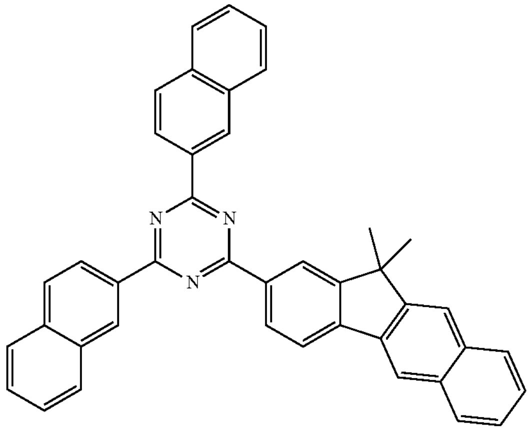
-continued
C-24
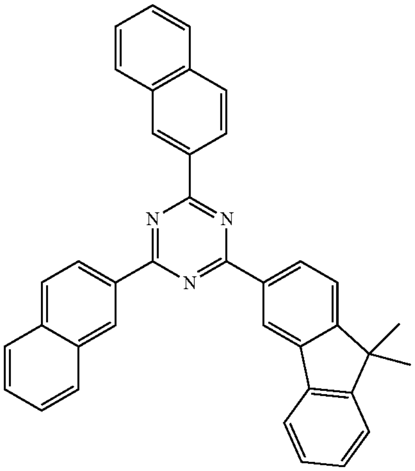
C-25
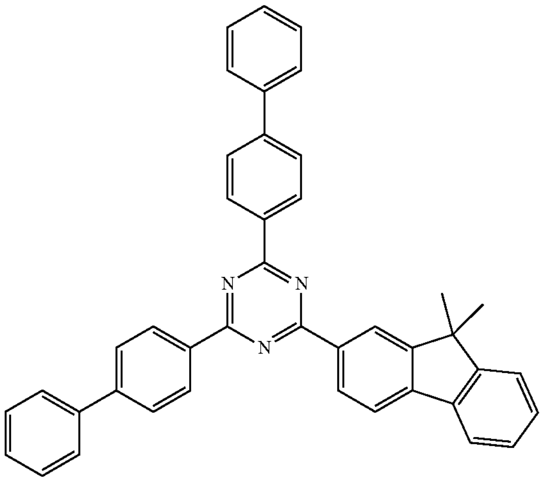
C-26
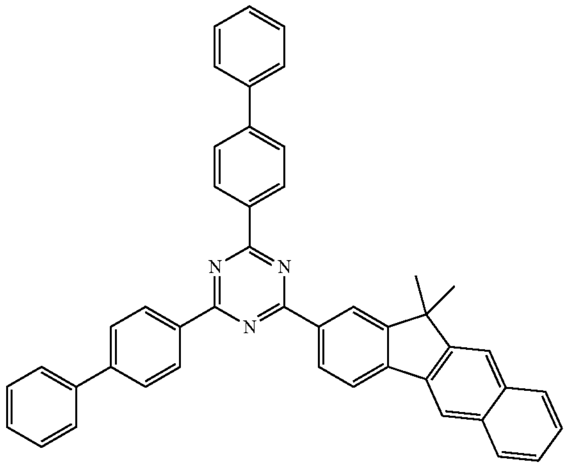

-continued
C-27
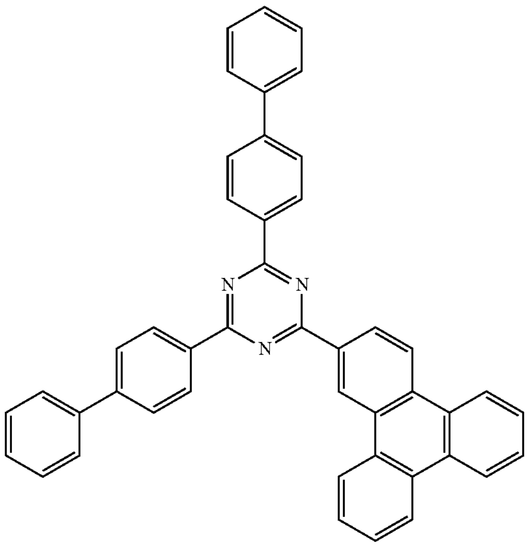
C-28
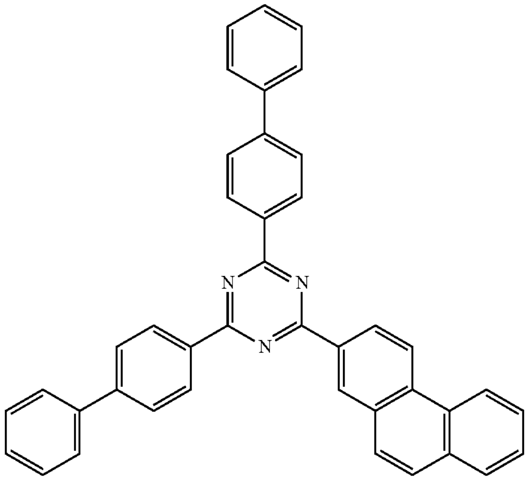
C-29
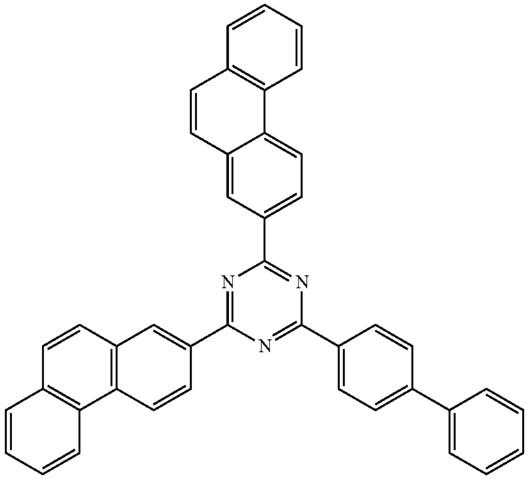
-continued
C-30
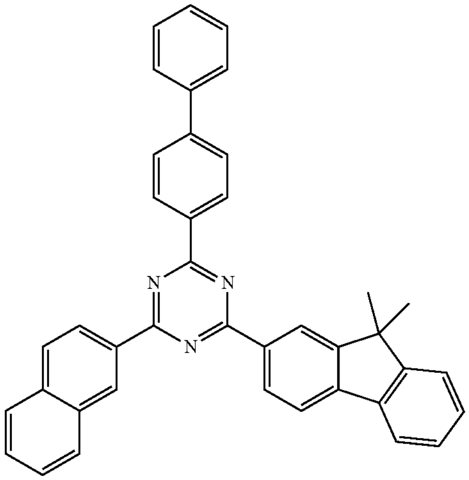
C-31
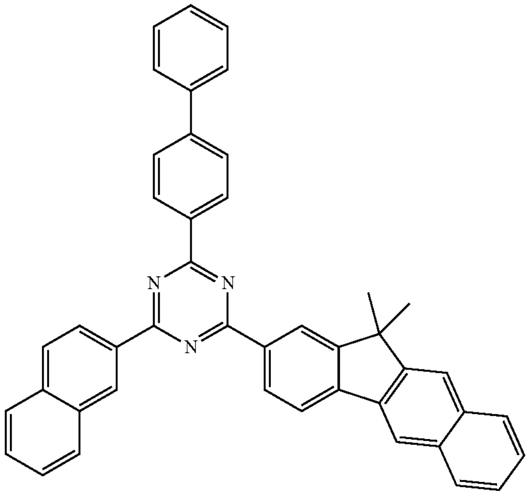
C-32
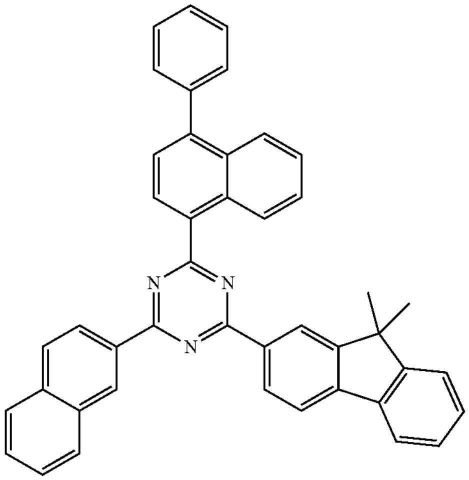

-continued
C-33
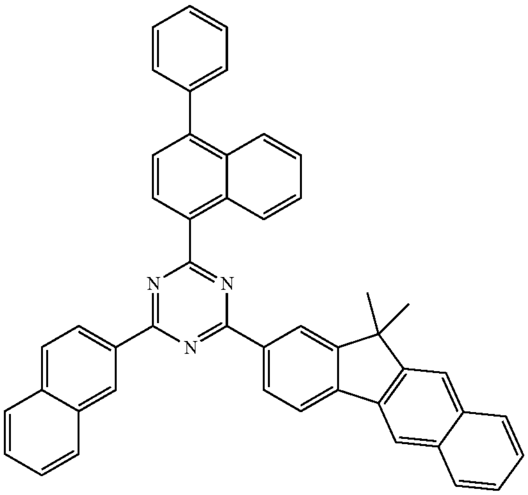
C-34
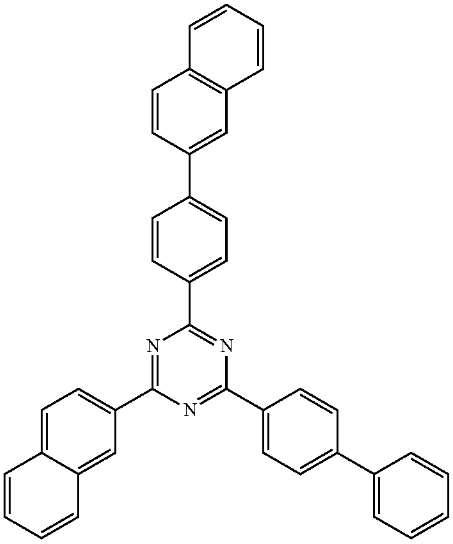
C-35
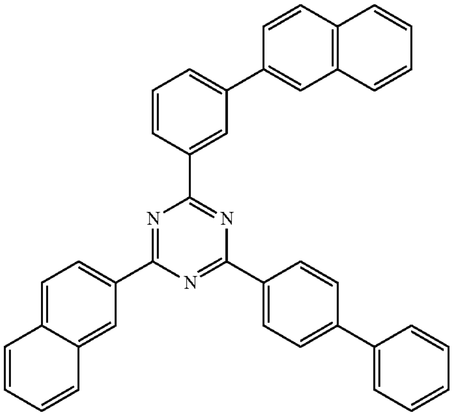
-continued
C-36
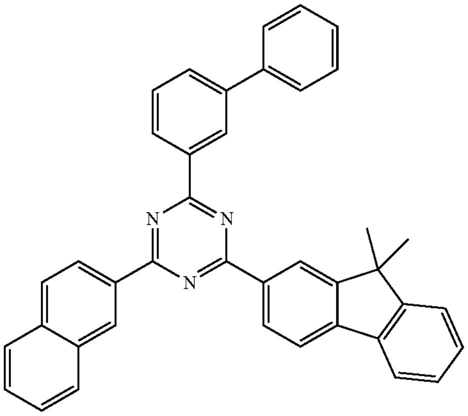
C-37
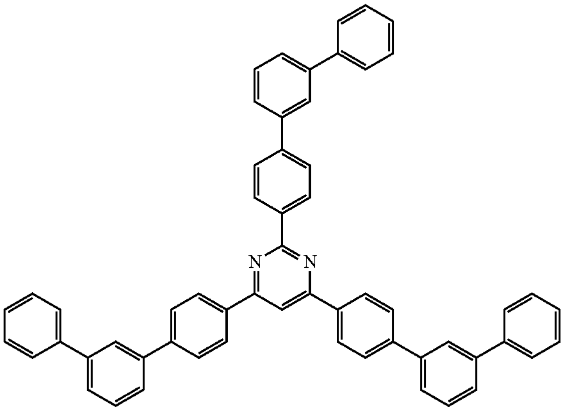
C-38
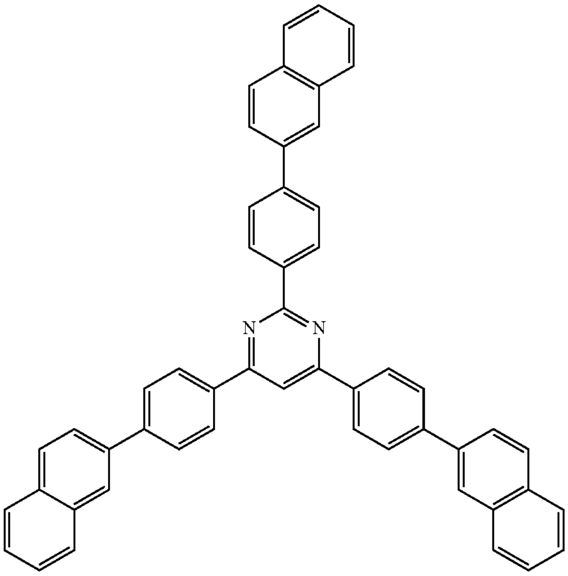

-continued
C-39
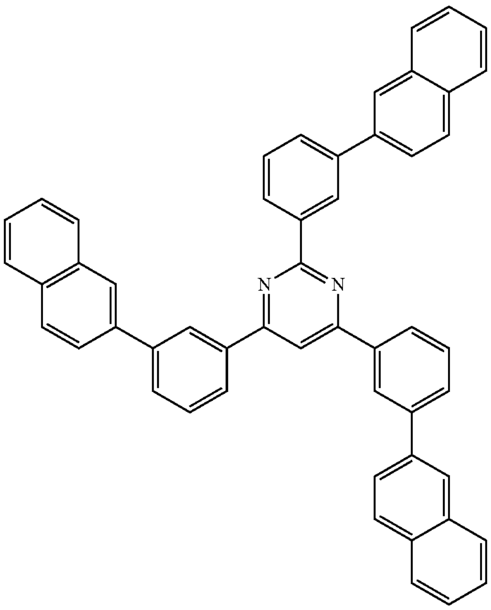
C-40
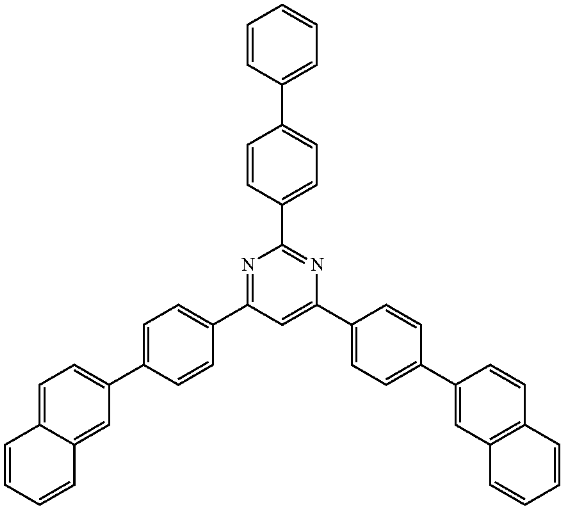
C-41
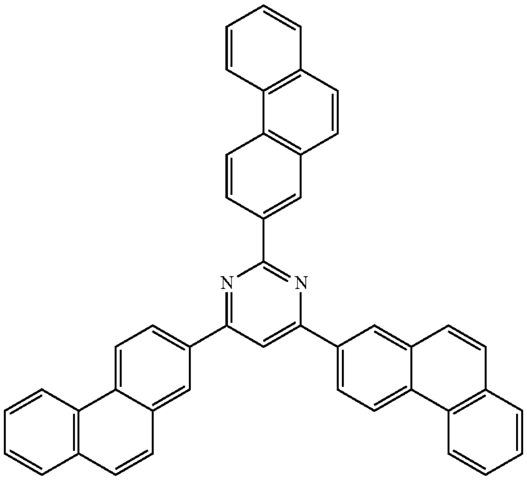
-continued
C-42
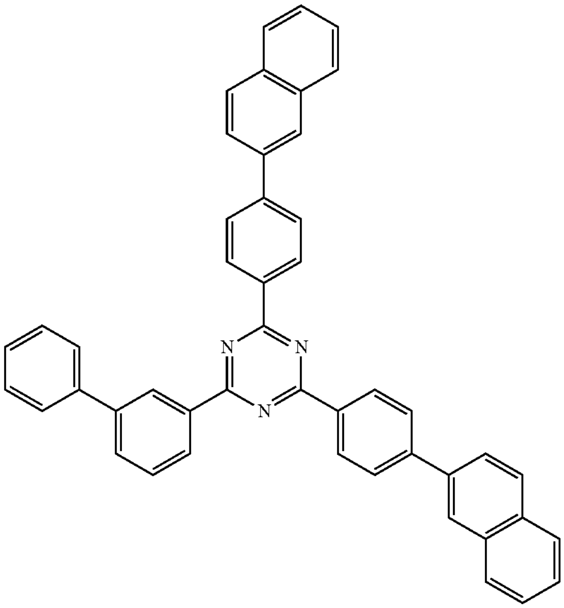
C-43
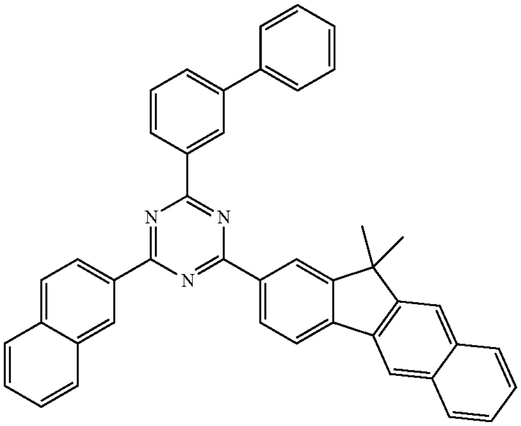
C-44
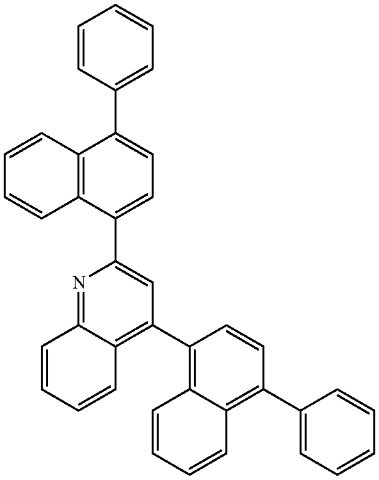

-continued
C-45
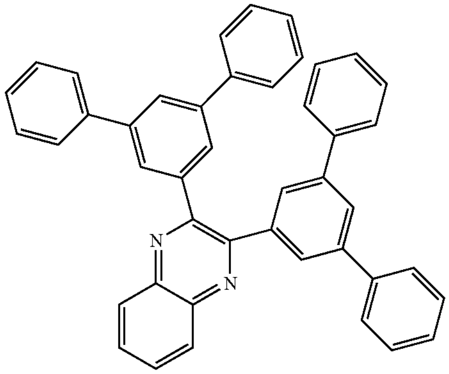
C-46
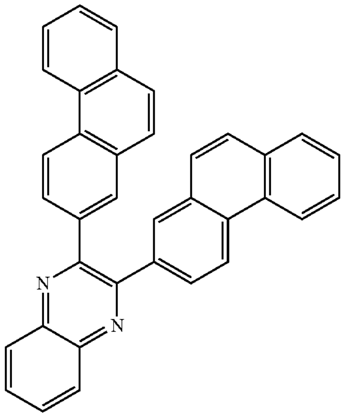
C-47
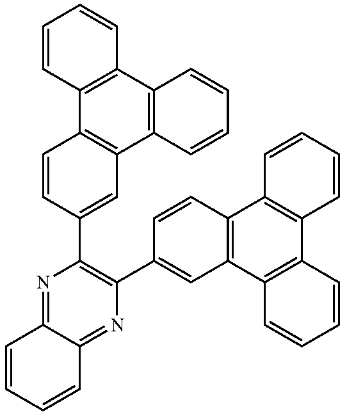
-continued
C-48
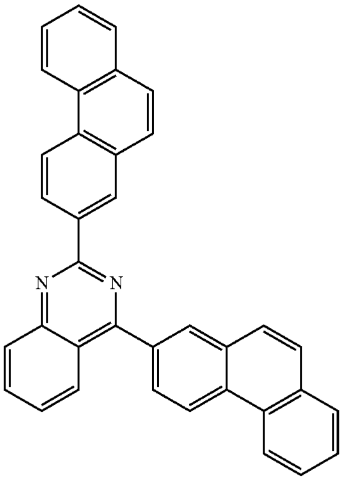
C-49
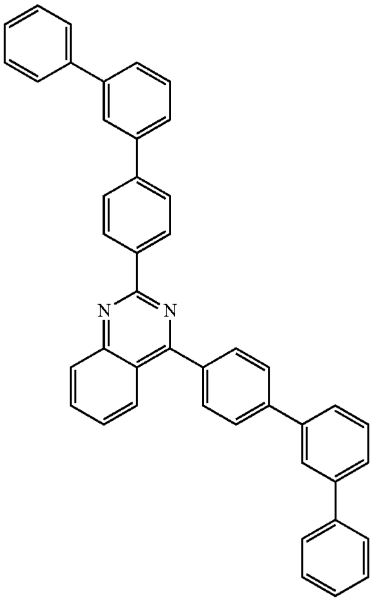
C-50
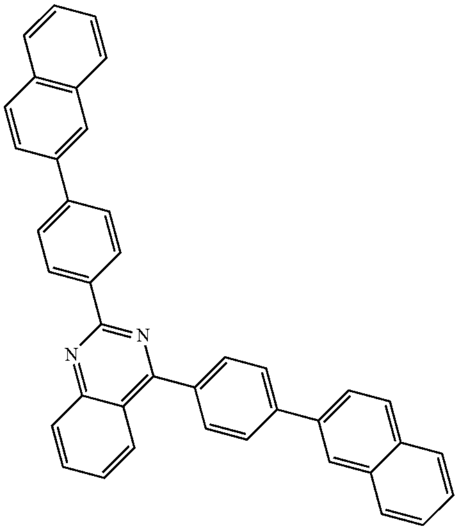

-continued
C-51
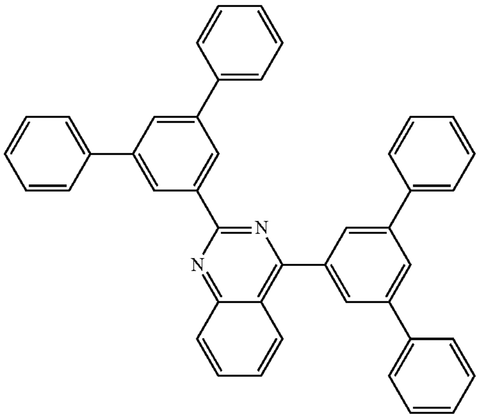
C-52
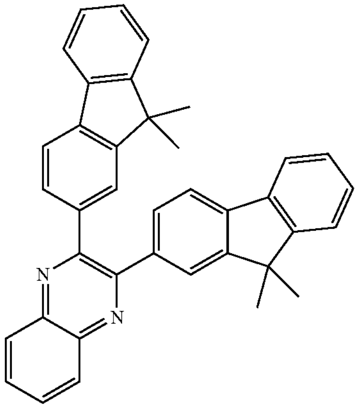
C-53
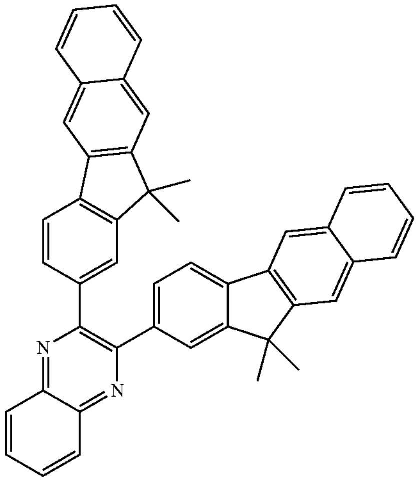
-continued
C-54
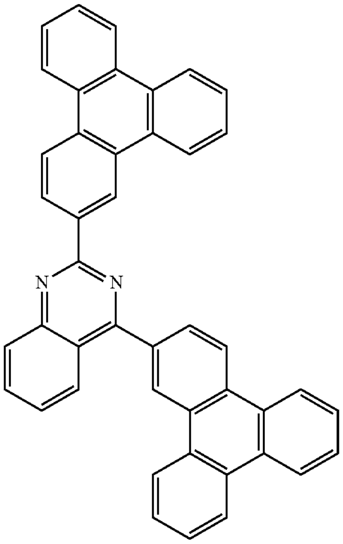
C-55
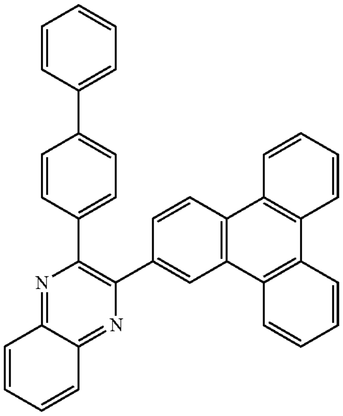
C-56
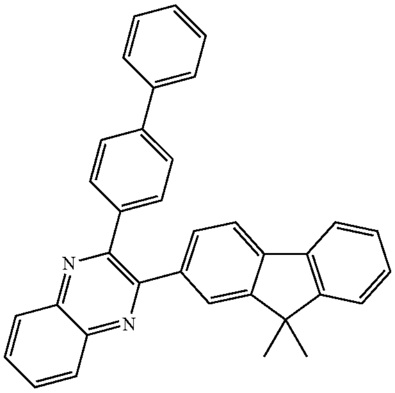

-continued
C-57
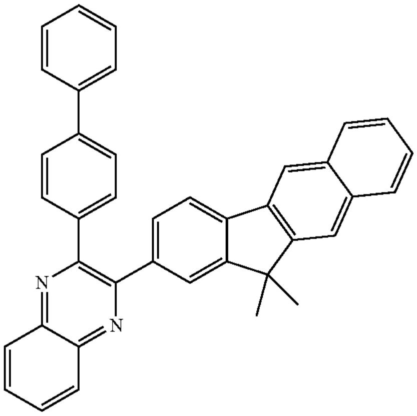
C-58
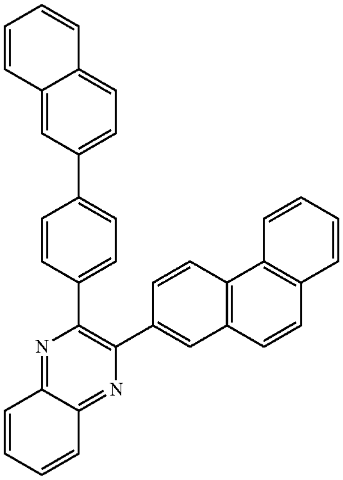
C-59
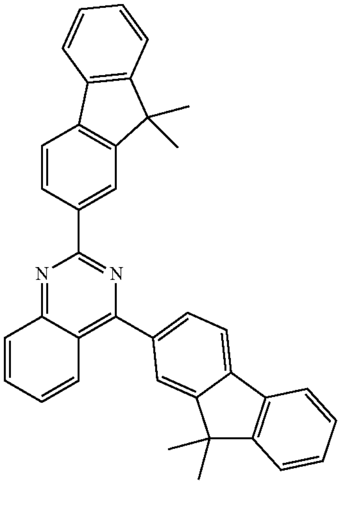
-continued
C-60
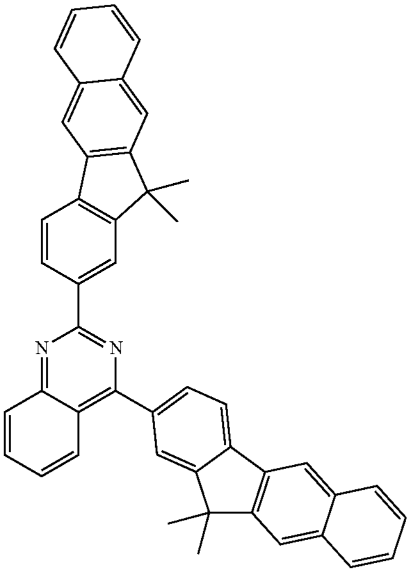
C-61
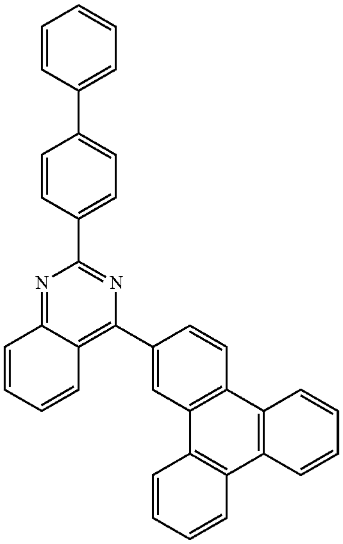
C-62
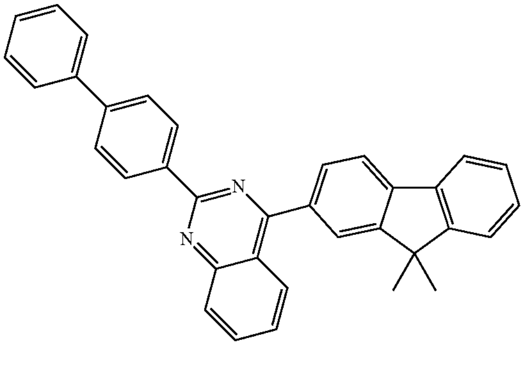

-continued
C-63
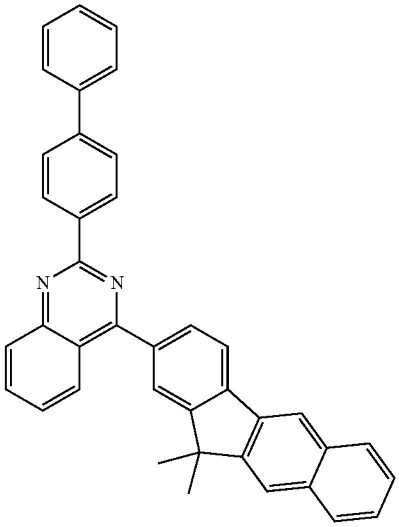
C-64
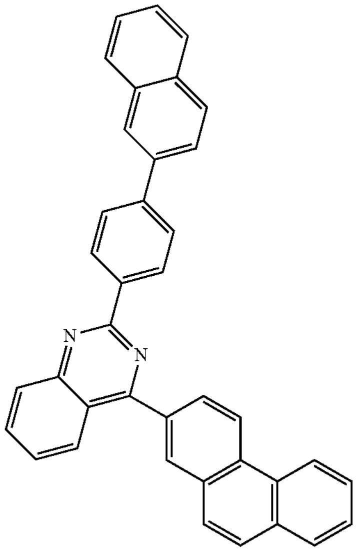
-continued
C-65
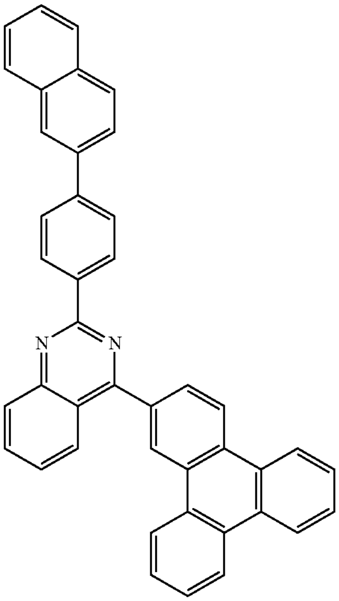
C-66
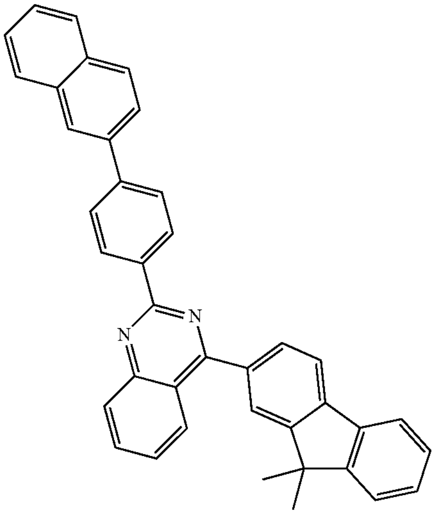
C-67
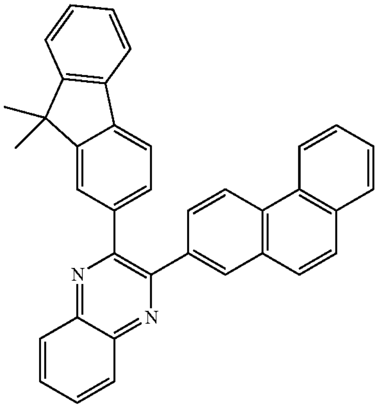

-continued
C-68
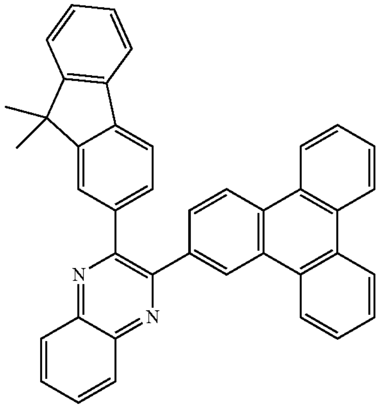
C-69
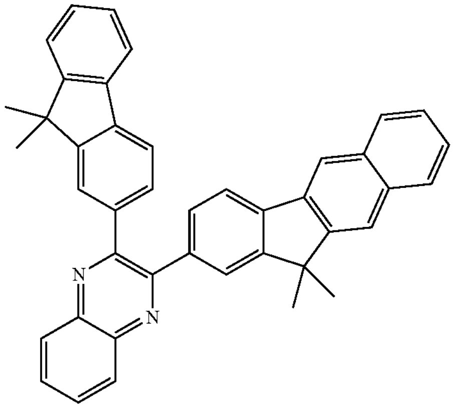
C-70
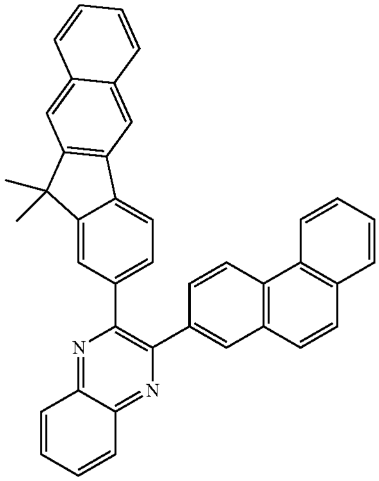
-continued
C-71
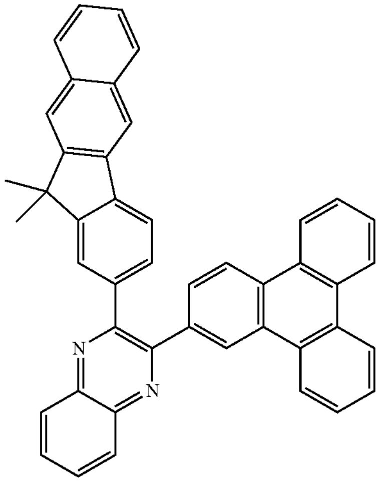
C-72
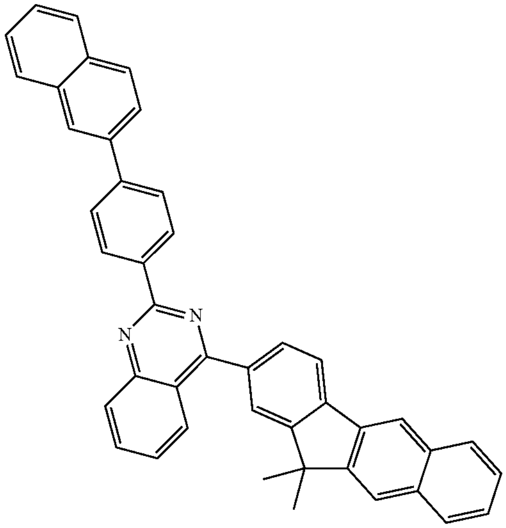
C-73
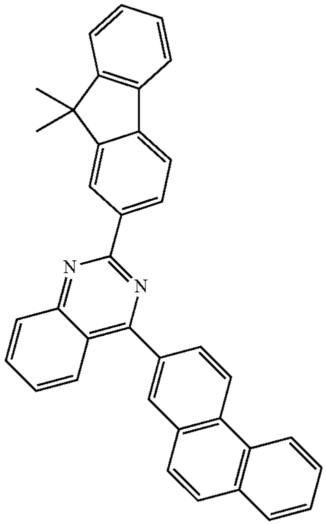

-continued
C-74
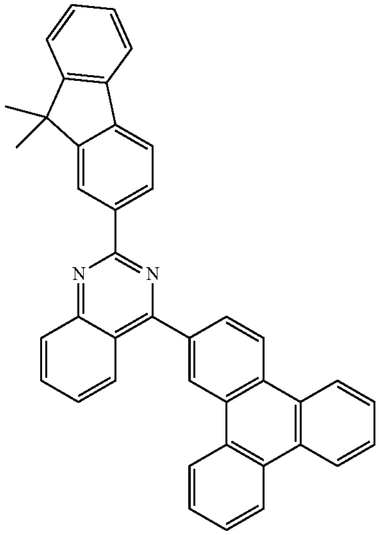
C-75
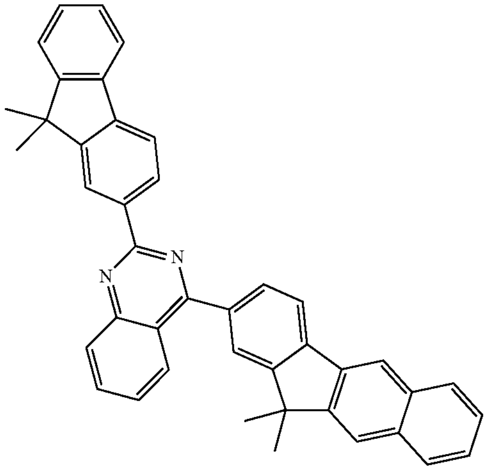
C-76
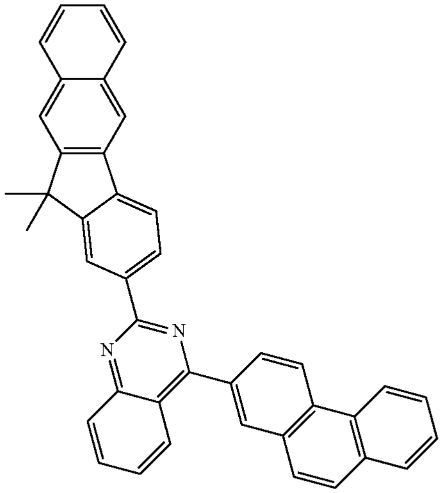
-continued
C-77
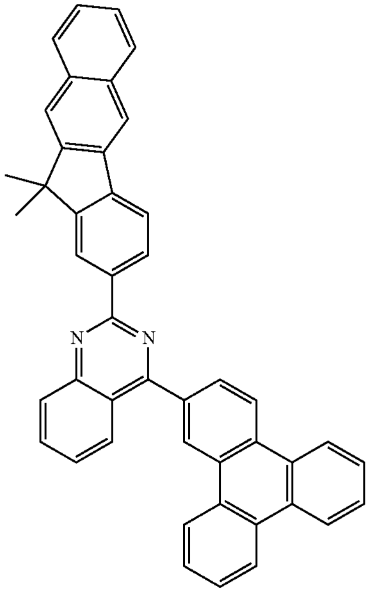
C-78
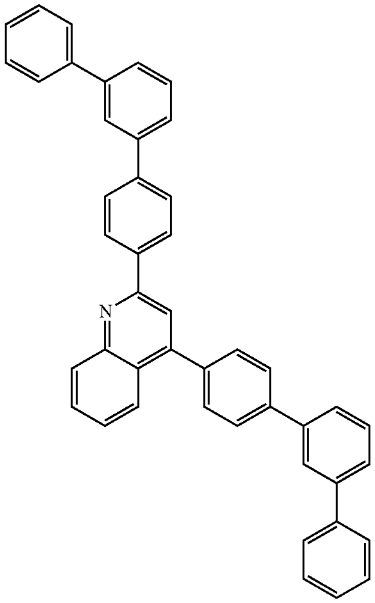

-continued
C-79
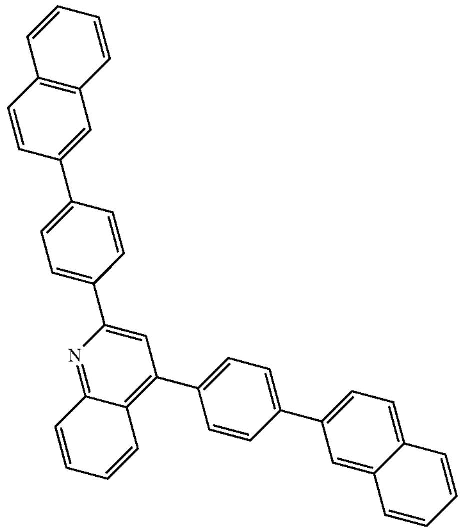
C-80
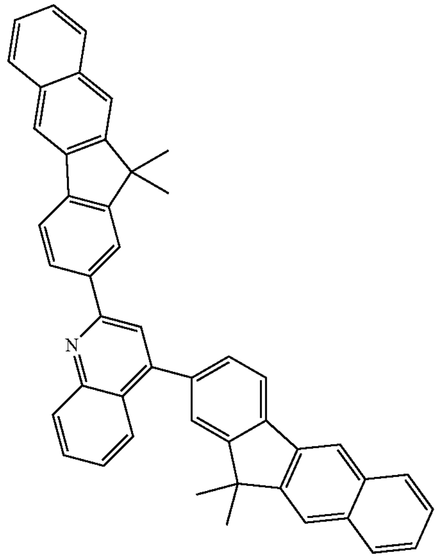
C-81
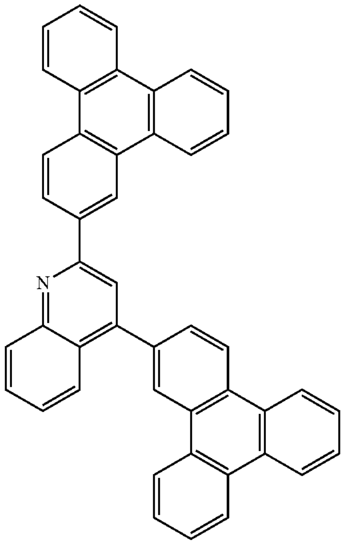
-continued
C-82
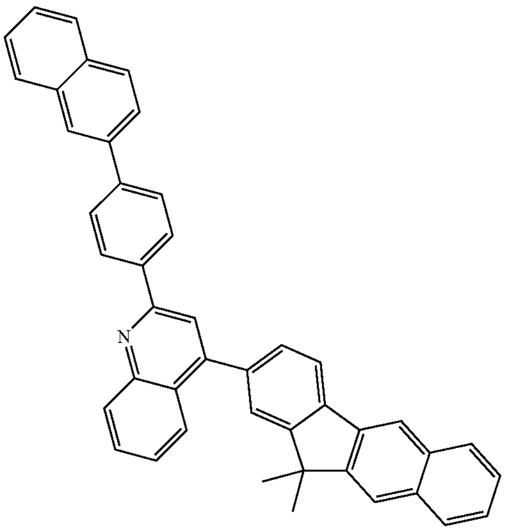
C-83
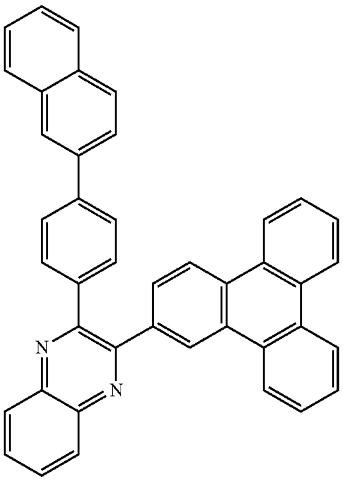
C-84
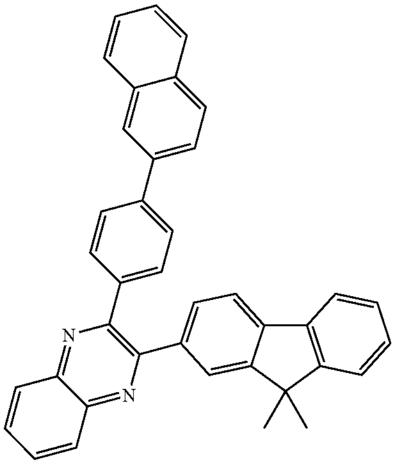

-continued
C-85
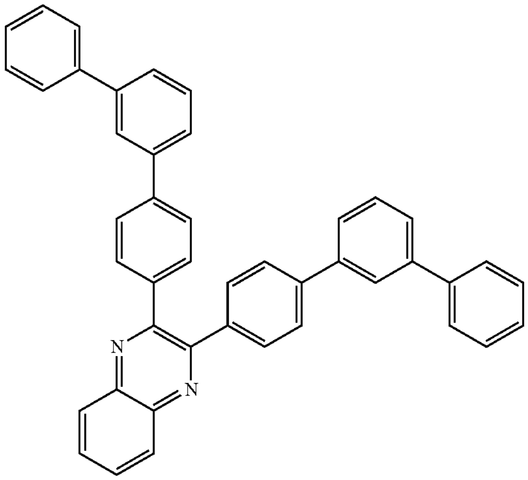
C-86
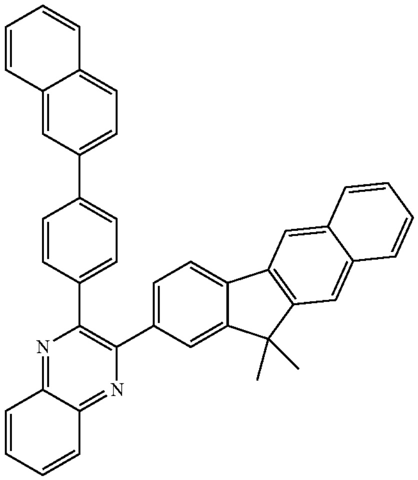
C-87
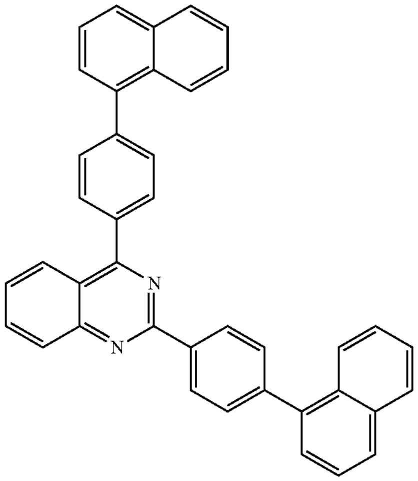
-continued
C-88
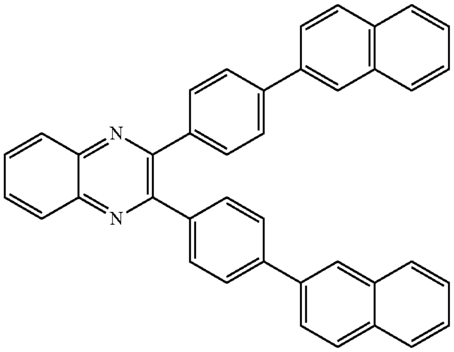
C-89
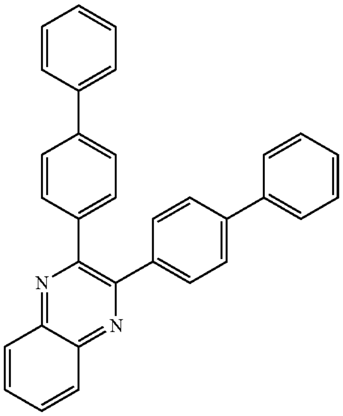
C-90
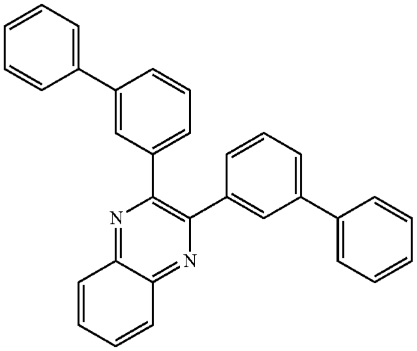
C-91
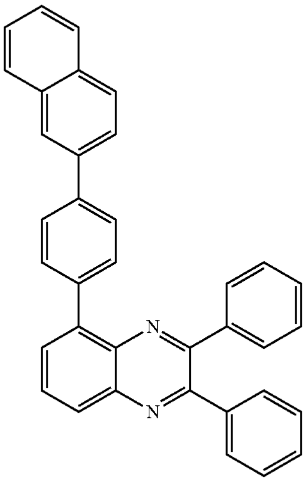

-continued
C-92
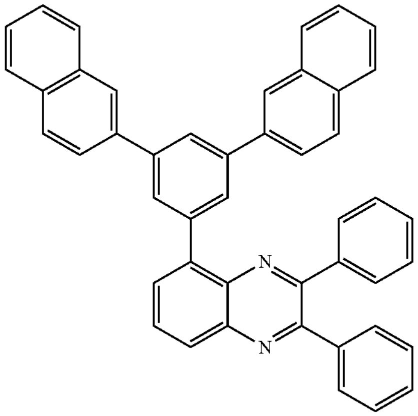
C-93
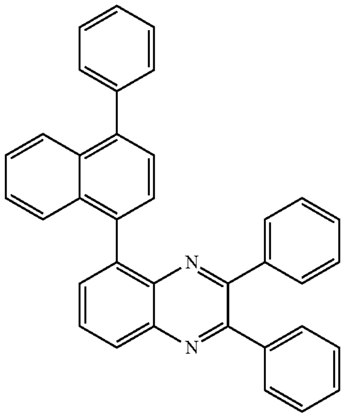
C-94
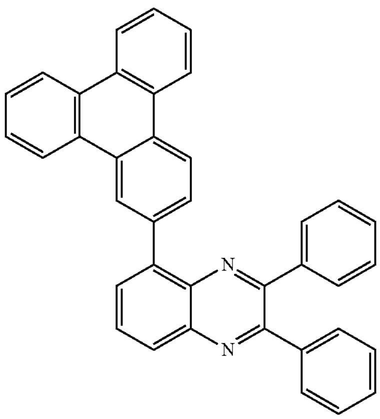
-continued
C-95
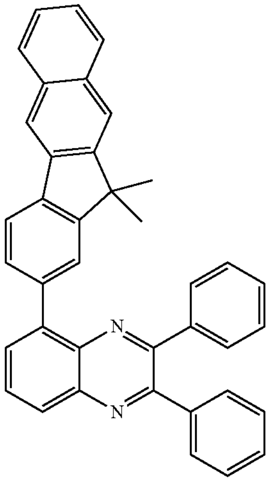
C-96
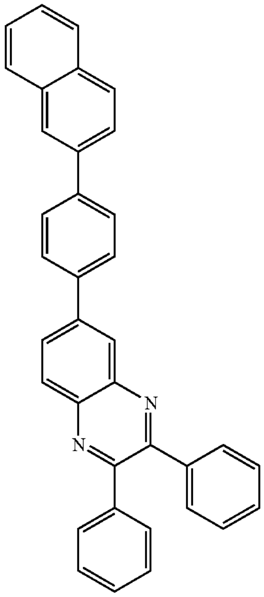
C-97
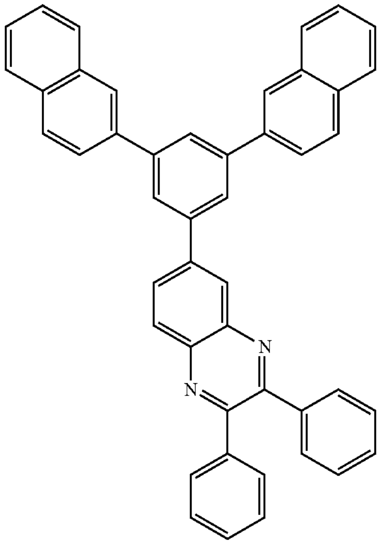

-continued
C-98
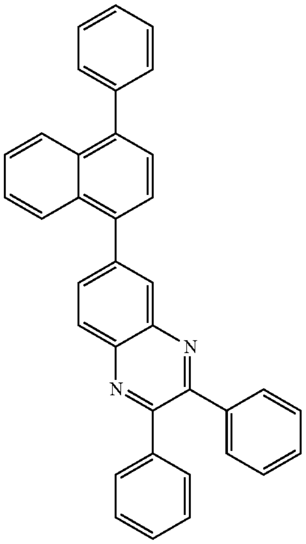
C-99
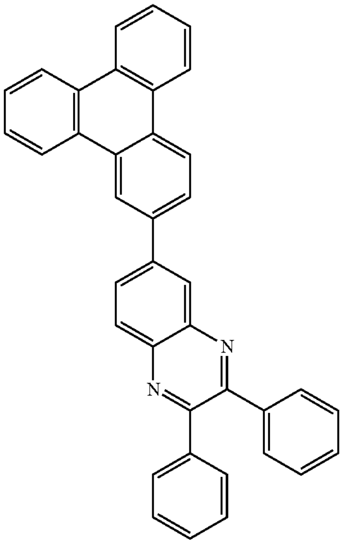
-continued
C-100
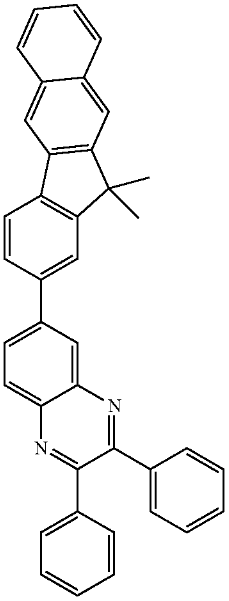
C-101
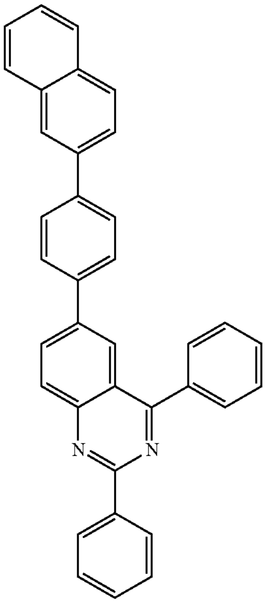

-continued
C-102
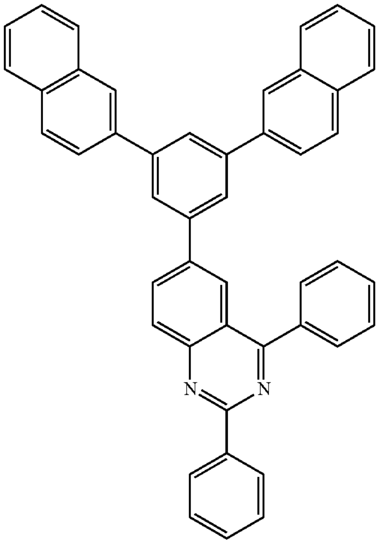
C-103
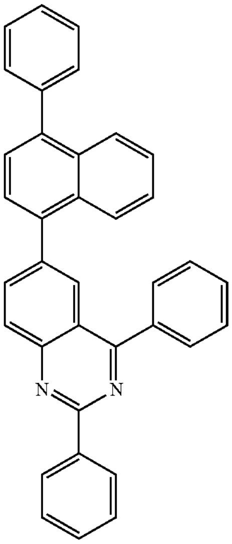
C-104
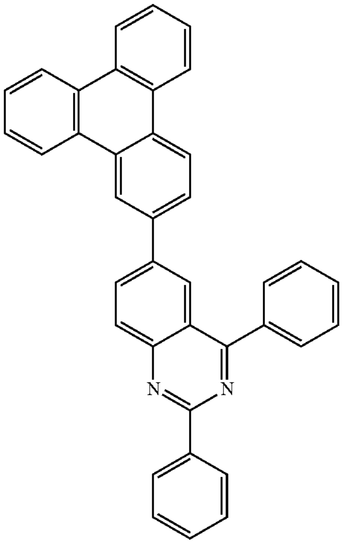
-continued
C-105
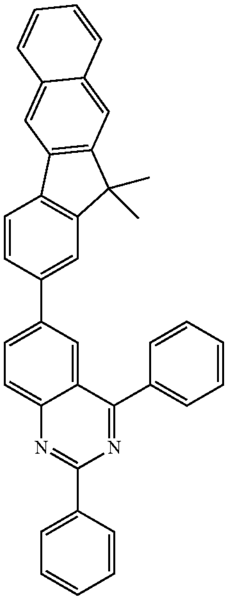
C-106
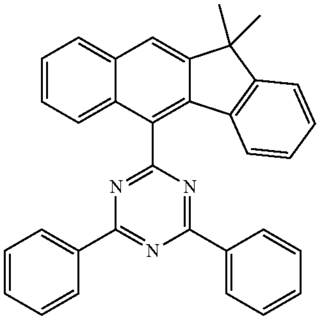
C-107
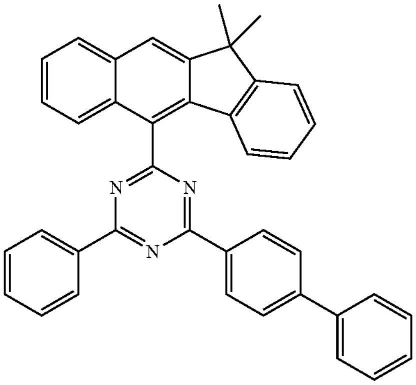
C-108
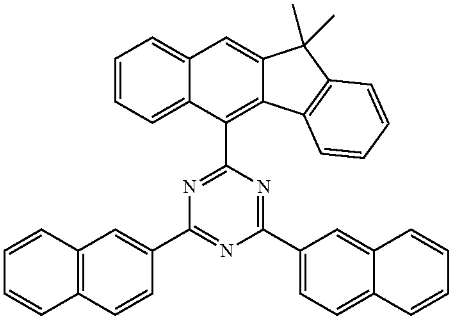

-continued
C-109
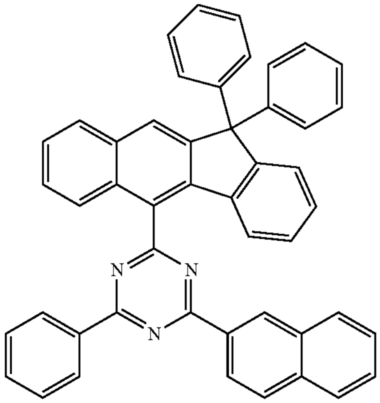
C-110
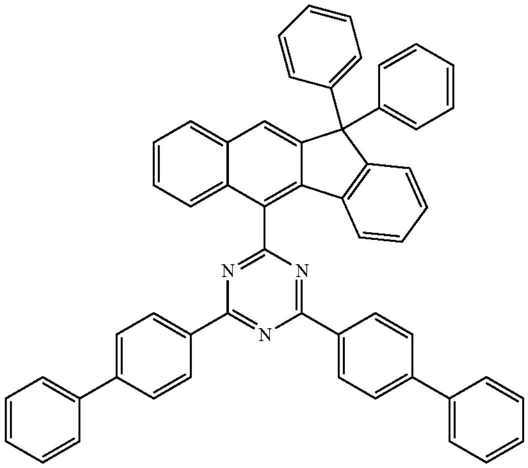
C-111
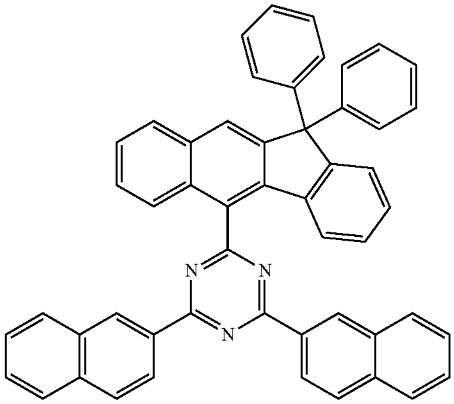
C-112
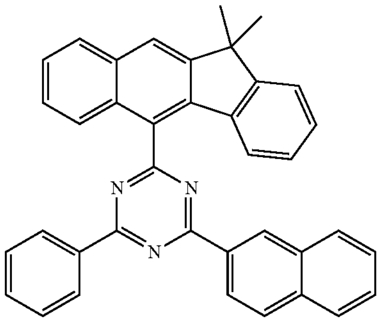
-continued
C-113
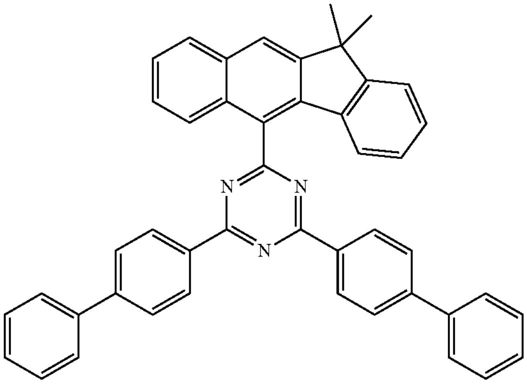
C-114
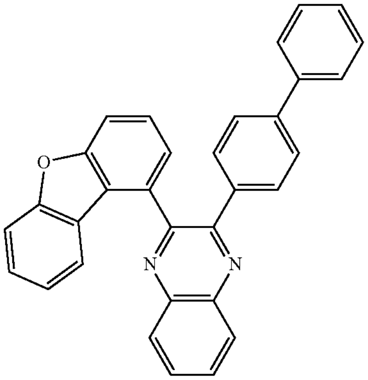
C-115
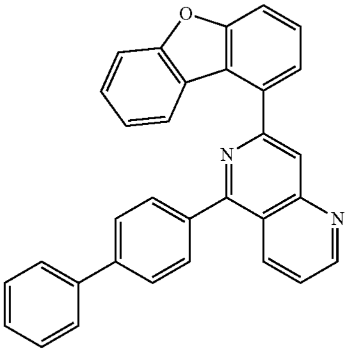
C-116
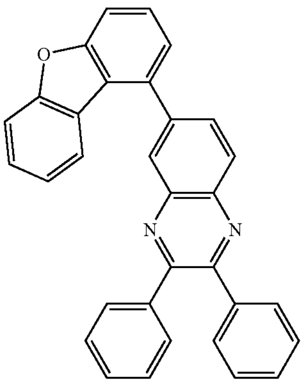

-continued
C-117
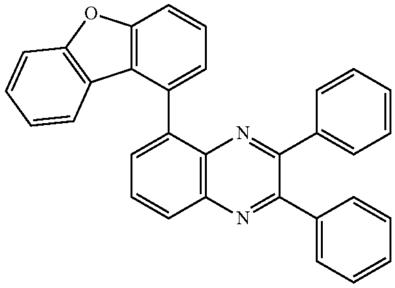
C-118
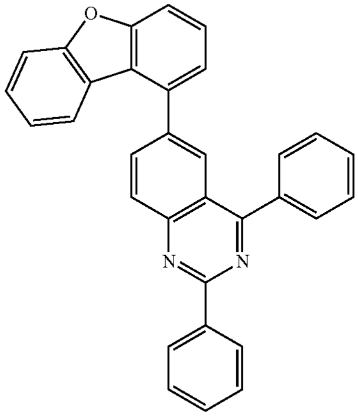
C-119
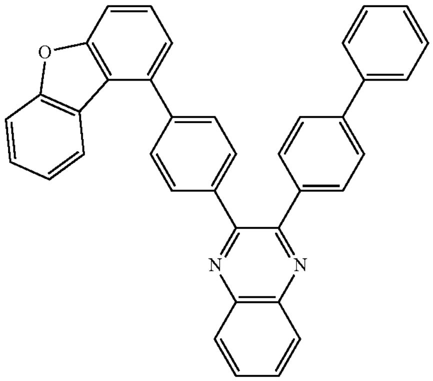
C-120
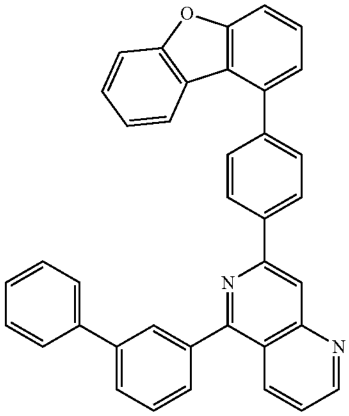
-continued
C-121
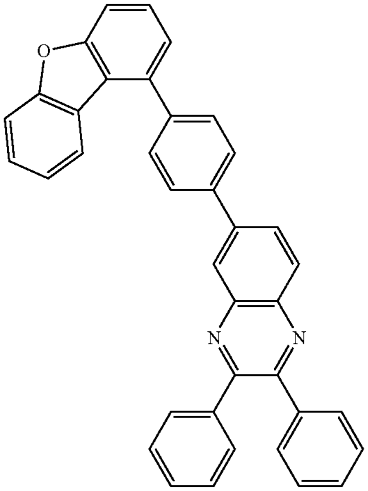
C-122
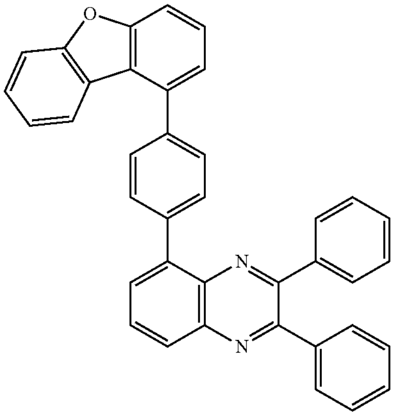
C-123
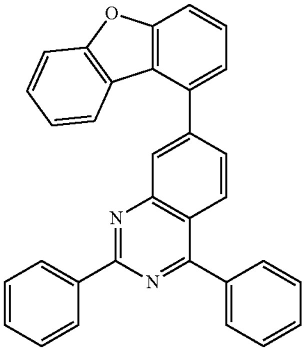

-continued
C-124
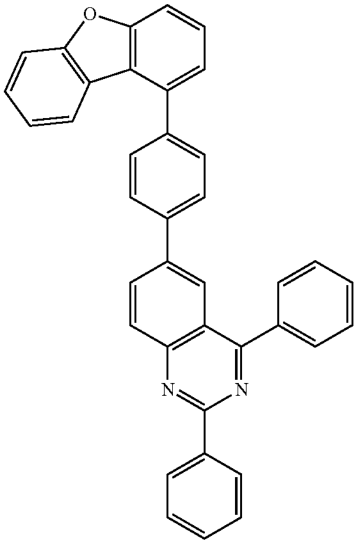
C-125
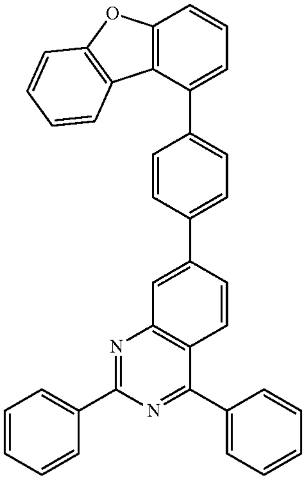
C-126
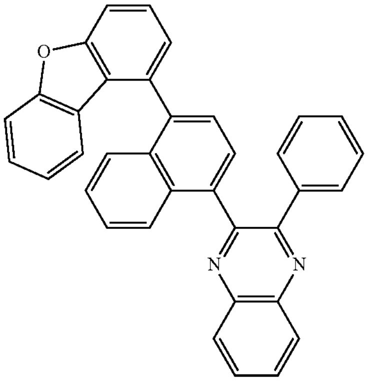
-continued
C-127
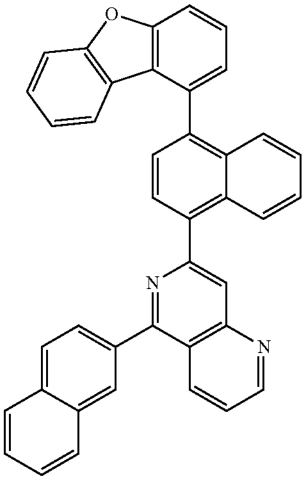
C-128
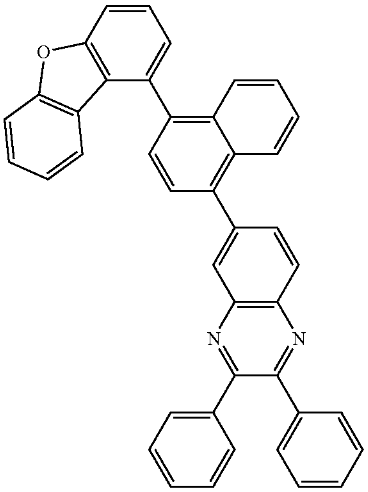
C-129
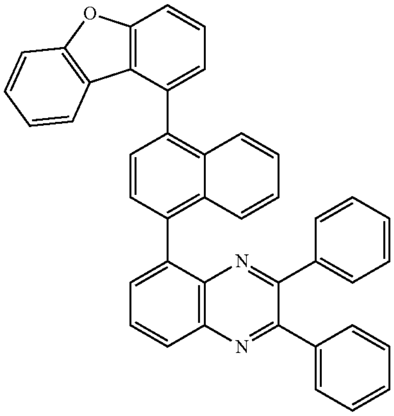

-continued
C-130
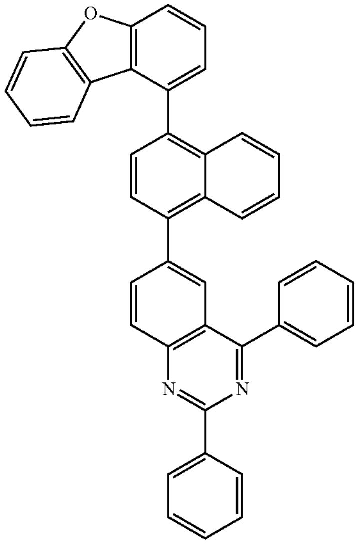
C-131
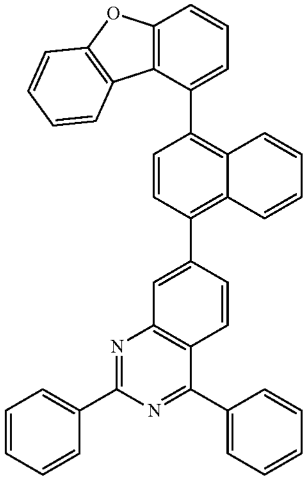
C-132
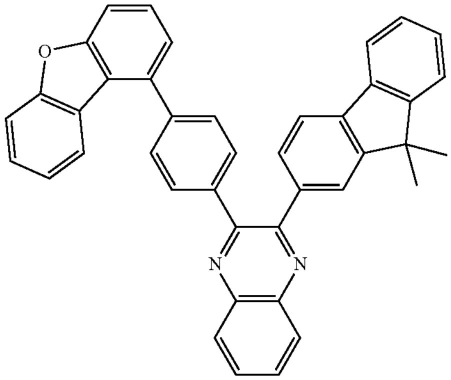
-continued
C-133
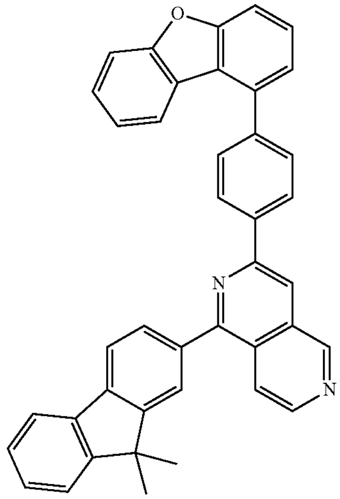
C-134
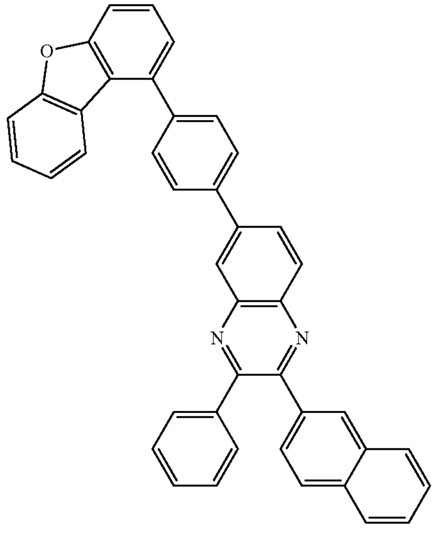
C-135
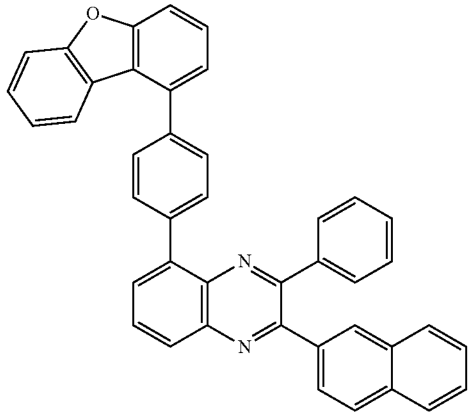

-continued
C-136
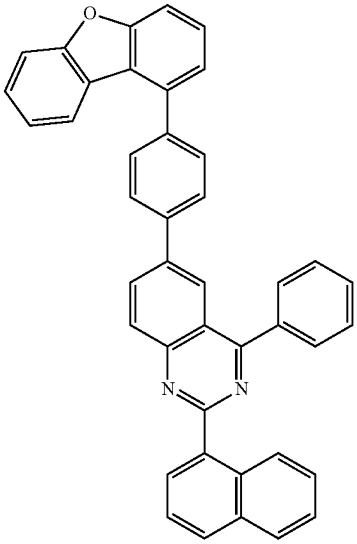
C-137
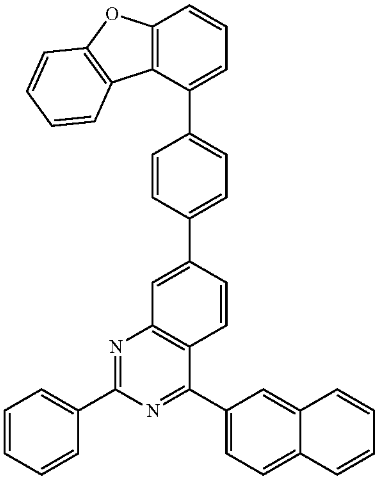
C-138
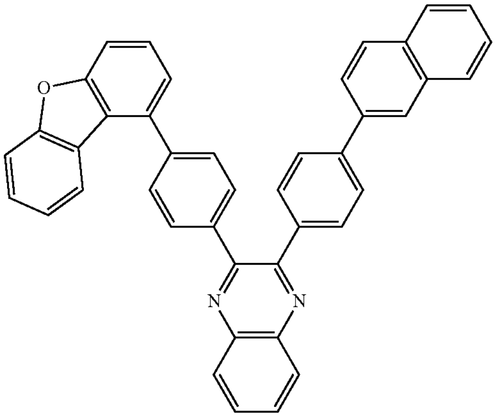
-continued
C-139
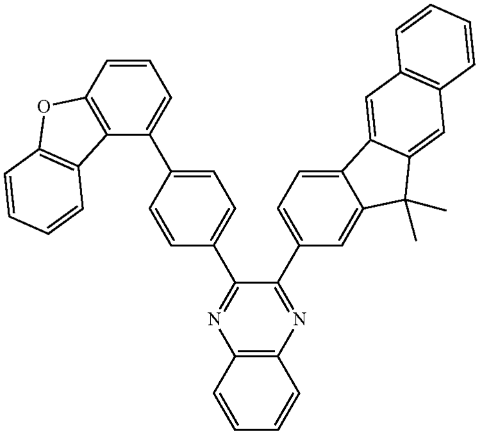
C-140
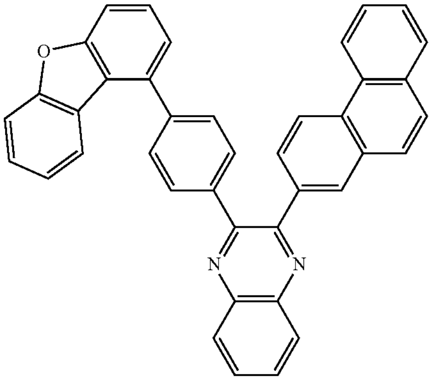
C-141
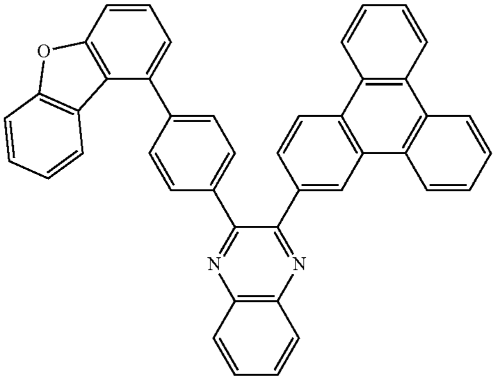

-continued
C-142
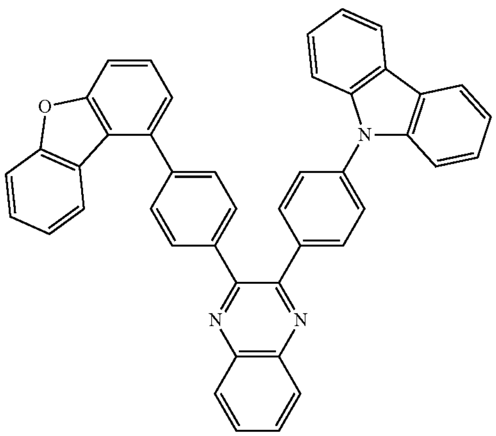
C-143
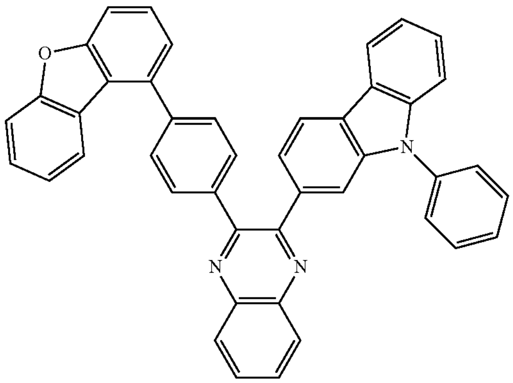
C-144
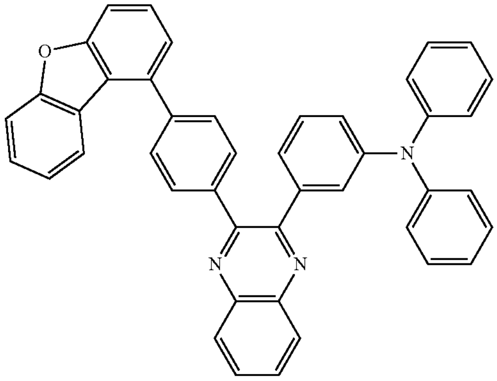
-continued
C-145
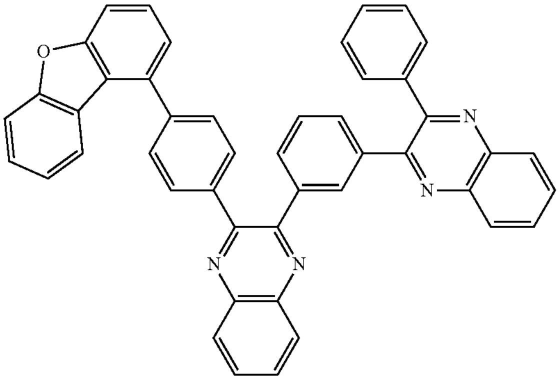
C-146
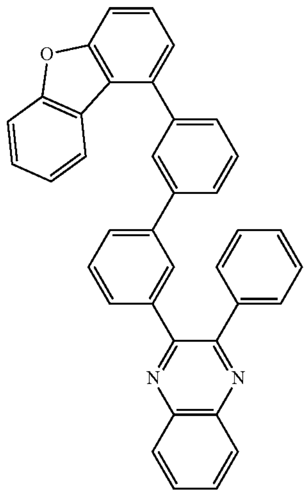
C-147
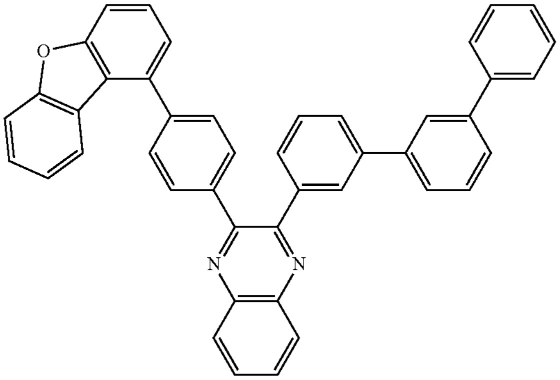

-continued
C-148
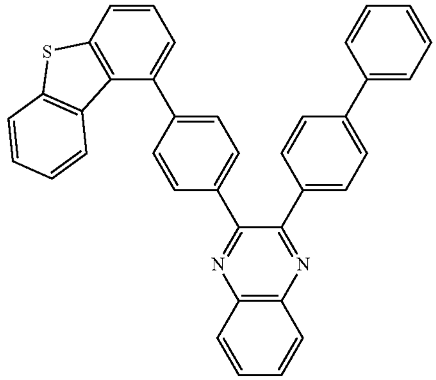
C-149
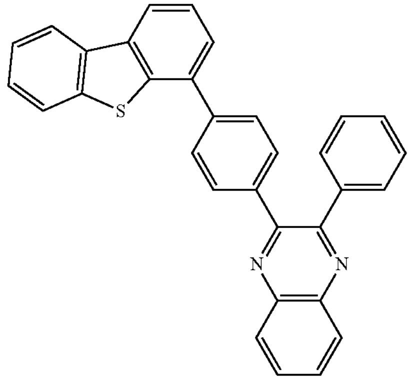
C-150
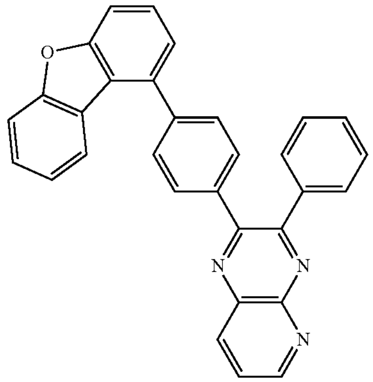
C-151
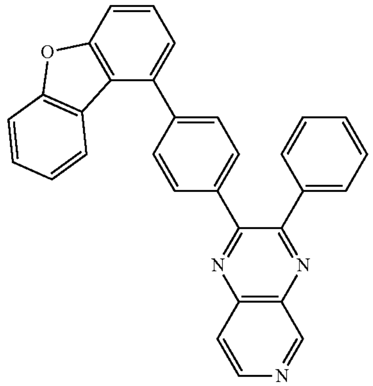
-continued
C-152
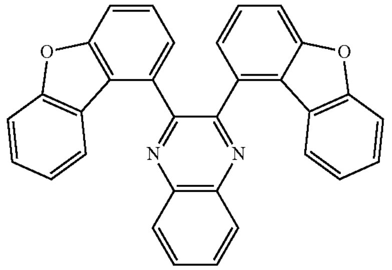
C-153
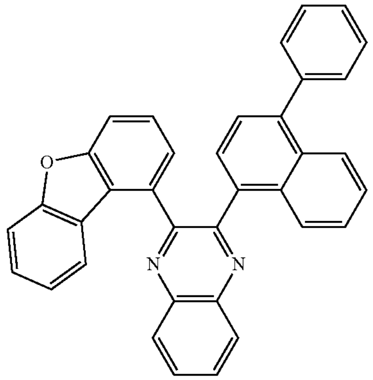
C-154
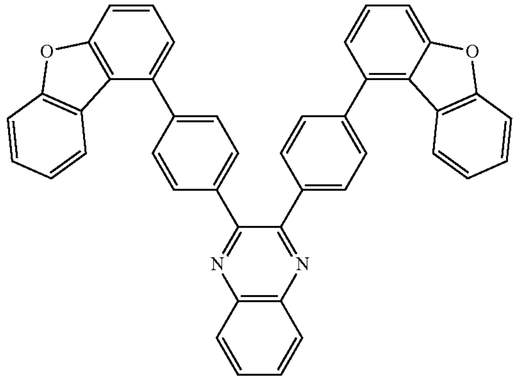
C-155
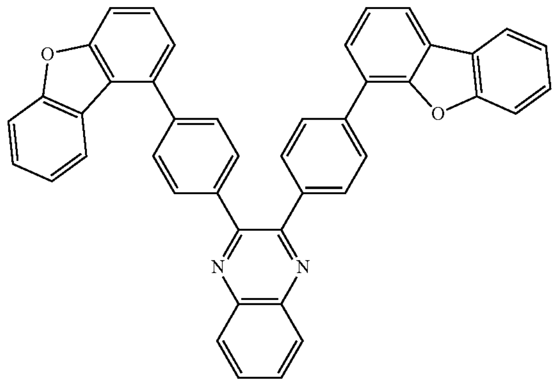

-continued
C-156
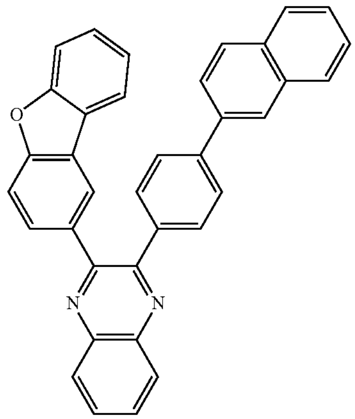
C-157
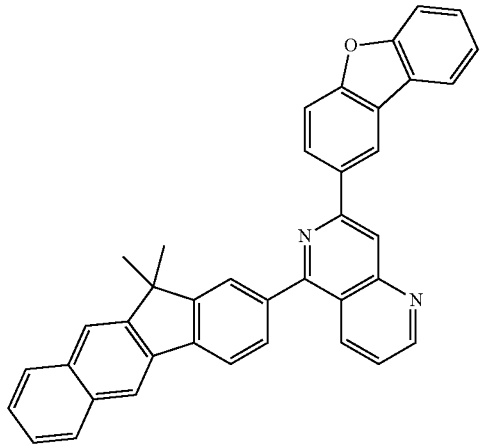
C-158
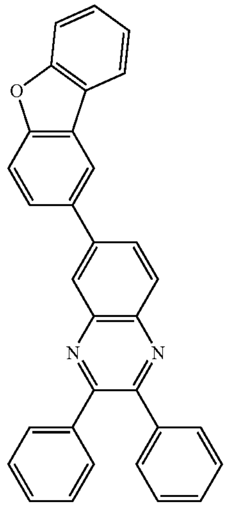
-continued
C-159
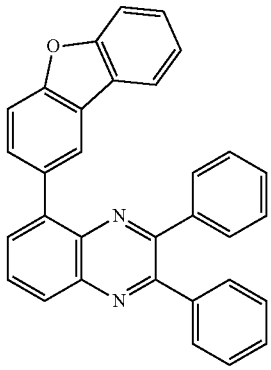
C-160
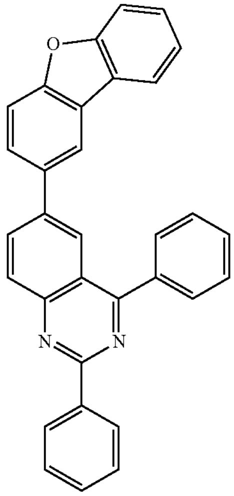
C-161
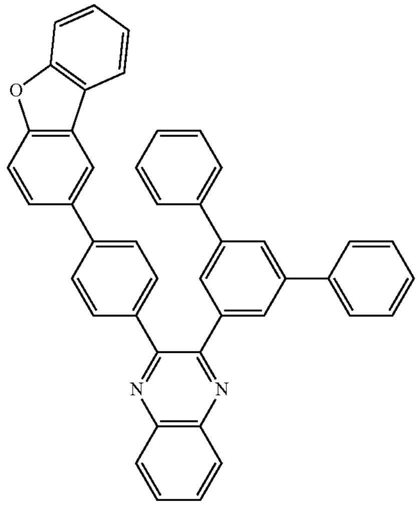

C-162
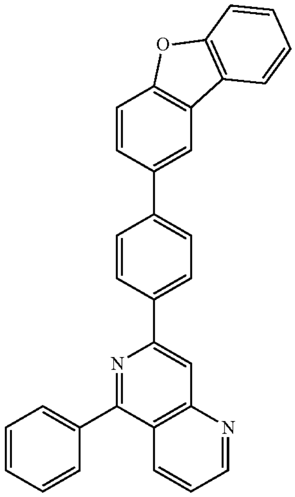
C-163
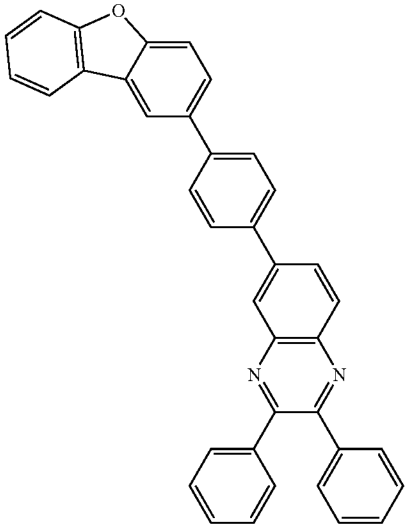
C-164
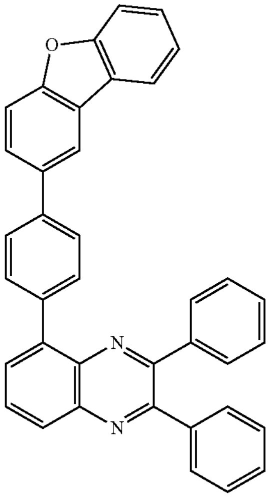
C-165
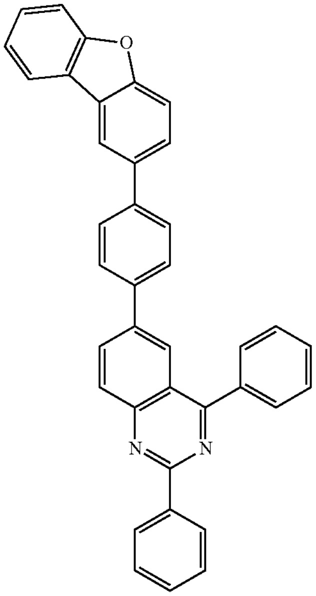
C-166
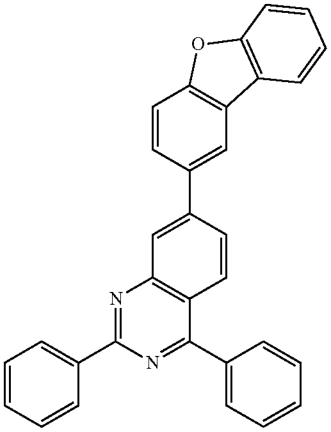
C-167
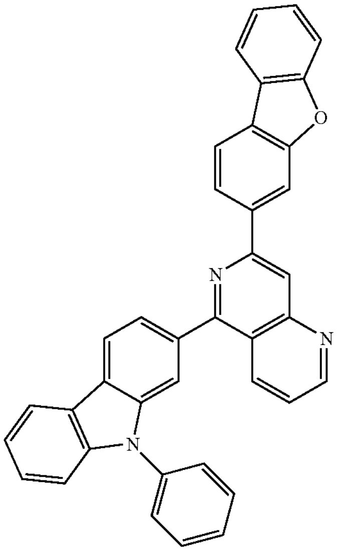

-continued
C-168
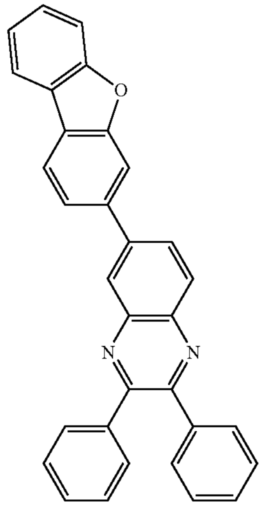
C-169
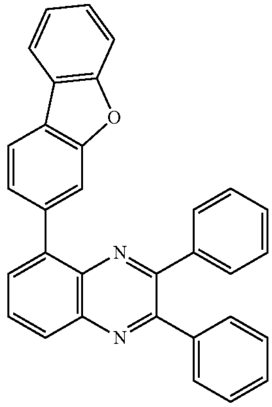
C-170
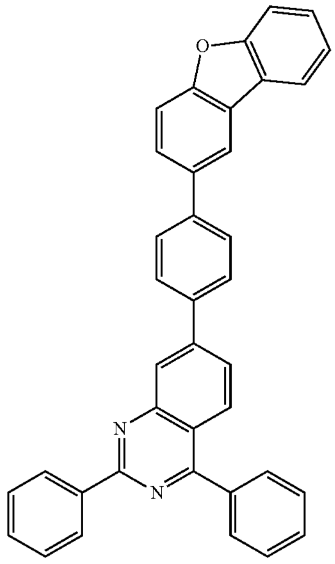
-continued
C-171
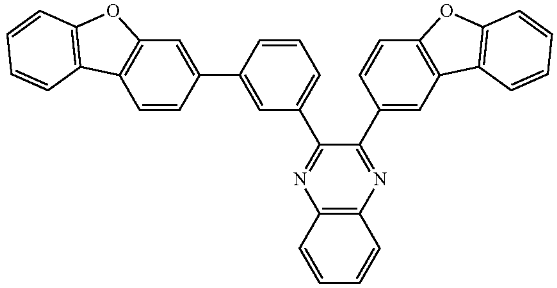
C-172
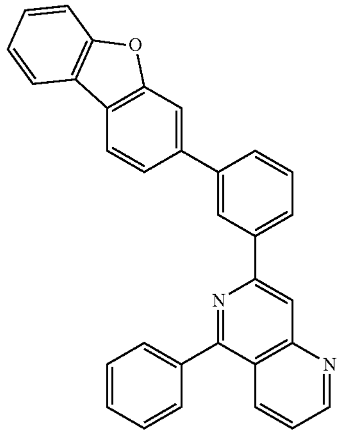
C-173
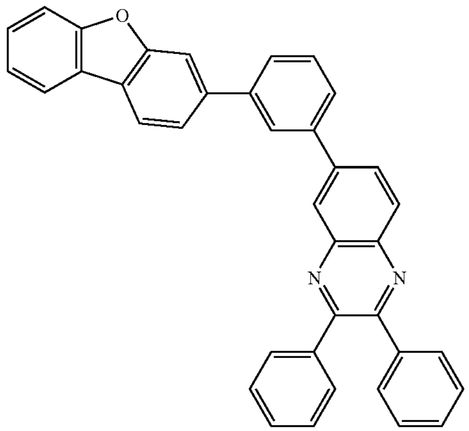
C-174
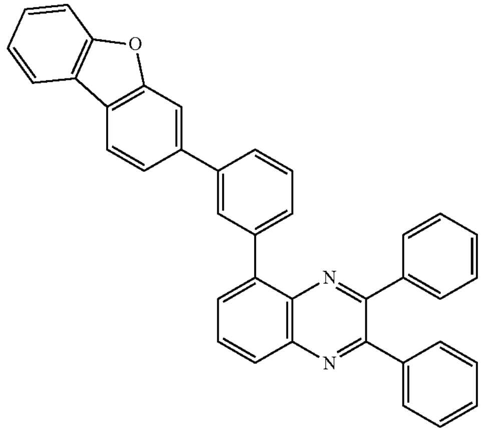

-continued
C-175
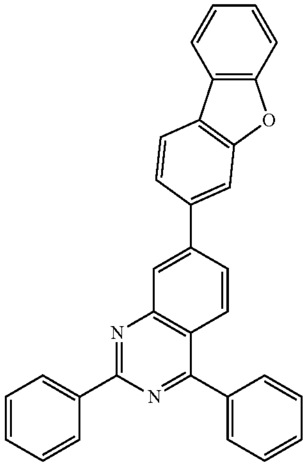
C-176
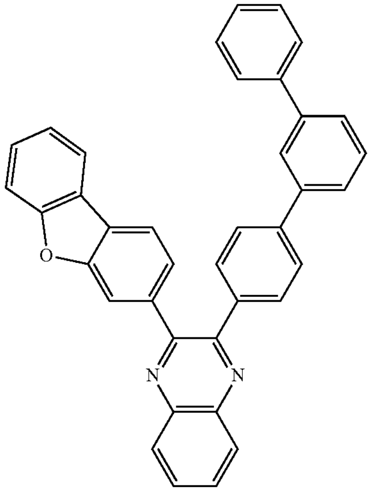
C-177
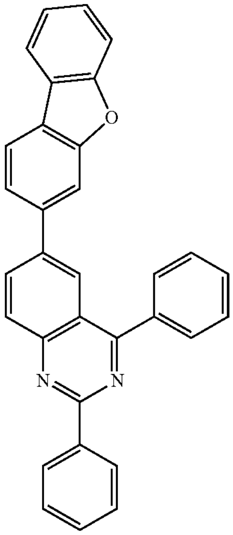
-continued
C-178
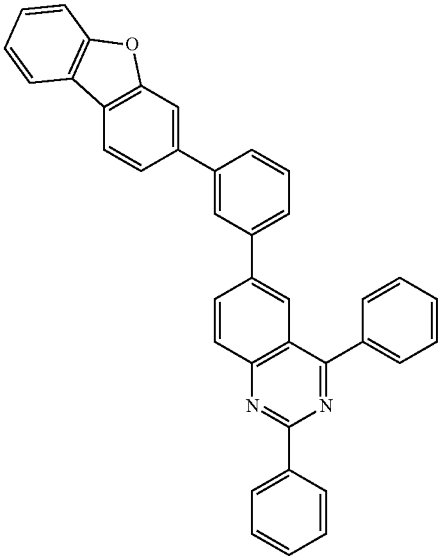
C-179
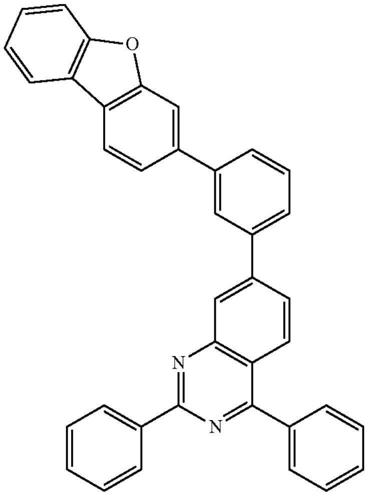
C-180
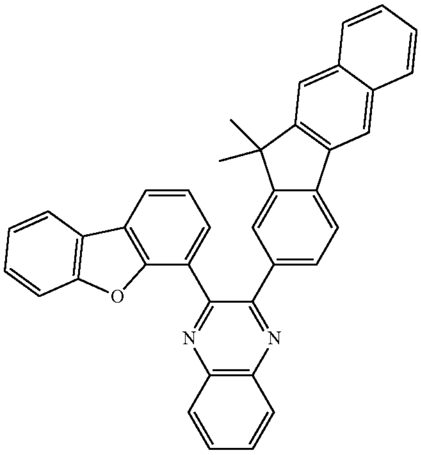

-continued
C-181
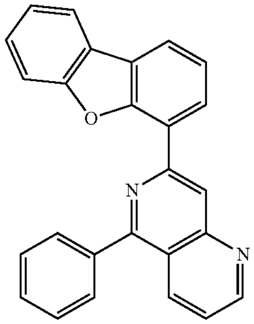
C-182
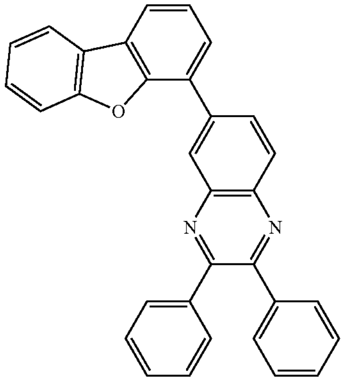
C-183
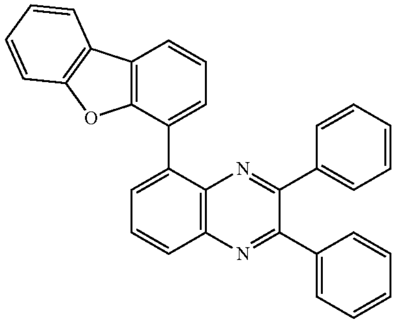
C-184
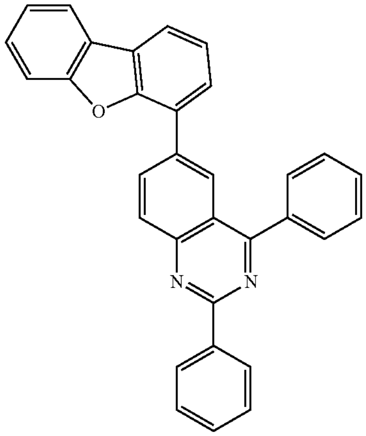
C-185
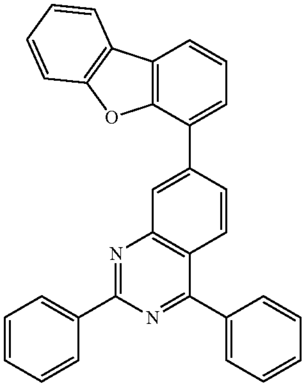
C-186
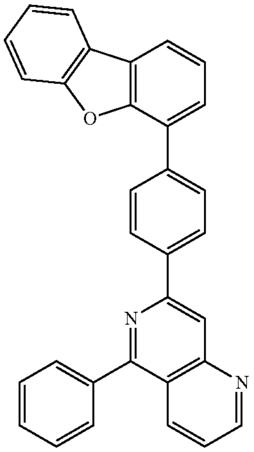
C-187
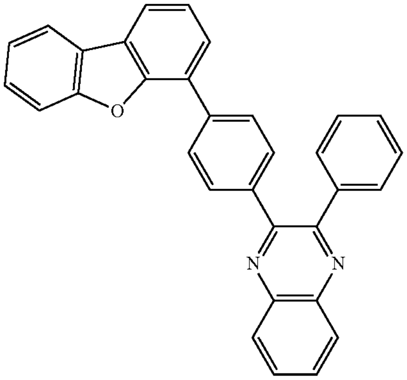

-continued
C-188
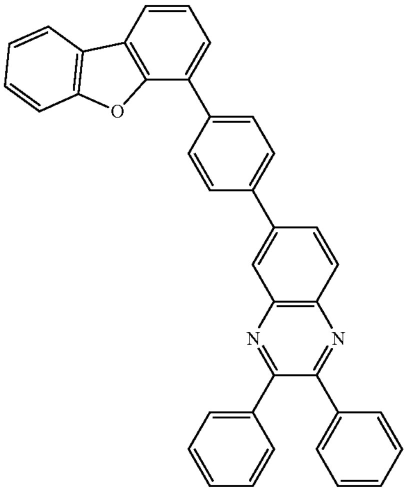
C-189
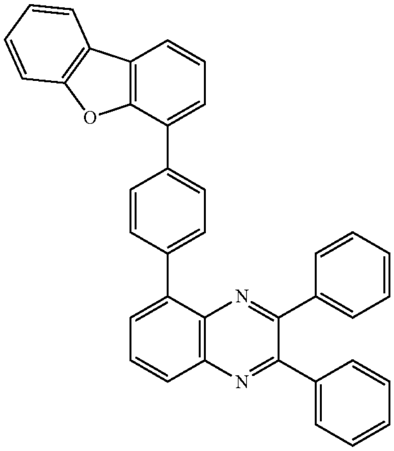
C-190
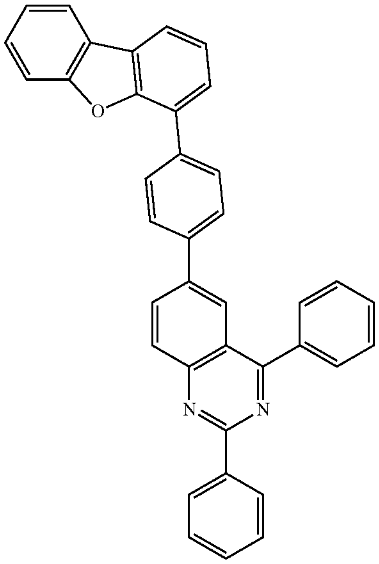
-continued
C-191
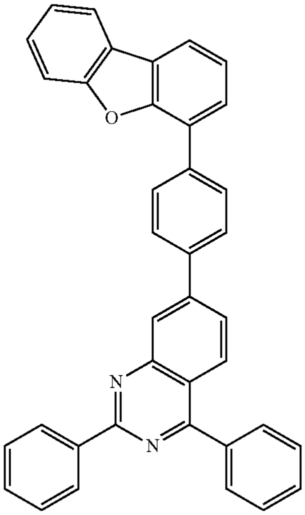
C-192
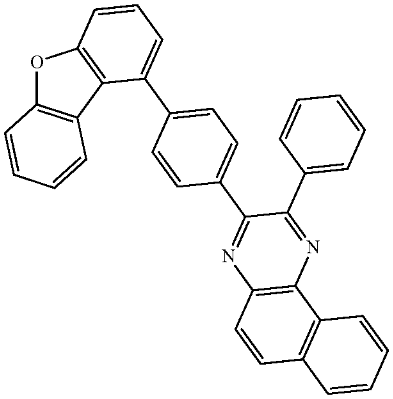
C-193
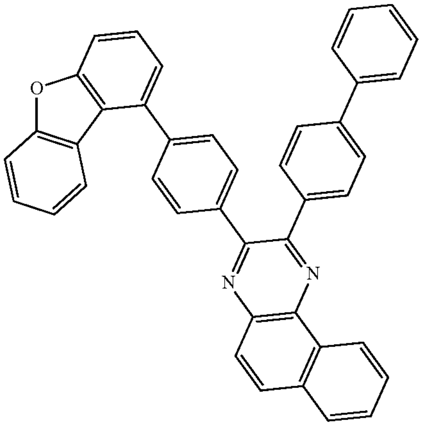

-continued
C-194
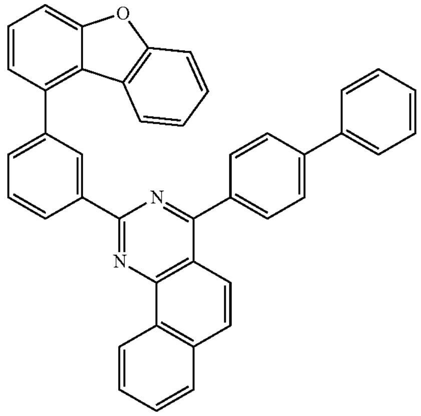
C-195
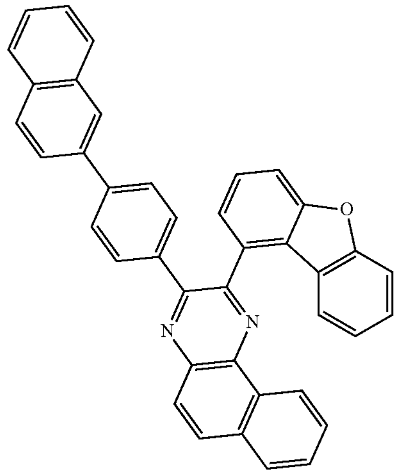
C-196
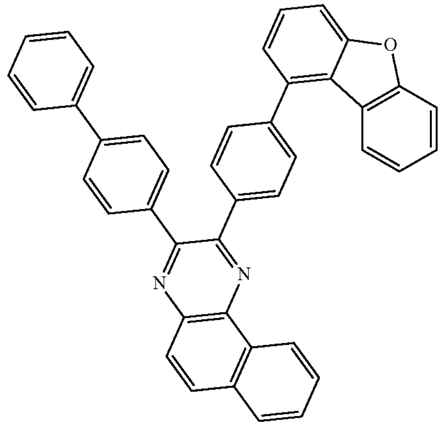
-continued
C-197
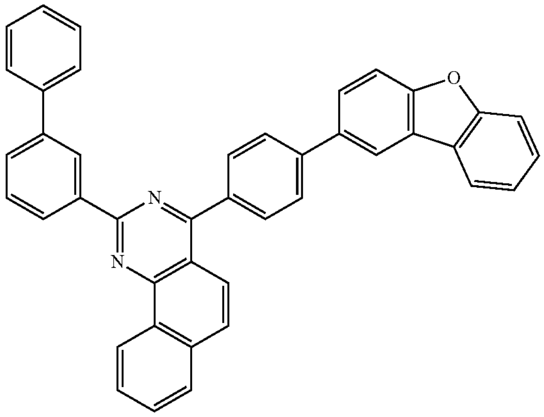
C-198
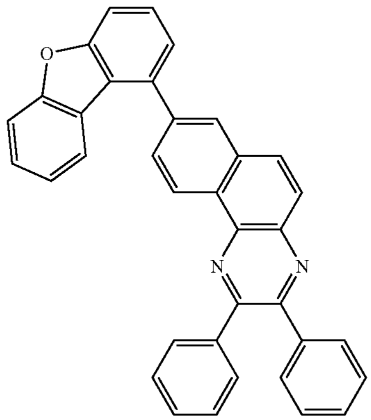
C-199
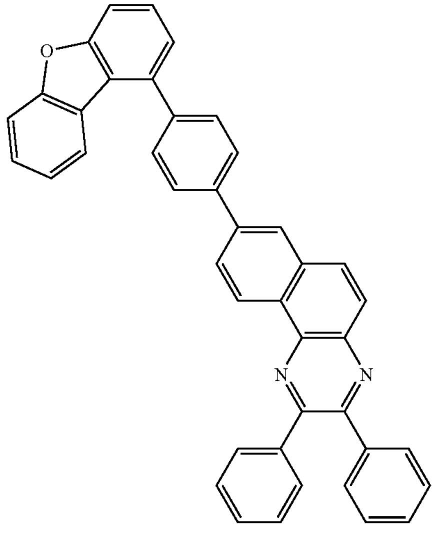

-continued
C-200
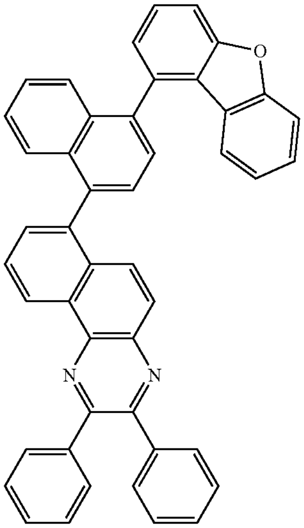
C-201
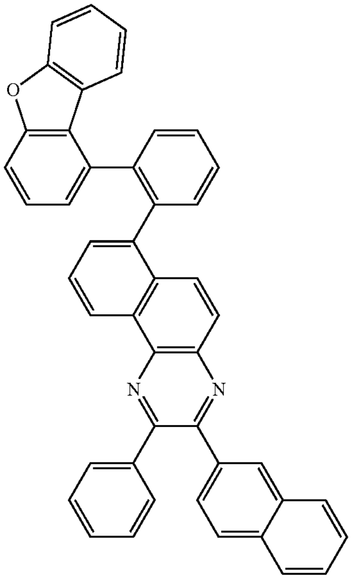
C-202
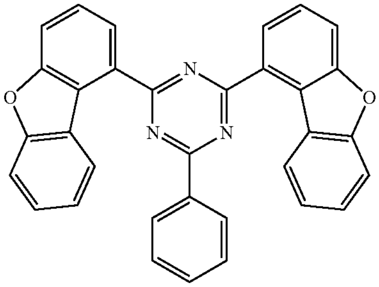
-continued
C-203
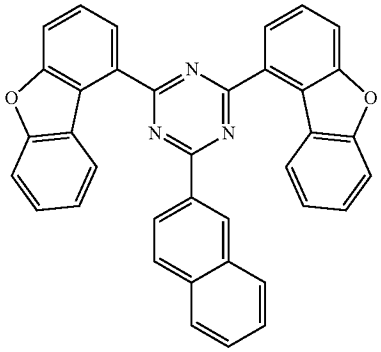
C-204
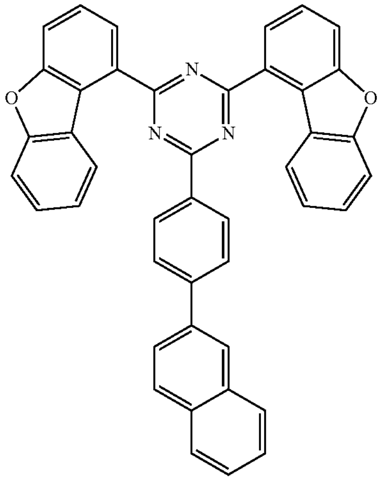
C-205
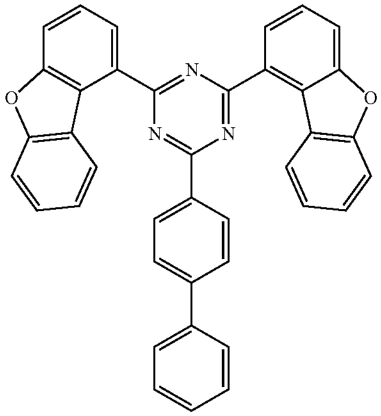
C-206
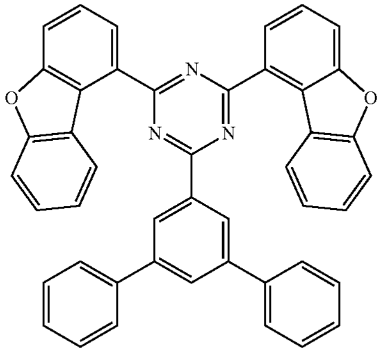

-continued
C-207
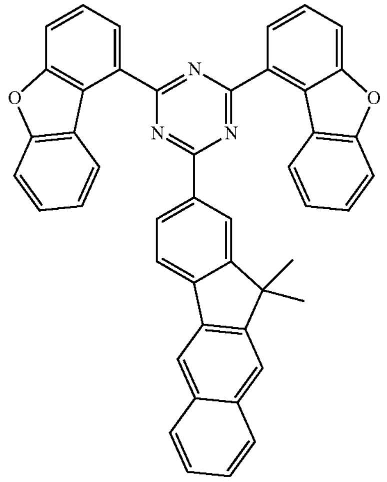
C-208
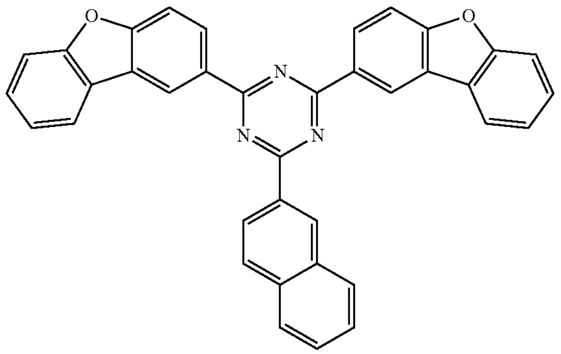
C-209
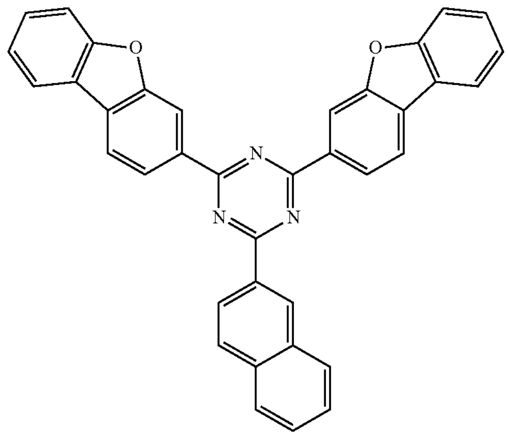
-continued
C-210
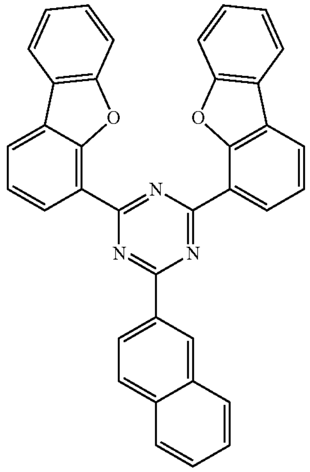
C-211
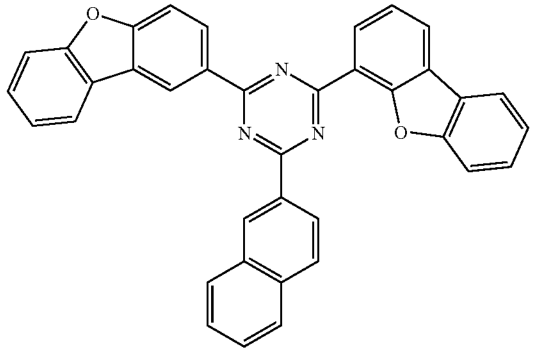
C-212
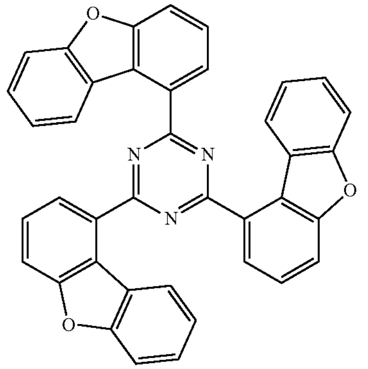
C-213
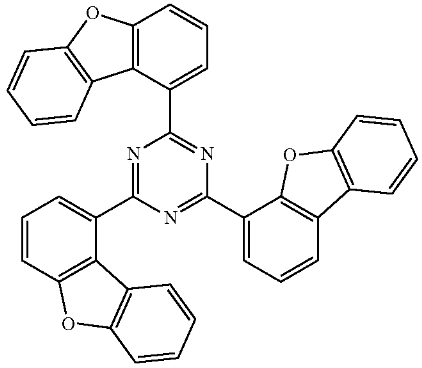

-continued
C-214
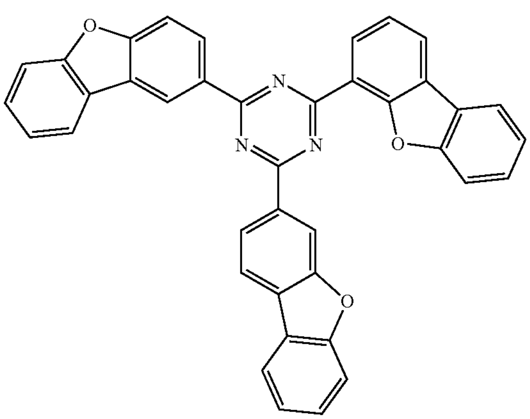
C-215
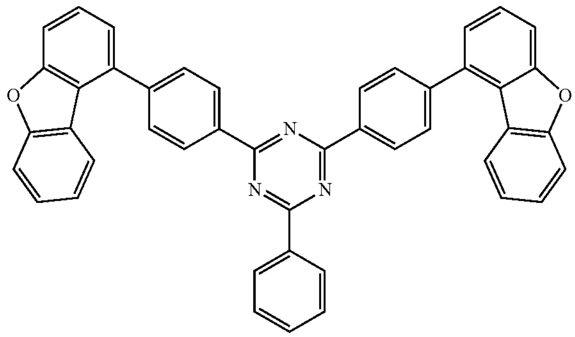
C-216
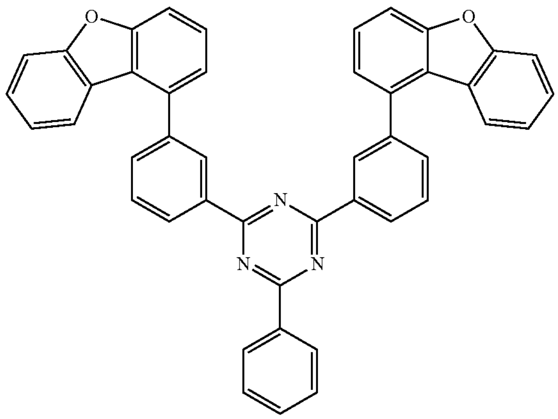
C-217
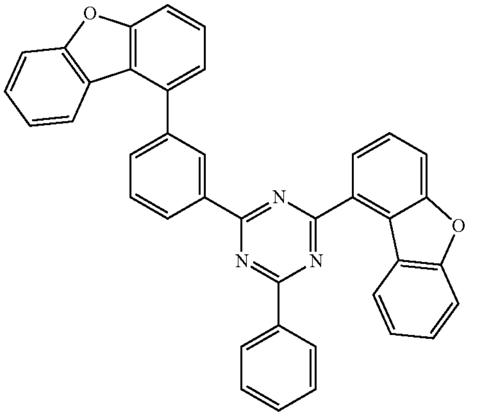
-continued
C-218
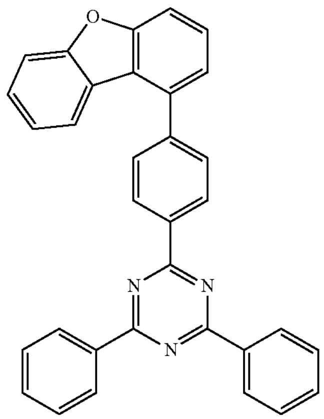
C-219
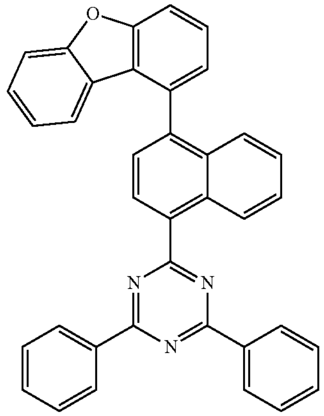
C-220
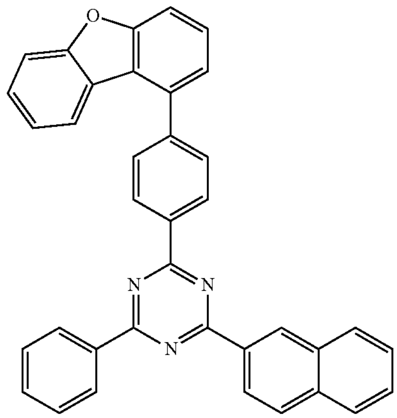

-continued
C-221
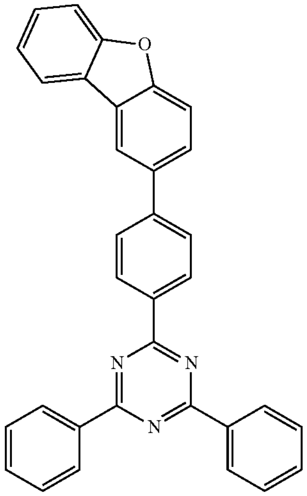
C-222
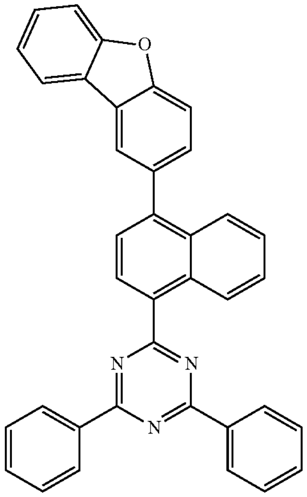
C-223
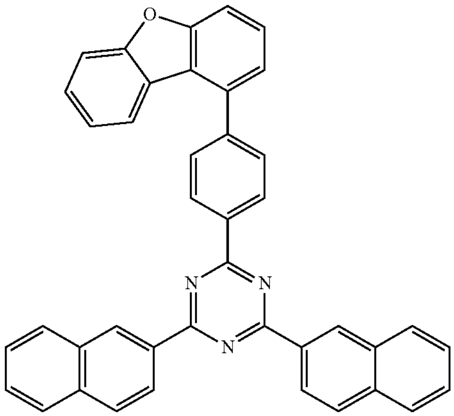
-continued
C-224
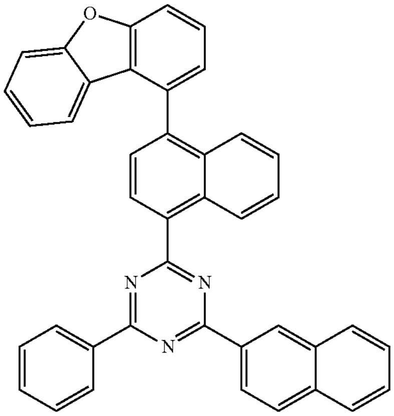
C-225
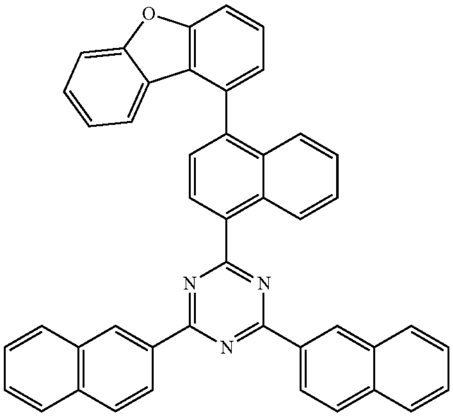
C-226
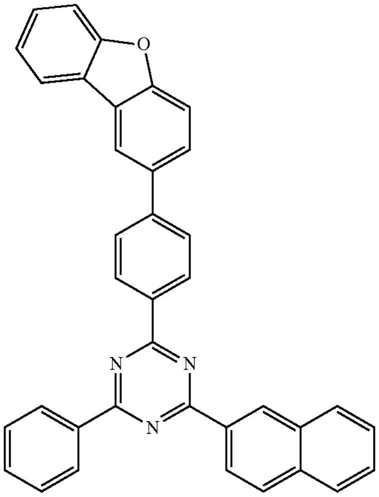

-continued
C-227
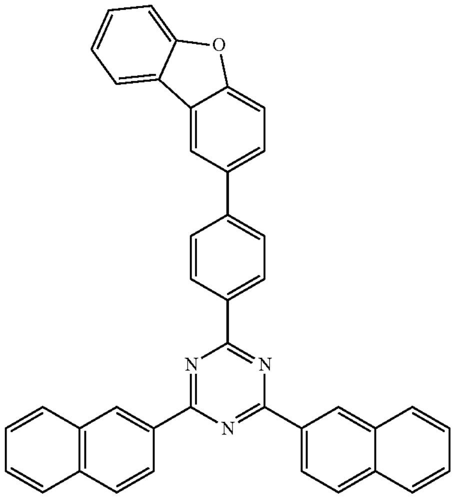
C-228
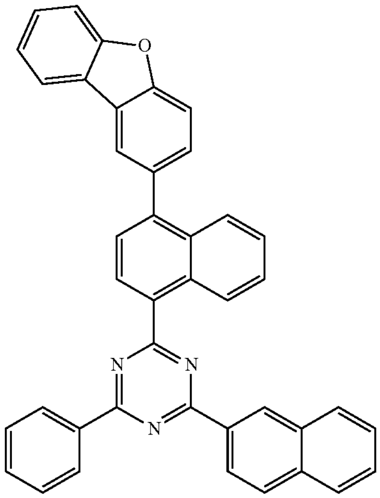
C-229
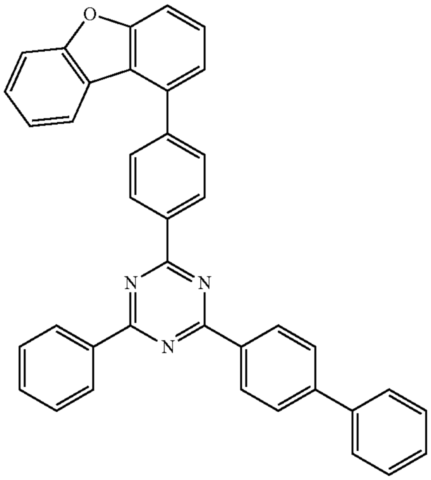
-continued
C-230
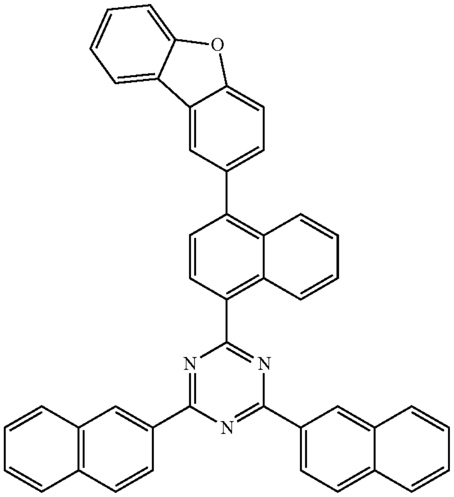
C-231
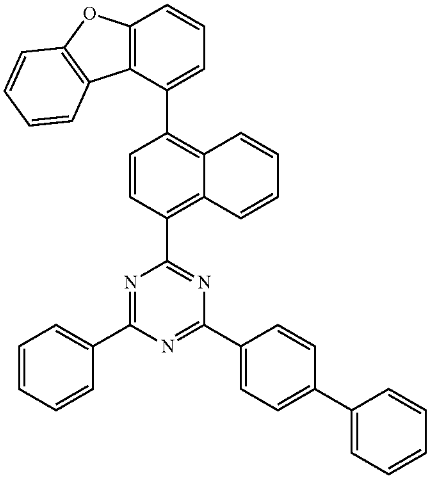
C-232
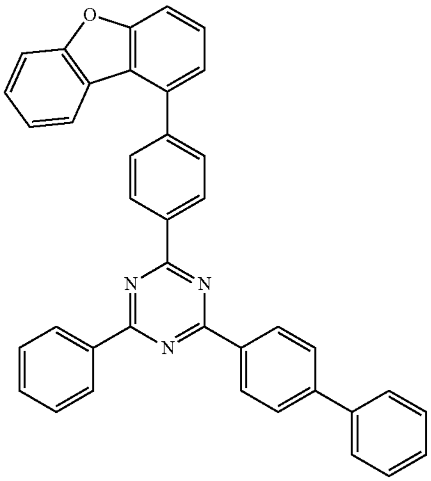

-continued
C-233
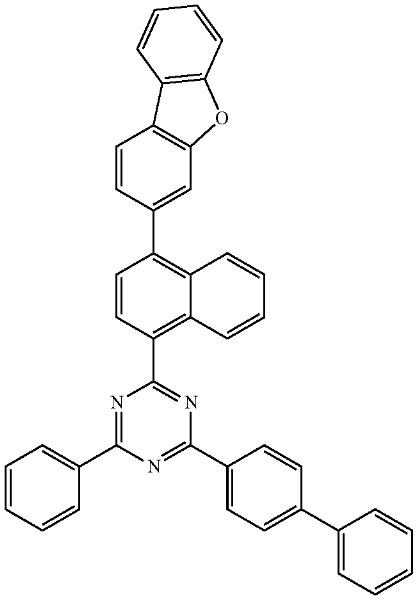
C-234
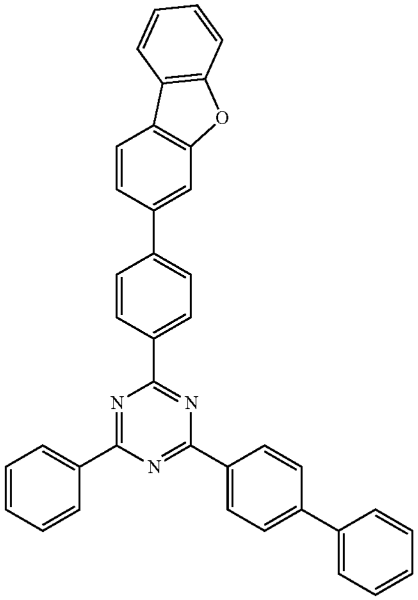
-continued
C-235
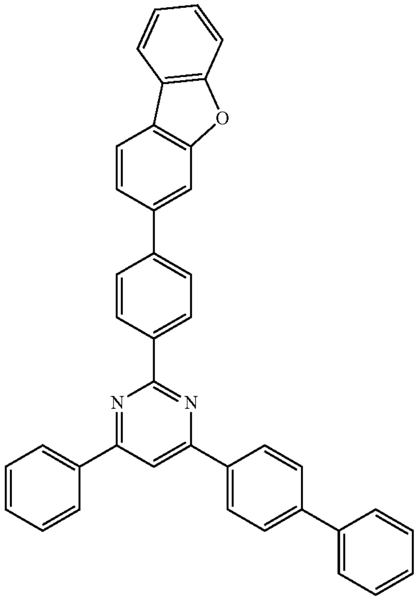
C-236
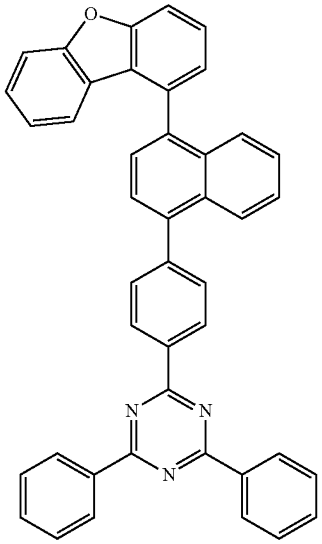
C-237
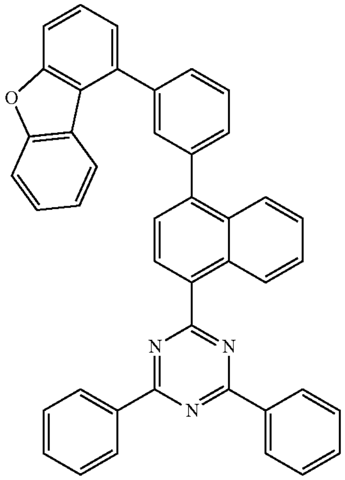

-continued
C-238
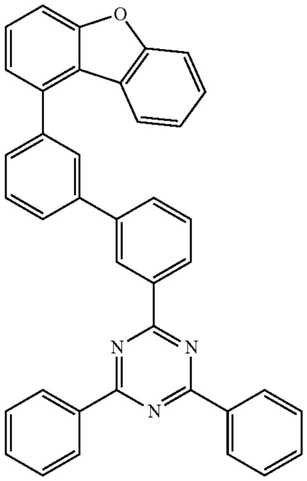
C-239
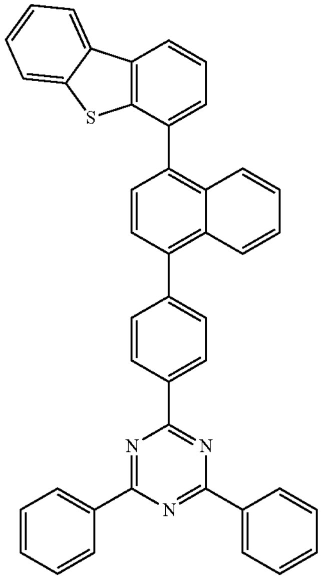
C-240
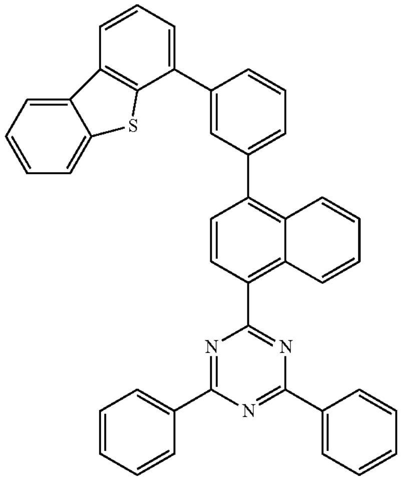
-continued
C-241
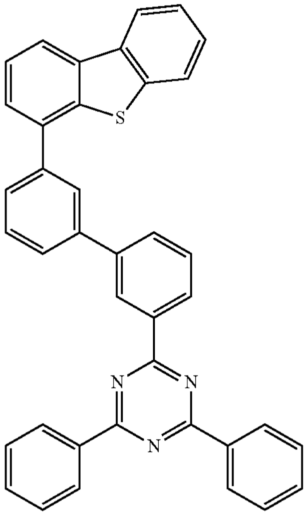
C-242
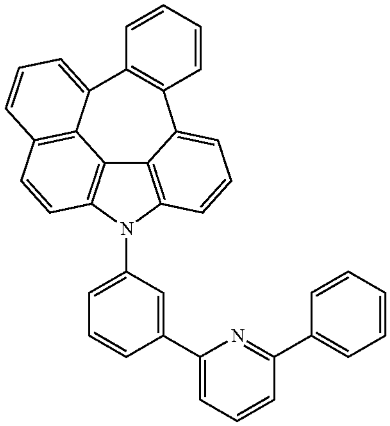
C-243
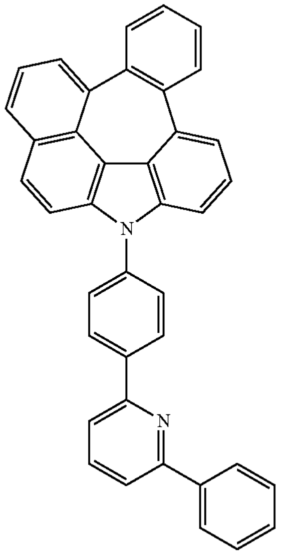

-continued
C-244
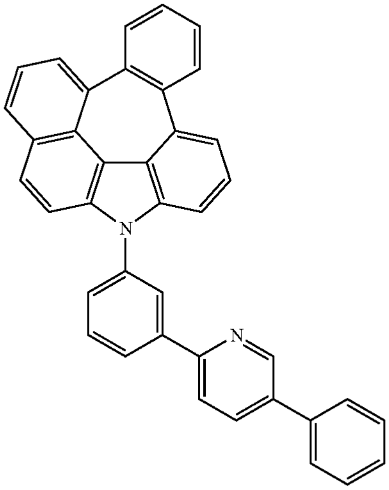
C-245
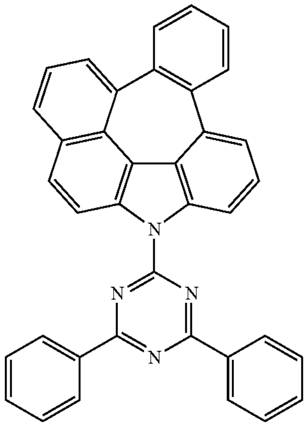
C-246
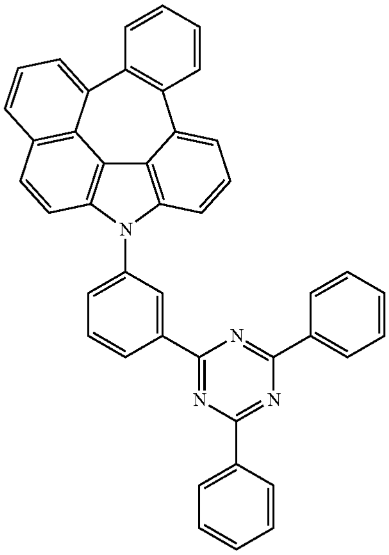
-continued
C-247
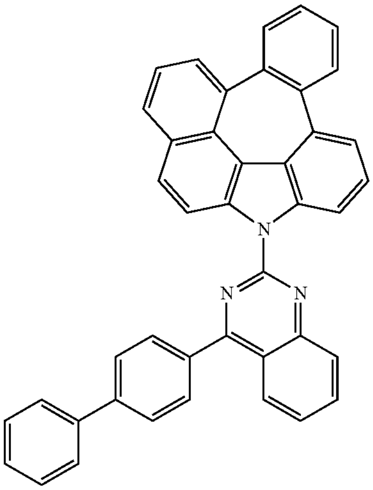
C-248
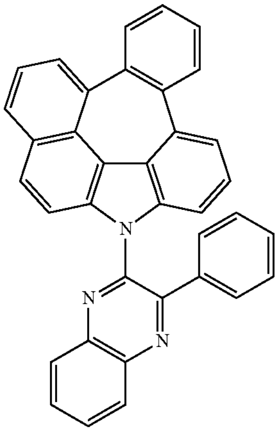
C-249
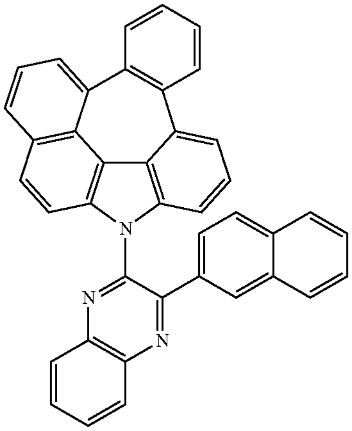

-continued
C-250
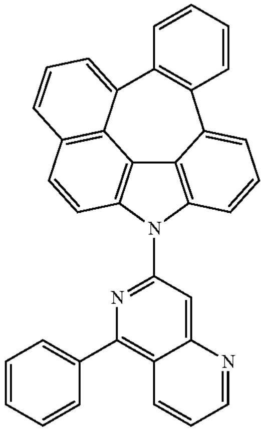
C-251
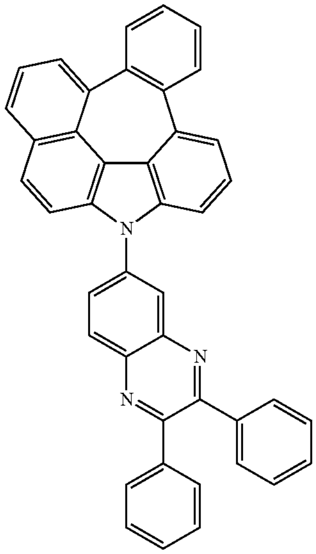
C-252
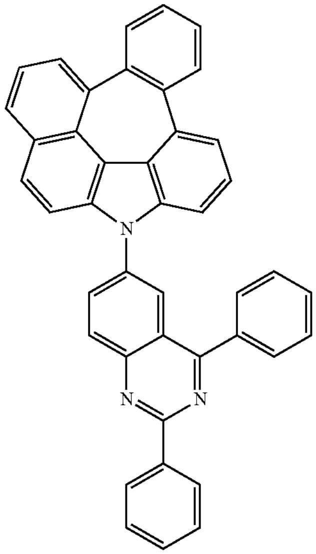
-continued
C-253
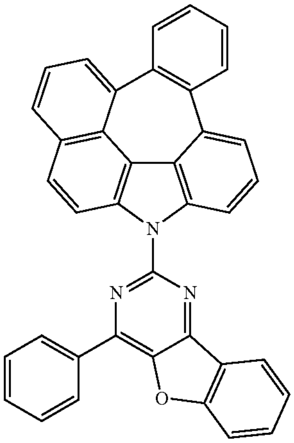
C-254
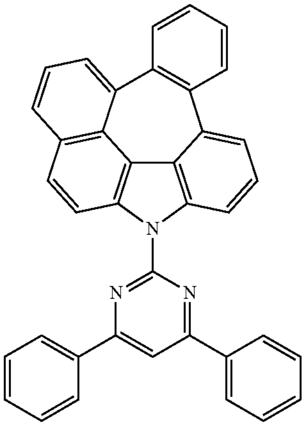
C-255
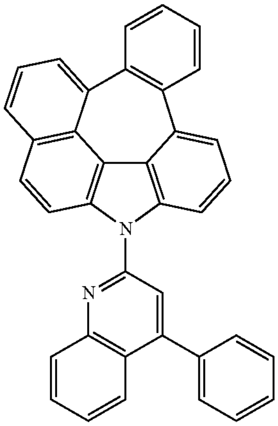

-continued
C-256
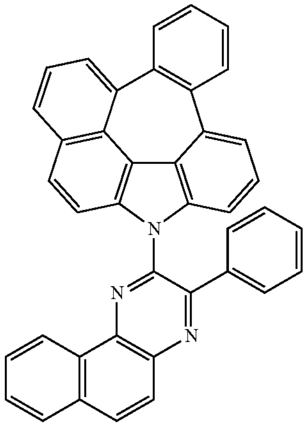
C-257
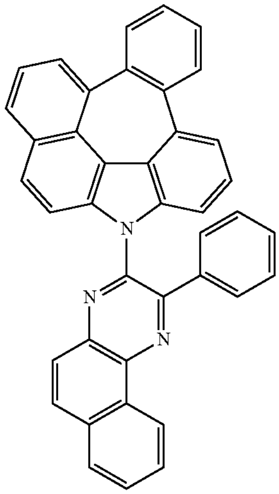
C-258
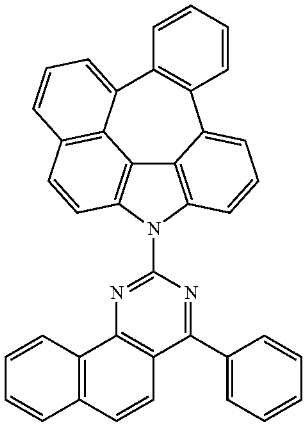
-continued
C-259
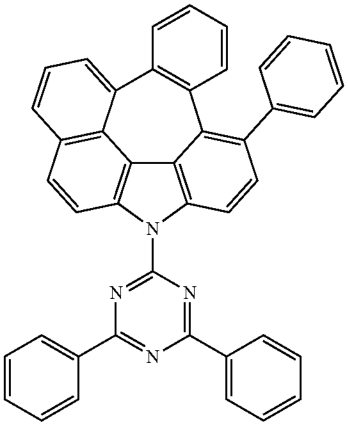
C-260
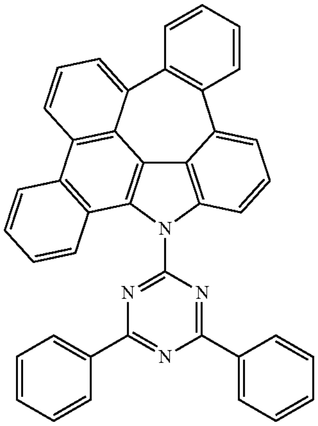
C-261
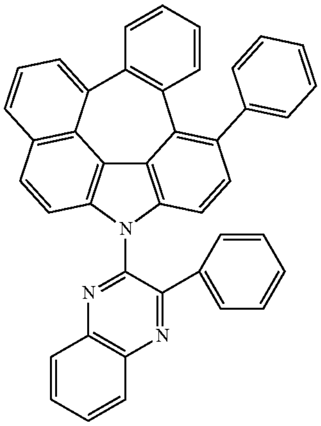

-continued
C-262
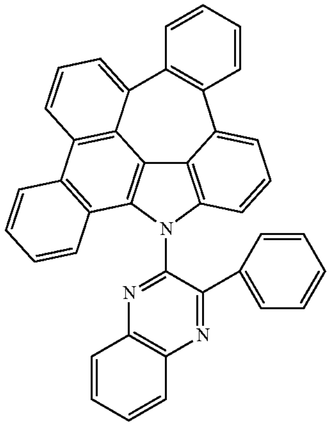
C-263
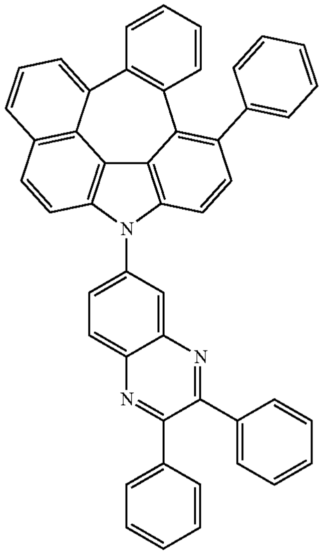
C-264
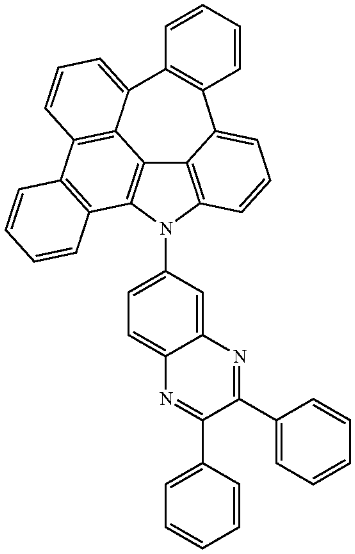
-continued
C-265
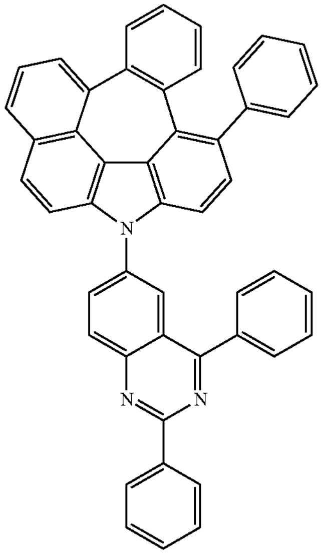
C-266
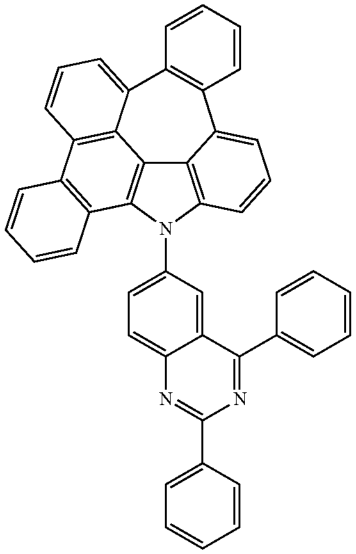
C-267
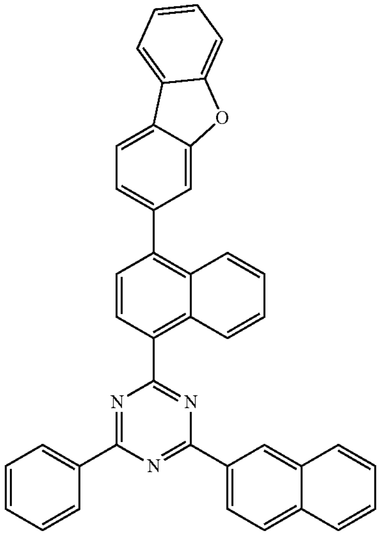

-continued
C-268
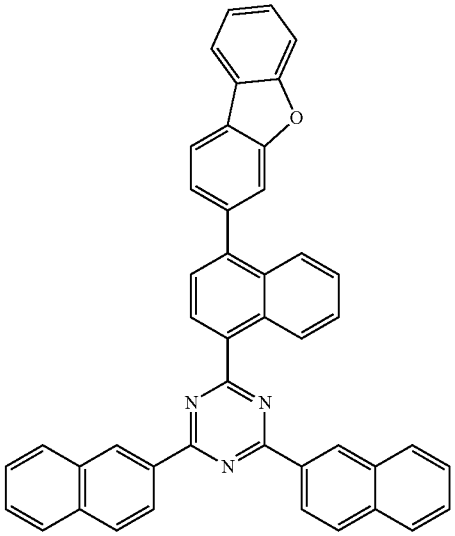
C-269
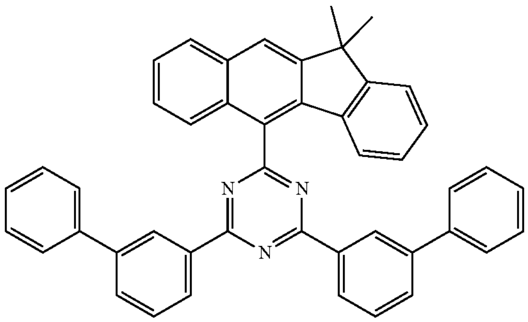
C-270
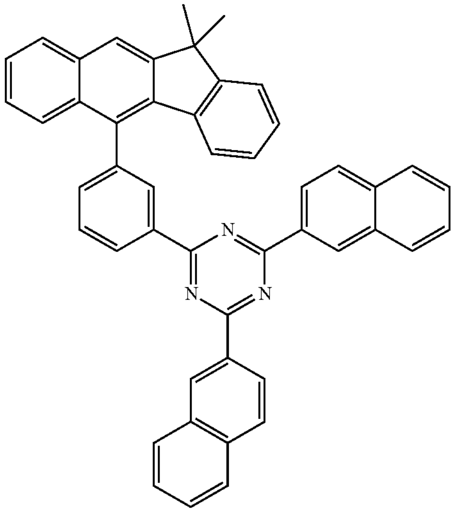
-continued
C-271
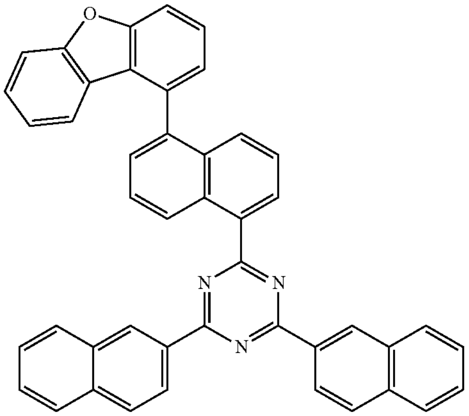
C-272
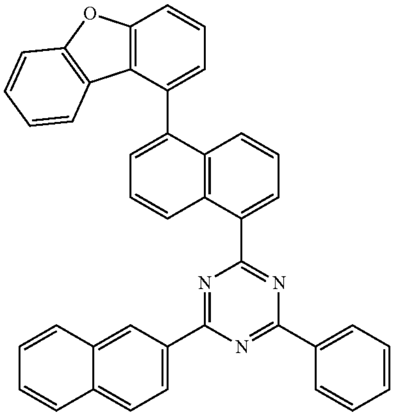
C-273
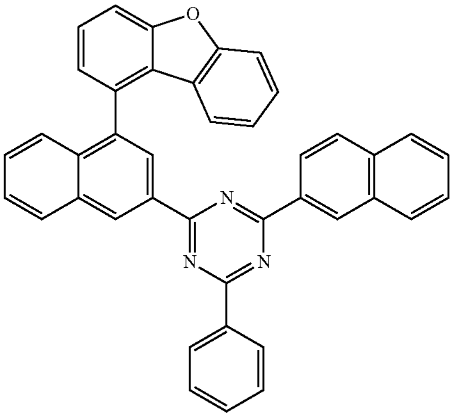

-continued
C-274
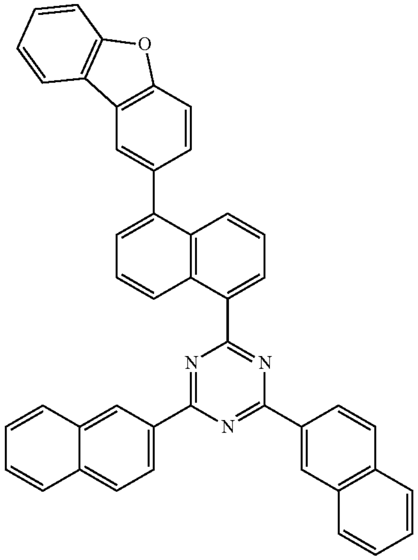
C-275
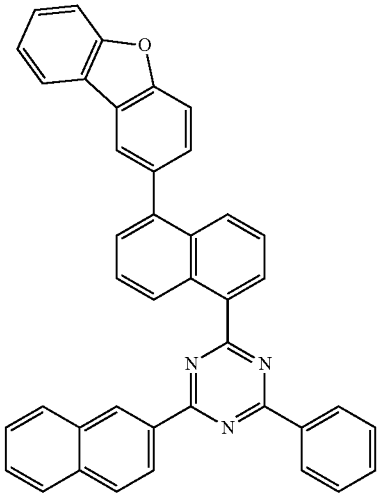
C-276
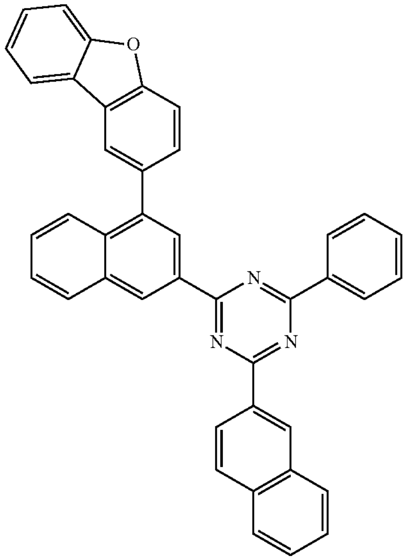
-continued
C-277
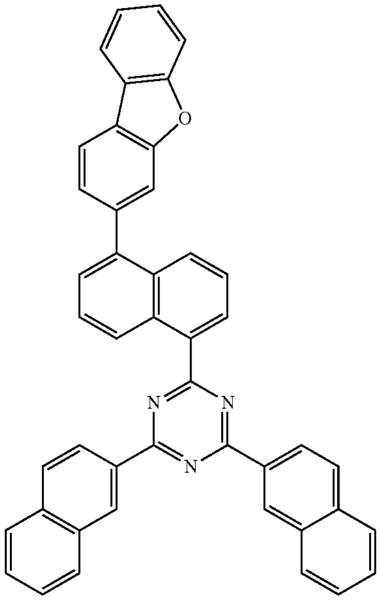
C-278
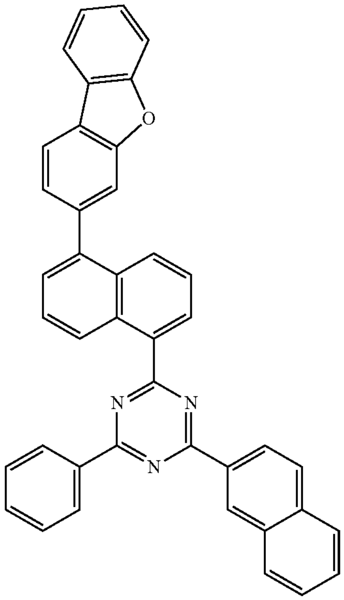

-continued
C-279
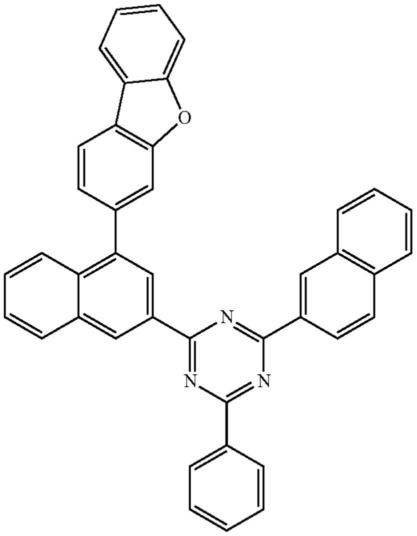
C-280
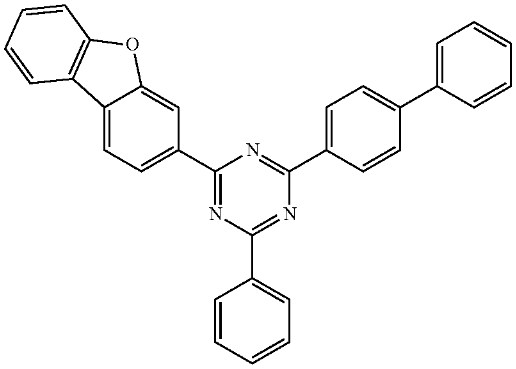
C-281
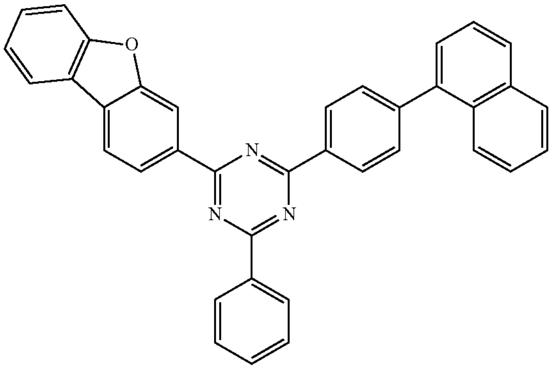
-continued
C-282
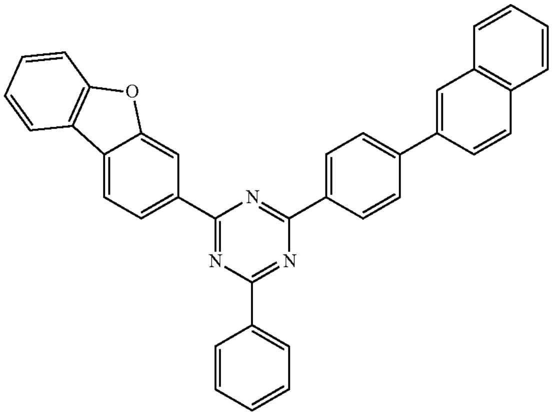
C-283
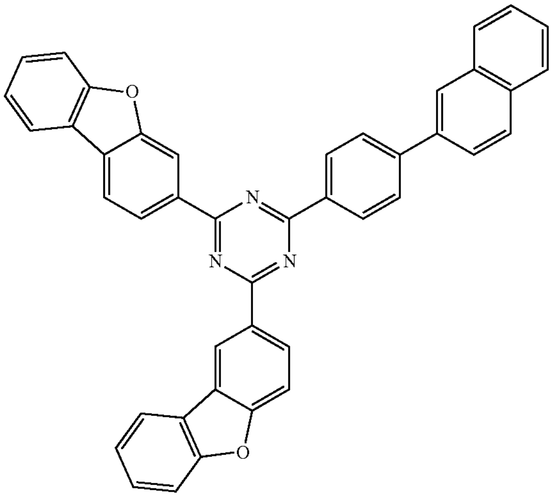
C-284
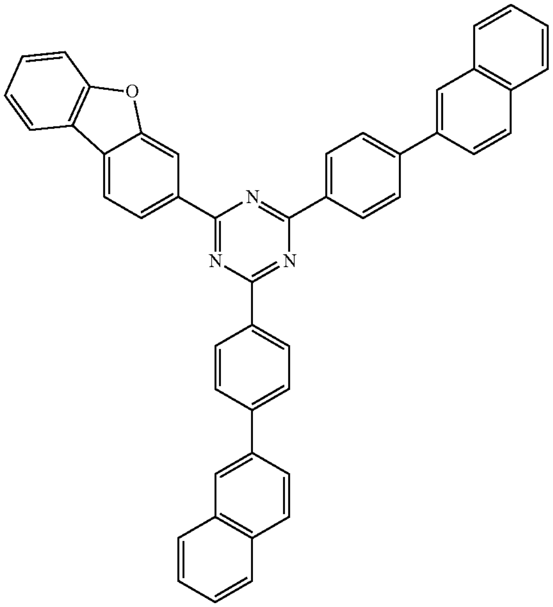

-continued
C-285
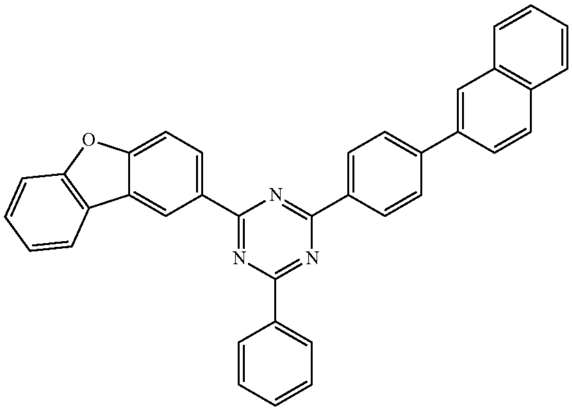
C-286
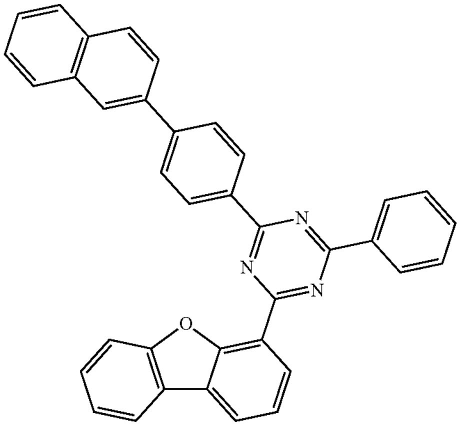
C-287
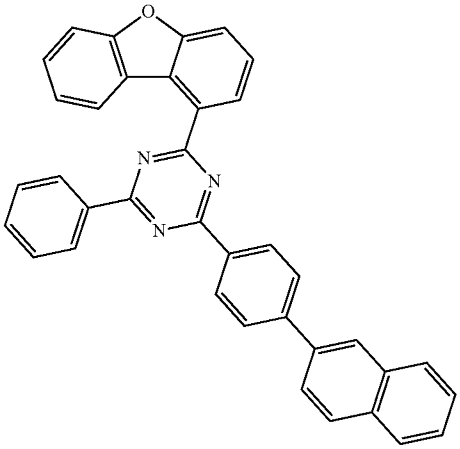
-continued
C-288
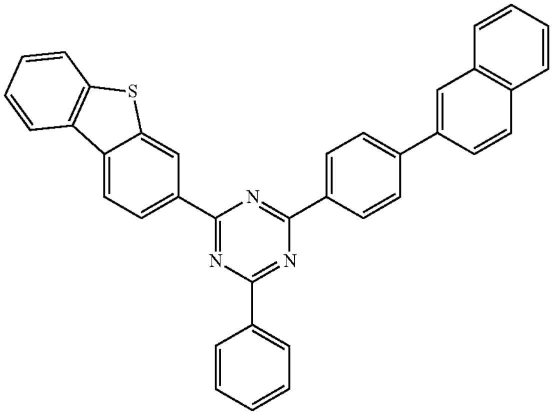
C-289
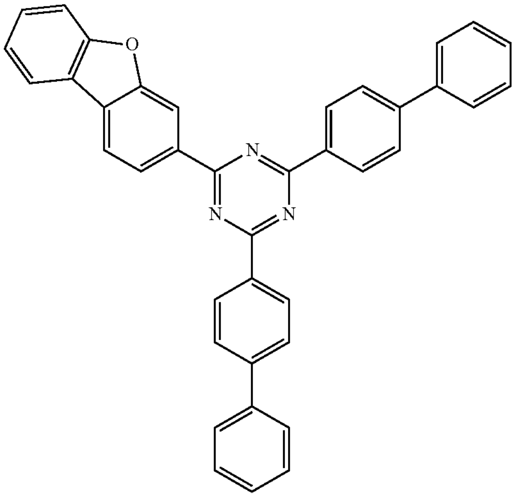
C-290
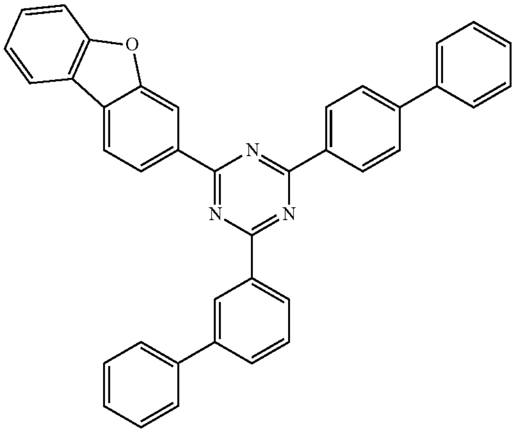

-continued

C-291

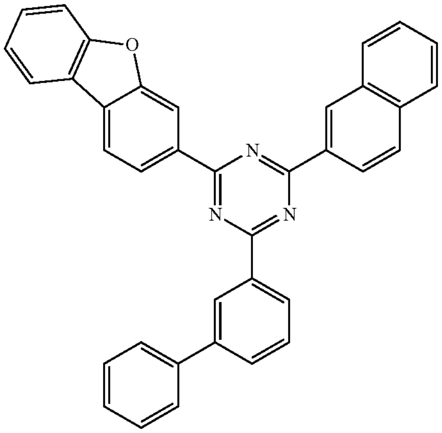

C-292

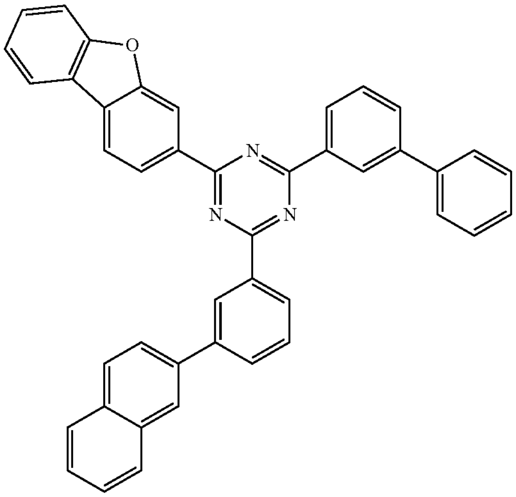

C-293

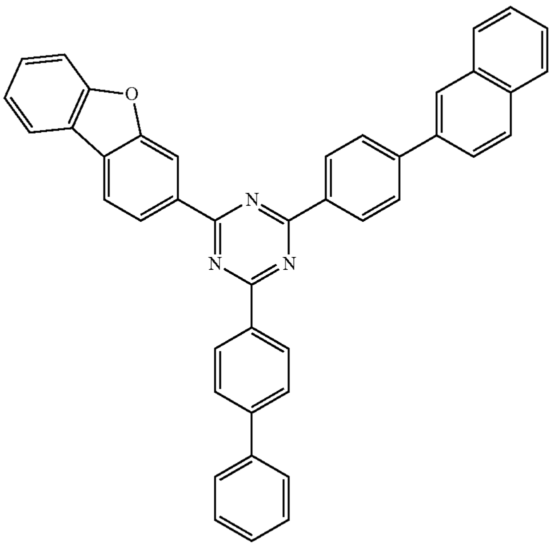

-continued

C-294

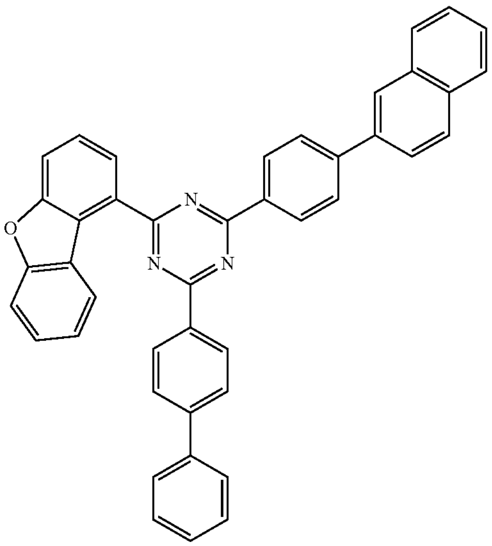

One or more of compounds H-1 to H-199 and one or more of compounds C-1 to C-294 may be combined and used in an organic electroluminescent device.

The compound represented by formula 1 according to the present disclosure may be prepared by a synthetic method known to one skilled in the art. For example, it may be prepared by referring to Korean Patent Application Laying-Open No. 2017-0022865 (Mar. 2, 2017), etc., but is not limited thereto.

The compound represented by formula 2 according to the present disclosure may be prepared by a synthetic method known to a person skilled in the art. For example, a compound represented by formula 2-1 or 2-2 may be prepared by referring to the following reaction scheme 1 or 2, etc., but is not limited thereto.

[Reaction Scheme 1]

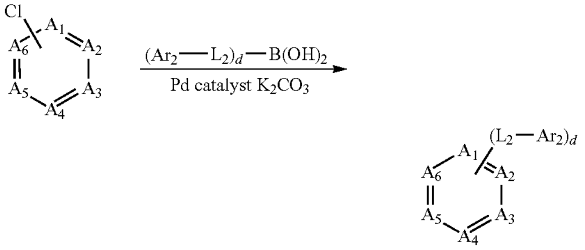

[Reaction Scheme 2]

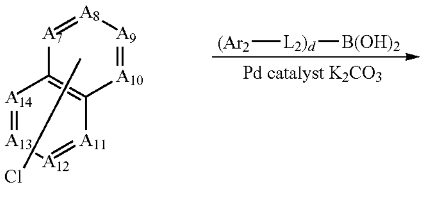

-continued

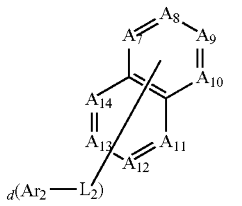

wherein $L_2$, $Ar_2$, and d are as defined as in formula 2, and $A_1$ to $A_{14}$ are as defined as in formulas 2-1 and 2-2.

The organic electroluminescent device according to the present disclosure comprises a first electrode; a second electrode; and at least one organic layer between the first and second electrodes.

One of the first and second electrodes may be an anode, and the other may be a cathode. The organic layer comprises a light-emitting layer, and may further comprise at least one layer selected from a hole injection layer, a hole transport layer, a hole auxiliary layer, a light-emitting auxiliary layer, an electron transport layer, an electron buffer layer, an electron injection layer, an interlayer, a hole blocking layer, and an electron blocking layer. Herein, the second electrode may be a transflective electrode or a reflective electrode, and may be a top emission, bottom emission, or both-sides emission type according to the material used. In addition, the hole injection layer may be further doped with a p-dopant, and the electron injection layer may be further doped with an n-dopant.

The organic electroluminescent device according to the present disclosure may comprise an anode, a cathode, and at least one organic layer between the anode and cathode, in which the organic layer may comprise a plurality of organic electroluminescent materials including a compound represented by formula 1 as the first organic electroluminescent material and a compound represented by formula 2 as the second organic electroluminescent material. The organic electroluminescent device according to the present disclosure may comprise an anode, a cathode, and at least one light-emitting layer between the anode and cathode, in which the light-emitting layer may comprise a compound represented by formula 1 and a compound represented by formula 2.

The light-emitting layer comprises a host and a dopant, and the host comprises the plurality of host materials. The compound represented by formula 1 may be comprised as a first host compound of the plurality of host materials and the compound represented by formula 2 may be comprised as a second host compound of the plurality of host materials. Herein, the weight ratio of the first host compound to the second host compound is in the range of about 1:99 to about 99:1, preferably about 10:90 to about 90:10, more preferably about 30:70 to about 70:30, even more preferably about 40:60 to about 60:40, and further more preferably about 50:50.

The light-emitting layer is a layer from which light is emitted, and can be a single layer or a multi-layer of which two or more layers are stacked. In the plurality of host materials according to the present disclosure, the first and second host materials may both be comprised in one layer or may be respectively comprised in different light-emitting layers. According to one embodiment of the present disclosure, the doping concentration of the dopant compound with respect to the host compound of the light-emitting layer may be less than 20 wt %.

The organic electroluminescent device of the present disclosure may further comprise at least one layer selected from a hole injection layer, a hole transport layer, a hole auxiliary layer, a light-emitting auxiliary layer, an electron transport layer, an electron injection layer, an interlayer, an electron buffer layer, a hole blocking layer, and an electron blocking layer. In one embodiment of the present disclosure, the organic electroluminescent device of the present disclosure may further comprise an amine-based compound, in addition to the plurality of host materials of the present disclosure, as at least one of a hole injection material, a hole transport material, a hole auxiliary material, a light-emitting material, a light-emitting auxiliary material, and an electron blocking material. In addition, in one embodiment of the present disclosure, the organic electroluminescent device of the present disclosure may further comprise an azine-based compound, in addition to the plurality of host materials of the present disclosure, as at least one of an electron transport material, an electron injection material, an electron buffer material, and a hole blocking material.

The dopant comprised in the organic electroluminescent device according to the present disclosure may be at least one phosphorescent or fluorescent dopant, and preferably phosphorescent dopant. The phosphorescent dopant material applied to the organic electroluminescent device of the present disclosure is not particularly limited, but may be selected from metallated complex compounds of iridium (Ir), osmium (Os), copper (Cu), and platinum (Pt), preferably selected from ortho-metallated complex compounds of iridium (Ir), osmium (Os), copper (Cu), and platinum (Pt), and more preferably ortho-metallated iridium complex compounds.

The dopant comprised in the organic electroluminescent device of the present disclosure may include the compound represented by the following formula 101, but is not limited thereto.

(101)

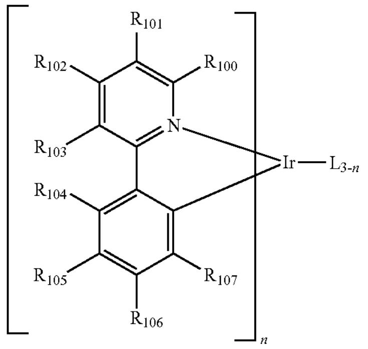

In formula 101, L is selected from the following structures 1 and 2:

[Structure 1]

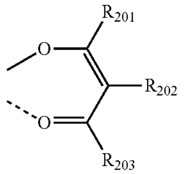

-continued

[Structure 2]

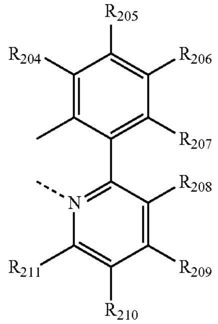

$R_{100}$ to $R_{103}$, each independently, represent hydrogen, deuterium, a halogen, a (C1-C30)alkyl unsubstituted or substituted with a halogen(s), a substituted or unsubstituted (C3-C30)cycloalkyl, a substituted or unsubstituted (C6-C30)aryl, a cyano, a substituted or unsubstituted (3- to 30-membered)heteroaryl, or a substituted or unsubstituted (C1-C30)alkoxy; or may be linked to an adjacent substituent to form a ring, e.g., a substituted or unsubstituted, quinoline, benzofuropyridine, benzothienopyridine, benzothienoquinoline, or indenoquinoline ring, together with pyridine;

$R_{104}$ to $R_{107}$, each independently, represent hydrogen, deuterium, a halogen, a (C1-C30)alkyl unsubstituted or substituted with a halogen(s), a substituted or unsubstituted (C3-C30)cycloalkyl, a substituted or unsubstituted (C6-C30)aryl, a substituted or unsubstituted (3- to 30-membered)heteroaryl, a cyano, or a substituted or unsubstituted (C1-C30)alkoxy; or may be linked to an adjacent substituent to form a ring, e.g., a substituted or unsubstituted, naphthyl, fluorene, dibenzothiophene, dibenzofuran, indenopyridine, benzofuropyridine or benzothienopyridine ring, together with benzene;

$R_{201}$ to $R_{211}$, each independently, represent hydrogen, deuterium, a halogen, a (C1-C30)alkyl unsubstituted or substituted with a halogen(s), a substituted or unsubstituted (C3-C30)cycloalkyl, or a substituted or unsubstituted (C6-C30)aryl; or may be linked to an adjacent substituent to form a ring; and n represents an integer of 1 to 3.

The specific examples of the dopant compound are as follows, but are not limited thereto.

D-1

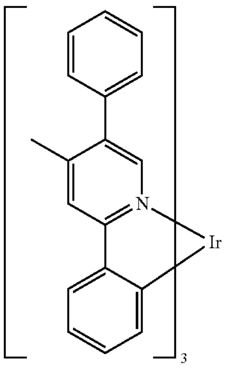

-continued

D-2

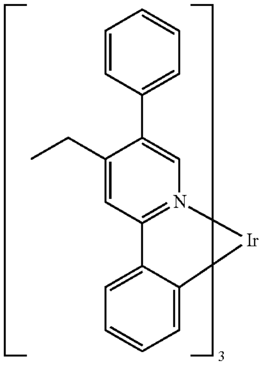

D-3

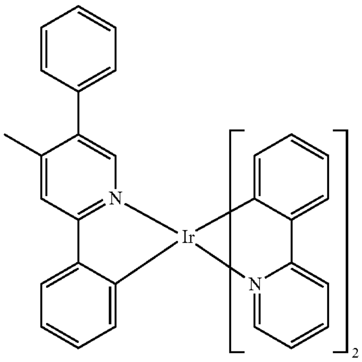

D-4

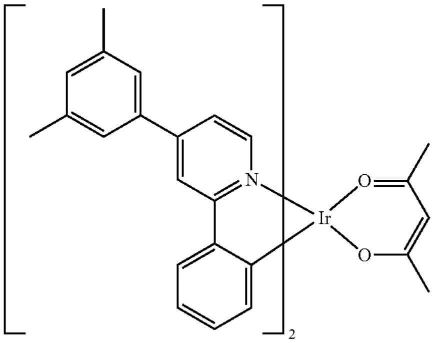

D-5

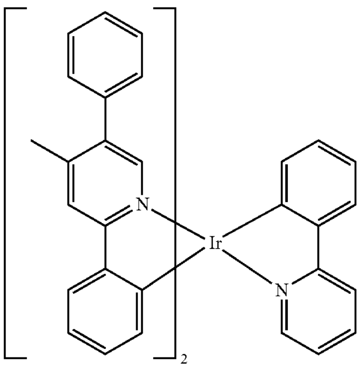

-continued
D-6
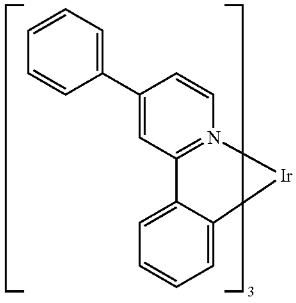
D-7
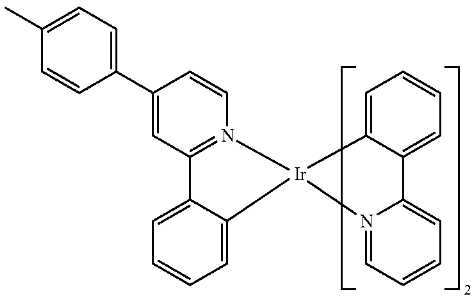
D-8
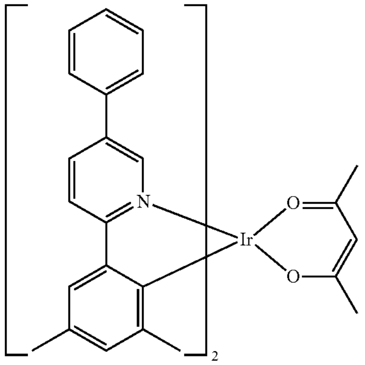
D-9
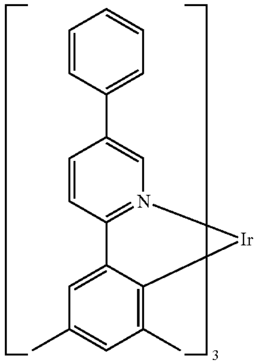
-continued
D-10
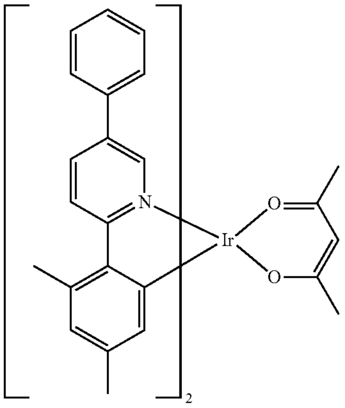
D-11
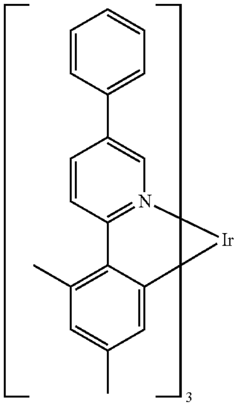
D-12
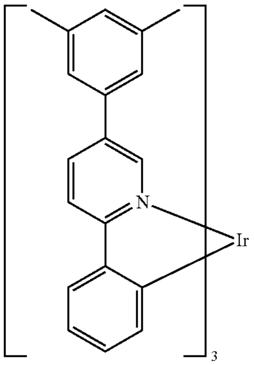
D-13
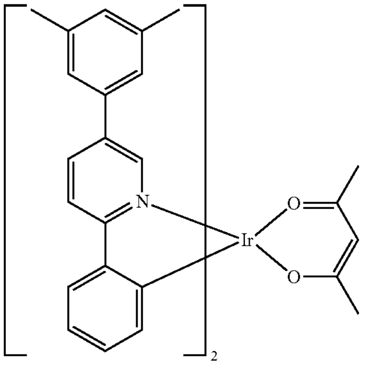

-continued
D-14
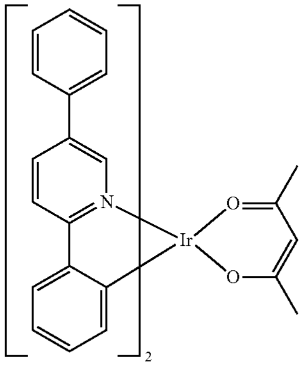
D-15
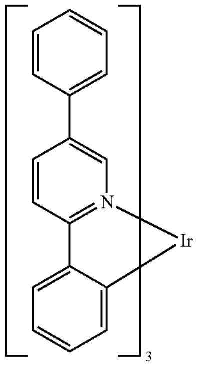
D-16
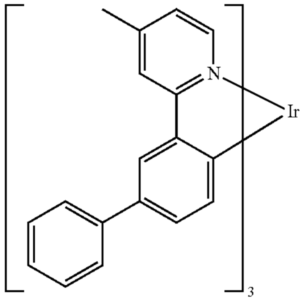
D-17
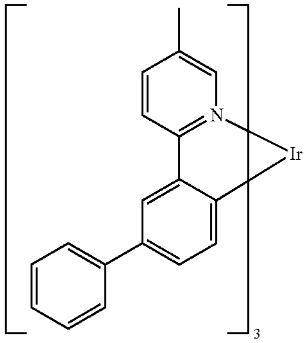
-continued
D-18
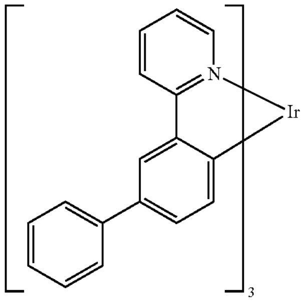
D-19
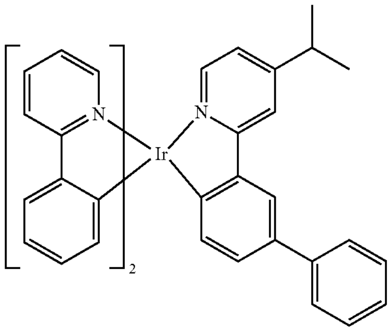
D-20
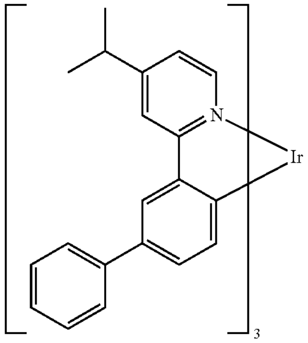
D-21
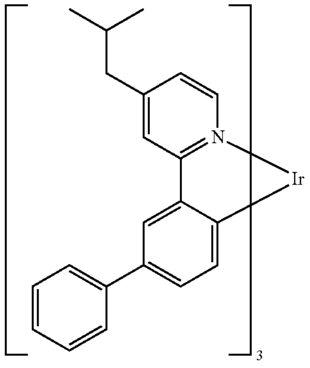

-continued
D-22
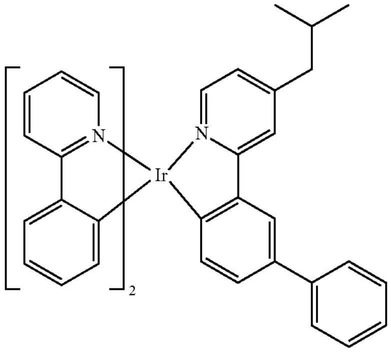
D-23
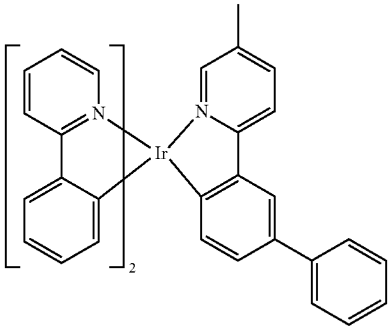
D-24
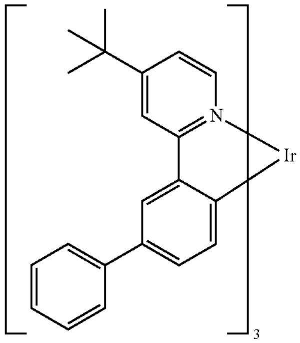
D-25
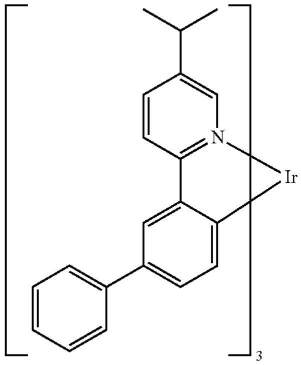
-continued
D-26
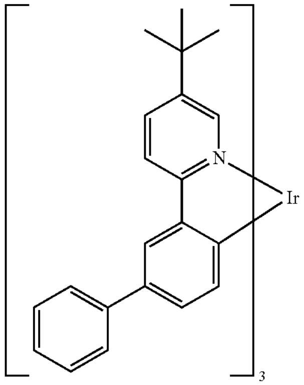
D-27
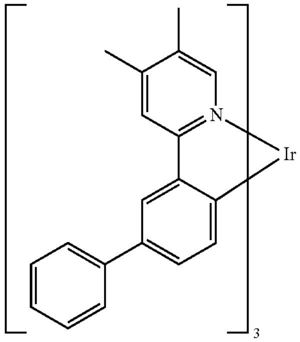
D-28
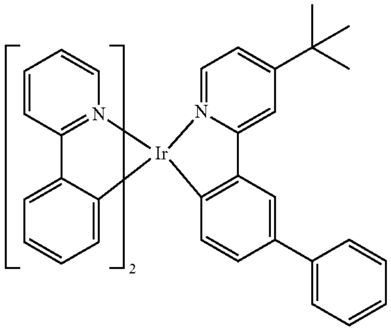
D-29
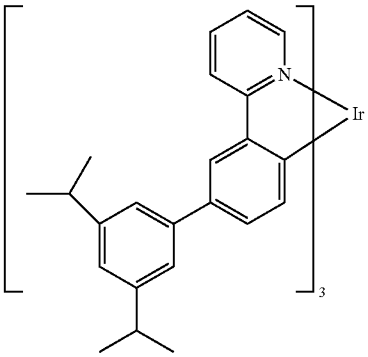

-continued
D-30
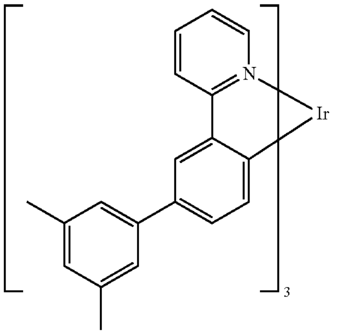
D-31
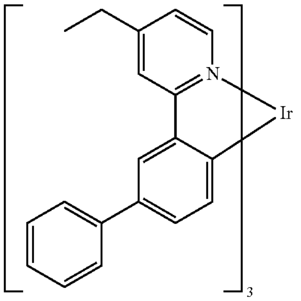
D-32
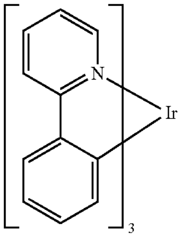
D-33
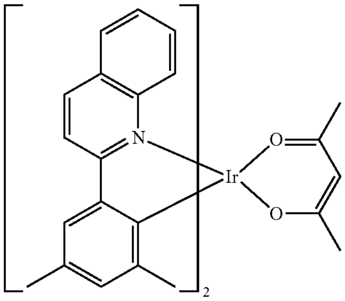
D-34
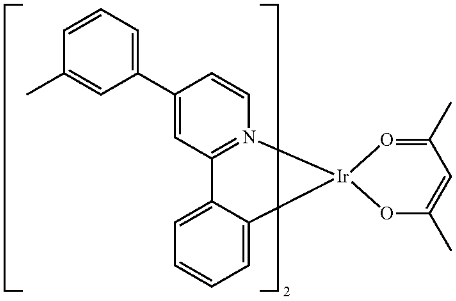
-continued
D-35
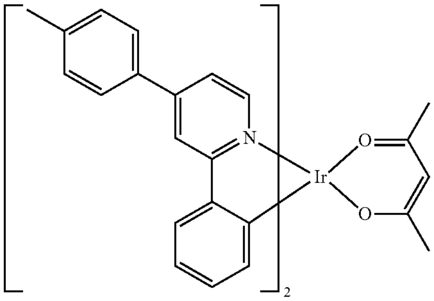
D-36
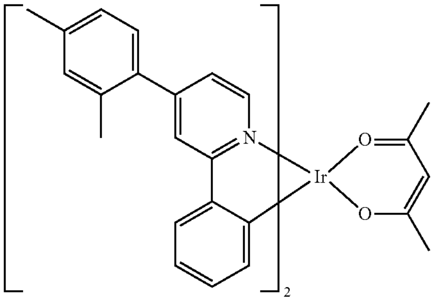
D-37
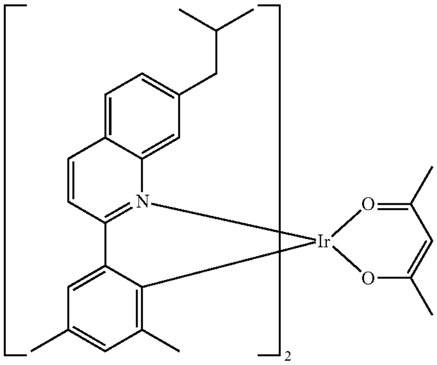
D-38
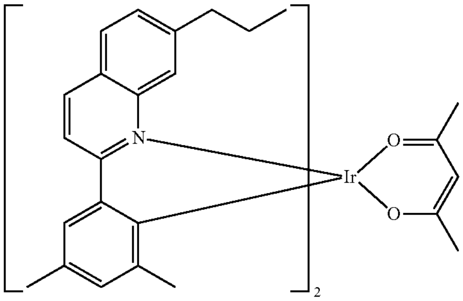

-continued
D-39
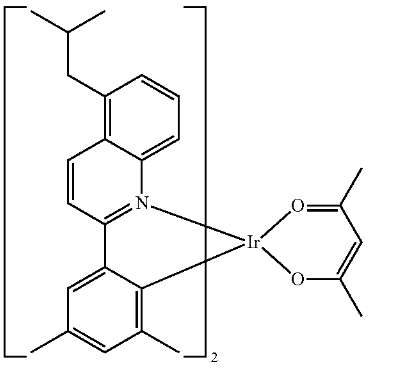
D-40
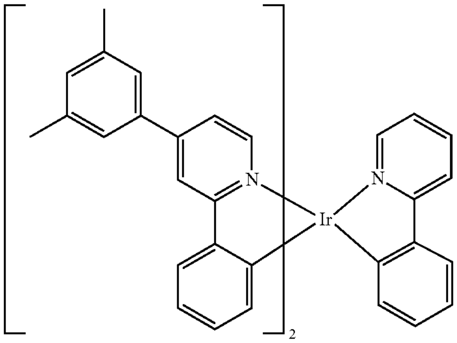
D-41
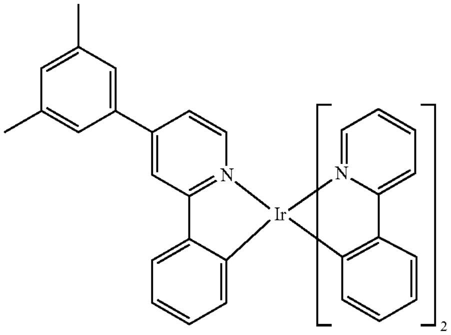
D-42
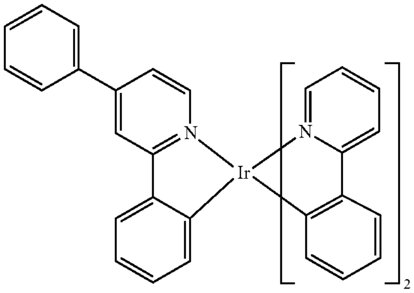
-continued
D-43
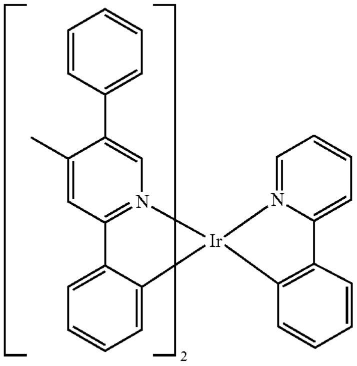
D-44
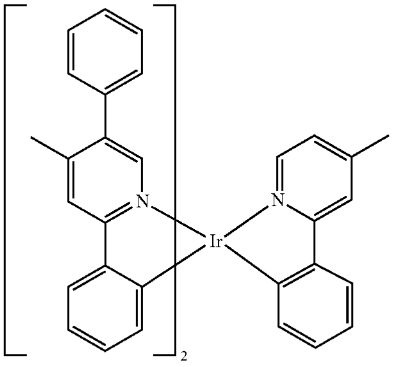
D-45
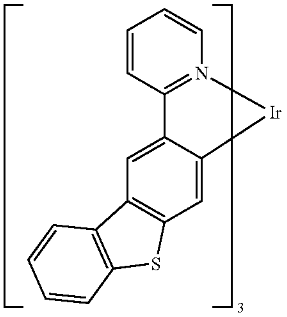
D-46
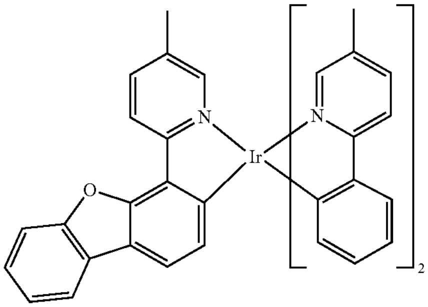

-continued
D-47
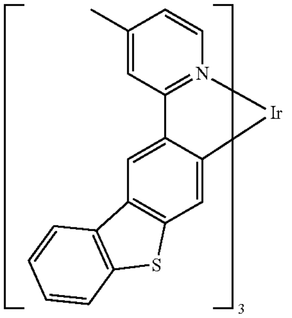
D-48
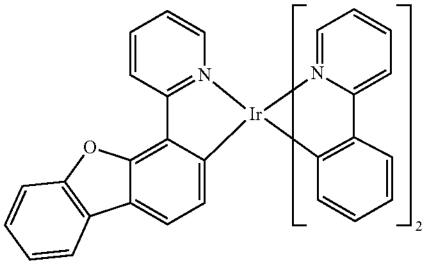
D-49
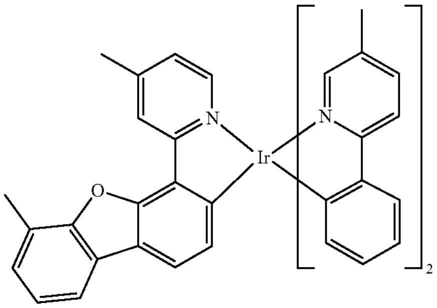
D-50
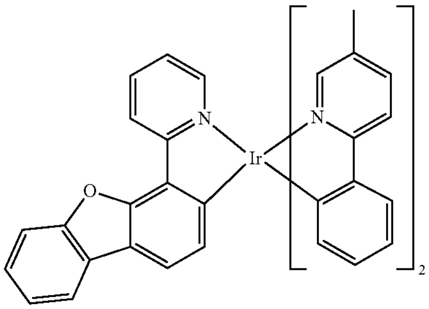
D-51
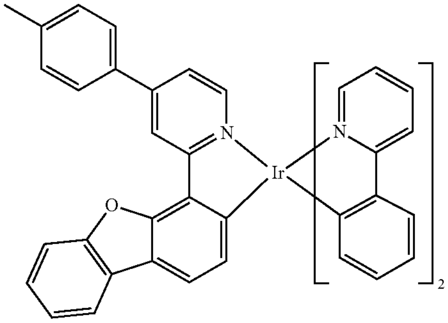
-continued
D-52
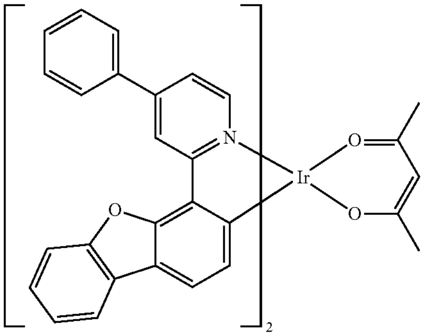
D-53
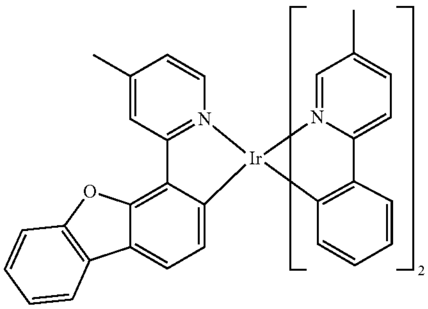
D-54
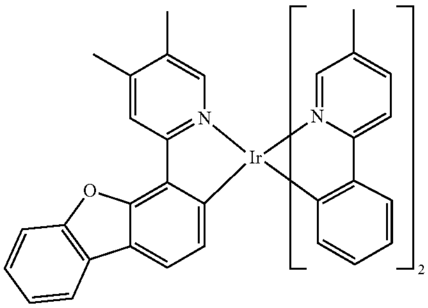
D-55
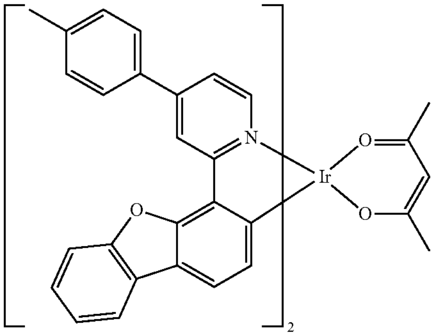
D-56
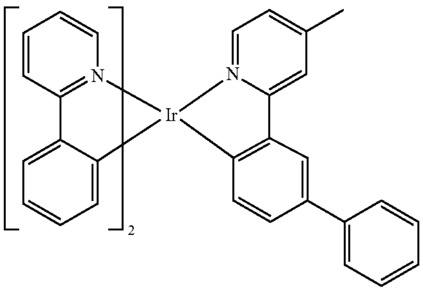

-continued
D-57
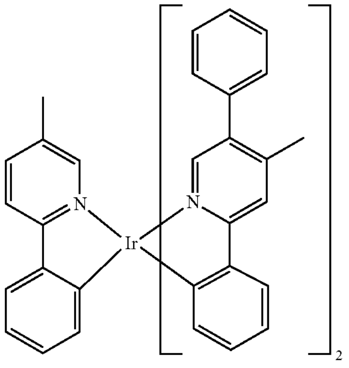
D-58
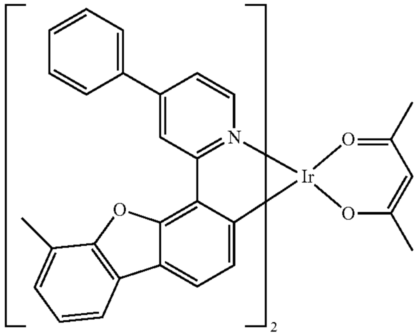
D-59
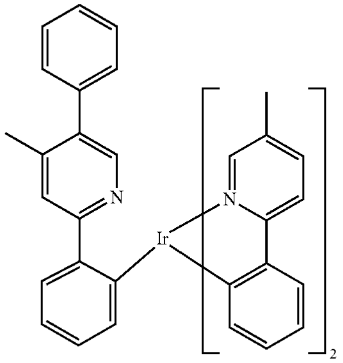
D-60
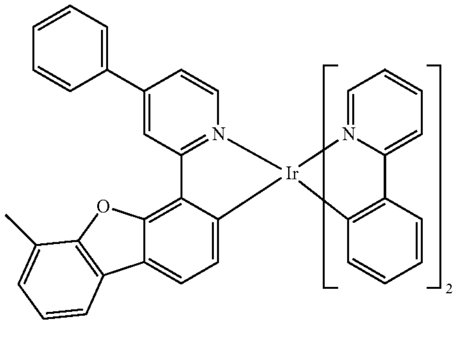
-continued
D-61
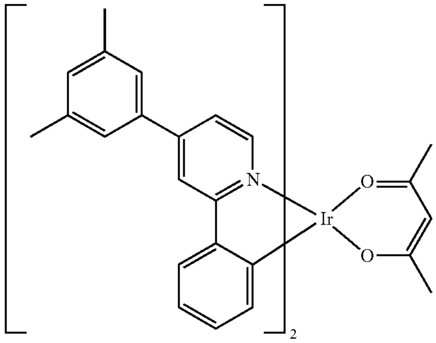
D-62
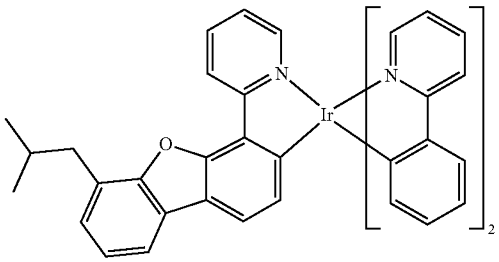
D-63
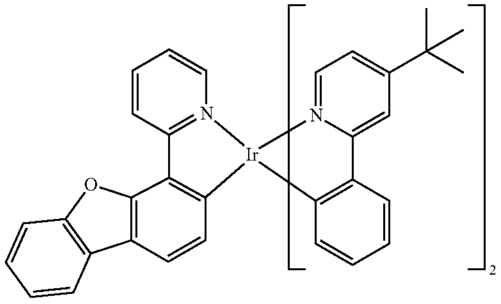
D-64
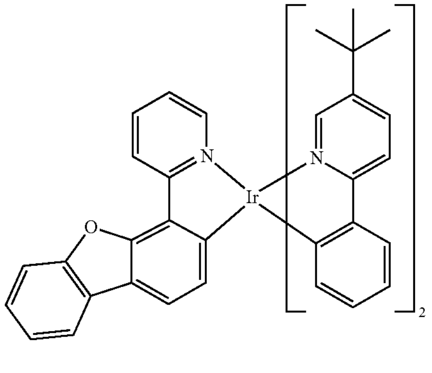

-continued
D-65
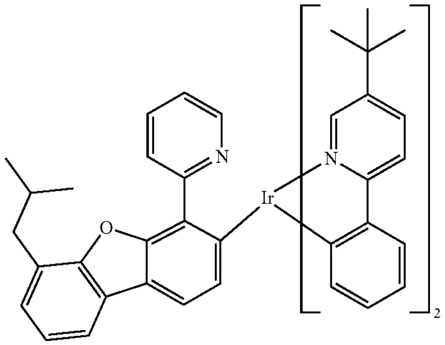
D-66
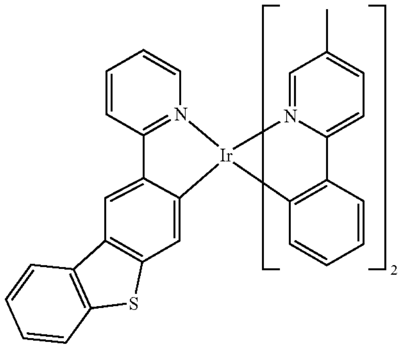
D-67
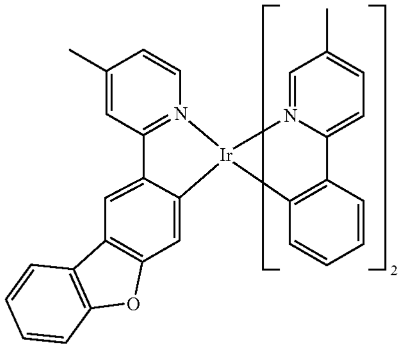
D-68
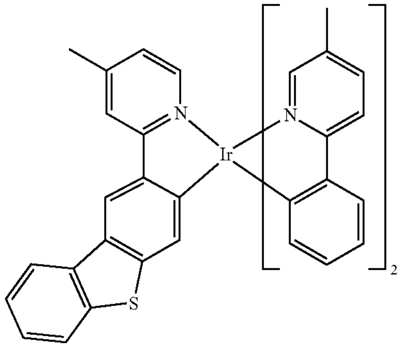
-continued
D-69
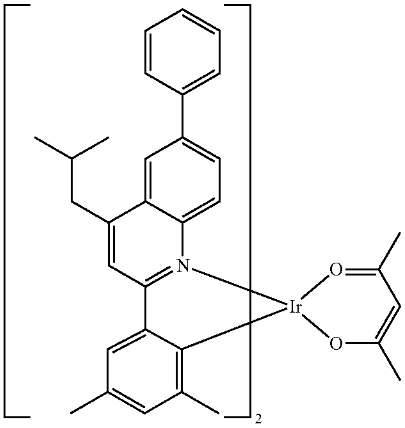
D-70
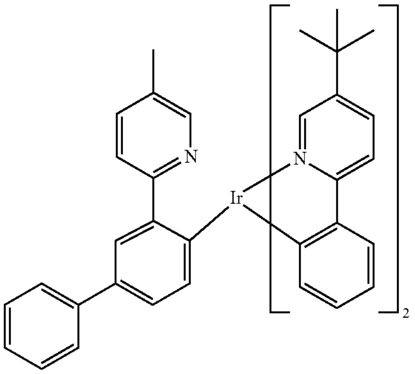
D-71
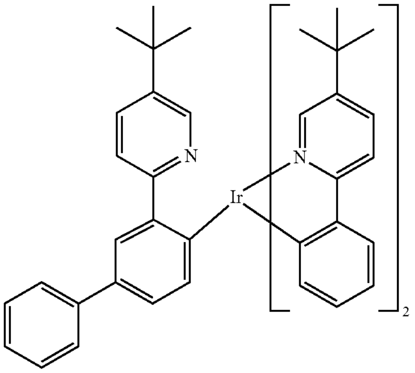
D-72
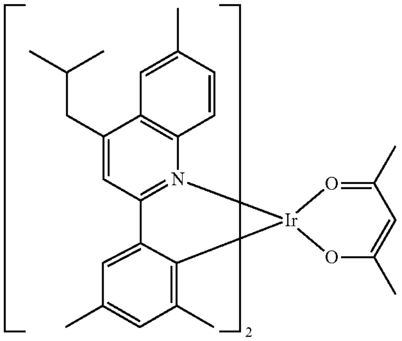

-continued
D-73
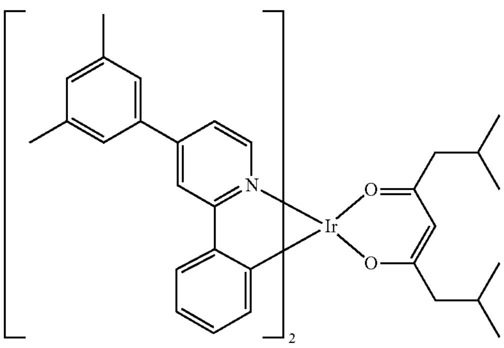
D-74
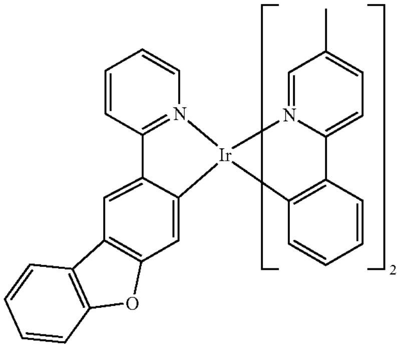
D-75
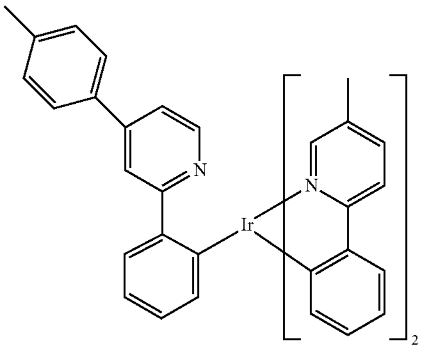
D-76
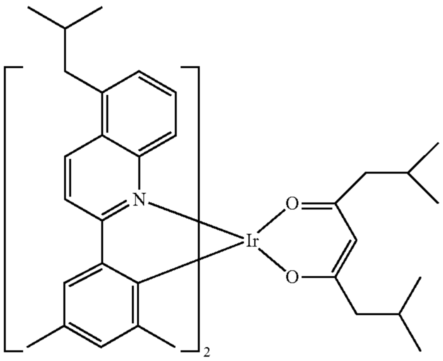
-continued
D-77
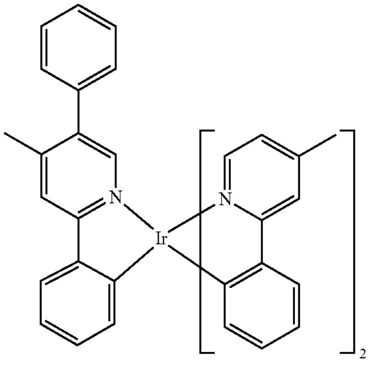
D-78
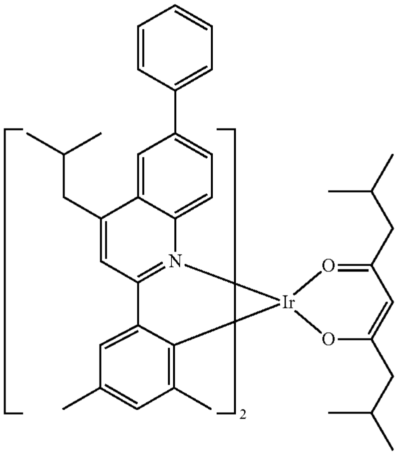
D-79
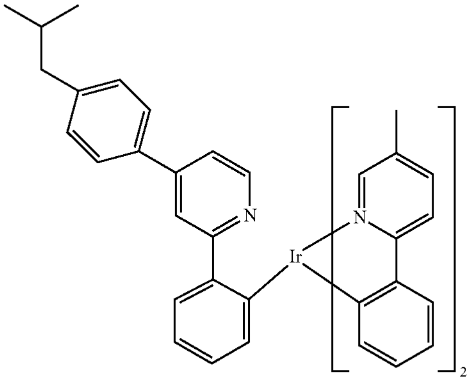
D-80
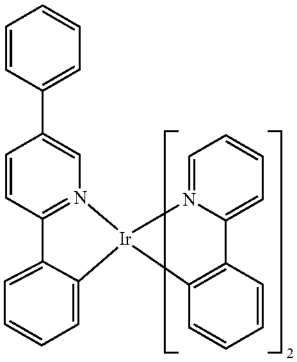

-continued
D-81
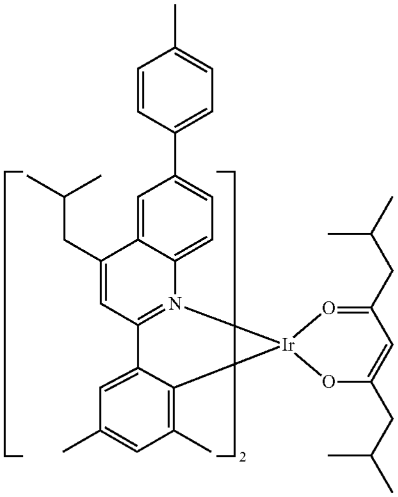
D-82
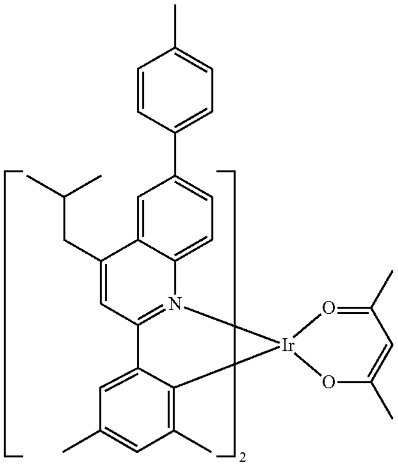
D-83
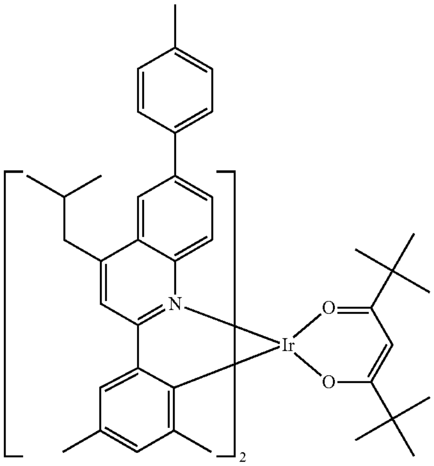
-continued
D-84
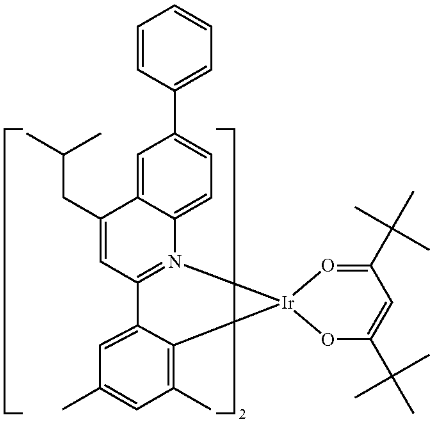
D-85
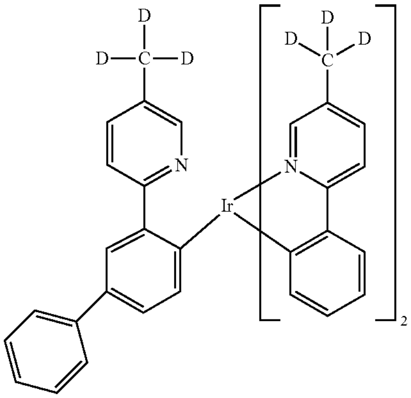
D-86
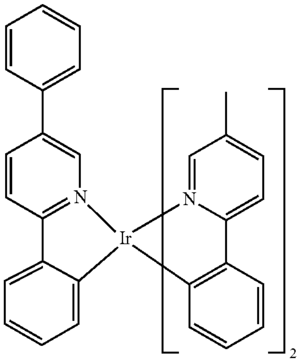
D-87
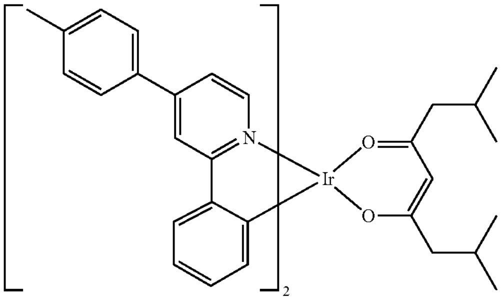

-continued
D-88
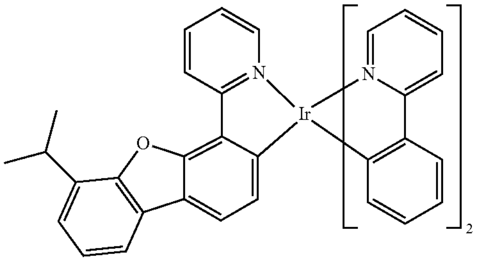
D-89
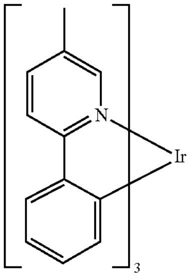
D-90
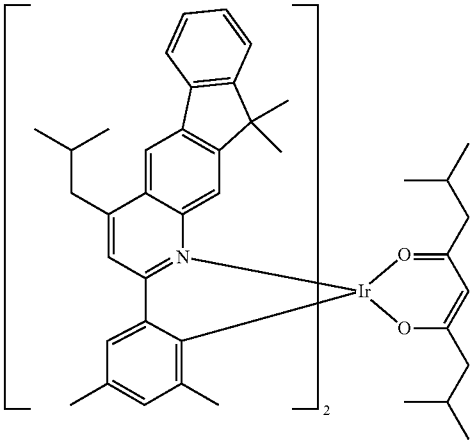
D-91
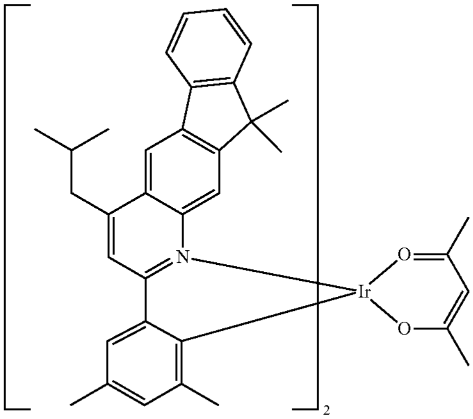
-continued
D-92
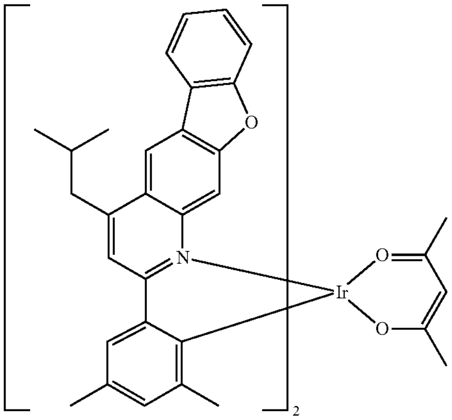
D-93
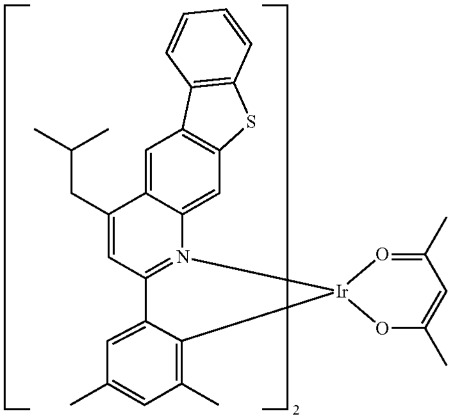
D-94
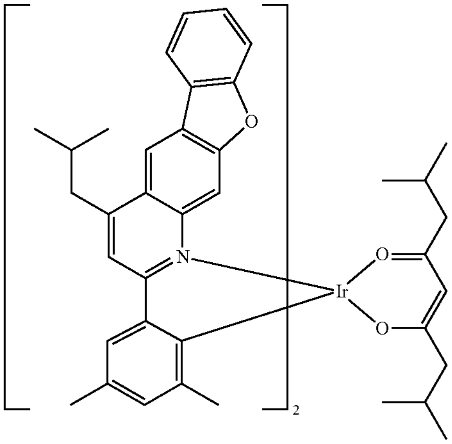

-continued
D-95
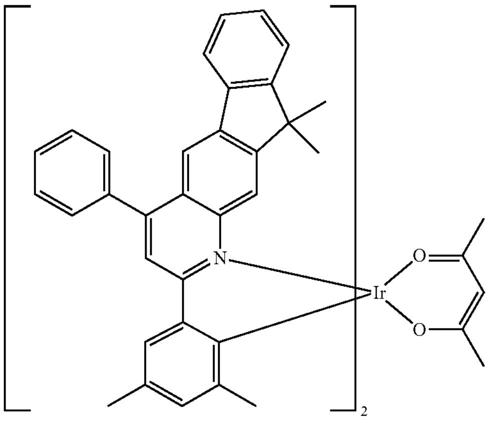
D-96
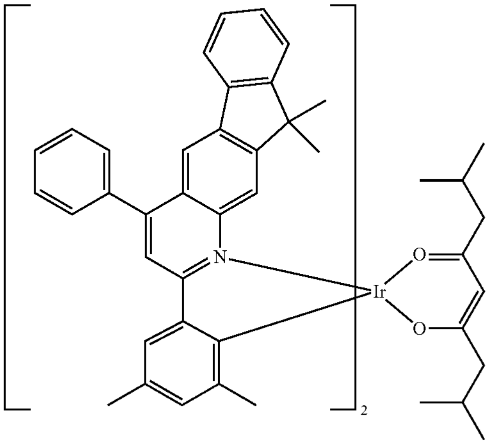
D-97
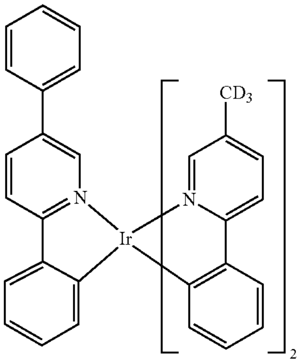
D-98
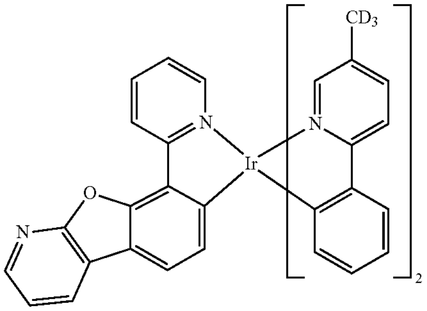
-continued
D-99
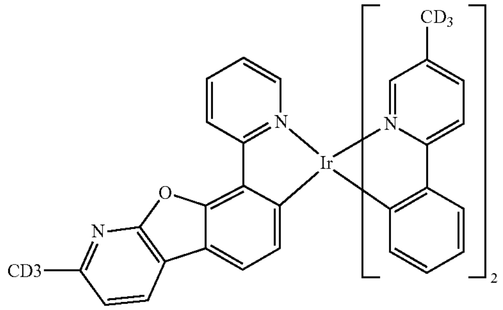
D-100
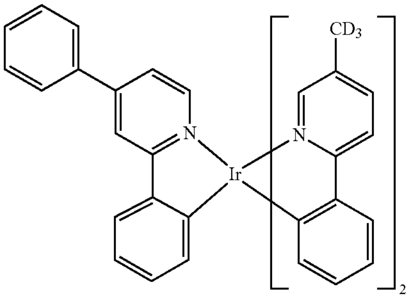
D-101
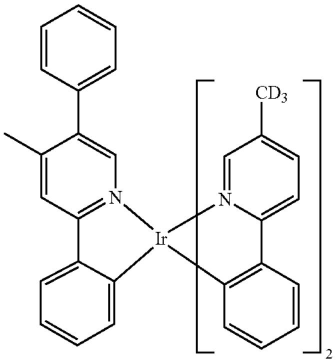
D-102
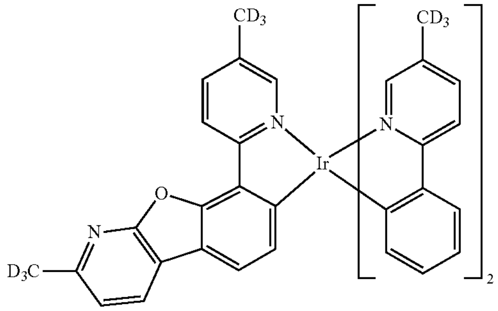

-continued
D-103
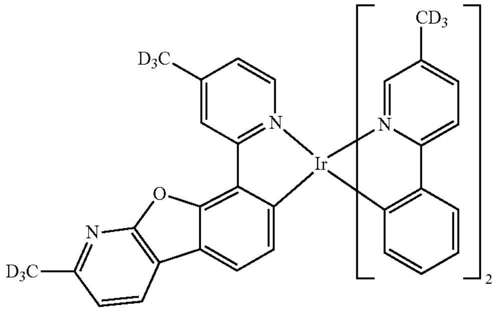
D-104
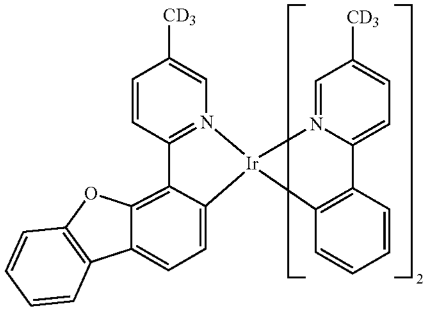
D-105
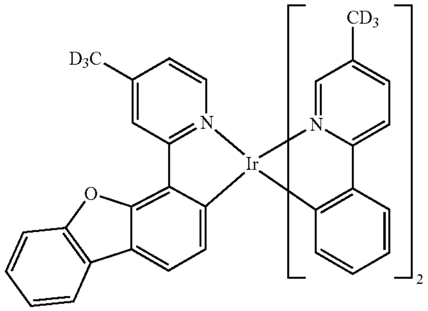
D-106
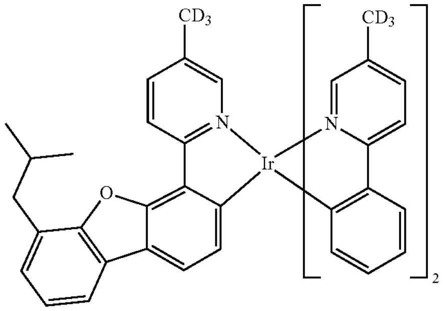
D-107
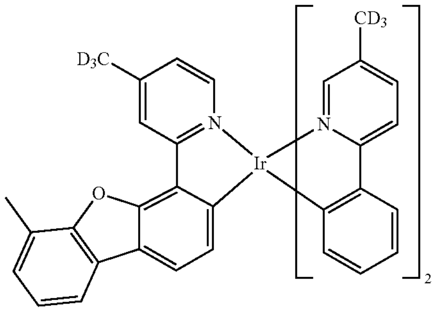
-continued
D-108
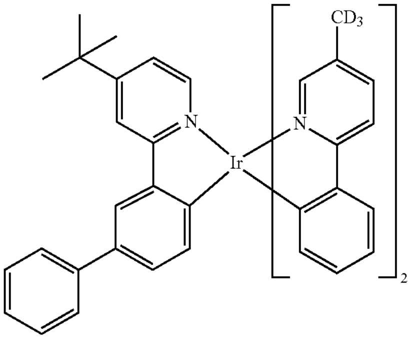
D-109
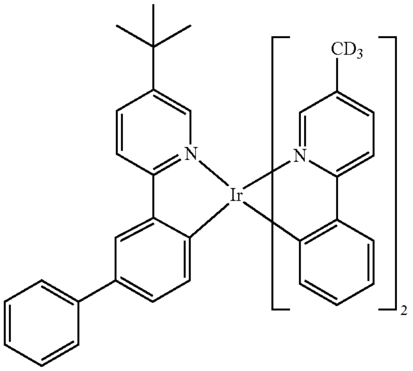
D-110
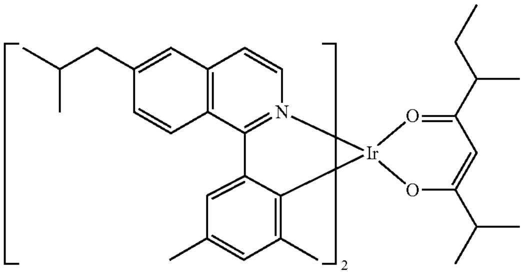
D-111
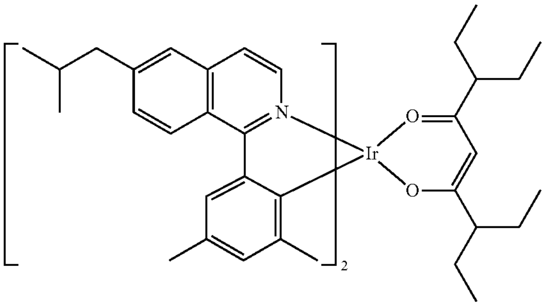

-continued

D-112

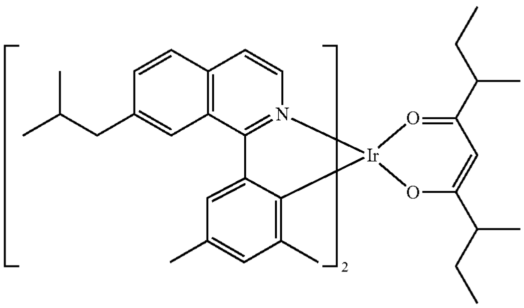

D-113

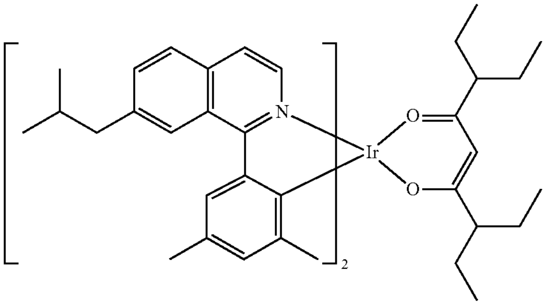

D-114

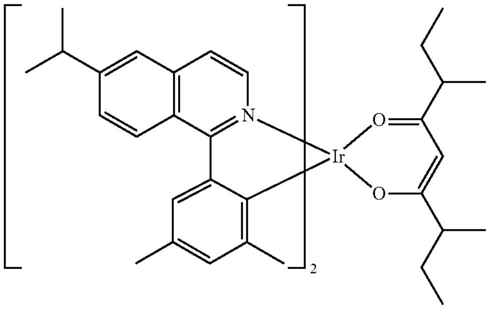

D-115

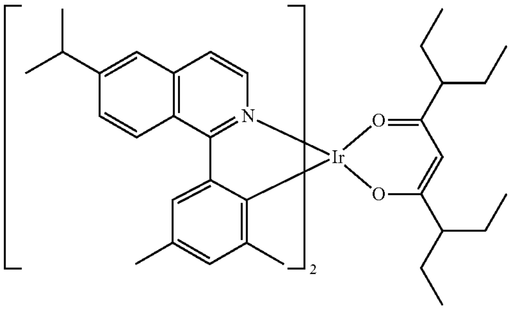

-continued

D-116

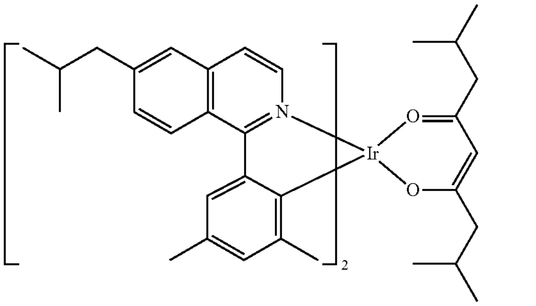

D-117

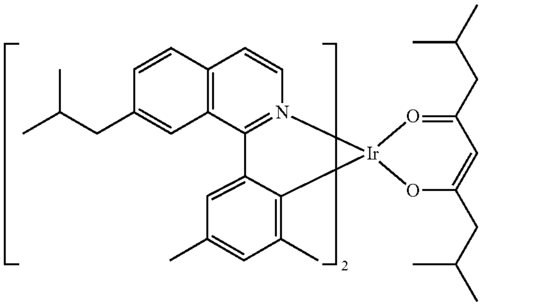

D-118

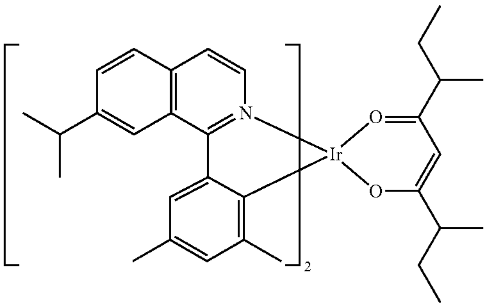

D-119

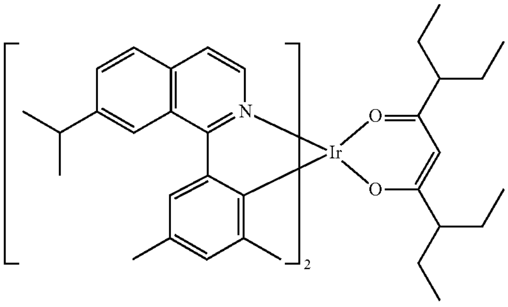

In the organic electroluminescent device of the present disclosure, between the anode and the light-emitting layer, a hole injection layer, a hole transport layer, an electron blocking layer, or a combination thereof can be used. Multiple hole injection layers can be used in order to lower the hole injection barrier (or hole injection voltage) from the anode to the hole transport layer or the electron blocking layer. Two compounds can be simultaneously used in each layer. The hole transport layer or the electron blocking layer can also be formed of multi-layers.

In addition, between the light-emitting layer and the cathode, an electron buffer layer, a hole blocking layer, an electron transport layer, an electron injection layer, or a combination thereof can be used. Multiple electron buffer layers can be used in order to control the injection of the electrons and enhance the interfacial characteristics between the light-emitting layer and the electron injection layer. Two compounds can be simultaneously used in each layer. The hole blocking layer or the electron transport layer can also be formed of multi-layers, and each layer can comprise two or more compounds.

In addition, the organic electroluminescent compound or the plurality of host materials according to the present disclosure can also be used in an organic electroluminescent device comprising a quantum dot (QD).

In order to form each layer of the organic electroluminescent device of the present disclosure, dry film-forming methods such as vacuum evaporation, sputtering, plasma and ion plating methods, or wet film-forming methods such as ink jet printing, nozzle printing, slot coating, spin coating, dip coating, and flow coating methods can be used.

When using a solvent in a wet film-forming method, a thin film can be formed by dissolving or diffusing materials forming each layer into any suitable solvent such as ethanol, chloroform, tetrahydrofuran, dioxane, etc. The solvent can be any solvent where the materials forming each layer can be dissolved or diffused, and where there are no problems in film-formation capability.

In addition, the first and the second host compounds of the present disclosure may be film-formed in the above-listed methods, commonly by a co-evaporation process or a mixture-evaporation process. The co-evaporation is a mixed deposition method in which two or more materials are placed in a respective individual crucible source and a current is applied to both cells at the same time to evaporate the materials. The mixture-evaporation is a mixed deposition method in which two or more materials are mixed in one crucible source before evaporating them, and a current is applied to the cell to evaporate the materials. Further, if the first and the second host compounds are present in the same layer or different layers in an organic electroluminescent device, the two host compounds may individually form films. For example, the second host compound may be deposited after depositing the first host compound.

The present disclosure may provide a display device by using the plurality of host materials comprising the compound represented by formula 1 and the compound represented by formula 2. That is, it is possible to manufacture a display system or a lighting system by using the plurality of host materials of the present disclosure. Specifically, it is possible to produce a display system, e.g., a display system for smartphones, tablets, notebooks, PCs, TVs, or cars, or a lighting system, e.g., an outdoor or indoor lighting system, by using the plurality of host materials of the present disclosure.

Hereinafter, the properties of an organic electroluminescent device comprising the plurality of host materials of the present disclosure will be explained in detail with reference to the representative compounds of the present disclosure. However, the present disclosure is not limited by the following examples.

DEVICE EXAMPLES 1 TO 16: PRODUCTION OF AN OLED COMPRISING THE PLURALITY OF HOST MATERIALS ACCORDING TO THE PRESENT DISCLOSURE

An organic electroluminescent device (OLED) according to the present disclosure was produced comprising the plurality of host materials according to the present disclosure. A transparent electrode indium tin oxide (ITO) thin film (10 Ω/sq) on a glass substrate for an OLED (Geomatec, Japan) was subjected to an ultrasonic washing with trichloroethylene, acetone, ethanol, and distilled water, sequentially, and was then stored in isopropanol. Next, the ITO substrate was mounted on a substrate holder of a vacuum vapor depositing apparatus. Compound HI-1 was introduced into a cell of said vacuum vapor depositing apparatus, and then the pressure in the chamber of said apparatus was controlled to 10-torr. Thereafter, an electric current was applied to the cell to evaporate the above-introduced material, thereby forming a first hole injection layer having a thickness of 80 nm on the ITO substrate. Compound HI-2 was then introduced into another cell of said vacuum vapor depositing apparatus, and was evaporated by applying an electric current to the cell, thereby forming a second hole injection layer having a thickness of 5 nm on the first hole injection layer. Compound HT-1 was introduced into another cell of said vacuum vapor depositing apparatus, and was evaporated by applying an electric current to the cell, thereby forming a first hole transport layer having a thickness of 10 nm on the second hole injection layer. Compound HT-2 was introduced into another cell of said vacuum vapor depositing apparatus, and was evaporated by applying an electric current to the cell, thereby forming a second hole transport layer having a thickness of 60 nm on the first hole transport layer. After forming the hole injection layers and the hole transport layers, a light-emitting layer was then deposited as follows. The first and second host compounds shown in Table 1 below were introduced into two cells of the vacuum vapor depositing apparatus as a host, and compound D-39 was introduced into another cell. The two host materials were evaporated at a rate of 1:1 and the dopant material was simultaneously evaporated at a different rate and these were deposited in a doping amount of 3 wt % based on the total amount of the host and dopant to form a light-emitting layer having a thickness of 40 nm on the second hole transport layer. Compound ET-1 and compound EI-1 were then introduced into two other cells, evaporated at the rate of 1:1, and deposited to form an electron transport layer having a thickness of 35 nm on the light-emitting layer. Next, after depositing compound EI-1 as an electron injection layer having a thickness of 2 nm on the electron transport layer, an Al cathode having a thickness of 80 nm was deposited by another vacuum vapor deposition apparatus on the electron injection layer. Thus, an OLED was produced.

COMPARATIVE EXAMPLES 1 TO 8: PRODUCTION OF AN OLED NOT ACCORDING TO THE PRESENT DISCLOSURE

An OLED was produced in the same manner as in Device Examples 1 to 16, except that only one host compound as listed in Table 1 below, was used instead of two hosts.

The luminous efficiency at a luminance of 5,000 nit, and the time taken for luminance to decrease from 100% to 97% at a constant current in a luminance of 5,000 nit (lifespan; T97) of the OLED devices produced in the Device Examples and Comparative Examples are provided in Table 1 below.

TABLE 1

| | First Host | Second Host | Luminous Efficiency (cd/A) | Lifespan (T97, hr) |
|---|---|---|---|---|
| Device Example 1 | H-175 | C-13 | 26.3 | 224 |
| Device Example 2 | H-146 | C-107 | 25.6 | 148 |
| Device Example 3 | H-179 | C-14 | 24.5 | 573 |
| Device Example 4 | H-160 | C-14 | 26.8 | 207 |
| Device Example 5 | H-160 | C-7 | 24.4 | 164 |
| Device Example 6 | H-175 | C-260 | 25.0 | 327 |
| Device Example 7 | H-175 | C-225 | 27.9 | 253 |
| Device Example 8 | H-183 | C-225 | 28.0 | 162 |
| Device Example 9 | H-183 | C-230 | 27.8 | 138 |
| Device Example 10 | H-183 | C-268 | 26.0 | 201 |
| Device Example 11 | H-183 | C-228 | 31.0 | 267 |
| Device Example 12 | H-183 | C-267 | 29.2 | 321 |
| Device Example 13 | H-182 | C-228 | 30.9 | 310 |
| Device Example 14 | H-181 | C-108 | 30.3 | 120 |
| Device Example 15 | H-181 | C-270 | 29.2 | 163 |
| Device Example 16 | H-181 | C-269 | 30.0 | 146 |
| Comparative Example 1 | — | C-13 | 20.8 | 8 |

TABLE 1-continued

| | First Host | Second Host | Luminous Efficiency (cd/A) | Lifespan (T97, hr) |
|---|---|---|---|---|
| Comparative Example 2 | — | C-107 | 21.4 | 7 |
| Comparative Example 3 | H-146 | — | 8.7 | 2 |
| Comparative Example 4 | — | C-14 | 21.8 | 10 |
| Comparative Example 5 | — | C-7 | 19.8 | 10 |
| Comparative Example 6 | — | C-260 | 22.7 | 171 |
| Comparative Example 7 | — | C-225 | 18.8 | 26 |
| Comparative Example 8 | — | C-108 | 18.7 | 7 |

From Table 1, it is confirmed that an organic electroluminescent device comprising the plurality of host materials comprising a specific combination of compounds according to the present disclosure has remarkably improved luminous efficiency and/or lifespan characteristics compared to conventional organic electroluminescent devices.

The compounds used in the Device Examples and the Comparative Examples are shown in Table 2 below.

TABLE 2

Hole Injection Layer/ Hole Transport Layer

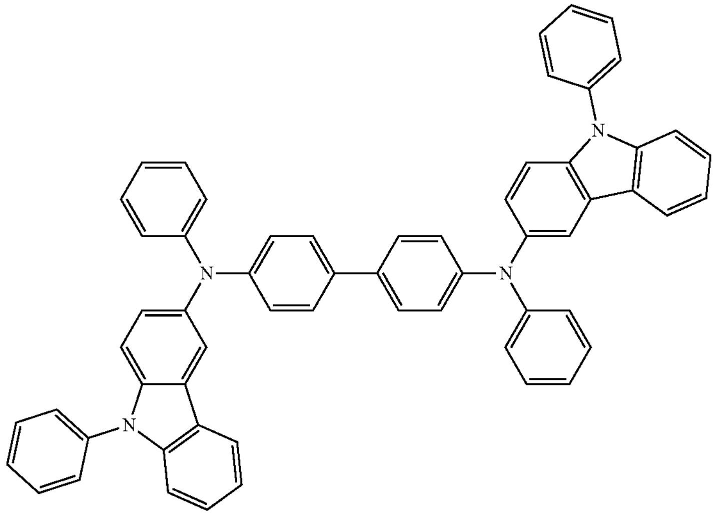

HI-1

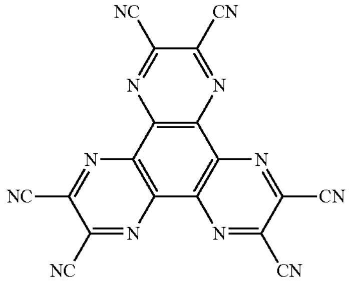

HI-2

TABLE 2-continued
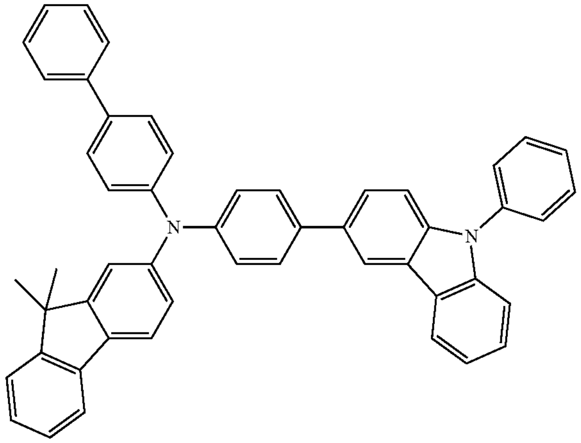
HT-1
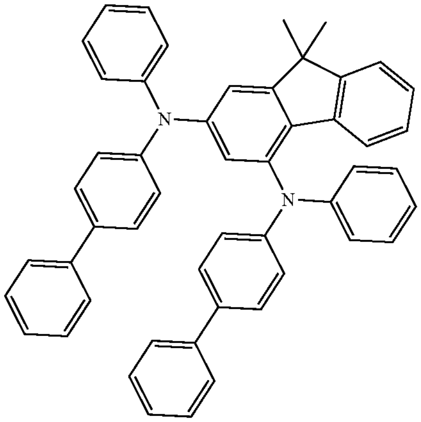
HT-2
Light-Emitting Layer
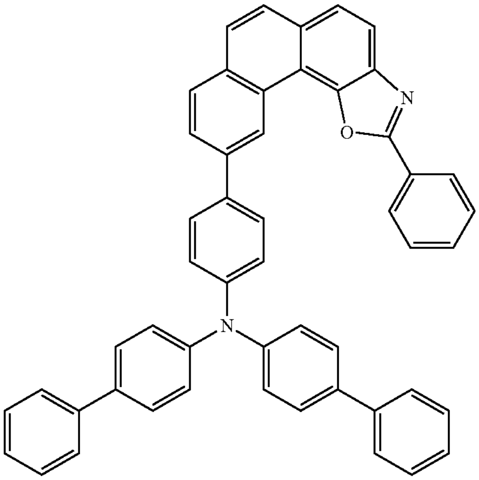
H-146

TABLE 2-continued
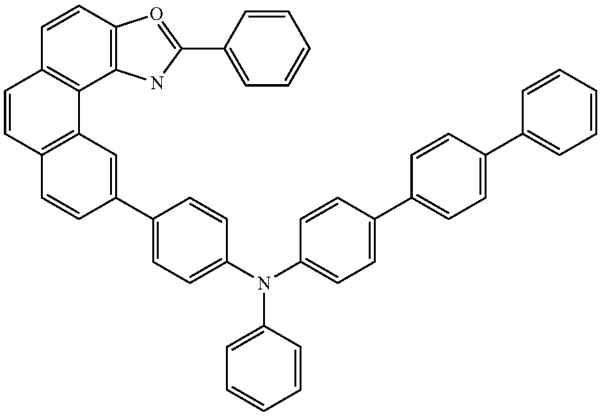
H-160
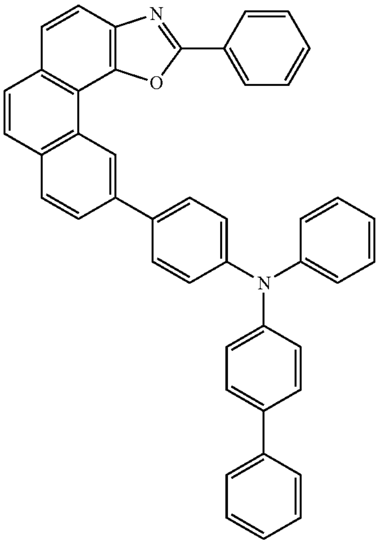
H-175
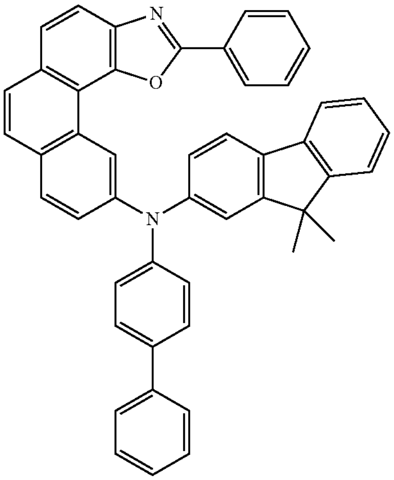
H-179

TABLE 2-continued
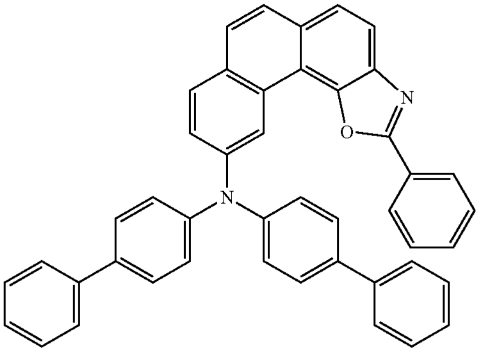
H-181
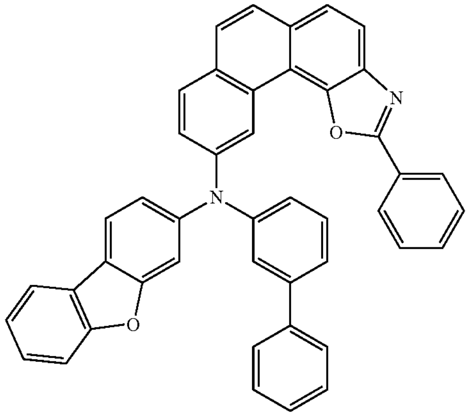
H-182
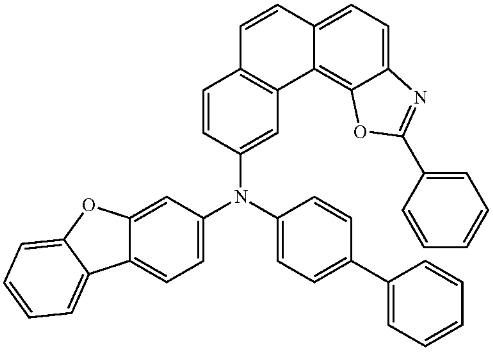
H-183

TABLE 2-continued
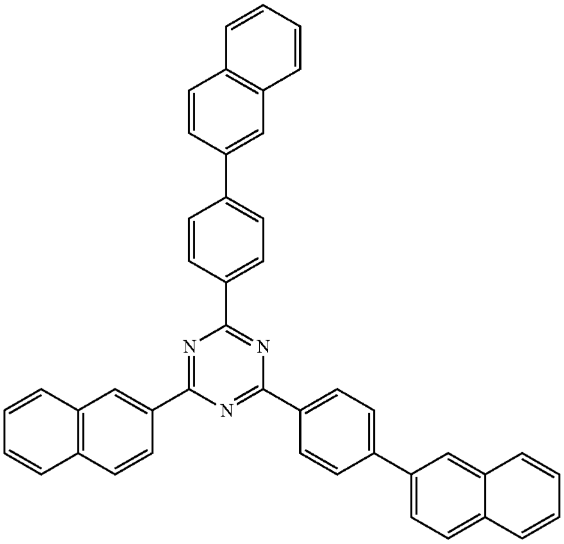
C-7
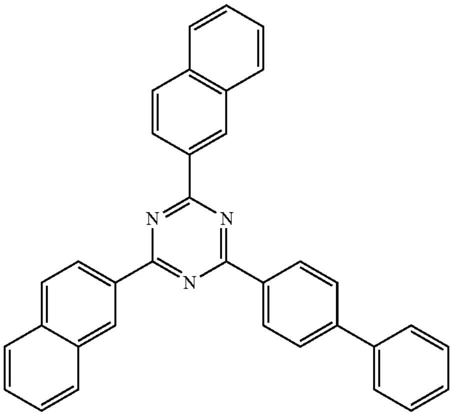
C-13
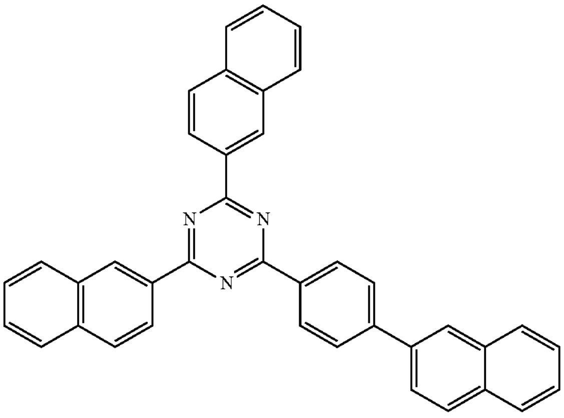
C-14

TABLE 2-continued
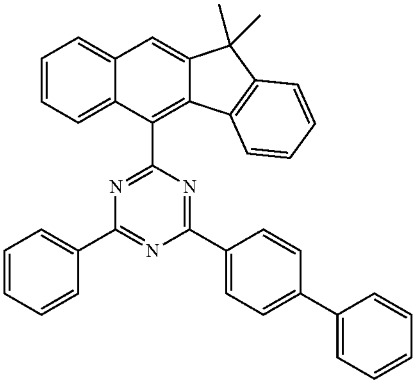
C-107
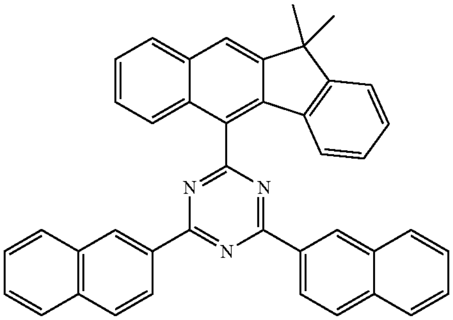
C-108
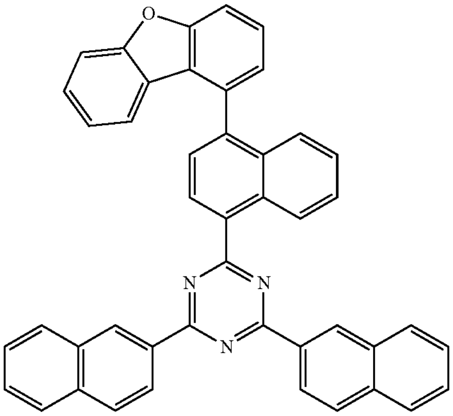
C-225

TABLE 2-continued
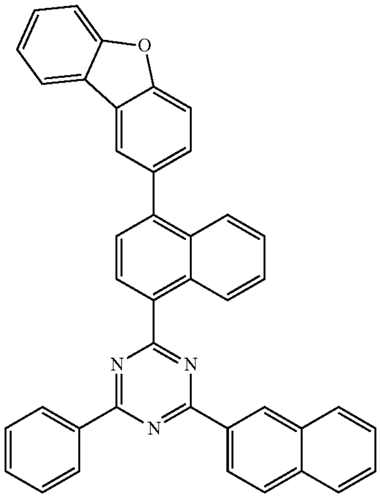
C-228
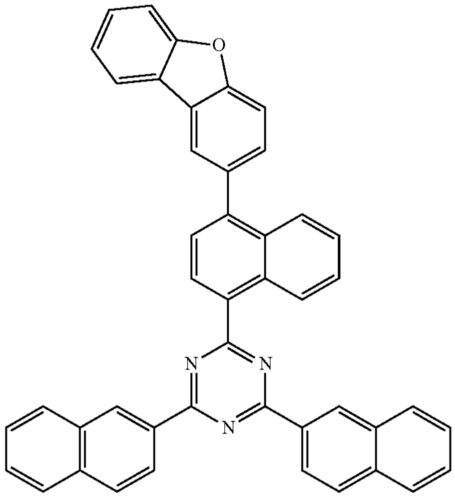
C-230
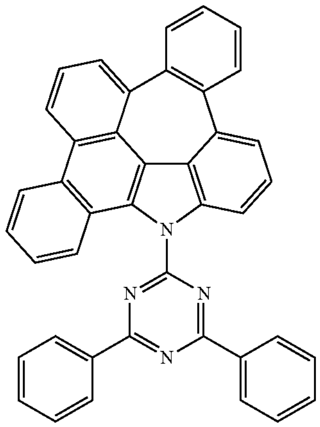
C-260

TABLE 2-continued
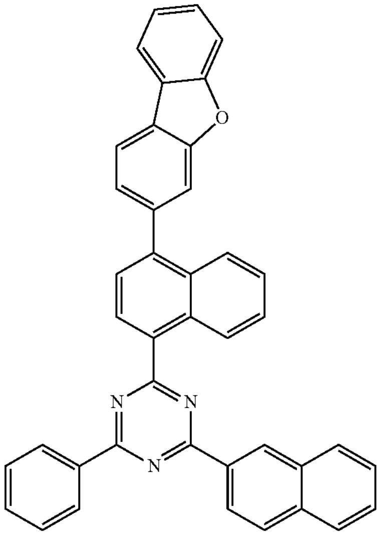
C-267
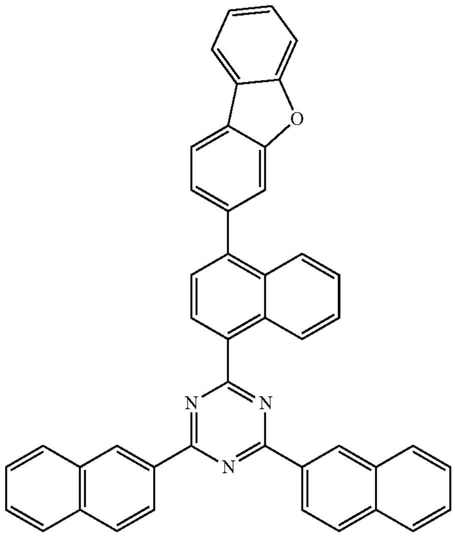
C-268
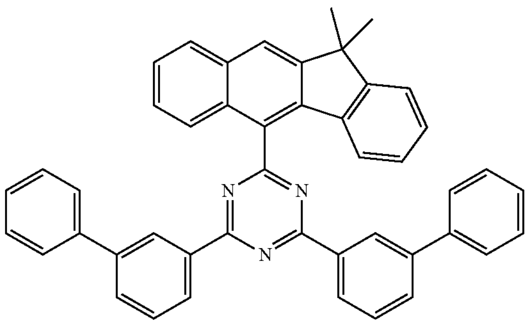
C-269

TABLE 2-continued
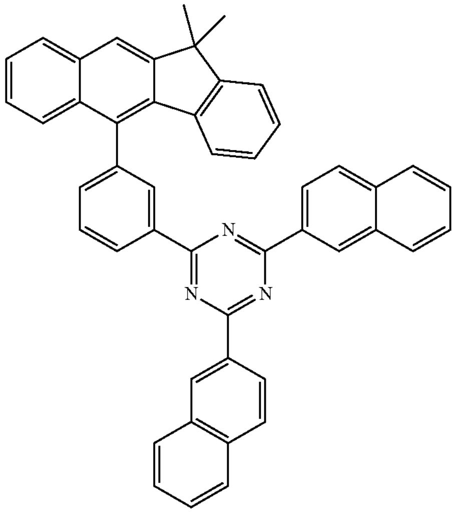
C-270
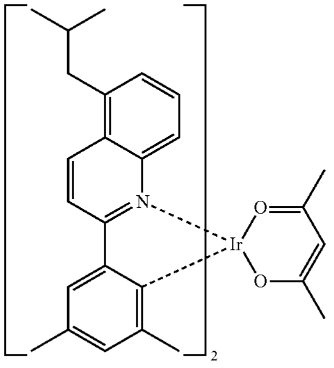
D-39
Electron Transport Layer/ Electron Injection Layer
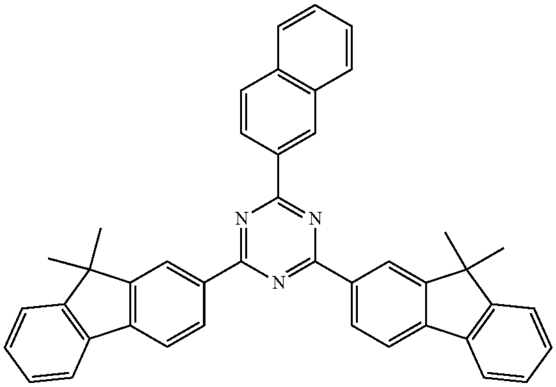
ET-1
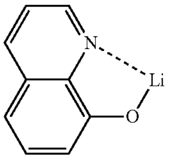
EI-1

The invention claimed is:

1. A plurality of host materials comprising a first host material comprising a compound represented by the following formula 1-2, and a second host material comprising a compound represented by the following formula 2-1:

(1-2)

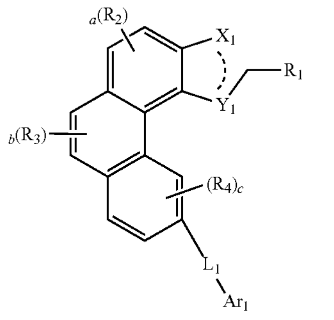

wherein $X_1$ represents —N═;

$Y_1$ represents —O— or —S;

$L_1$ represents a single bond;

$Ar_1$ represents a substituted or unsubstituted (C6-C60) aryl, a substituted or unsubstituted (3- to 30-membered) heteroaryl, a substituted or unsubstituted mono- or di-(C1-C30)alkylamino, a substituted or unsubstituted phenylbiphenylamino, a substituted or unsubstituted phenylnaphthylamino, a substituted or unsubstituted phenylterphenylamino, a substituted or unsubstituted phenylfluorenylamino, a substituted or unsubstituted naphthylbiphenylamino, a substituted or unsubstituted naphthylterphenylamino, a substituted or unsubstituted naphthylphenanthrenylamino, a substituted or unsubstituted dinaphthylamino, a substituted or unsubstituted phenylcarbazolylamino, a substituted or unsubstituted phenyldibenzofuranylamino, a substituted or unsubstituted biphenyldibenzofuranylamino, a substituted or unsubstituted biphenyldibenzothiophenylamino-, a substituted or unsubstituted terphenyldibenzofuranylamino, a substituted or unsubstituted terphenyldibenzothiophenylamino or a substituted or unsubstituted (C1-C30)alkyl(C6-C30)arylamino;

$R_1$ represents a substituted or unsubstituted (C6-C30)aryl, or a substituted or unsubstituted (3- to 30-membered) heteroaryl;

$R_2$ to $R_4$ each independently represent hydrogen, deuterium, a halogen, a cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl (C6-C30)arylamino; or adjacent substituents may be linked to each other to form a ring(s);

a and b each independently represent 1 or 2, and c represents an integer of 1 to 3, where if a to c are an integer of 2 or more, each $R_2$ to each $R_4$ may be the same or different;

(2-1)

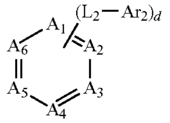

wherein $A_2$, $A_4$, and $A_6$ each independently represent N;

$A_1$, $A_3$, and $A_5$ each independently represent $CR_{10}$;

$R_{10}$ of $A_1$ represents $-L_2-Ar_2$ wherein $L_2$ represents a single bond or a substituted or unsubstituted (C6-C30) arylene; and $Ar_2$ represents a substituted or unsubstituted naphthyl, or a substituted or unsubstituted naphthylphenyl;

$R_{10}$ of $A_3$ represents $-L_2-Ar_2$ wherein $L_2$ represents a single bond or a substituted or unsubstituted (C6-C30) arylene; and $Ar_2$ represents a substituted or unsubstituted (C6-C30)aryl;

$R_{10}$ of $A_5$ represents $-L_2-Ar_2$ wherein $L_2$ represents, a deuterium-substituted or unsubstituted naphthylene, a deuterium-substituted or unsubstituted phenylnaphthylene, or a deuterium-substituted or unsubstituted naphthylphenylene; and $Ar_2$ represents the following formula 3;

with the proviso $L_2$ of $A_1$, $L_2$ of $A_3$, and $L_2$ of $A_5$ do not simultaneously represent a single bond;

(3)

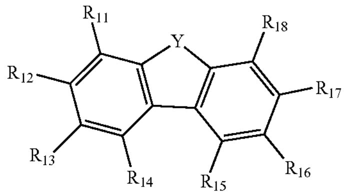

Y represents O, S, or $NR_{21}$;

$R_{21}$ represents a substituted or unsubstituted (C6-C30) aryl;

$R_{14}$ or $R_{15}$ is a bonding site with $L_2$; or $R_{11}$ to $R_{18}$ each independently represent hydrogen, deuterium, a halogen, a cyano, a substituted or unsubstituted (C1-C30) alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl (C6-C30)arylamino; or may be linked to an adjacent substituent to form a ring(s); and d represents an integer of 3.

2. The plurality of host materials according to claim 1, wherein the substituents of the substituted alkyl, the substituted aryl, the substituted arylene, the substituted heteroaryl, the substituted cycloalkyl, the substituted alkoxy, the substituted trialkylsilyl, the substituted dialkylarylsilyl, the substituted alkyldiarylsilyl, the substituted triarylsilyl, the substituted mono- or di-alkylamino, the substituted mono- or di-arylamino, the substituted phenylbiphenylamino, the substituted phenylnaphthylamino, the substituted phenylterphenylamino, the substituted phenylfluorenylamino, the substituted naphthylbiphenylamino, the substituted naphthylterphenylamino, the substituted naphthylphenanthrenylamino, the substituted dinaphthylamino, the substituted phenylcarbazolylamino, the substituted phenyldibenzofuranylamino, the substituted biphenyldibenzofuranylamino, the substituted biphenyldibenzothiophenylamino, the substituted terphenyldibenzofuranylamino, the substituted terphenyldibenzothiophenylamino, and the substituted alkylarylamino in $L_2$, $Ar_1$, $R_1$ to $R_4$, $R_{11}$ to $R_{18}$, and $R_{21}$ each independently are at least one selected from the group consisting of deuterium; a halogen; a cyano; a carboxyl; a nitro; a hydroxyl; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (3- to 30-membered)heteroaryl unsubstituted or substituted with a (C6-C30)aryl(s); a (C6-C30)aryl unsubstituted or substituted with at least one of a (C1-C30)alkyl(s) and a (3- to 30-membered)heteroaryl(s); a tri(C1-C30)alkylsilyl; a tri(C6-C30)arylsilyl; a di(C1-C30)alkyl(C6-C30)arylsilyl; a (C1-C30)alkyldi(C6-C30)arylsilyl; an amino; a mono- or di-(C1-C30)alkylamino; a mono- or di-(C6-C30)arylamino; a (C1-C30)alkyl(C6-C30)arylamino; a (C1-C30)alkylcarbonyl; a (C1-C30)alkoxycarbonyl; a (C6-C30)arylcarbonyl; a di(C6-C30)arylboronyl; a di(C1-C30)alkylboronyl; a (C1-C30)alkyl(C6-C30)arylboronyl; a (C6-C30)aryl(C1-C30)alkyl; and a (C1-C30)alkyl(C6-C30)aryl.

3. The plurality of host materials according to claim 1, wherein in formula 1-2, $Ar_1$ represents a substituted or unsubstituted phenyl, a substituted or unsubstituted naphthyl, a substituted or unsubstituted biphenyl, a substituted or unsubstituted naphthylphenyl, a substituted or unsubstituted phenylnaphthyl, a substituted or unsubstituted terphenyl, a substituted or unsubstituted phenanthrenyl, a substituted or unsubstituted benzophenanthrenyl, a substituted or unsubstituted chrysenyl, a substituted or unsubstituted fluoranthenyl, a substituted or unsubstituted fluorenyl, a substituted or unsubstituted benzofluorenyl, a substituted or unsubstituted triphenylenyl, a substituted or unsubstituted spirobifluorenyl, a substituted or unsubstituted spiro[cyclopentane-fluorene]yl, a substituted or unsubstituted spiro[indane-fluorene]yl, a substituted or unsubstituted spiro[fluorene-benzofluorene]yl, a substituted or unsubstituted nitrogen-containing 23-membered heteroaryl, a substituted or unsubstituted phenylbiphenylamino, a substituted or unsubstituted phenylnaphthylamino, a substituted or unsubstituted phenylterphenylamino, a substituted or unsubstituted phenylfluorenylamino, a substituted or unsubstituted naphthylbiphenylamino, a substituted or unsubstituted naphthylterphenylamino, a substituted or unsubstituted naphthylphenanthrenylamino, a substituted or unsubstituted dinaphthylamino, a substituted or unsubstituted phenylcarbazolylamino, a substituted or unsubstituted phenyldibenzofuranylamino, a substituted or unsubstituted biphenyldibenzofuranylamino, or a substituted or unsubstituted biphenyldibenzothiophenylamino.

4. The plurality of host materials according to claim 1, wherein the compound represented by formula 1-2 is at least one selected from the following compounds;

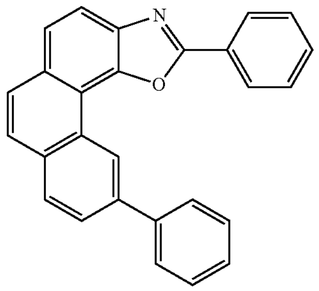
H-1

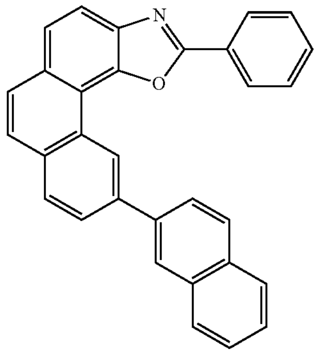
H-2

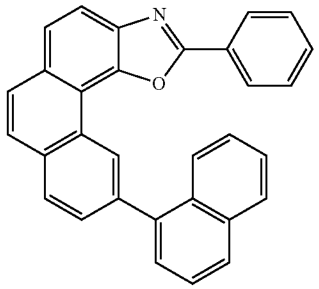
H-3

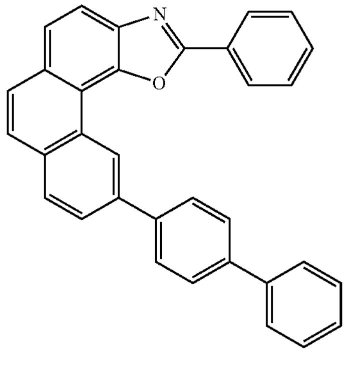
H-4

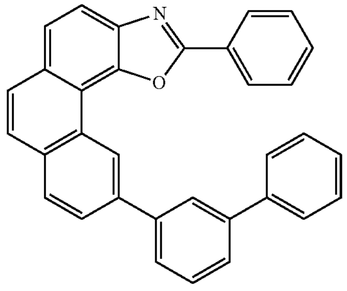
H-5

-continued
H-6
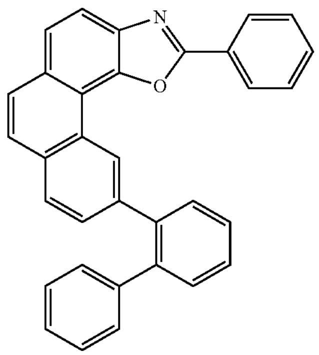
H-7
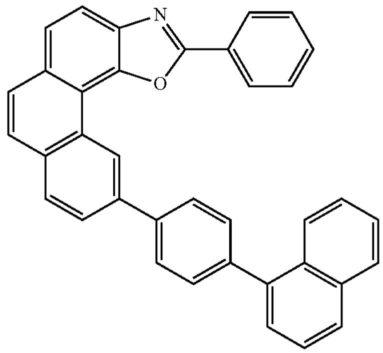
H-8
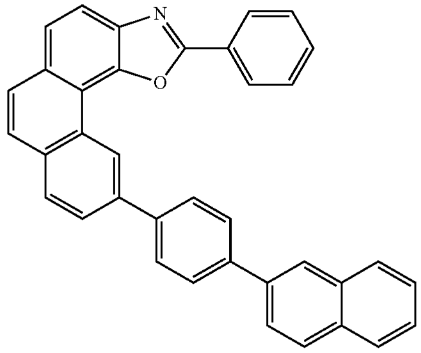
H-9
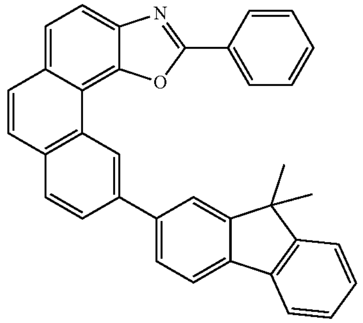
-continued
H-10
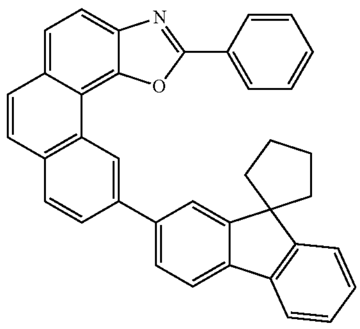
H-11
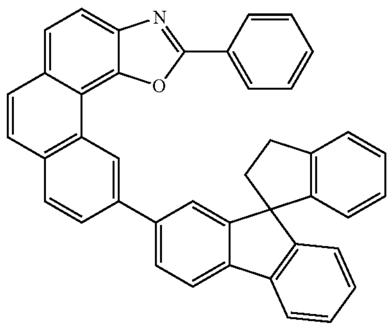
H-12
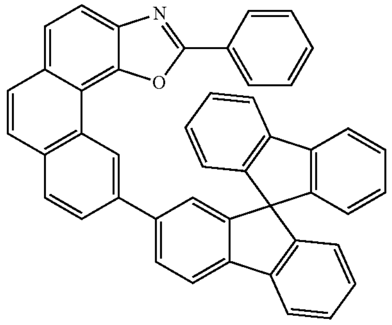
H-13
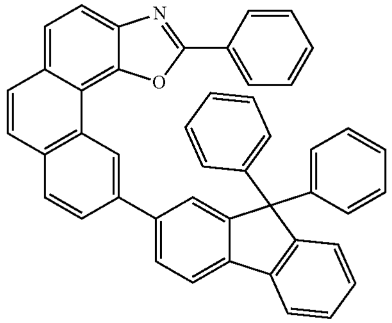

-continued
H-14
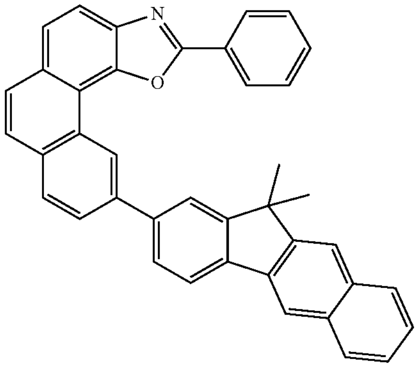
H-15
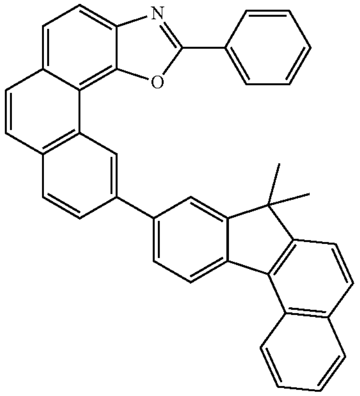
H-16
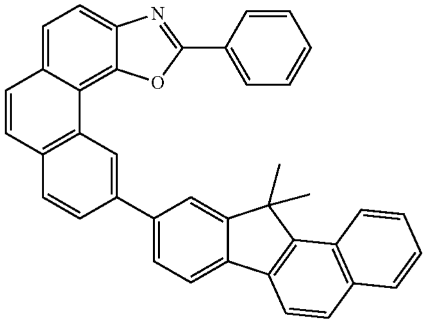
H-17
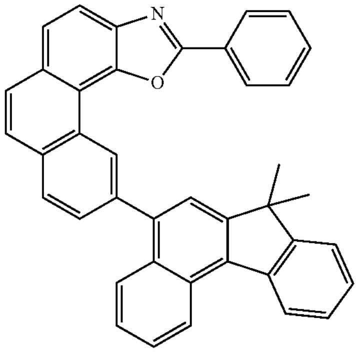
-continued
H-18
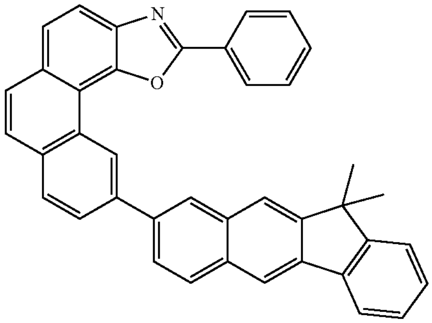
H-19
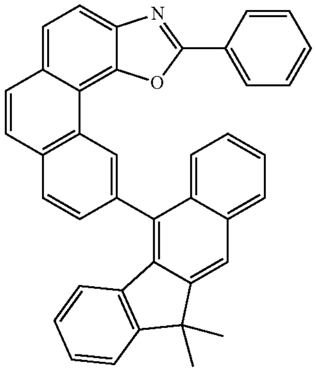
H-20
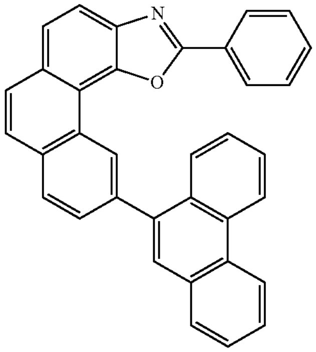
H-21
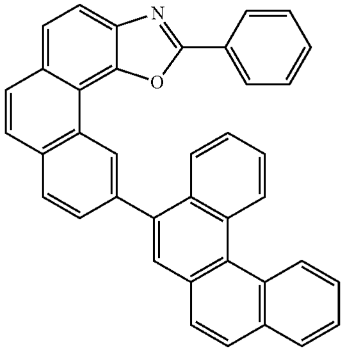

-continued
H-22
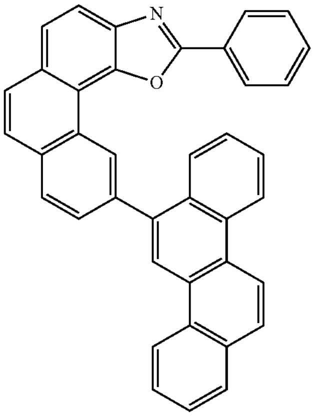
H-23
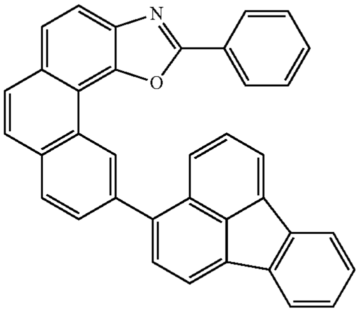
H-24
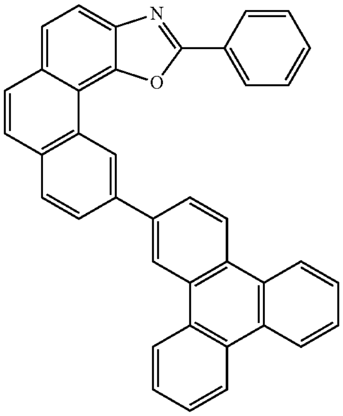
H-25
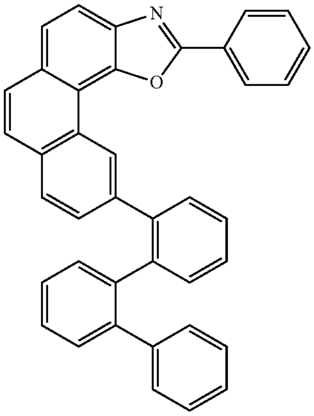
-continued
H-26
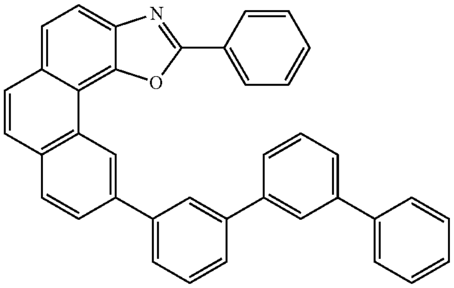
H-27
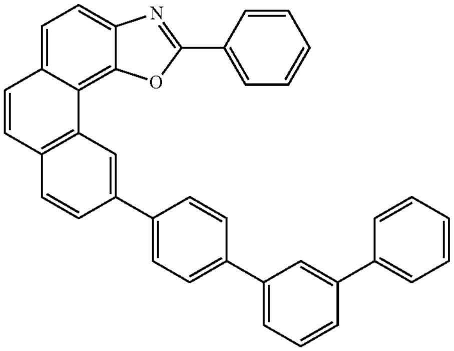
H-28
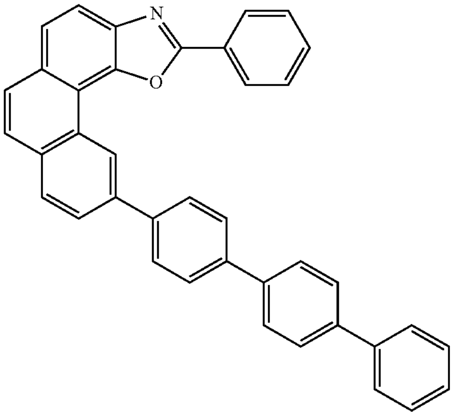
H-29
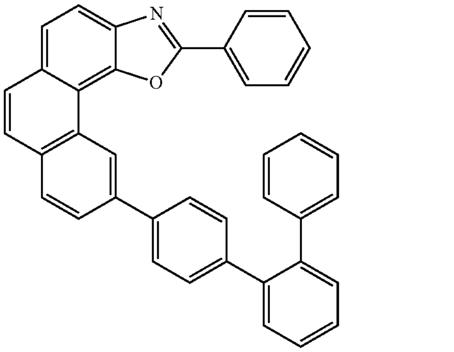

-continued
H-30
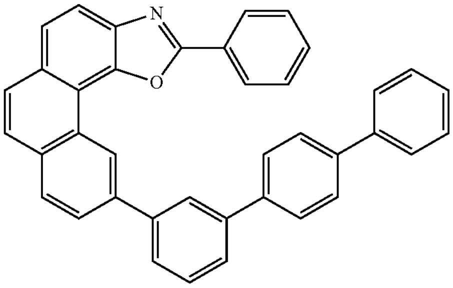
H-31
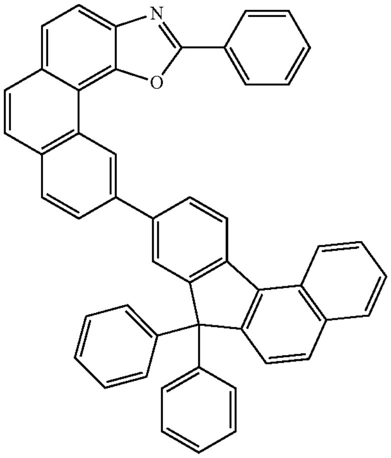
H-32
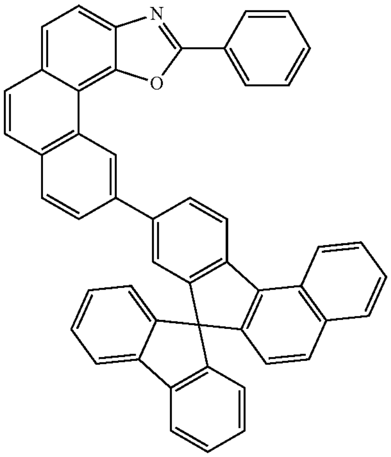
-continued
H-33
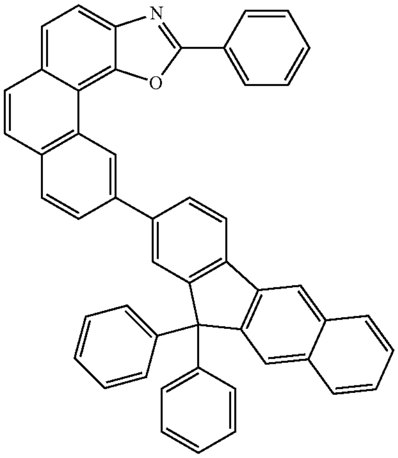
H-34
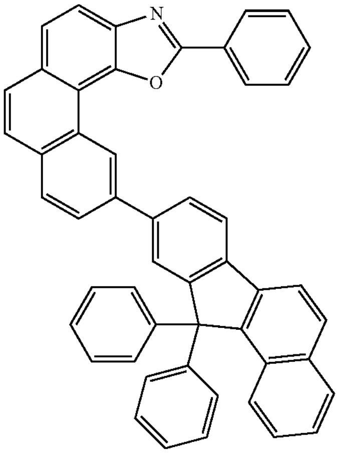
H-35
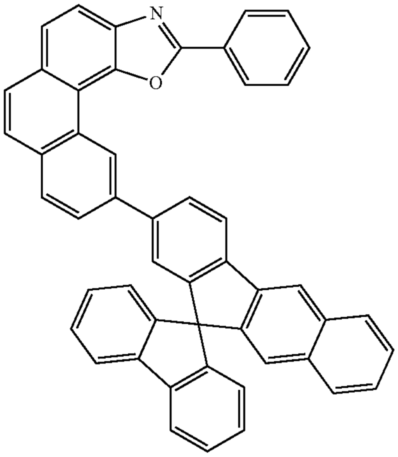

-continued
H-36
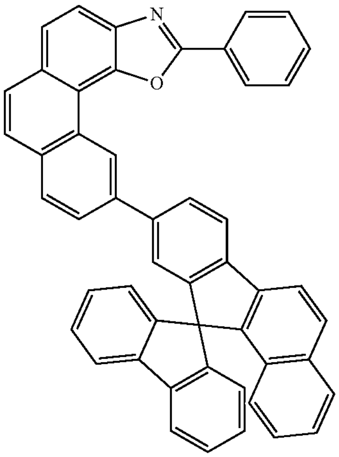
H-39
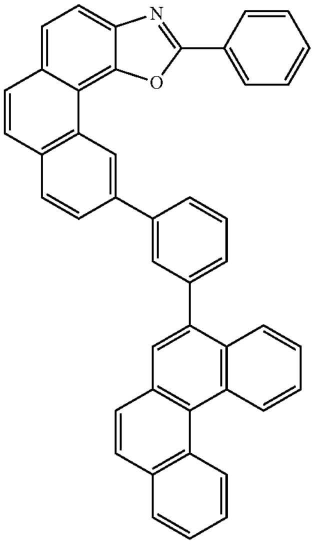
H-40
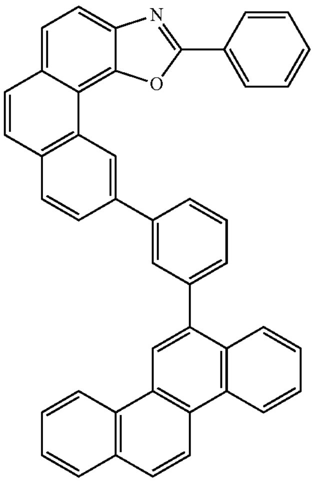
-continued
H-41
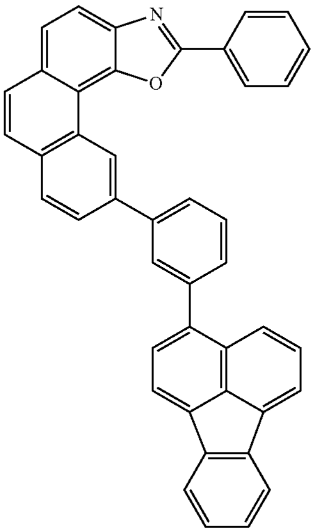
H-42
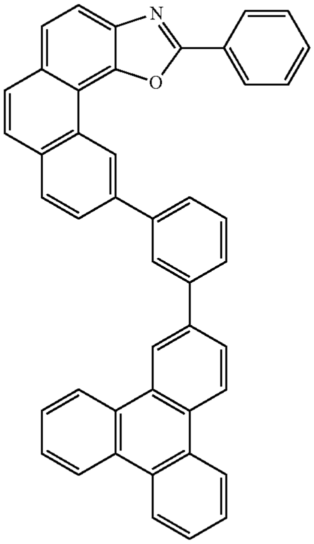
H-43
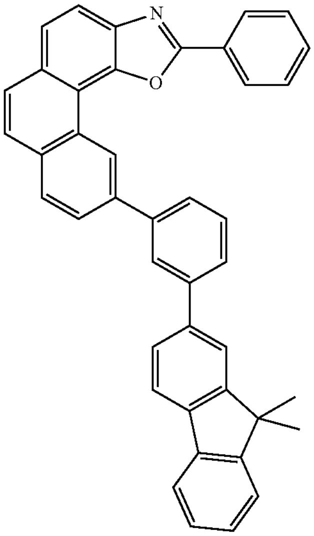

-continued
H-44
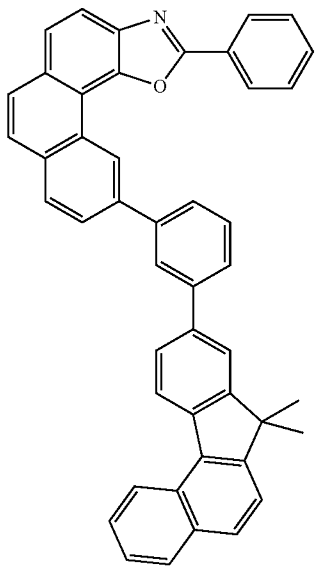
H-46
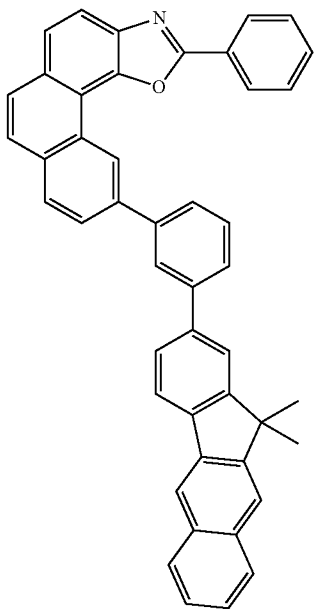
H-45
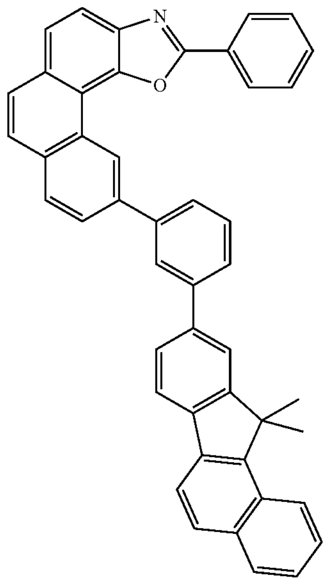
H-47
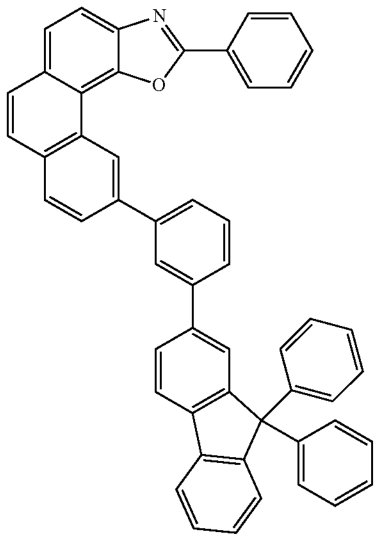

-continued
H-48
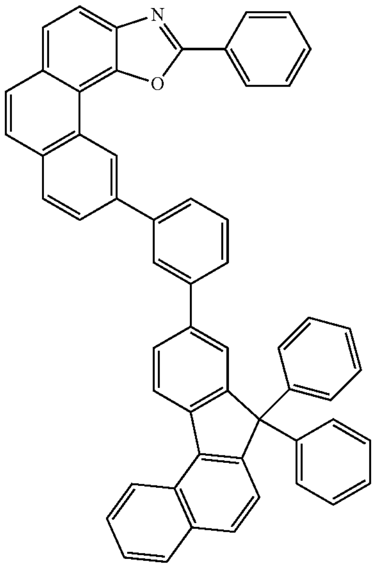
-continued
H-50
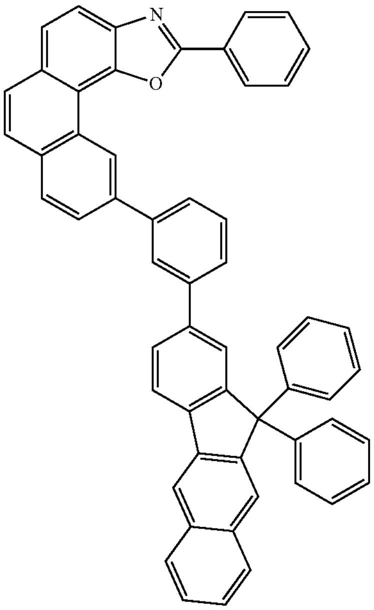
H-49
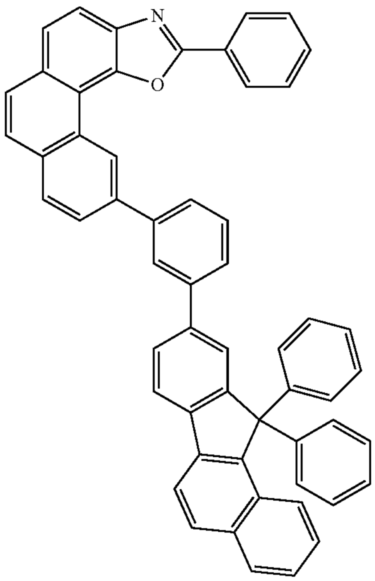
H-51
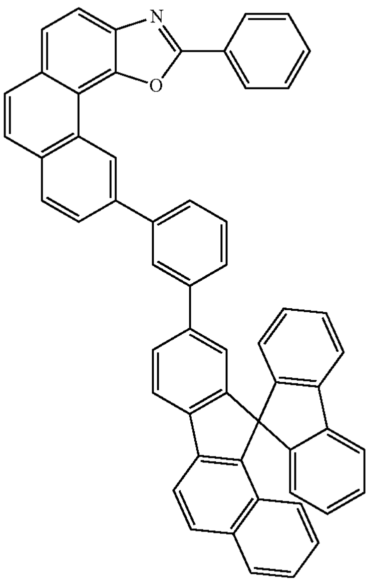

-continued
H-52
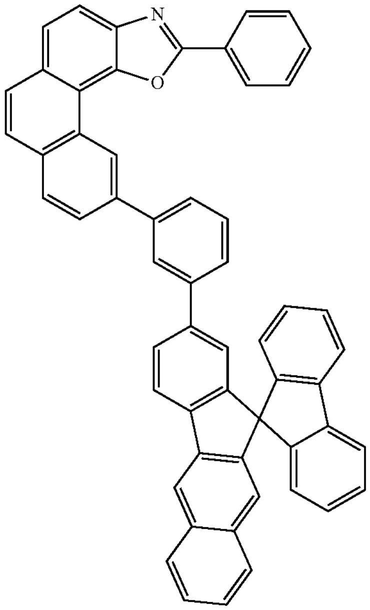
H-53
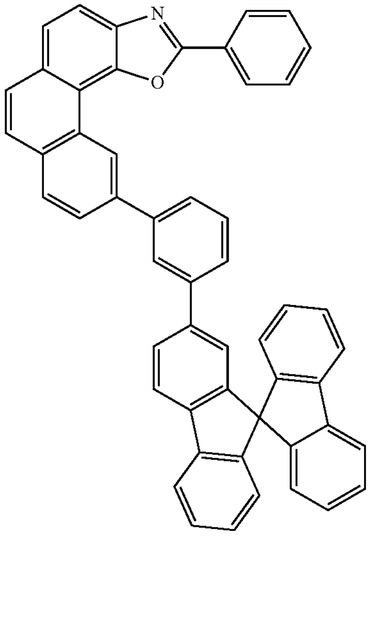
-continued
H-54
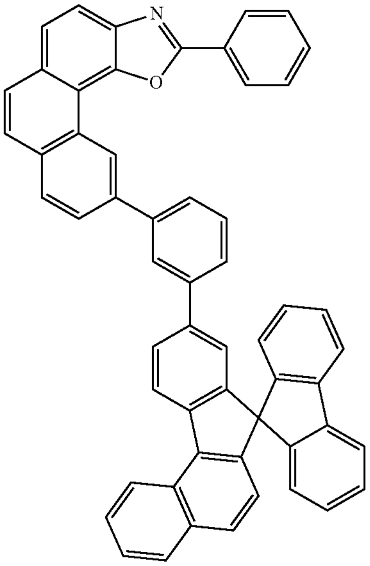
H-55
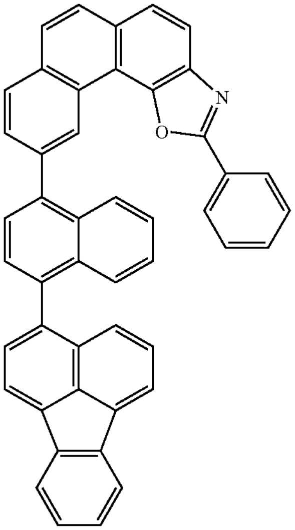
H-56
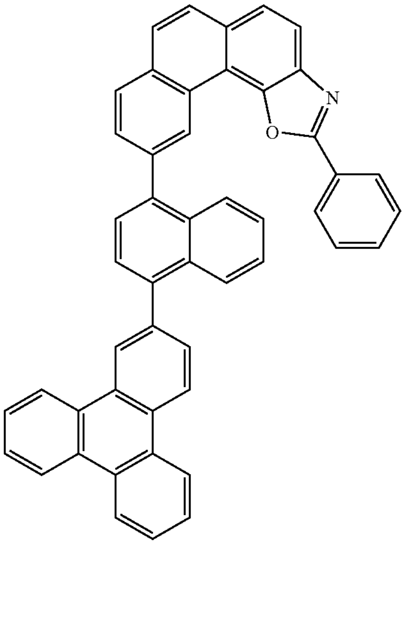

-continued
H-59
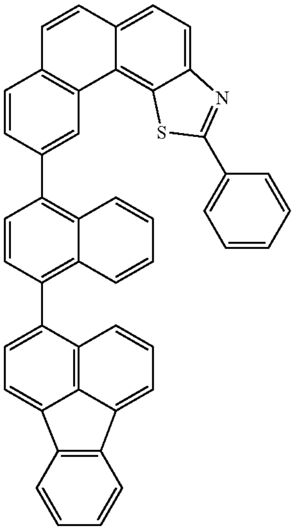
H-60
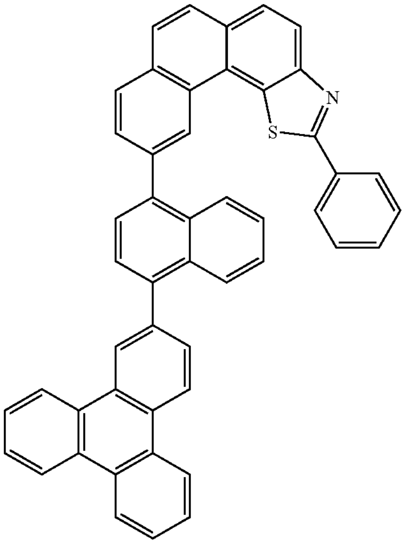
H-63
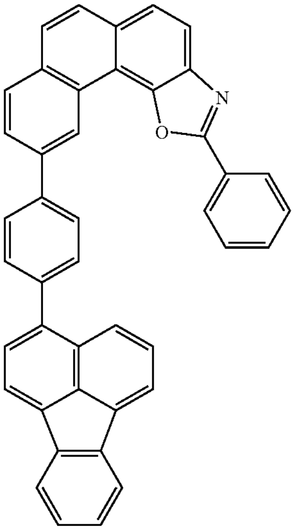
-continued
H-64
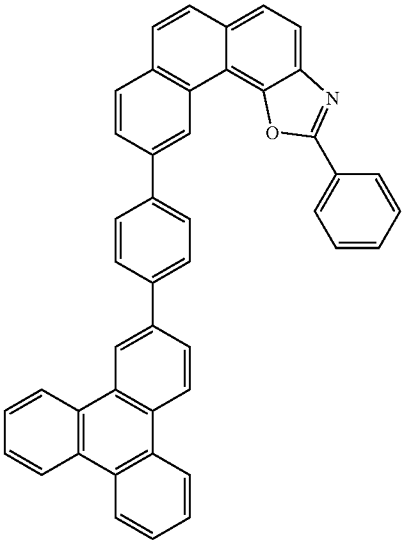
H-65
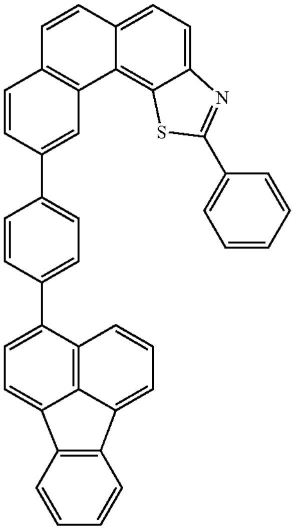
H-66
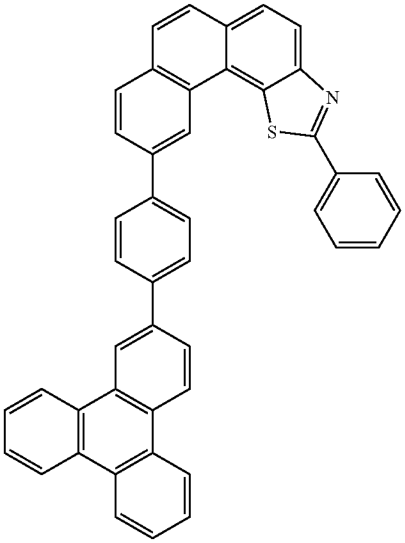

-continued
H-67
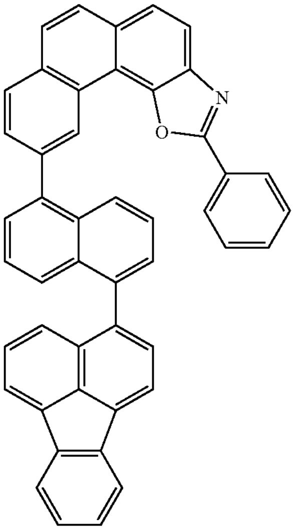
H-68
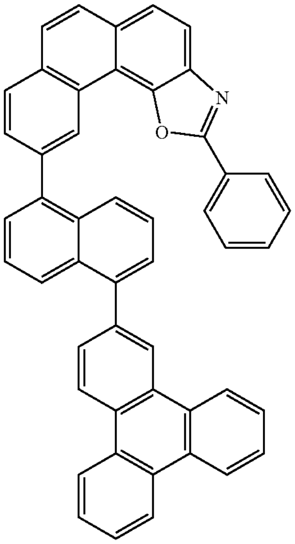
H-69
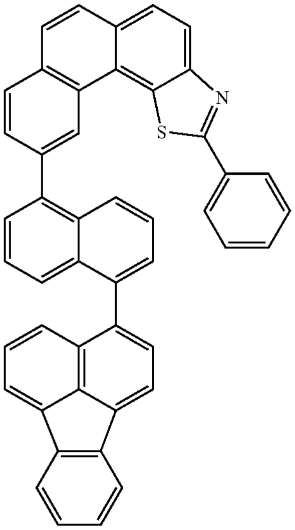
-continued
H-70
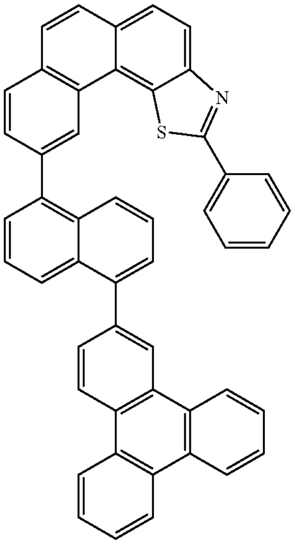
H-71
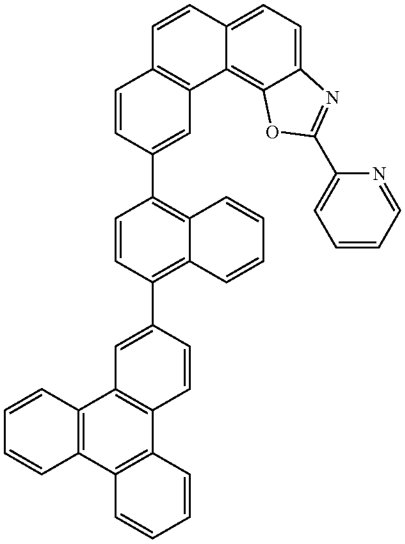
H-72
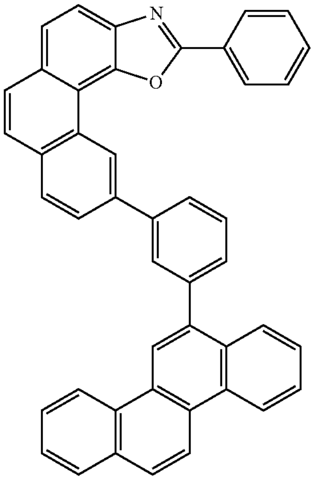

-continued
H-75
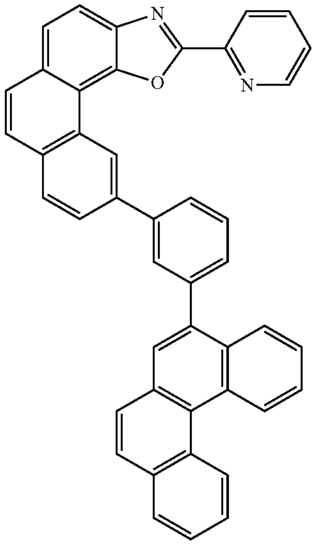
H-76
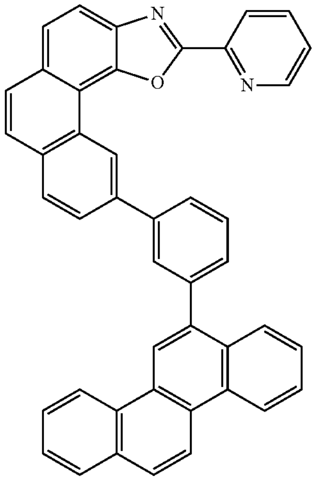
H-77
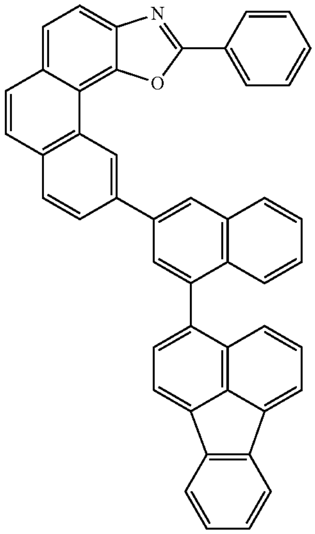
-continued
H-78
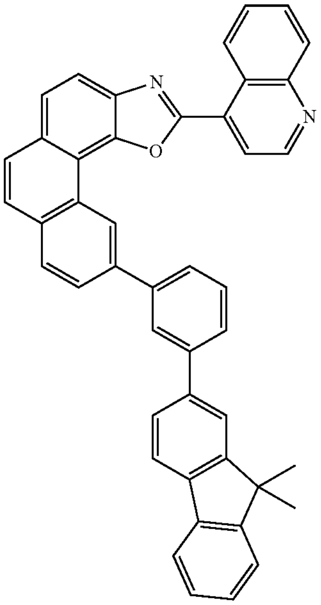
H-79
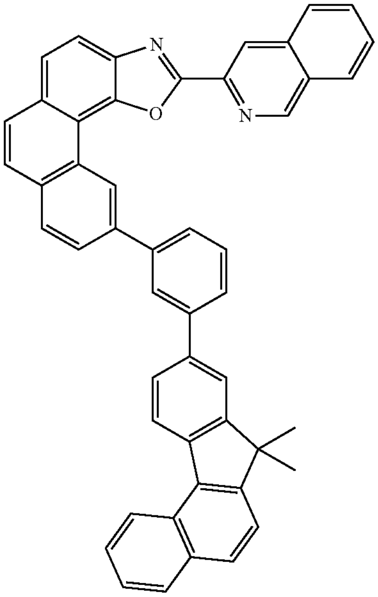

-continued
H-80
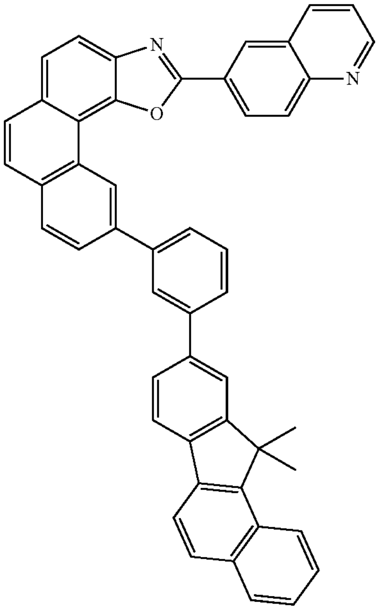
H-81
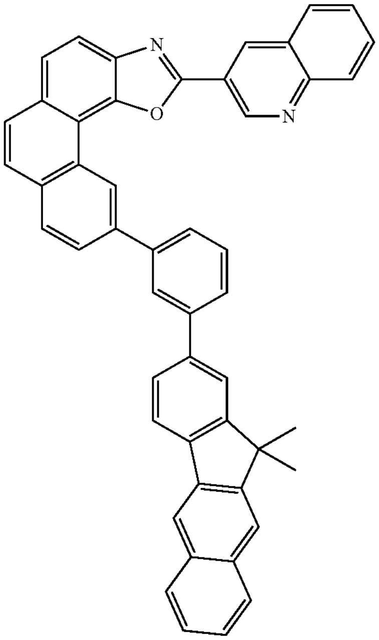
-continued
H-82
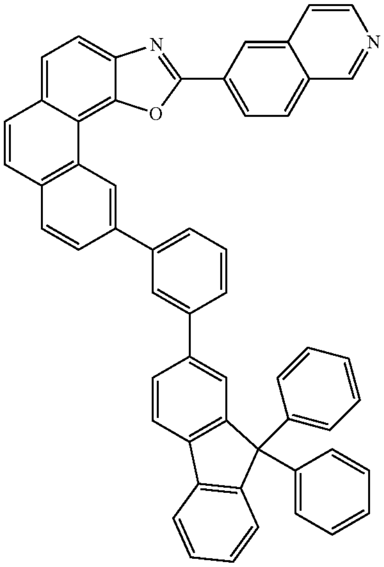
H-83
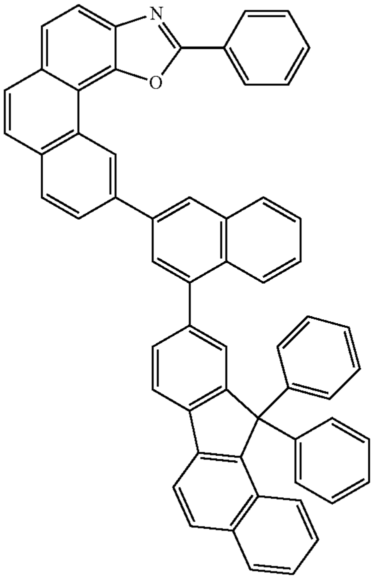

-continued
H-84
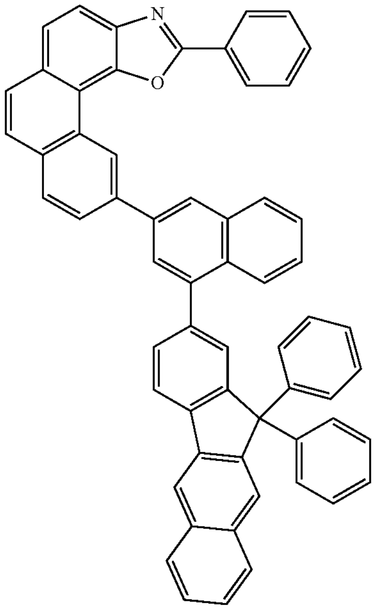
H-85
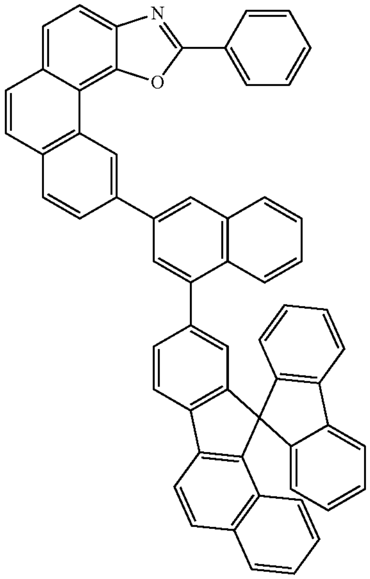
H-104
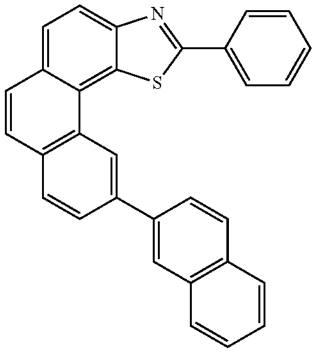
-continued
H-105
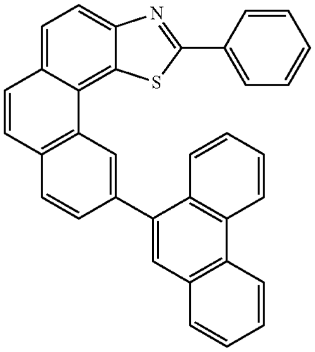
H-106
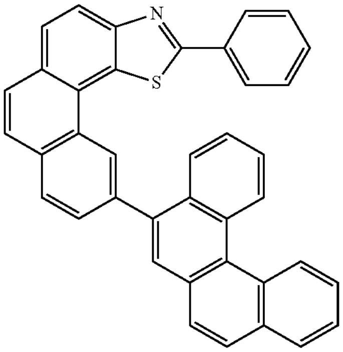
H-107
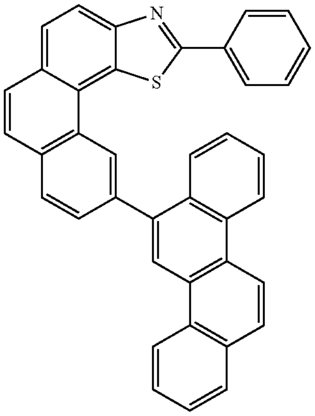
H-108
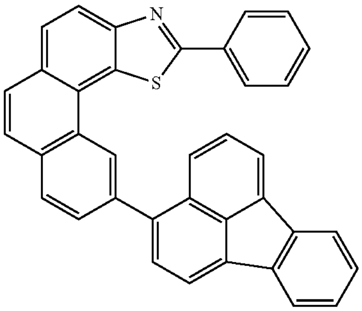

-continued
H-109
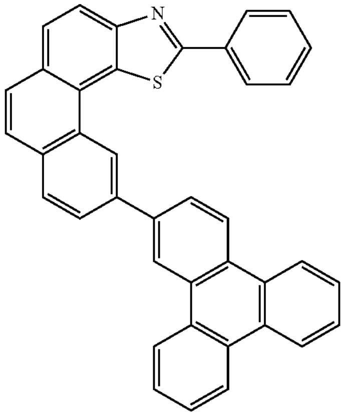
H-110
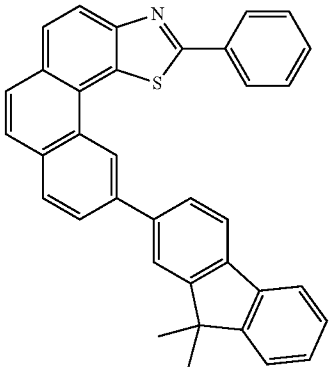
H-111
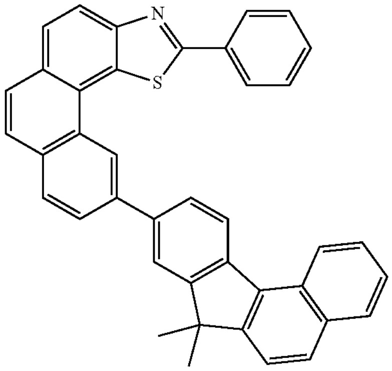
H-112
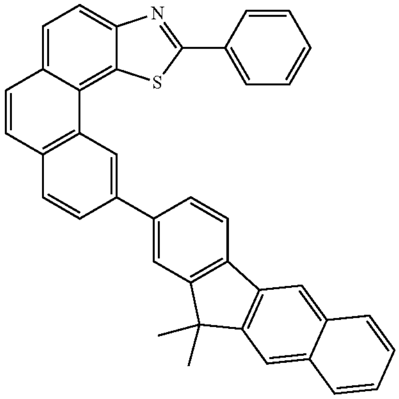
-continued
H-113
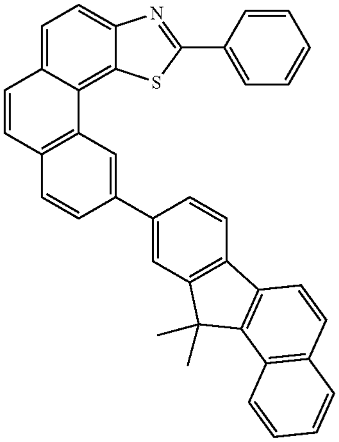
H-114
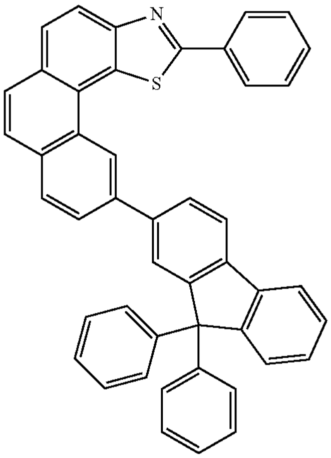
H-115
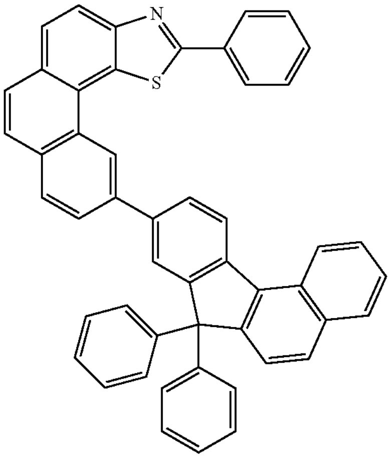

-continued
H-116
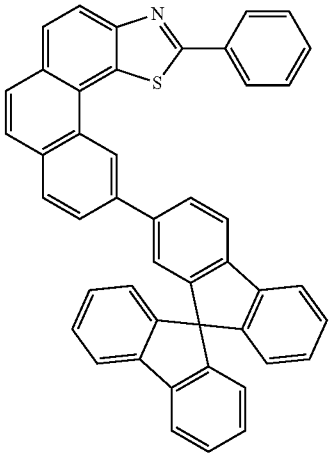
H-117
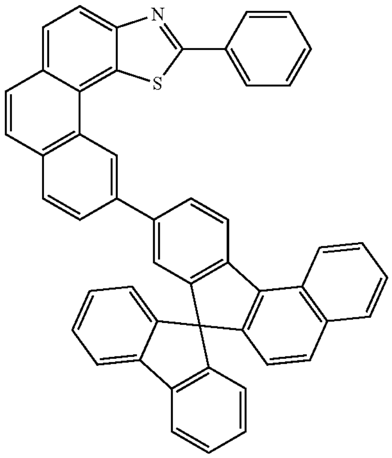
H-118
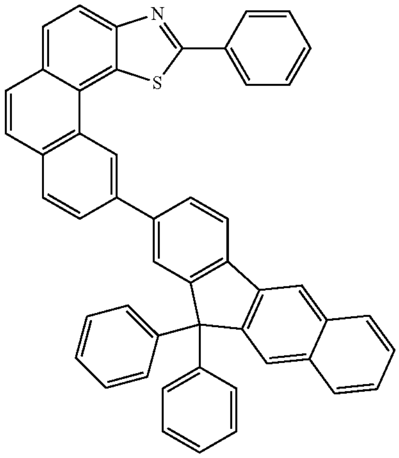
-continued
H-119
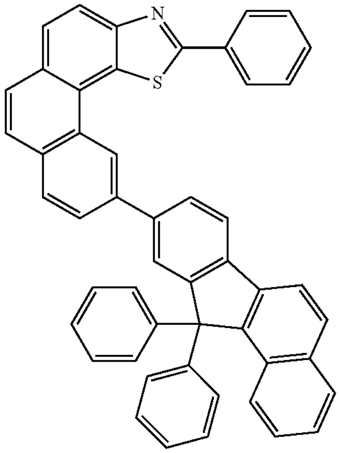
H-120
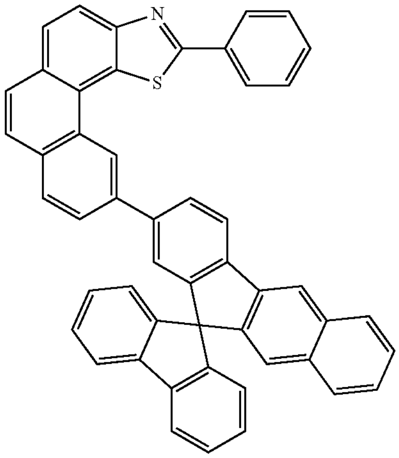
H-121
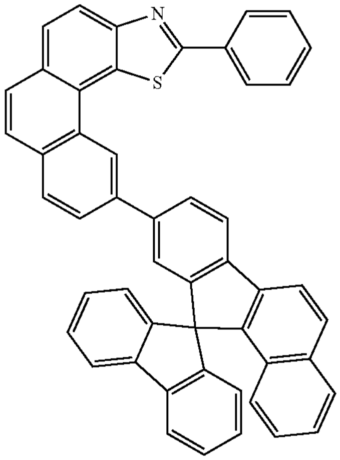

-continued
H-122
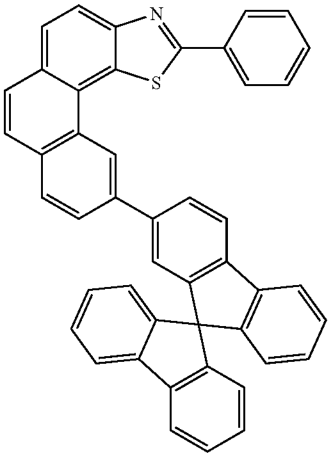
H-123
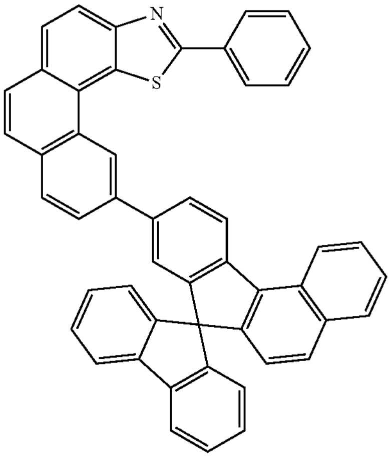
H-124
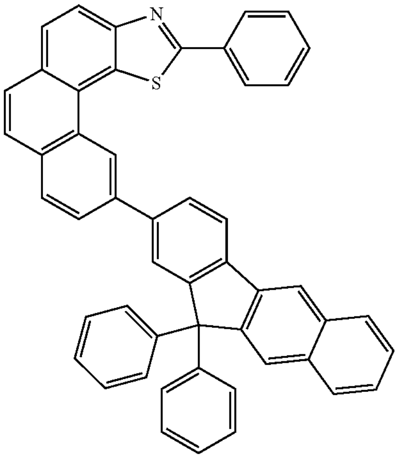
-continued
H-125
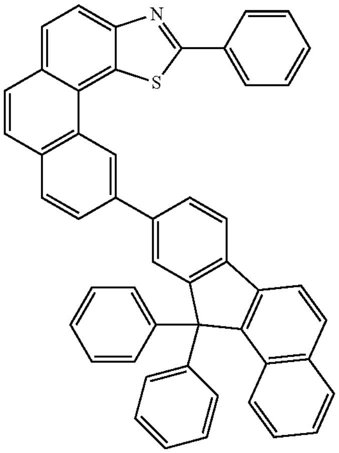
H-126
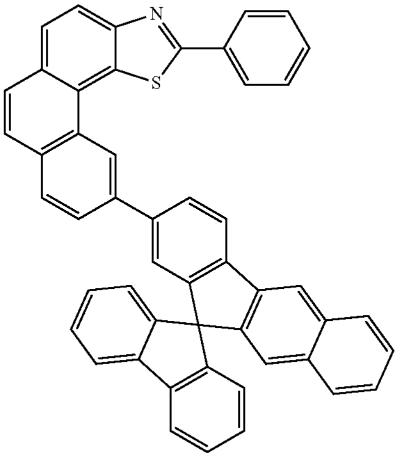
H-127
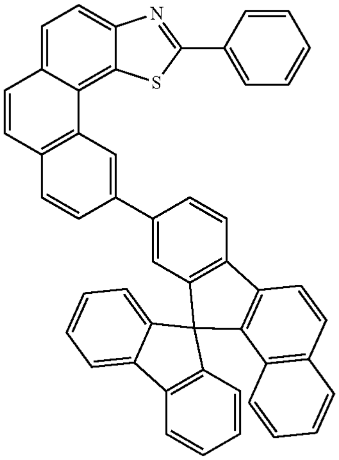

-continued
H-130
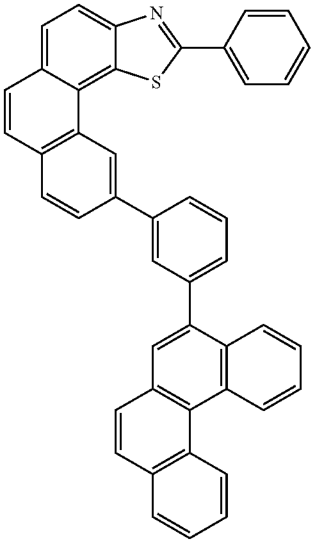
H-131
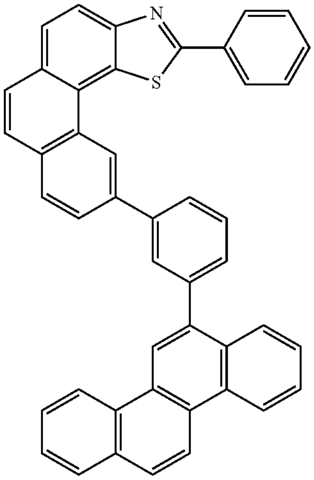
H-132
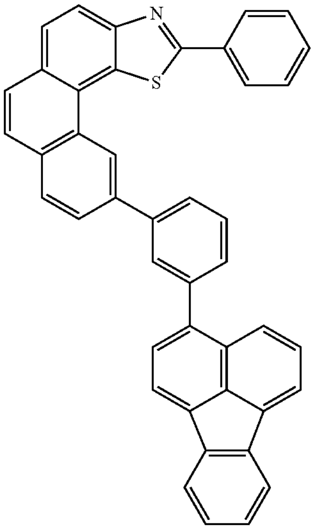
-continued
H-133
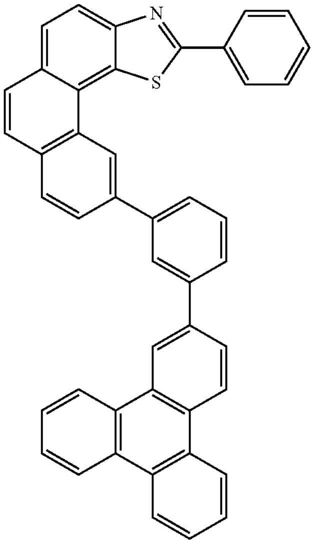
H-134
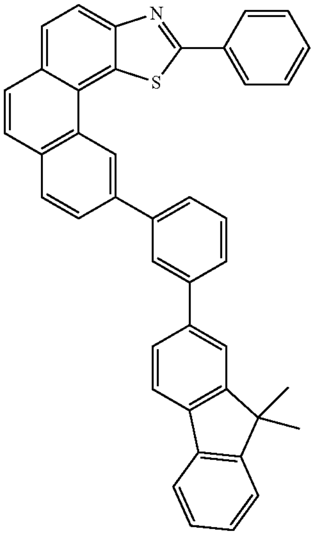
H-135
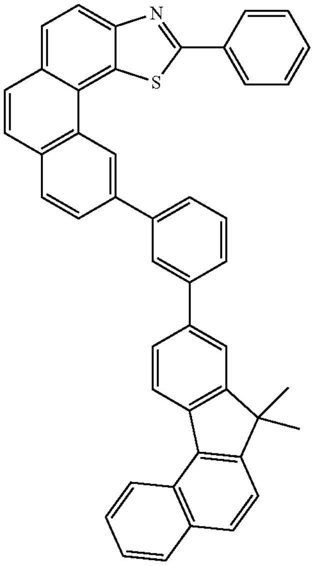

-continued
H-136
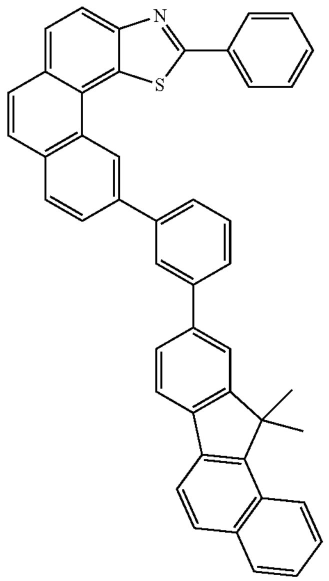
H-137
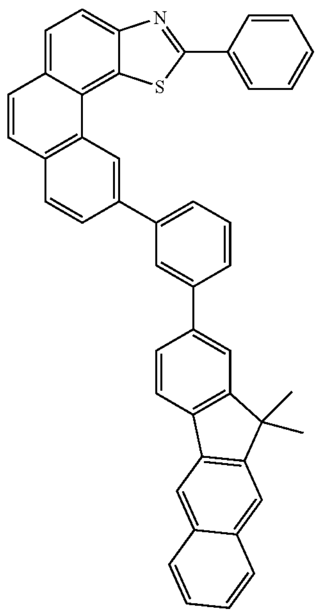
-continued
H-138
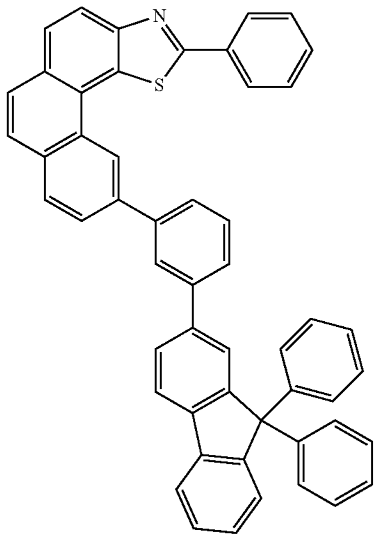
H-139
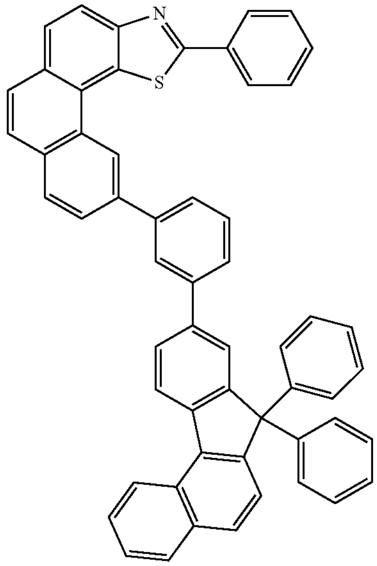

-continued
H-140
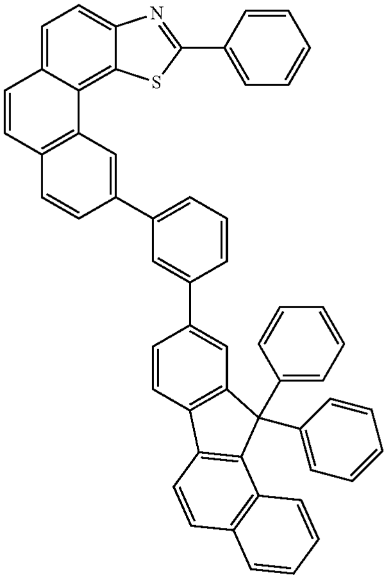
-continued
H-142
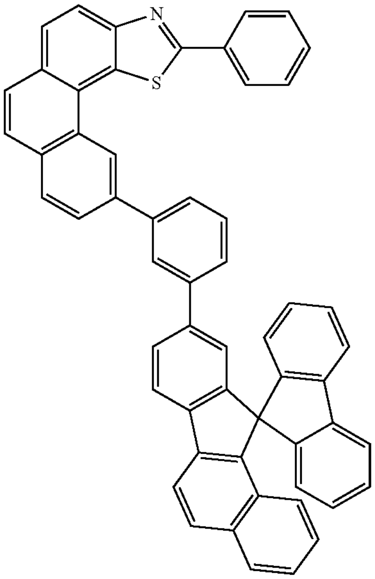
H-141
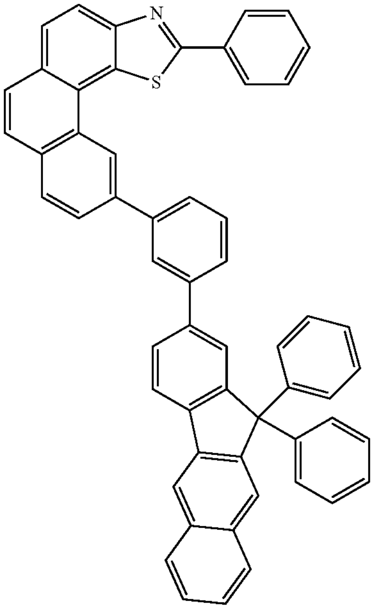
H-143
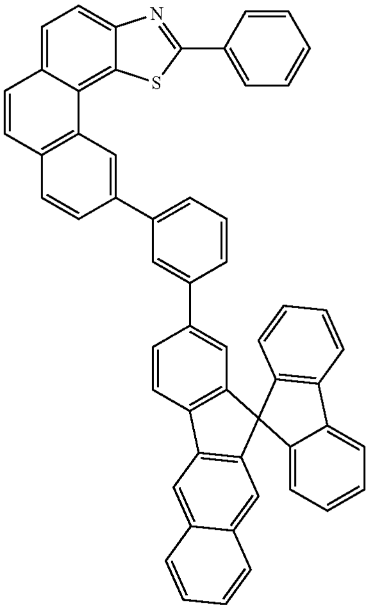

-continued
H-144
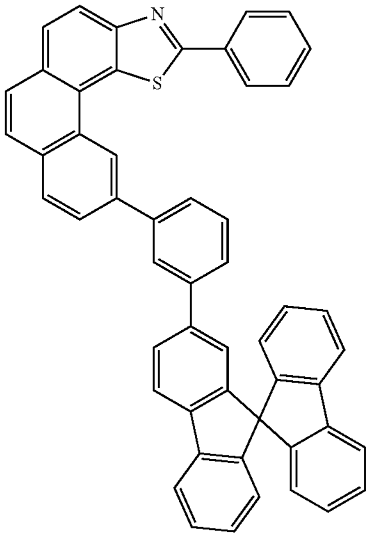
H-145
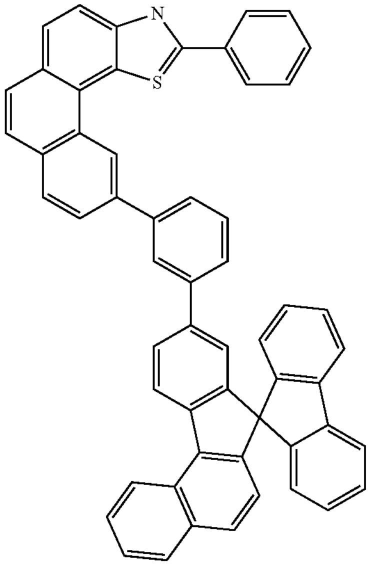
H-179
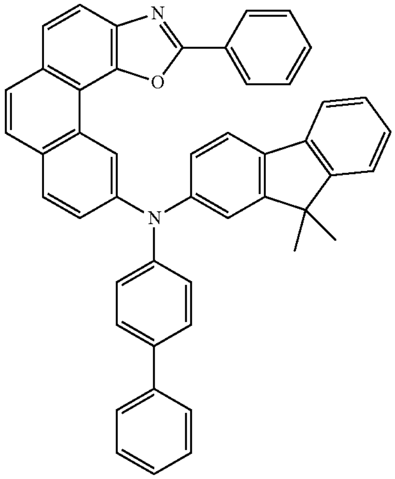
-continued
H-182
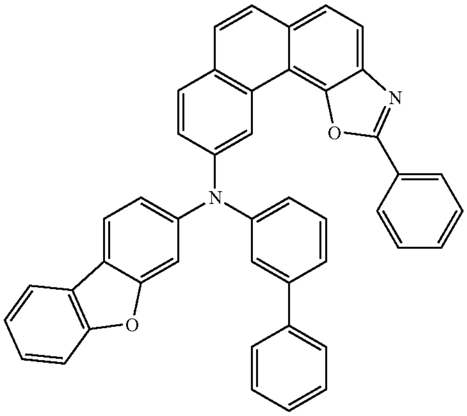
H-183
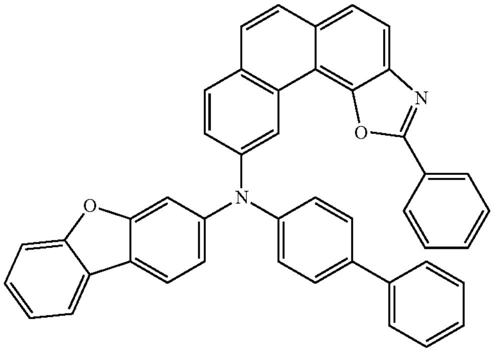
H-185
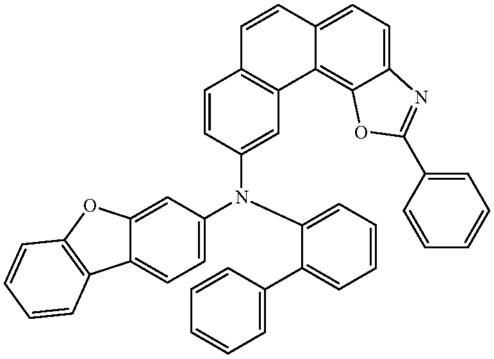
H-186
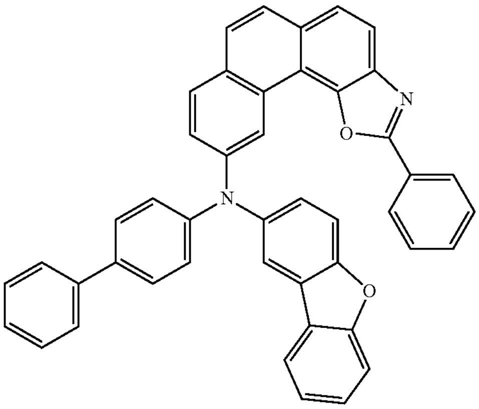

H-187
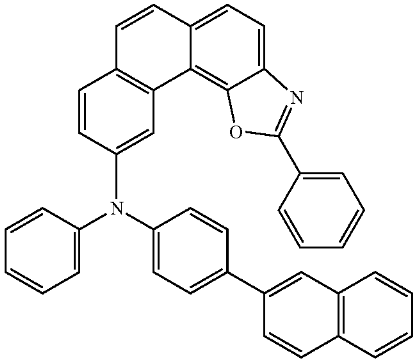
H-188
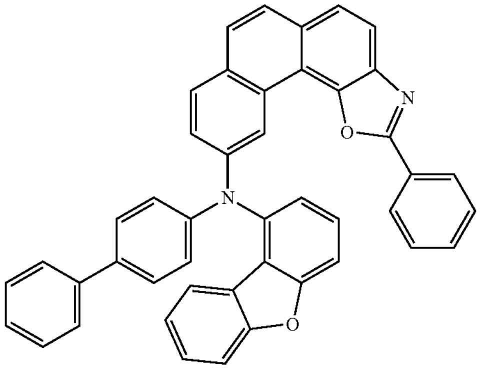
H-189
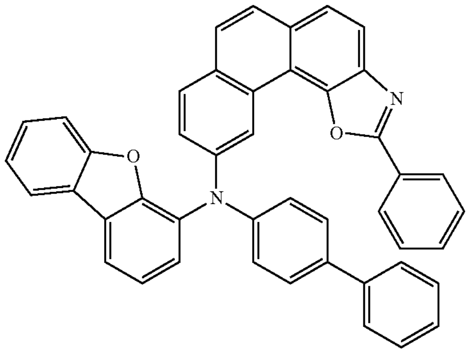
H-190
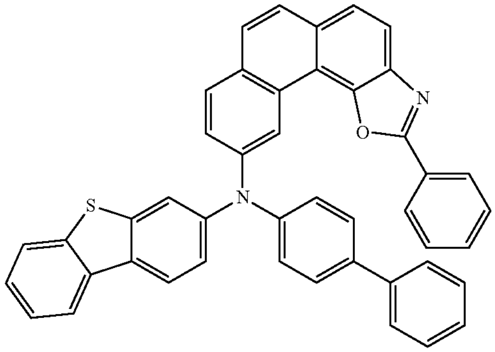
H-191
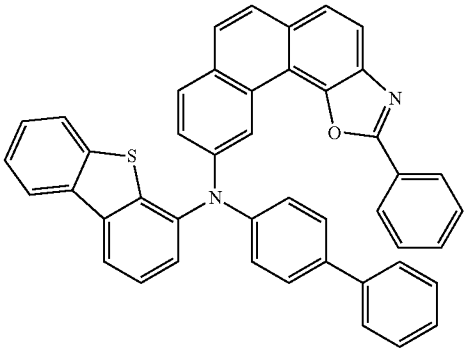
H-192
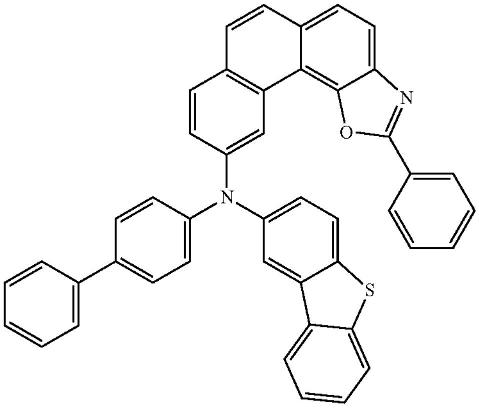
H-193
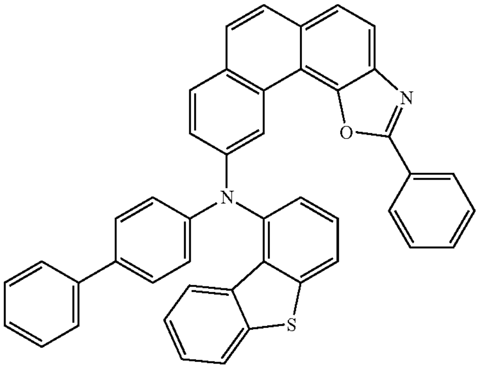
H-194
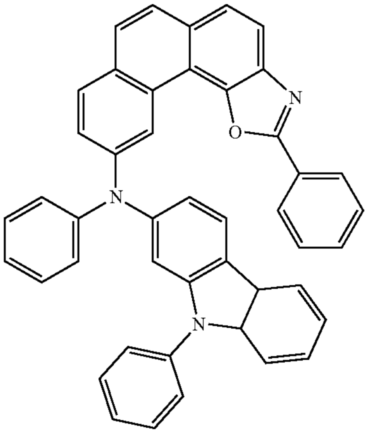

-continued
H-195
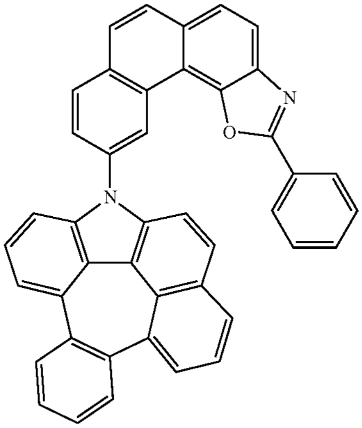
H-196
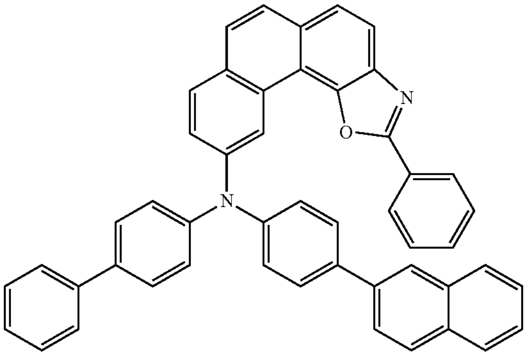
H-197
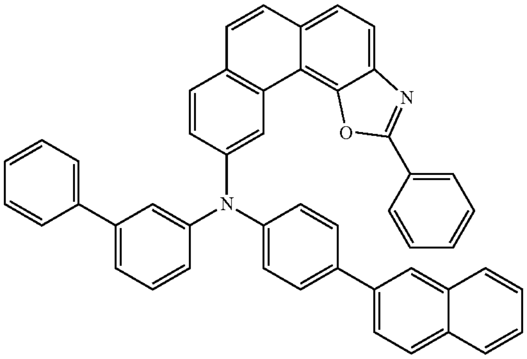
-continued
H-198
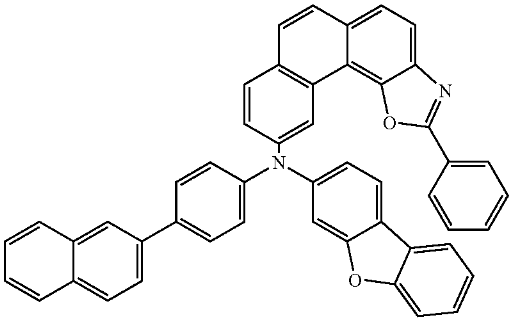
and
H-199
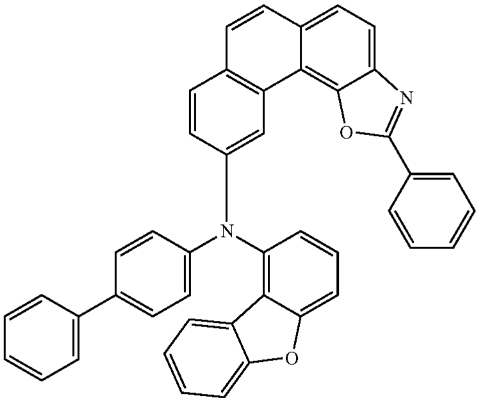
.
5. The plurality of host materials according to claim 1, wherein the compound represented by formula 2-1 is at least one selected from the following compounds:
C-224
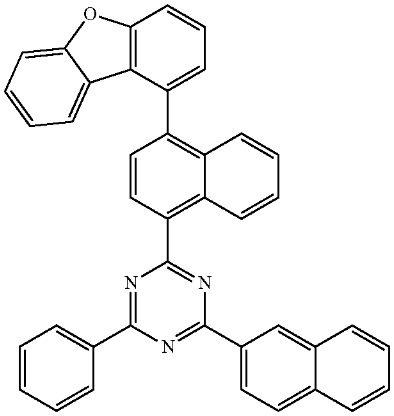

-continued
C-225
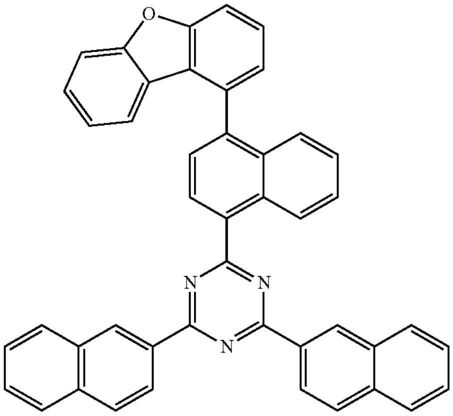
C-271
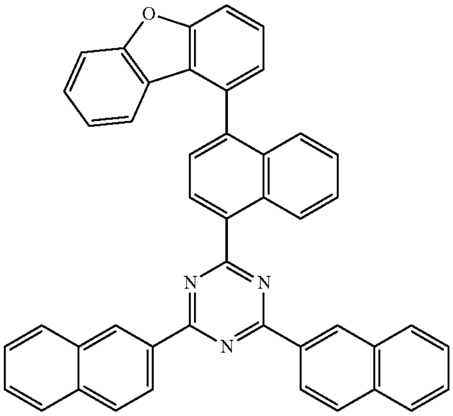
-continued
C-272
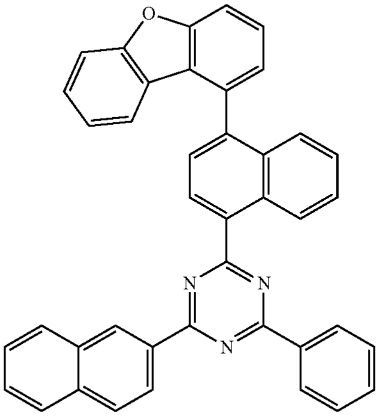
and
C-273
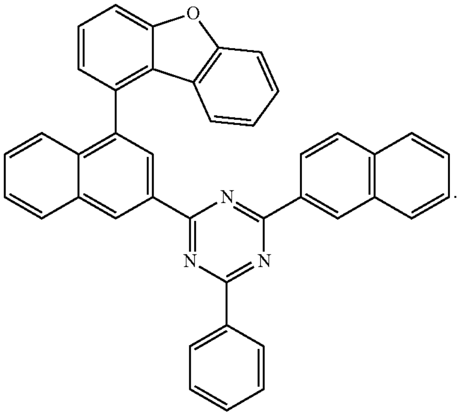
.
6. An organic electroluminescent device comprising an anode, a cathode, and at least one light-emitting layer between the anode and the cathode, wherein at least one layer of the light-emitting layers comprises the plurality of host materials according to claim 1.
* * * * *